US012471339B2

(12) United States Patent
Ueno et al.

(10) Patent No.: US 12,471,339 B2
(45) Date of Patent: Nov. 11, 2025

(54) SiC SEMICONDUCTOR DEVICE

(71) Applicant: ROHM CO., LTD., Kyoto (JP)

(72) Inventors: Masaya Ueno, Kyoto (JP); Yuki Nakano, Kyoto (JP); Sawa Haruyama, Kyoto (JP); Yasuhiro Kawakami, Kyoto (JP); Seiya Nakazawa, Kyoto (JP); Yasunori Kutsuma, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 19 days.

(21) Appl. No.: 18/654,028

(22) Filed: May 3, 2024

(65) Prior Publication Data

US 2024/0282825 A1 Aug. 22, 2024

Related U.S. Application Data

(63) Continuation of application No. 18/180,599, filed on Mar. 8, 2023, now Pat. No. 12,021,120, which is a (Continued)

(30) Foreign Application Priority Data

Aug. 10, 2018 (JP) ................................. 2018-151450
Aug. 10, 2018 (JP) ................................. 2018-151451
Aug. 10, 2018 (JP) ................................. 2018-151452

(51) Int. Cl.
*H10D 62/832* (2025.01)
*H10D 62/40* (2025.01)

(52) U.S. Cl.
CPC ....... *H10D 62/8325* (2025.01); *H10D 62/405* (2025.01)

(58) Field of Classification Search
CPC .... H10D 62/8325; H10D 62/405; H10D 8/60; H10D 8/051; H10D 30/665;
(Continued)

(56) References Cited

U.S. PATENT DOCUMENTS

2010/0051981 A1 3/2010 Osawa et al.
2011/0092063 A1* 4/2011 Kawai ................ H01L 21/0485 257/E21.062

(Continued)

FOREIGN PATENT DOCUMENTS

JP 2003266185 A 9/2003
JP 2005-057257 A 3/2005

(Continued)

OTHER PUBLICATIONS

Notice of Reasons for Refusal dated Jan. 9, 2025 in corresponding Japanese Patent Application No. 2023-207826 (6 pages; with English machine translation).

(Continued)

*Primary Examiner* — Douglas W Owens
(74) *Attorney, Agent, or Firm* — XSENSUS LLP

(57) ABSTRACT

An SiC semiconductor device includes an SiC semiconductor layer including an SiC monocrystal and having a first main surface as an element forming surface, a second main surface at a side opposite to the first main surface, and a plurality of side surfaces connecting the first main surface and the second main surface, and a plurality of modified lines formed one layer each at the respective side surfaces of the SiC semiconductor layer and each extending in a band shape along a tangential direction to the first main surface of the SiC semiconductor layer and modified to be of a property differing from the SiC monocrystal.

21 Claims, 64 Drawing Sheets

Related U.S. Application Data continuation of application No. 17/265,454, filed as application No. PCT/JP2019/031474 on Aug. 8, 2019, now Pat. No. 11,626,490.

(58) Field of Classification Search
CPC .. H10D 30/668; H10D 62/106; H10D 62/117; H10D 62/127; H10D 62/393; H10D 62/53; H10D 62/57; H10D 64/117; H10D 64/519; H10D 84/00; H10D 84/0126; H10D 84/038; H10D 84/143; H01L 24/29; H01L 24/32; H01L 24/73; H01L 24/83; H01L 24/85; H01L 2224/04026; H01L 2224/04042; H01L 2224/056; H01L 2224/0603; H01L 2224/451; H01L 2224/48091; H01L 2224/48247; H01L 2224/48464; H01L 2224/73265; H01L 2924/00014; H01L 2924/10272; H01L 2924/181; H01L 2924/19107; H01L 24/03; H01L 24/05; H01L 2224/02166; H01L 2224/06181; H01L 21/78
See application file for complete search history.

(56) References Cited

U.S. PATENT DOCUMENTS

| | | | |
|---|---|---|---|
| 2012/0292642 A1 | 11/2012 | Urata et al. | |
| 2014/0001679 A1 | 1/2014 | Okuma et al. | |
| 2017/0098733 A1 | 4/2017 | Tamemoto et al. | |
| 2018/0202070 A1* | 7/2018 | Asamizu | C30B 29/36 |

FOREIGN PATENT DOCUMENTS

| | | | |
|---|---|---|---|
| JP | 2007-167875 | A | 7/2007 |
| JP | 2008-078440 | A | 4/2008 |
| JP | 2009-135512 | A | 6/2009 |
| JP | 2012004316 | A | 1/2012 |
| JP | 2012-146878 | A | 8/2012 |
| JP | 2013-135198 | A | 7/2013 |
| JP | 2013-235867 | A | 11/2013 |
| JP | 2013-247147 | A | 12/2013 |
| JP | 2015-041638 | A | 3/2015 |
| JP | 2016-030292 | A | 3/2016 |
| JP | 2016-207908 | A | 12/2016 |
| JP | 2017-038066 | A | 2/2017 |
| JP | 2017-059670 | A | 3/2017 |
| JP | 2017-069510 | A | 4/2017 |
| JP | 2017-174969 | A | 9/2017 |
| JP | 2018-117016 | A | 7/2018 |
| WO | 2015/033638 | A1 | 3/2015 |
| WO | 2016/162987 | A1 | 10/2016 |
| WO | 2017/126506 | A1 | 7/2017 |
| WO | 2018/190271 | A1 | 10/2018 |

OTHER PUBLICATIONS

Notice of Reasons for Refusal dated Jan. 23, 2025 in corresponding Japanese Patent Application No. 2024-069384 (9 pages; with English machine translation).
Notice of Reasons for Refusal dated Jun. 12, 2025 in corresponding Japanese patent application No. 2024-069384 (11 pages; with English machine translation).
Japanese Notice of Reasons for Refusal dated Sep. 5, 2024 in corresponding Japanese Patent Application No. 2023-207826, 13 pages.
International Search Report and Written Opinion issued for International Patent Application No. PCT/JP2019/031474, Date of mailing: Sep. 10, 2019, 11 pages including English translation of Search Report.
Notice of Reasons for Refusal issued for Japanese Patent Application No. 2018-151450, Date of Drafting: Jul. 8, 2019, 6 pages including English translation.
Decision to Grant a Patent issued for Japanese Patent Application No. 2018-151451, Date of Drafting: Dec. 16, 2019, 5 pages including English translation.
Notice of Reasons for Refusal issued for Japanese Patent Application No. 2018-151452, Date of Drafting: Jul. 18, 2019, 10 pages including English translation.
International Preliminary Report on Patentability issued for International Patent Application No. PCT/JP2019/031474, Date of mailing: Feb. 25, 2021, 18 pages including English translation.
Notice of Reasons for Refusal issued for Japanese Patent Application No. 2019-221393, Dispatch Date: May 12, 2022, 3 pages including English translation.
Notice of Reasons for Refusal issued Sep. 21, 2023 in Japanese Patent Application No. 2022-132064 and machine English translation thereof.
Japanese Office Action issued Feb. 8, 2024 in corresponding Japanese Patent Application No. 2022-132064, 3 pages.

* cited by examiner

SiC SEMICONDUCTOR DEVICE

CROSS-REFERENCE TO RELATED APPLICATIONS

The present application is a continuation of U.S. application Ser. No. 18/180,599, filed on Mar. 8, 2023, which is a continuation of U.S. application Ser. No. 17/265,454, filed on Feb. 2, 2021 (now U.S. Pat. No. 11,626,490), which is based on PCT filing PCT/JP2019/031474, filed Aug. 8, 2019, which claims priority to Japanese patent application nos. 2018-151451, 2018-151450 and 2018-151452 filed on Aug. 10, 2018, the entire contents of each are incorporated herein by reference.

TECHNICAL FIELD

The present invention relates to an SiC semiconductor device.

BACKGROUND ART

A method for processing an SiC semiconductor wafer called a stealth dicing method has come to be noted in recent years. With the stealth dicing method, after laser light is selectively irradiated onto the SiC semiconductor wafer, the SiC semiconductor wafer is cut along the portion irradiated with the laser light. According to this method, the SiC semiconductor wafer, which has a comparatively high hardness, can be cut without using a cutting member such as a dicing blade, etc., and therefore a manufacturing time can be shortened.

Patent Literature 1 discloses a method for manufacturing an SiC semiconductor device that uses the stealth dicing method. In the manufacturing method of Patent Literature 1, a plurality of columns of modified regions (modified layers) are formed over entire areas of respective side surfaces of an SiC semiconductor layer cut out from the SiC semiconductor wafer. The plurality of columns of modified regions extend along tangential directions to a main surface of the SiC semiconductor layer and are formed at intervals in a normal direction to the main surface of the SiC semiconductor layer.

CITATION LIST

Patent Literature

Patent Literature 1: Japanese Patent Application Publication No. 2012-146878

SUMMARY OF INVENTION

Technical Problem

A modified line is formed by modifying an SiC monocrystal of the SiC semiconductor layer to be of another property. Thus, in consideration of influences on the SiC semiconductor layer due to the modified line, it cannot be said to be desirable to form a plurality of modified lines over the entire areas of the side surfaces of the SiC semiconductor layer. As examples of the influences on the SiC semiconductor layer due to the modified line, fluctuation of electrical characteristics of the SiC semiconductor layer due to the modified line, generation of a crack in the SiC semiconductor layer with the modified line as a starting point, etc., can be cited.

One preferred embodiment of the present invention provides an SiC semiconductor device that enables influences on an SiC semiconductor layer due to a modified line to be reduced.

Solution to Problem

One preferred embodiment of the present invention provides an SiC semiconductor device including an SiC semiconductor layer including an SiC monocrystal and having a first main surface as an element forming surface, a second main surface at a side opposite to the first main surface, and a plurality of side surfaces connecting the first main surface and the second main surface, and a plurality of modified lines formed one layer each at the respective side surfaces of the SiC semiconductor layer and each extending in a band shape along a tangential direction to the first main surface of the SiC semiconductor layer and modified to be of a property differing from the SiC monocrystal.

According to this SiC semiconductor device, just one modified line is formed at each side surface of the SiC semiconductor layer. Influences on the SiC semiconductor layer due to the modified lines can thus be reduced.

The aforementioned as well as yet other objects, features, and effects of the present invention will be made clear by the following description of the preferred embodiments, with reference to the accompanying drawings.

BRIEF DESCRIPTION OF DRAWINGS

FIG. 13O is a perspective view showing the SiC semiconductor device shown in FIG. 3 and is a perspective view showing a thirteenth configuration example of the modified lines.

DESCRIPTION OF EMBODIMENTS

An SiC (silicon carbide) monocrystal constituted of a hexagonal crystal is applied in the preferred embodiments of the present invention. The SiC monocrystal constituted of the hexagonal crystal has a plurality of polytypes including a 2H (hexagonal)-SiC monocrystal, a 4H-SiC monocrystal, and a 6H-SiC monocrystal in accordance with cycle of atomic arrangement. Although, in the preferred embodiments of the present invention, examples where a 4H-SiC monocrystal is applied shall be described, this does not exclude other polytypes from the present invention.

Figure 1:
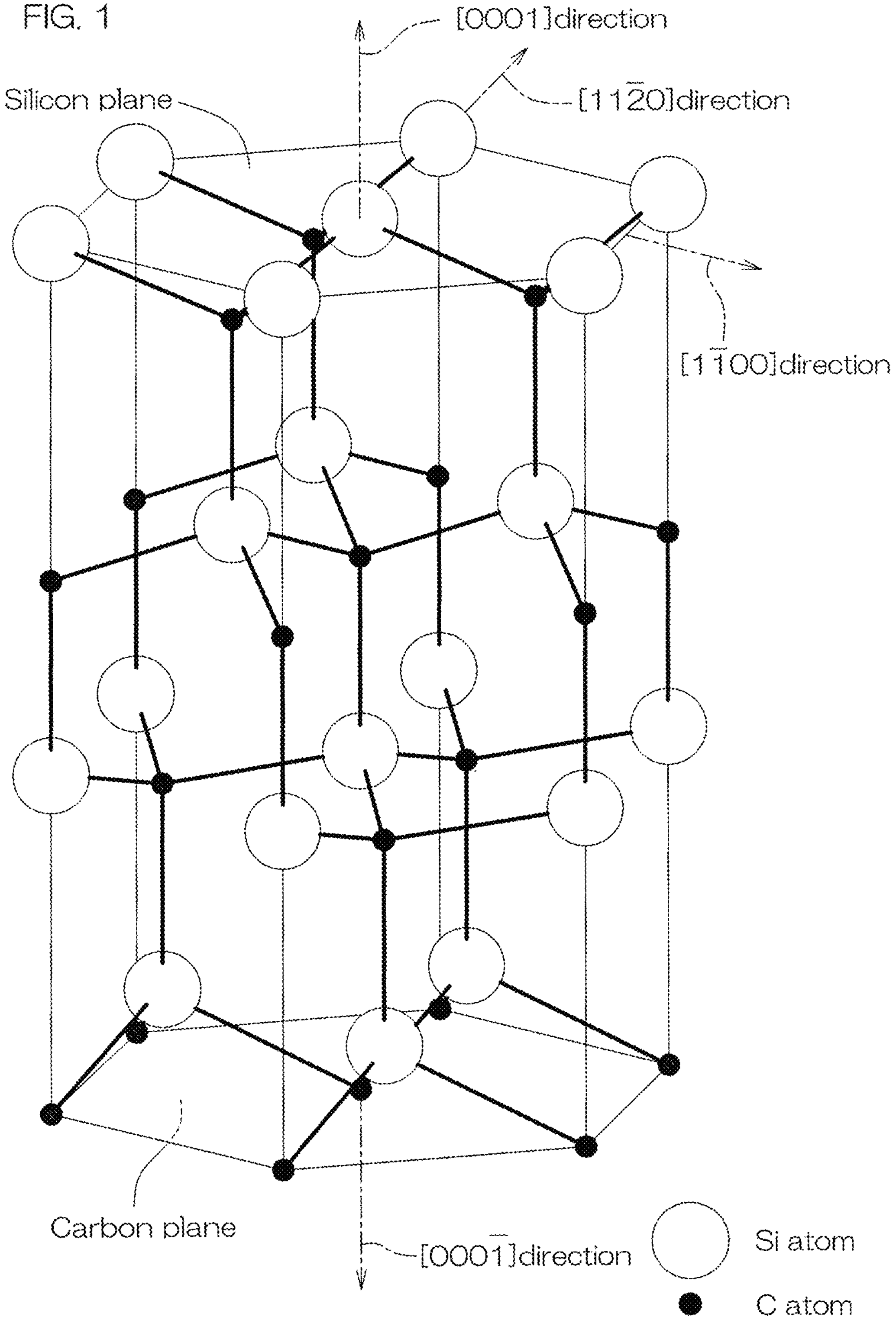
FIG. 1 is a diagram of a unit cell of a 4H-SiC monocrystal to be applied to preferred embodiments of the present invention.
Figure 2:
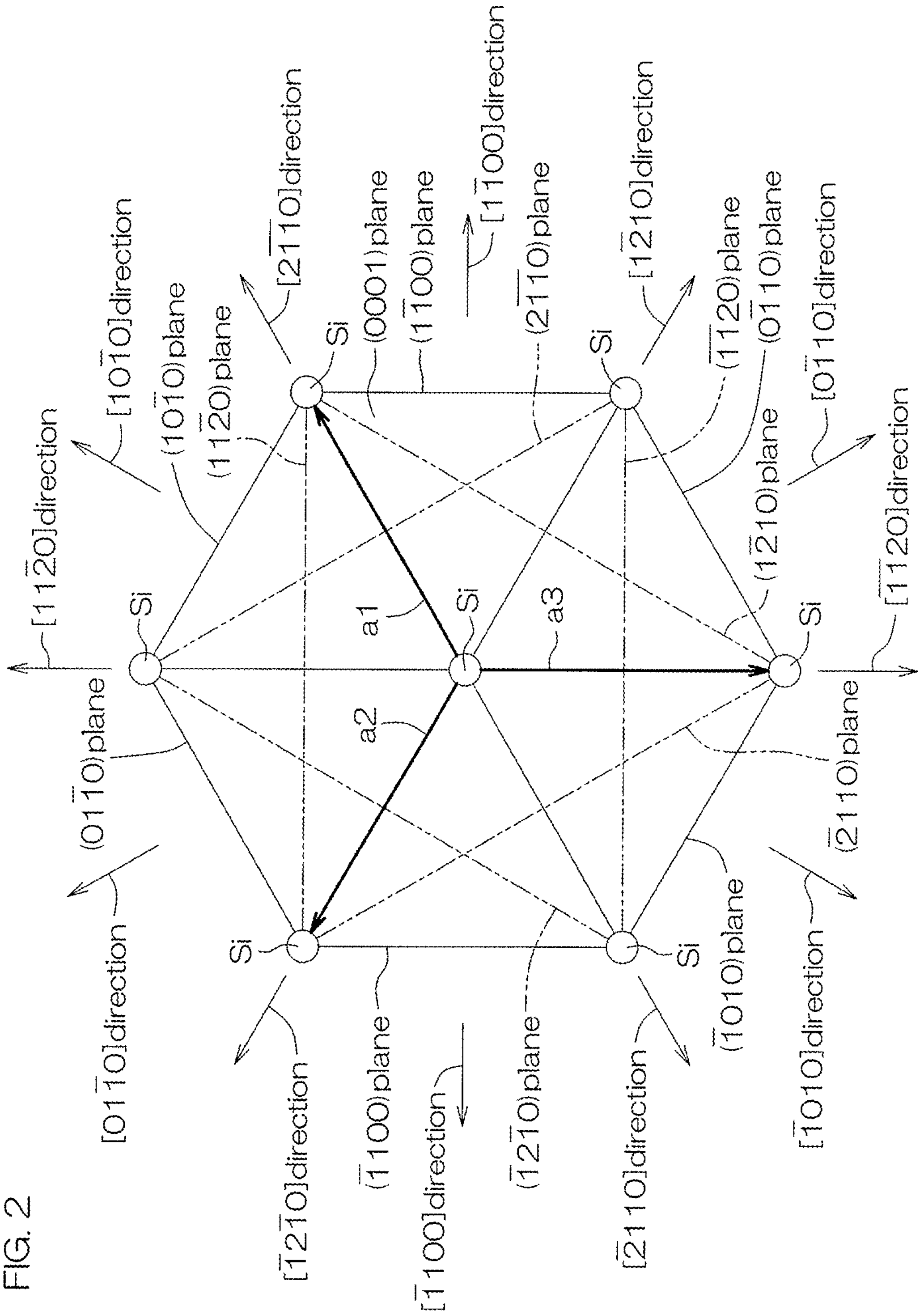
FIG. 2 is a plan view of a silicon plane of the unit cell shown in FIG. 1.

The crystal structure of the 4H-SiC monocrystal shall now be described. FIG. 1 is a diagram of a unit cell of the 4H-SiC monocrystal to be applied to preferred embodiments of the present invention (hereinafter referred to simply as the "unit cell"). FIG. 2 is a plan view of a silicon plane of the unit cell shown in FIG. 1.

Referring to FIG. 1 and FIG. 2, the unit cell includes tetrahedral structures in each of which four C atoms are bonded to a single Si atom in a tetrahedral arrangement (regular tetrahedral arrangement) relationship. The unit cell has an atomic arrangement in which the tetrahedral structures are stacked in a four-period. The unit cell has a hexagonal prism structure having a regular hexagonal silicon plane, a regular hexagonal carbon plane, and six side planes connecting the silicon plane and the carbon plane.

The silicon plane is an end plane terminated by Si atoms. At the silicon plane, a single Si atom is positioned at each of six vertices of a regular hexagon and a single Si atom is positioned at a center of the regular hexagon. The carbon plane is an end plane terminated by C atoms. At the carbon plane, a single C atom is positioned at each of six vertices of a regular hexagon and a single C atom is positioned at a center of the regular hexagon.

The crystal planes of the unit cell are defined by four coordinate axes (a1, a2, a3, and c) including an a1-axis, an a2-axis, an a3-axis, and a c-axis. Of the four coordinate axes, a value of a3 takes on a value of −(a1+a2). The crystal planes of the 4H-SiC monocrystal shall be described below based on the silicon plane as an example of an end plane of a hexagonal crystal.

In a plan view of viewing the silicon plane from the c-axis, the a1-axis, the a2-axis, and the a3-axis are respectively set along directions of arrangement of the nearest neighboring Si atoms (hereinafter referred to simply as the "nearest atom directions") based on the Si atom positioned at the center. The a1-axis, the a2-axis, and the a3-axis are set to be shifted by 120° each in conformance to the arrangement of the Si atoms.

The c-axis is set in a normal direction to the silicon plane based on the Si atom positioned at the center. The silicon plane is a (0001) plane. The carbon plane is a (000-1) plane. The side planes of the hexagonal prism include six crystal planes oriented along the nearest atom directions in the plan view of viewing the silicon plane from the c-axis. More specifically, the side planes of the hexagonal prism include the six crystal planes each including two nearest neighboring Si atoms in the plan view of viewing the silicon plane from the c-axis.

In the plan view of viewing the silicon plane from the c-axis, the side planes of the unit cell include a (1-100) plane, a (0-110) plane, a (−1010) plane, a (−1100) plane, a (01-10) plane, and a (10-10) plane in clockwise order from a tip of the a1-axis.

Diagonal planes of the unit cell not passing through the center include six crystal planes oriented along intersecting directions intersecting the nearest atom directions in the plan view of viewing the silicon plane from the c-axis. When viewed on a basis of the Si atom positioned at the center, the nearest atom direction intersecting directions are orthogonal directions to the nearest atom directions. More specifically, the diagonal planes of the unit cell not passing through the center include the six crystal planes that each include two Si atoms that are not nearest neighbors.

In the plan view of viewing the silicon plane from the c-axis, the diagonal planes of the unit cell not passing through the center include a (11-20) plane, a (1-210) plane, a (−2110) plane, a (−1-120) plane, a (−12-10) plane, and a (2-1-10) plane.

The crystal directions of the unit cell are defined by directions normal to the crystal planes. A normal direction to the (1-100) plane is a [1-100] direction. A normal direction to the (0-110) plane is a [0-110] direction. A normal direction to the (−1010) plane is a [−1010] direction. A normal direction to the (−1100) plane is a [−1100] direction. A normal direction to the (01-10) plane is a [01-10] direction. A normal direction to the (10-10) plane is a [10-10] direction.

A normal direction to the (11-20) plane is a [11-20] direction. A normal direction to the (1-210) plane is a [1-210] direction. A normal direction to the (−2110) plane is a [−2110] direction. A normal direction to the (−1-120) plane is a [−1-120] direction. A normal direction to the (−12-10) plane is a [−12-10] direction. A normal direction to the (2-1-10) plane is a [Feb. 1, 2010] direction.

The hexagonal prism is six-fold symmetrical and has equivalent crystal planes and equivalent crystal directions every 60°. For example, the (1-100) plane, the (0-110) plane, the (−1010) plane, the (−1100) plane, the (01-10) plane, and the (10-10) plane form equivalent crystal planes. Also, the (11-20) plane, the (1-210) plane, the (−2110) plane, the (−1-120) plane, the (−12-10) plane, and the (2-1-10) plane form equivalent crystal planes.

Also, the [1-100] direction, the [0-110] direction, the [−1010] direction, the [−1100] direction, the [01-10] direction, and the [10-10] direction form equivalent crystal directions. Also, the [11-20] direction, the [1-210] direction, the

[−2110] direction, the [−1-120] direction, the [−12-10] direction, and the [Feb. 1, 2010] direction form equivalent crystal directions.

The c-axis is a direction ([000-1] direction). The a1-axis is the [Feb. 1, 2010] direction ([−2110] direction). The a2-axis is the [−12-10] direction ([1-210] direction). The a3-axis is the [−1-120] direction ([11-20] direction).

The direction and the [000-1] direction are referred to as the c-axis. The (0001) plane and the (000-1) plane are referred to as c-planes. The [11-20] direction and the [−1-120] direction are referred to as an a-axis. The (11-20) plane and the (−1-120) plane are referred to as a-planes. The [1-100] direction and the [−1100] direction are referred to as an m-axis. The (1-100) plane and the (−1100) plane are referred to as m-planes.

Figure 3:
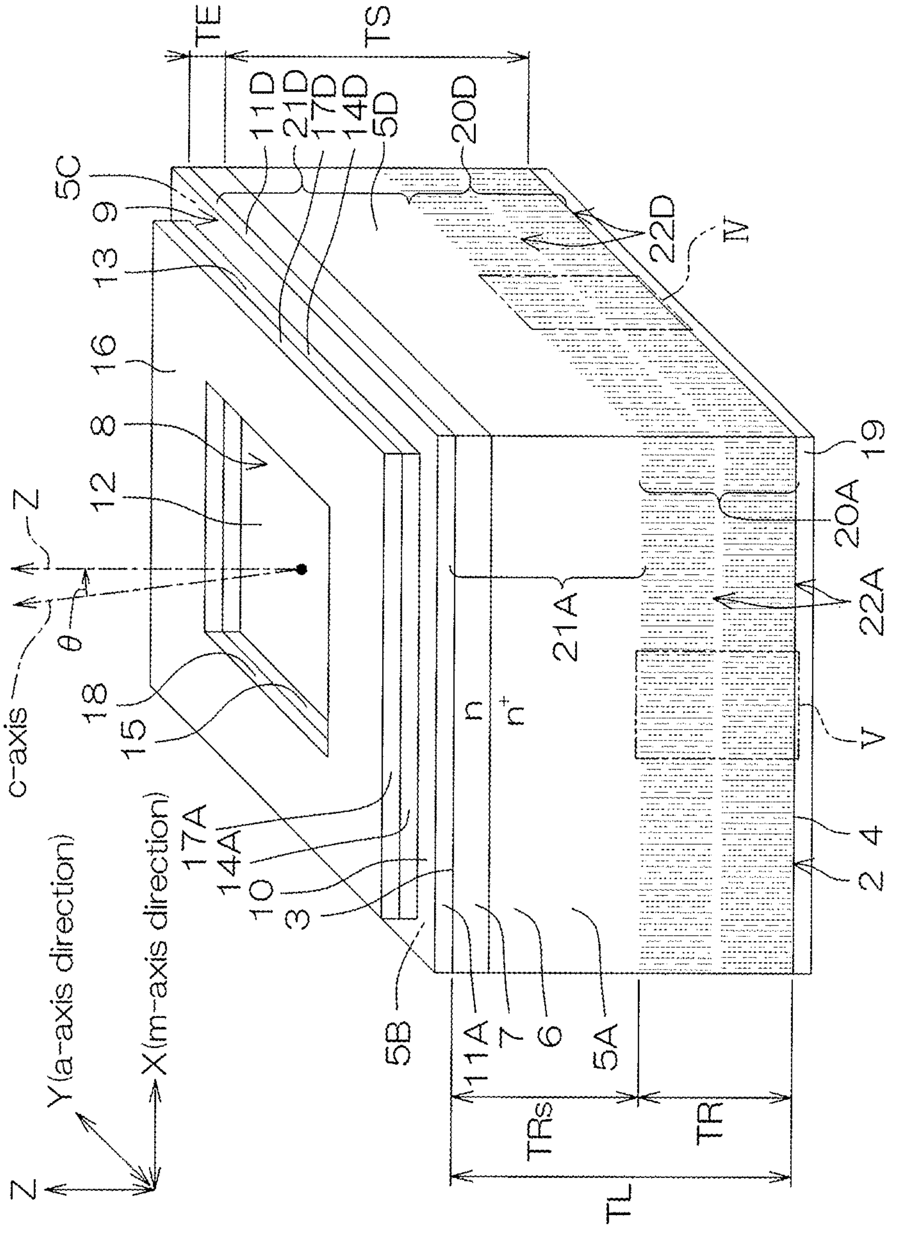
FIG. 3 is a perspective view as viewed from one angle of an SiC semiconductor device according to a first preferred embodiment of the present invention and is a perspective view showing a first configuration example of modified lines.
Figure 4:
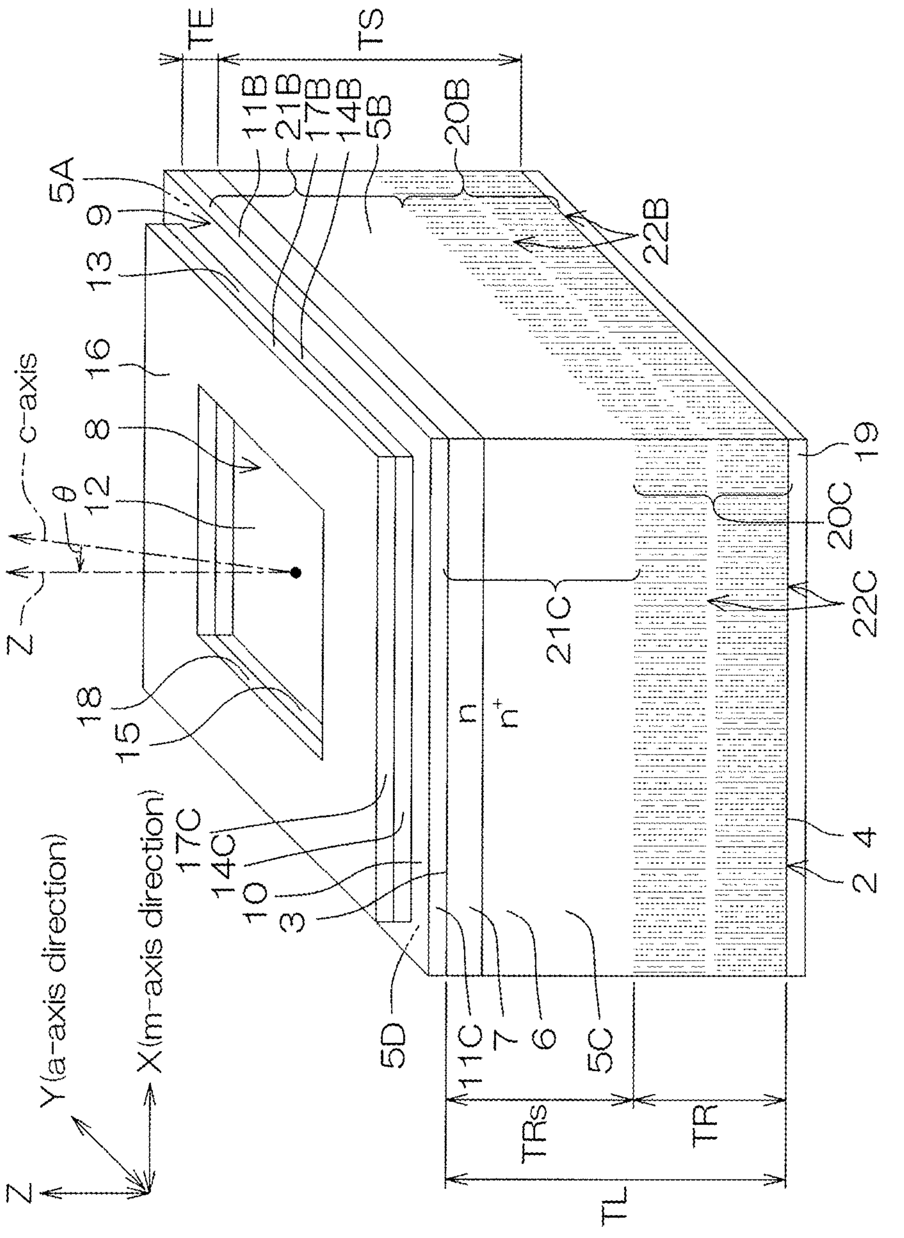
FIG. 4 is a perspective view as viewed from another angle of the SiC semiconductor device shown in FIG. 3.
Figure 5:
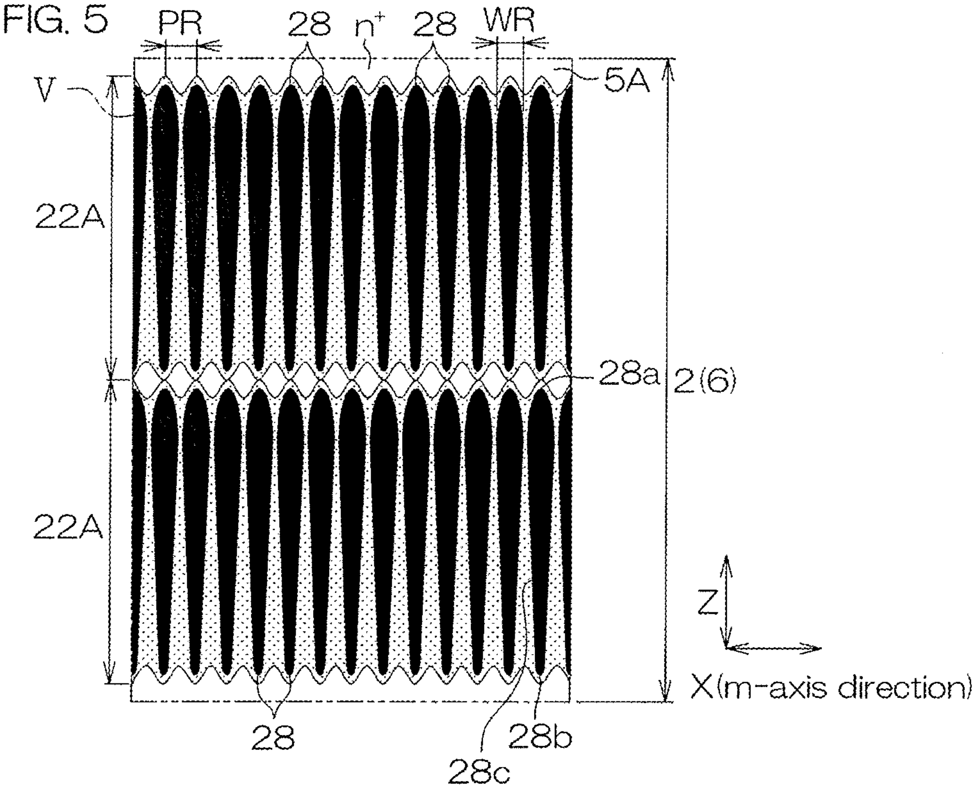
FIG. 5 is an enlarged view of a region V shown in FIG. 3.
Figure 6:
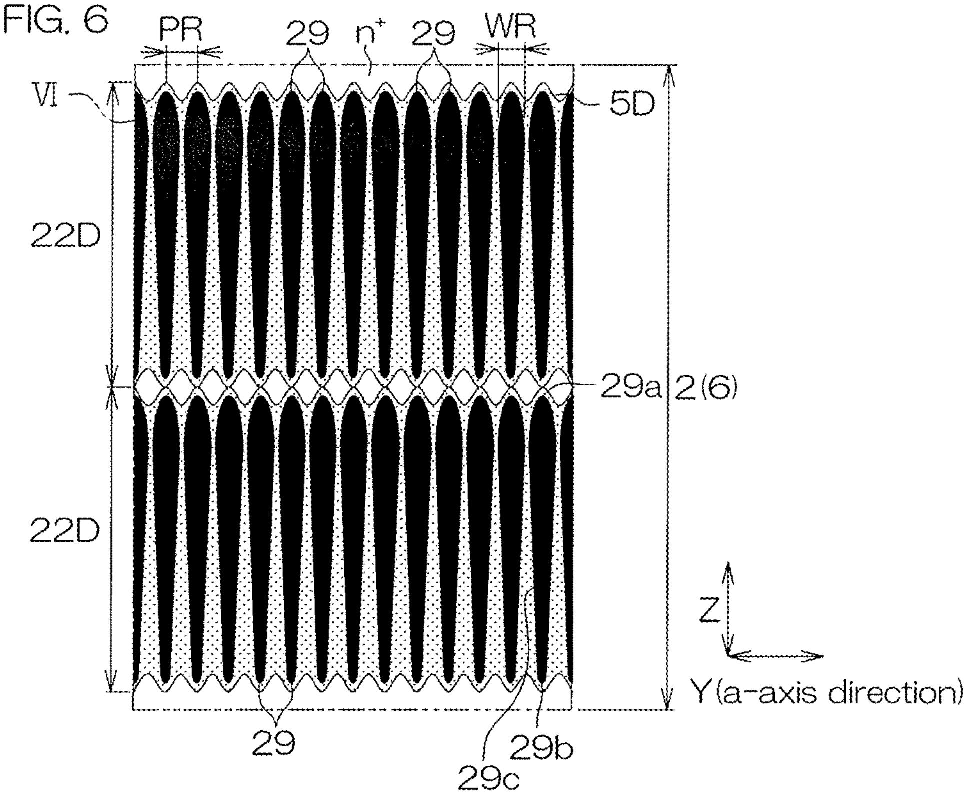
FIG. 6 is an enlarged view of a region VI shown in FIG. 3.
Figure 7:
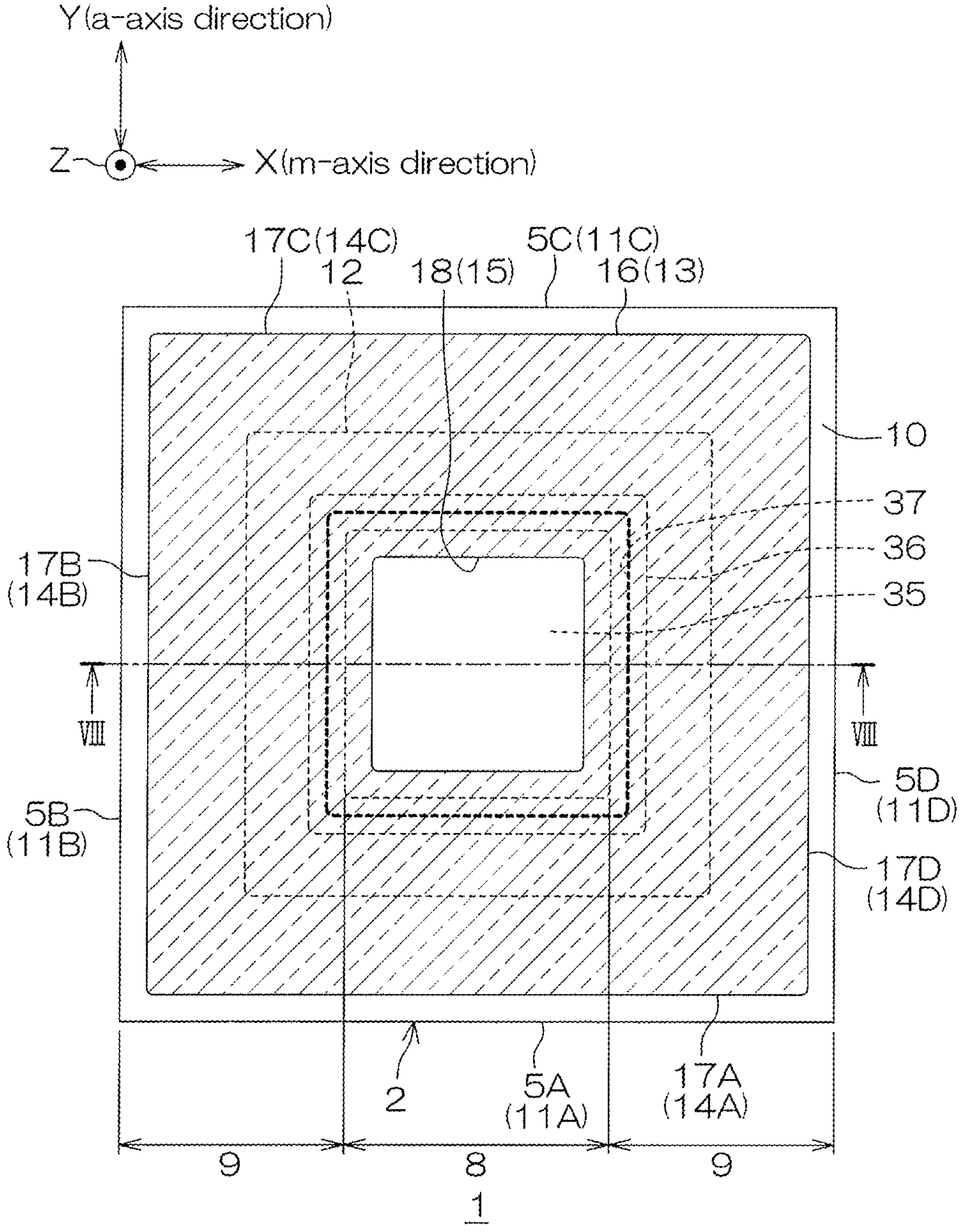
FIG. 7 is a plan view of the SiC semiconductor device shown in FIG. 3.
Figure 8:
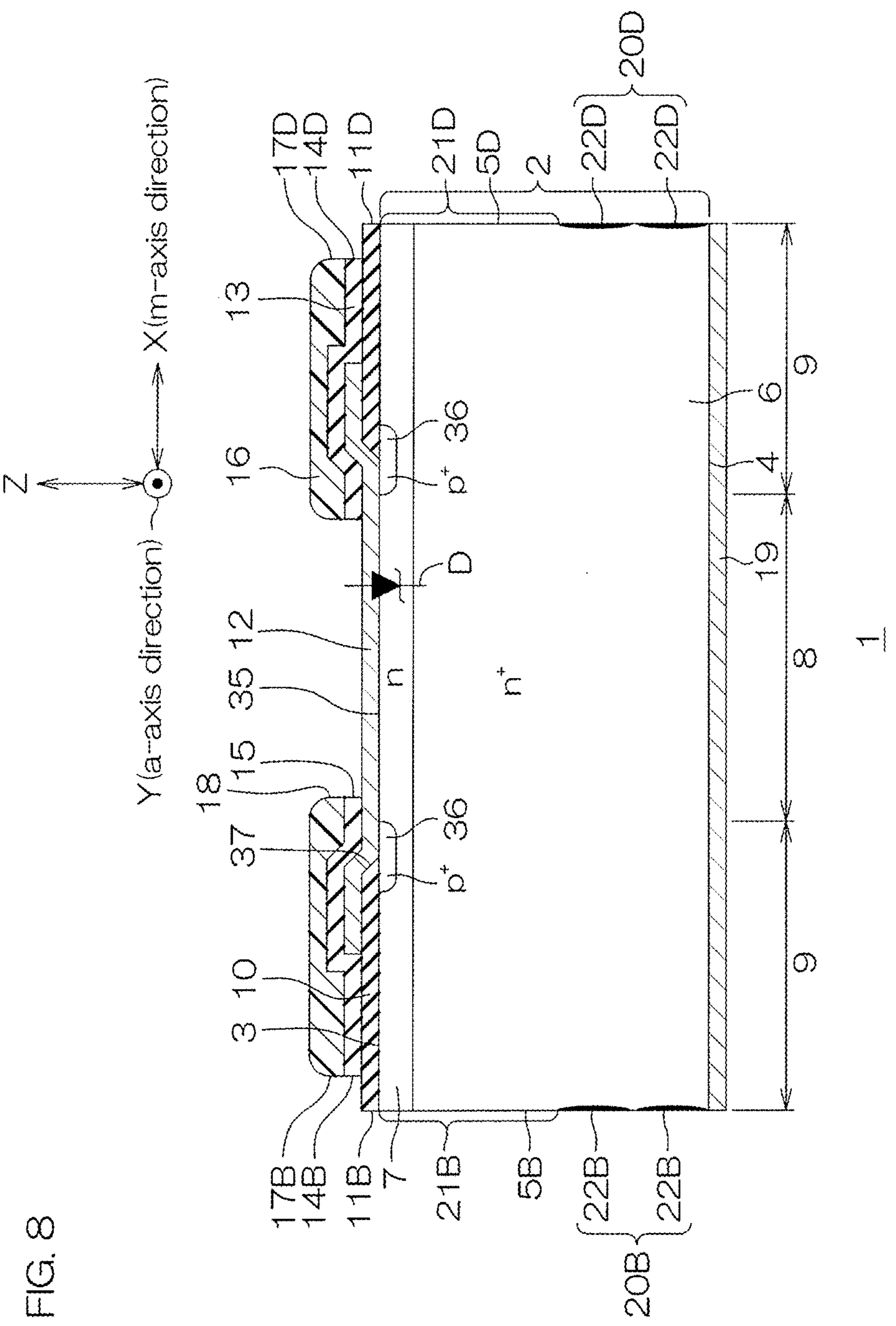
FIG. 8 is a sectional view taken along line VIII-VIII shown in FIG. 7.

FIG. 3 is a perspective view as viewed from one angle of an SiC semiconductor device 1 according to a first preferred embodiment of the present invention and is a perspective view showing a first configuration example of modified lines 22A to 22D. FIG. 4 is a perspective view as viewed from another angle of the SiC semiconductor device 1 shown in FIG. 3. FIG. 5 is an enlarged view of a region V shown in FIG. 3. FIG. 6 is an enlarged view of a region VI shown in FIG. 3. FIG. 7 is a plan view of the SiC semiconductor device 1 shown in FIG. 3. FIG. 8 is a sectional view taken along line VIII-VIII shown in FIG. 7.

Referring to FIG. 3 to FIG. 8, the SiC semiconductor device 1 includes an SiC semiconductor layer 2. The SiC semiconductor layer 2 includes a 4H-SiC monocrystal as an example of an SiC monocrystal constituted of a hexagonal crystal. The SiC semiconductor layer 2 is formed in a chip shape of rectangular parallelepiped shape.

The SiC semiconductor layer 2 has a first main surface 3 at one side, a second main surface 4 at another side, and side surfaces 5A, 5B, 5C, and 5D connecting the first main surface 3 and the second main surface 4. The first main surface 3 and the second main surface 4 are formed in quadrilateral shapes (square shapes here) in a plan view as viewed in a normal direction Z thereof (hereinafter referred to simply as “plan view”).

The first main surface 3 is a device surface in which a functional device (semiconductor element) is formed. The second main surface 4 is constituted of a ground surface having grinding marks. The side surfaces 5A to 5D are each constituted of a smooth cleavage surface facing a crystal plane of the SiC monocrystal. The side surfaces 5A to 5D are free from a grinding mark.

In this embodiment, the first main surface 3 of the SiC semiconductor layer 2 is formed as a non-mounting surface. In this embodiment, the second main surface 4 of the SiC semiconductor layer 2 is formed as a mounting surface. When the SiC semiconductor layer 2 is mounted on a connection object, the SiC semiconductor layer 2 is mounted on the connection object in a posture where the second main surface 4 opposes the connection object. As examples of the connection object, an electronic component, a lead frame, a circuit board, etc., can be cited.

A thickness TL of the SiC semiconductor layer 2 may be not less than 40 μm and not more than 200 μm. The thickness TL may be not less than 40 μm and not more than 60 μm, not less than 60 μm and not more than 80 μm, not less than 80 μm and not more than 100 μm, not less than 100 μm and not more than 120 μm, not less than 120 μm and not more than 140 μm, not less than 140 μm and not more than 160 μm, not less than 160 μm and not more than 180 μm, or not less than 180 μm and not more than 200 μm. The thickness TL is preferably not less than 60 μm and not more than 150 μm.

In this embodiment, the first main surface 3 and the second main surface 4 face the c-planes of the SiC monocrystal. The first main surface 3 faces the (0001) plane (silicon plane). The second main surface 4 faces the (000-1) plane (carbon plane) of the SiC monocrystal.

The first main surface 3 and the second main surface 4 have an off angle θ inclined at an angle of not more than 10° in the [11-20] direction with respect to the c-planes of the SiC monocrystal. The normal direction Z is inclined by just the off angle θ with respect to the c-axis (direction) of the SiC monocrystal.

The off angle θ may be not less than 0° and not more than 5.0°. The off angle θ may be set in an angular range of not less than 0° and not more than 1.0°, not less than 1.0° and not more than 1.5°, not less than 1.5° and not more than 2.0°, not less than 2.0° and not more than 2.5°, not less than 2.5° and not more than 3.0°, not less than 3.0° and not more than 3.5°, not less than 3.5° and not more than 4.0°, not less than 4.0° and not more than 4.5°, or not less than 4.5° and not more than 5.0°. The off angle θ preferably exceeds 0°. The off angle θ may be less than 4.0°.

The off angle θ may be set in an angular range of not less than 3.0° and not more than 4.5°. In this case, the off angle θ is preferably set in an angular range of not less than 3.0° and not more than 3.5°, or not less than 3.5° and not more than 4.0°. The off angle θ may be set in an angular range of not less than 1.5° and not more than 3.0°. In this case, the off angle θ is preferably set in an angular range of not less than 1.5° and not more than 2.0°, or not less than 2.0° and not more than 2.5°.

Lengths of the side surfaces 5A to 5D may each be not less than 0.5 mm and not more than 10 mm. Surface areas of the side surfaces 5A to 5D are equal to each other in this embodiment. If the first main surface 3 and the second main surface 4 are formed in rectangular shapes in plan view, the surface areas of the side surfaces 5A and 5C may be less than the surface areas of the side surfaces 5B and 5D or may exceed the surface areas of the side surfaces 5B and 5D.

In this embodiment, the side surface 5A and the side surface 5C extend in a first direction X and oppose each other in a second direction Y intersecting the first direction X. In this embodiment, the side surface 5B and the side surface 5D extend in the second direction Y and oppose each other in the first direction X. More specifically, the second direction Y is orthogonal to the first direction X.

In this embodiment, the first direction X is set to the m-axis direction ([1-100] direction) of the SiC monocrystal. The second direction Y is set to the a-axis direction ([11-20] direction) of the SiC monocrystal.

The side surface 5A and the side surface 5C are formed by the a-planes of the SiC monocrystal and oppose each other in the a-axis direction. The side surface 5A is formed by the (−1-120) plane of the SiC monocrystal. The side surface 5C is formed by the (11-20) plane of the SiC monocrystal. The side surface 5A and the side surface 5C may form inclined surfaces that, when a normal to the first main surface 3 is taken as a basis, are inclined toward the c-axis direction (direction) of the SiC monocrystal with respect to the normal.

In this case, the side surface 5A and the side surface 5C may be inclined at an angle in accordance with the off angle θ with respect to the normal to the first main surface 3 when the normal to the first main surface 3 is 0°. The angle in accordance with the off angle θ may be equal to the off angle θ or may be an angle that exceeds 0° and is less than the off angle θ.

The side surface 5B and the side surface 5D are formed by the m-planes of the SiC monocrystal and oppose each other in the m-axis direction. The side surface 5B is formed by the (−1100) plane of the SiC monocrystal. The side surface 5D is formed by the (1-100) plane of the SiC monocrystal. The side surface 5B and the side surface 5D extend in plane shapes along the normal to the first main surface 3. More specifically, the side surface 5B and the side surface 5D are formed substantially perpendicular to the first main surface 3 and the second main surface 4.

In this embodiment, the SiC semiconductor layer 2 has a laminated structure that includes an $n^+$ type SiC semiconductor substrate 6 and an n type SiC epitaxial layer 7. The second main surface 4 of the SiC semiconductor layer 2 is formed by the SiC semiconductor substrate 6. The first main surface 3 of the SiC semiconductor layer 2 is formed by the SiC epitaxial layer 7. The side surfaces 5A to 5D of the SiC semiconductor layer 2 are formed by the SiC semiconductor substrate 6 and the SiC epitaxial layer 7.

An n type impurity concentration of the SiC epitaxial layer 7 is not more than an n type impurity concentration of the SiC semiconductor substrate 6. More specifically, the n type impurity concentration of the siC epitaxial layer 7 is less than the n type impurity concentration of the SiC semiconductor substrate 6. The n type impurity concentration of the SiC semiconductor substrate 6 may be not less than $1.0\times10^{18}$ $cm^{-3}$ and not more than $1.0\times10^{21}$ $cm^{-3}$. The n type impurity concentration of the SiC epitaxial layer 7 may be not less than $1.0\times10^{15}$ $cm^{-3}$ and not more than $1.0\times10^{18}$ $cm^{-3}$.

A thickness TS of the SiC semiconductor substrate 6 may be not less than 40 μm and not more than 150 μm. The thickness TS may be not less than 40 μm and not more than 50 μm, not less than 50 μm and not more than 60 μm, not less than 60 μm and not more than 70 μm, not less than 70 μm and not more than 80 μm, not less than 80 μm and not more than 90 μm, not less than 90 μm and not more than 100 μm, not less than 100 μm and not more than 110 μm, not less than 110 μm and not more than 120 μm, not less than 120 μm and not more than 130 μm, not less than 130 μm and not more than 140 μm, or not less than 140 μm and not more than 150 μm. The thickness TS is preferably not less than 40 μm and not more than 130 μm. By thinning the SiC semiconductor substrate 6, a current path is shortened and reduction of resistance value can thus be achieved.

A thickness TE of the SiC epitaxial layer 7 may be not less than 1 μm and not more than 50 μm. The thickness TE may be not less than 1 μm and not more than 5 μm, not less than μm and not more than 10 μm, not less than 10 μm and not more than 15 μm, not less than 15 μm and not more than 20 μm, not less than 20 μm and not more than 25 μm, not less than 25 μm and not more than 30 μm, not less than 30 μm and not more than μm, not less than 35 μm and not more than 40 μm, not less than 40 μm and not more than 45 μm, or not less than 45 μm and not more than 50 μm. The thickness TE is preferably not less than 5 μm and not more than 15 μm.

The SiC semiconductor layer 2 includes an active region 8 and an outer region 9. The active region 8 is a region in which a Schottky barrier diode D is formed as an example of a functional device. In plan view, the active region 8 is formed in a central portion of the SiC semiconductor layer 2 at intervals toward an inner region from the side surfaces 5A to 5D of the SiC semiconductor layer 2. In plan view, the active region 8 is formed in a quadrilateral shape having four sides parallel to the four side surfaces 5A to 5D.

The outer region 9 is a region at an outer side of the active region 8. The outer region 9 is formed in a region between the side surfaces 5A to 5D and peripheral edges of the active region 8. The outer region 9 is formed in an endless shape (a quadrilateral annular shape in this embodiment) surrounding the active region 8 in plan view.

The SiC semiconductor device 1 includes a main surface insulating layer 10 formed on the first main surface 3. The main surface insulating layer 10 selectively covers the active region 8 and the outer region 9. The main surface insulating layer 10 may have a single layer structure constituted of a silicon oxide ($SiO_2$) layer or a silicon nitride (SiN) layer. The main surface insulating layer 10 may have a laminated structure that includes a silicon oxide layer and a silicon nitride layer. The silicon oxide layer may be formed on the silicon nitride layer. The silicon nitride layer may be formed on the silicon oxide layer. In this embodiment, the main surface insulating layer 10 has a single layer structure constituted of a silicon oxide layer.

The main surface insulating layer 10 has insulating side surfaces 11A, 11B, 11C, and 11D exposed from the side surfaces 5A to 5D of the SiC semiconductor layer 2. The insulating side surfaces 11A to 11D are continuous to the side surfaces 5A to 5D. The insulating side surfaces 11A to 11D are formed flush with the side surfaces 5A to 5D. The insulating side surfaces 11A to 11D are constituted of cleavage surfaces.

A thickness of the main surface insulating layer may be not less than 1 μm and not more than 50 μm. The thickness of the main surface insulating layer 10 may be not less than 1 μm and not more than 10 μm, not less than 10 μm and not more than 20 μm, not less than 20 μm and not more than μm, not less than 30 μm and not more than 40 μm, or not less than 40 μm and not more than 50 μm.

The SiC semiconductor device 1 includes a first main surface electrode layer 12 formed on the main surface insulating layer 10. In plan view, the first main surface electrode layer 12 is formed in the central portion of the SiC semiconductor layer 2 at intervals toward the inner region from the side surfaces 5A to 5D.

The SiC semiconductor device 1 includes a passivation layer 13 (insulating layer) formed on the main surface insulating layer 10. The passivation layer 13 may have a single layer structure constituted of a silicon oxide layer or a silicon nitride layer. The passivation layer 13 may have a laminated structure that includes a silicon oxide layer and a silicon nitride layer. The silicon oxide layer may be formed on the silicon nitride layer. The silicon nitride layer may be formed on the silicon oxide layer. In this embodiment, the passivation layer 13 has a single layer structure constituted of a silicon nitride layer.

The passivation layer 13 includes four side surfaces 14A, 14B, 14C, and 14D. In plan view, the side surfaces 14A to 14D of the passivation layer 13 are formed at intervals toward the inner region from the side surfaces 5A to 5D of the SiC semiconductor layer 2. In plan view, the passivation layer 13 exposes a peripheral edge portion of the first main surface 3. The passivation layer 13 exposes the main surface insulating layer 10. The side surfaces 14A to 14D of the passivation layer 13 may be formed flush with the side surfaces 5A to 5D of the SiC semiconductor layer 2.

The passivation layer 13 includes a sub pad opening that exposes a portion of the first main surface electrode layer 12 as a pad region. The sub pad opening 15 is formed in a quadrilateral shape having four sides parallel to the side surfaces 5A to 5D in plan view.

A thickness of the passivation layer 13 may be not less than 1 μm and not more than 50 μm. The thickness of the passivation layer 13 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm.

The SiC semiconductor device 1 includes a resin layer 16 (insulating layer) formed on the passivation layer 13. The resin layer 16, with the passivation layer 13, forms a single insulating laminated structure (insulating layer). In FIG. 7, the resin layer 16 is shown with hatching.

The resin layer 16 may include a negative type or positive type photosensitive resin. In this embodiment, the resin layer 16 includes a polybenzoxazole as an example of a positive type photosensitive resin. The resin layer 16 may include a polyimide as an example of a negative type photosensitive resin.

The resin layer 16 includes four resin side surfaces 17A, 17B, 17C, and 17D. In plan view, the resin side surfaces 17A to 17D of the resin layer 16 are formed at intervals toward the inner region from the side surfaces 5A to 5D of the SiC semiconductor layer 2. In plan view, the resin layer 16 exposes the peripheral edge portion of the first main surface 3. The resin layer 16, together with the passivation layer 13, exposes the main surface insulating layer 10. In this embodiment, the resin side surfaces 17A to 17D of the resin layer 16 are formed flush with the side surfaces 14A to 14D of the passivation layer 13.

The resin side surfaces 17A to 17D of the resin layer 16, with the side surfaces 5A to 5D of the SiC semiconductor layer 2, demarcate a dicing street. In this embodiment, the side surfaces 14A to 14D of the passivation layer 13 also demarcate the dicing street. According to the dicing street, it is made unnecessary to physically cut the resin layer 16 and the passivation layer 13 when cutting out the SiC semiconductor device 1 from a single SiC semiconductor wafer. The SiC semiconductor device 1 can thereby be cut out smoothly from the single SiC semiconductor wafer. Also, insulation distances from the side surfaces 5A to 5D can be increased.

A width of the dicing street may be not less than 1 μm and not more than 25 μm. The width of the dicing street may be not less than 1 μm and not more than 5 μm, not less than μm and not more than 10 μm, not less than 10 μm and not more than 15 μm, not less than 15 μm and not more than 20 μm, or not less than 20 μm and not more than 25 μm.

The resin layer 16 includes a pad opening 18 that exposes a portion of the first main surface electrode layer 12 as a pad region. The pad opening 18 is formed in a quadrilateral shape having four sides parallel to the side surfaces 5A to 5D in plan view.

The pad opening 18 is in communication with the sub pad opening 15. Inner walls of the pad opening 18 are formed flush with inner walls of the sub pad opening 15. The inner walls of the pad opening 18 may be positioned toward the side surface 5A to 5D sides with respect to the inner walls of the sub pad opening 15. The inner walls of the pad opening 18 may be positioned toward the inner region of the SiC semiconductor layer 2 with respect to the inner walls of the sub pad opening 15. The resin layer 16 may cover the inner walls of the sub pad opening 15.

A thickness of the resin layer 16 may be not less than 1 μm and not more than 50 μm. The thickness of the resin layer 16 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm.

The SiC semiconductor device 1 includes a second main surface electrode layer 19 formed on the second main surface 4 of the SiC semiconductor layer 2. The second main surface electrode layer 19 forms an ohmic contact with the second main surface 4 (SiC semiconductor substrate 6).

The SiC semiconductor device 1 includes rough surface regions 20A to 20D and smooth surface regions 21A to 21D formed respectively at the side surfaces 5A to 5D of the SiC semiconductor layer 2. The rough surface regions 20A to 20D are regions in which partial regions of the side surfaces 5A to 5D are roughened by introducing a predetermined surface roughness Rr. The smooth surface regions 21A to 21D are regions of the side surfaces 5A to 5D having a surface roughness Rs less than the surface roughness Rr of the rough surface regions 20A to 20D (Rs<Rr).

The rough surface regions 20A to 20D include a rough surface region 20A formed at the side surface 5A, a rough surface region 20B formed at the side surface 5B, a rough surface region 20C formed at the side surface 5C, and a rough surface region 20D formed at the side surface 5D. The smooth surface regions 21A to 21D include a smooth surface region 21A formed at the side surface 5A, a smooth surface region 21B formed at the side surface 5B, a smooth surface region 21C formed at the side surface 5C, and a smooth surface region 21D formed at the side surface 5D.

The rough surface regions 20A to 20D are formed in regions of the side surfaces 5A to 5D at the second main surface 4 side. In this embodiment, the rough surface regions 20A to 20D are formed at the side surfaces 5A to 5D from corner portions at the second main surface 4 side to thickness direction intermediate portions of the SiC semiconductor layer 2.

The rough surface regions 20A to 20D are formed at intervals toward the second main surface 4 side from the first main surface 3. The rough surface regions 20A to 20D expose surface layer portions of the first main surface 3 from the side surface 5A to 5D. The rough surface regions 20A to 20D are not formed in the main surface insulating layer 10, the passivation layer 13, and the resin layer 16.

More specifically, the rough surface regions 20A to 20D are formed in thickness direction intermediate portions of the SiC semiconductor substrate 6. Even more specifically, the rough surface regions 20A to 20D are formed at intervals toward the second main surface 4 side from a boundary between the SiC semiconductor substrate 6 and the SiC epitaxial layer 7. The rough surface regions 20A to 20D thereby expose a portion of the SiC semiconductor substrate 6 and the SiC epitaxial layer 7 at the surface layer portions of the first main surface 3.

The rough surface regions 20A to 20D extend in band shapes along tangential directions to the first main surface 3. The tangential directions to the first main surface 3 are directions orthogonal to the normal direction Z. The tangential directions include the first direction X (the m-axis direction of the SiC monocrystal) and the second direction Y (the a-axis direction of the SiC monocrystal).

The rough surface region 20A is formed in a band shape extending rectilinearly along the m-axis direction at the side surface 5A. The rough surface region 20B is formed in a band shape extending rectilinearly along the a-axis direction at the side surface 5B. The rough surface region 20C is formed in a band shape extending rectilinearly along the m-axis direction at the side surface 5C. The rough surface region 20D is formed in a band shape extending rectilinearly along the a-axis direction at the side surface 5D.

The rough surface region 20A and the rough surface region 20B are continuous to each other at a corner portion connecting the side surface 5A and the side surface 5B. The rough surface region 20B and the rough surface region 20C are continuous to each other at a corner portion connecting the side surface 5B and the side surface 5C. The rough surface region 20C and the rough surface region 20D are continuous to each other at a corner portion connecting the side surface 5C and the side surface 5D. The rough surface region 20D and the rough surface region 20A are continuous to each other at a corner portion connecting the side surface 5D and the side surface 5A.

The rough surface regions 20A to 20D are thereby formed integrally such as to surround the SiC semiconductor layer 2. The rough surface regions 20A to 20D form a single endless (annular) rough surface region surrounding the SiC semiconductor layer 2 at the side surfaces 5A to 5D.

In the normal direction Z, thicknesses TR of the rough surface regions 20A to 20D are less than the thickness TL of the SiC semiconductor layer 2 (TR<TL). The thicknesses TR of the rough surface regions 20A to 20D are preferably less than the thickness TS of the SiC semiconductor substrate 6 (TR<TS).

The thicknesses TR of the rough surface regions 20A to 20D may be not less than the thickness TE of the SiC epitaxial layer 7 (TR≥TE). The thickness TR of the rough surface region 20A, the thickness TR of the rough surface region 20B, the thickness TR of the rough surface region 20C, and the thickness TR of the rough surface region 20D may be mutually equal or may be mutually different.

Ratios TR/TL of the thicknesses TR of the rough surface regions 20A to 20D with respect to the thickness TL of the SiC semiconductor layer 2 are preferably not less than 0.1 and less than 1.0. The ratios TR/TL may be not less than 0.1 and not more than 0.2, not less than 0.2 and not more than 0.4, not less than 0.4 and not more than 0.6, not less than 0.6 and not more than 0.8, or not less than 0.8 and less than 1.0.

The ratios TR/TL may be not less than 0.1 and not more than 0.2, not less than 0.2 and not more than 0.3, not less than 0.3 and not more than 0.4, not less than 0.4 and not more than 0.5, not less than 0.5 and not more than 0.6, not less than 0.6 and not more than 0.7, not less than 0.7 and not more than 0.8, not less than 0.8 and not more than 0.9, or not less than 0.9 and less than 1.0. The ratios TR/TL are preferably not less than 0.2 and not more than 0.5.

More preferably, ratios TR/TS of the thicknesses TR of the rough surface regions 20A to 20D with respect to the thickness TS of the SiC semiconductor substrate 6 are not less than 0.1 and less than 1.0. The ratios TR/TS may be not less than 0.1 and not more than 0.2, not less than 0.2 and not more than 0.4, not less than 0.4 and not more than 0.6, not less than 0.6 and not more than 0.8, or not less than 0.8 and less than 1.0.

The ratios TR/TS may be not less than 0.1 and not more than 0.2, not less than 0.2 and not more than 0.3, not less than 0.3 and not more than 0.4, not less than 0.4 and not more than 0.5, not less than 0.5 and not more than 0.6, not less than 0.6 and not more than 0.7, not less than 0.7 and not more than 0.8, not less than 0.8 and not more than 0.9, or not less than 0.9 and less than 1.0. The ratios TR/TS are preferably not less than 0.2 and not more than 0.5.

The rough surface regions 20A to 20D include the modified lines 22A to 22D (modified layers), respectively. That is, the rough surface regions 20A to 20D are regions that are roughened by the modified lines 22A to 22D.

The modified lines 22A to 22D include regions of layer form in which portions of the SiC monocrystal forming the side surfaces 5A to 5D are modified to be of a property differing from the SiC monocrystal. The modified lines 22A to 22D include the regions that are modified to be of the property differing in density, refractive index, mechanical strength (crystal strength), or other physical characteristic from the SiC monocrystal. The modified lines 22A to 22D may include at least one layer among a melted-and-rehardened layer, a defect layer, a dielectric breakdown layer, and a refractive index change layer The melted-and-rehardened layer is a layer in which a portion of the SiC semiconductor layer 2 is melted and thereafter hardened again. The defect layer is a layer that includes a hole, fissure, etc., formed in the SiC semiconductor layer 2. The dielectric breakdown layer is a layer in which a portion of the SiC semiconductor layer 2 has undergone dielectric breakdown. The refractive index change layer is a layer in which a portion of the SiC semiconductor layer 2 is changed to a refractive index differing from the SiC monocrystal.

The rough surface region 20A includes one layer or a plurality (two layers or more; two layers in this embodiment) of the modified lines 22A. In this embodiment, the plurality of modified lines 22A extend in band shapes along the tangential direction to the first main surface 3. More specifically, each of the plurality of modified lines 22A is formed in a band shape extending rectilinearly along the m-axis direction at the side surface 5A.

The plurality of modified lines 22A are formed shifted from each other in the normal direction Z. The plurality of modified lines 22A may be mutually overlapped in the normal direction Z. The plurality of modified lines 22A may be formed at intervals in the normal direction Z. The thickness TR of the rough surface region 20A is determined by a total value of thicknesses of the plurality of modified lines 22A. The thicknesses of the plurality of modified lines 22A may be mutually equal or may be mutually different.

The rough surface region 20B includes one layer or a plurality (two layers or more; two layers in this embodiment) of the modified lines 22B. In this embodiment, the plurality of modified lines 22B extend in band shapes along the tangential direction to the first main surface 3. More specifically, each of the plurality of modified lines 22B is formed in a band shape extending rectilinearly along the a-axis direction at the side surface 5B.

The plurality of modified lines 22B are formed shifted from each other in the normal direction Z. The plurality of modified lines 22B may be mutually overlapped in the normal direction Z. The plurality of modified lines 22B may be formed at intervals in the normal direction Z. The thickness TR of the rough surface region 20B is determined by a total value of thicknesses of the plurality of modified lines 22B. The thicknesses of the plurality of modified lines 22B may be mutually equal or may be mutually different.

The rough surface region 20C includes one layer or a plurality (two layers or more; two layers in this embodiment) of the modified lines 22C. In this embodiment, the plurality of modified lines 22C extend in band shapes along the tangential direction to the first main surface 3. More specifically, each of the plurality of modified lines 22C is formed in a band shape extending rectilinearly along the m-axis direction at the side surface 5C.

The plurality of modified lines 22C are formed shifted from each other in the normal direction Z. The plurality of modified lines 22C may be mutually overlapped in the normal direction Z. The plurality of modified lines 22C may be formed at intervals in the normal direction Z. The thickness TR of the rough surface region 20C is determined by a total value of thicknesses of the plurality of modified lines 22C. The thicknesses of the plurality of modified lines 22C may be mutually equal or may be mutually different.

The rough surface region 20D includes one layer or a plurality (two layers or more; two layers in this embodiment) of the modified lines 22D. In this embodiment, the plurality of modified lines 22D extend in band shapes along the tangential direction to the first main surface 3. More specifically, each of the plurality of modified lines 22D is formed in a band shape extending rectilinearly along the a-axis direction at the side surface 5D.

The plurality of modified lines 22D are formed shifted from each other in the normal direction Z. The plurality of modified lines 22D may be mutually overlapped in the normal direction Z. The plurality of modified lines 22D may be formed at intervals in the normal direction Z. The thickness TR of the rough surface region 20D is determined by a total value of thicknesses of the plurality of modified lines 22D. The thicknesses of the plurality of modified lines 22D may be mutually equal or may be mutually different.

The modified lines 22A and the modified lines 22B are continuous to each other at a corner portion connecting the side surface 5A and the side surface 5B. The modified lines 22B and the modified lines 22C are continuous to each other at a corner portion connecting the side surface 5B and the side surface 5C. The modified lines 22C and the modified lines 22D are continuous to each other at a corner portion connecting the side surface 5C and the side surface 5D. The modified lines 22D and the modified lines 22A are continuous to each other at a corner portion connecting the side surface 5D and the side surface 5A.

The modified lines 22A to 22D are thereby formed integrally such as to surround the SiC semiconductor layer 2. The modified lines 22A to 22D form a single endless (annular) modified line surrounding the SiC semiconductor layer 2 at the side surfaces 5A to 5D.

Referring to FIG. 5, the modified line 22A includes a plurality of a-plane modified portions 28 (modified portions). In other words, the modified line 22A is formed of an aggregate of the plurality of a-plane modified portions 28. The plurality of a-plane modified portions 28 are portions at which the SiC monocrystal exposed from the side surface 5A is modified to be of the property differing from the SiC monocrystal. At the side surface 5A, a region in a periphery of each a-plane modified portion 28 may be modified to be of a property differing from the SiC monocrystal.

The plurality of a-plane modified portions 28 each include one end portion 28*a* positioned at the first main surface 3 side, another end portion 28*b* positioned at the second main surface 4 side, and a connecting portion 28*c* connecting the one end portion 28*a* and the other end portion 28*b*.

The plurality of a-plane modified portions 28 are each formed in a linear shape extending in the normal direction Z. The plurality of a-plane modified portions 28 are thereby formed in a stripe shape as a whole. The plurality of a-plane modified portions 28 may include a plurality of a-plane modified portions 28 formed in a convergent shape in which the m-axis direction width narrows from the one end portion 28*a* side to the other end portion 28*b* side.

The plurality of a-plane modified portions 28 are formed at intervals in the m-axis direction such as to oppose each other in the m-axis direction. The plurality of a-plane modified portions 28 may be overlapped mutually in the m-axis direction. A band-shaped region extending in the m-axis direction is formed by a line joining the one end portions 28*a* of the plurality of a-plane modified portions 28 and a line joining the other end portions 28*b* of the plurality of a-plane modified portions 28. The modified line 22A is formed by this band-shaped region.

The plurality of a-plane modified portions 28 may each form a notched portion at which the side surface 5A is notched. The plurality of a-plane modified portions 28 may each form a recess recessed toward the a-axis direction from the side surface 5A. The plurality of a-plane modified portions 28 may be formed in point shapes (dot shapes) in accordance with length in the normal direction Z and the m-axis direction width.

A pitch PR in the m-axis direction between central portions of a plurality of mutually adjacent a-plane modified portions 28 may exceed 0 μm and be not more than 20 μm. The pitch PR may exceed 0 μm and be not more than 5 μm, be not less than 5 μm and not more than 10 μm, be not less than 10 μm and not more than 15 μm, or be not less than 15 μm and not more than 20 μm.

A width WR in the m-axis direction of each a-plane modified portion 28 may exceed 0 μm and be not more than 20 μm. The width WR may exceed 0 μm and be not more than 5 μm, be not less than 5 μm and not more than 10 μm, be not less than 10 μm and not more than 15 μm, or be not less than 15 μm and not more than 20 μm.

The rough surface region 20A is roughened by the modified lines 22A that each include the plurality of a-plane modified portions 28 that extend along the normal direction Z and oppose each other along the m-axis direction. The rough surface region 20A has the surface roughness Rr that is in accordance with the pitch PR and the width WR of the plurality of a-plane modified portions 28.

With the exception of being formed at the side surface 5C, the rough surface region 20C (the modified lines 22C) has the same structure as the rough surface region 20A (the modified lines 22A). The description of the rough surface region 20A (the modified lines 22A) applies to the description of the rough surface region 20C (the modified lines 22C) upon replacement of "side surface 5A" by "side surface 5C."

Referring to FIG. 6, the modified line 22D includes a plurality of m-plane modified portions 29 (modified portions). In other words, the modified line 22D is formed of an aggregate of the plurality of m-plane modified portions 29. The plurality of m-plane modified portions 29 are portions at which the SiC monocrystal exposed from the side surface 5D is modified to be of the property differing from the SiC monocrystal. At the side surface 5D, a region in a periphery of each m-plane modified portion 29 may be modified to be of a property differing from the SiC monocrystal.

The plurality of m-plane modified portions 29 each include one end portion 29*a* positioned at the first main surface 3 side, another end portion 29*b* positioned at the second main surface 4 side, and a connecting portion 29*c* connecting the one end portion 29*a* and the other end portion 29*b*.

The plurality of m-plane modified portions 29 are each formed in a linear shape extending in the normal direction Z. The plurality of m-plane modified portions 29 are thereby formed in a stripe shape as a whole. The plurality of m-plane modified portions 29 may include a plurality of m-plane modified portions 29 formed in a convergent shape in which an a-axis direction width narrows from the one end portion 29*a* side to the other end portion 29*b* side.

The plurality of m-plane modified portions 29 are formed at intervals in the a-axis direction such as to oppose each other in the a-axis direction. The plurality of m-plane modified portions 29 may be overlapped mutually in the a-axis direction. A band-shaped region extending in the a-axis direction is formed by a line joining the one end portions 29*a* of the plurality of m-plane modified portions 29 and a line joining the other end portions 29*b* of the plurality of m-plane modified portions 29. The modified line 22D is formed by this band-shaped region.

The plurality of m-plane modified portions 29 may each form a notched portion at which the side surface 5D is notched. The plurality of m-plane modified portions 29 may each form a recess recessed toward the m-axis direction from the side surface 5D. The plurality of m-plane modified portions 29 may be formed in point shapes (dot shapes) in accordance with length in the normal direction Z and the a-axis direction width.

A pitch PR in the a-axis direction between central portions of a plurality of mutually adjacent m-plane modified portions 29 may be not less than 0 μm and not more than 20 μm. The pitch PR may be not less than 0 μm and not more than 5 μm, not less than 5 μm and not more than 10 μm, not less than 10 μm and not more than 15 μm, or not less than 15 μm and not more than 20 μm.

A width WR in the a-axis direction of each m-plane modified portion 29 may exceed 0 μm and be not more than 20 μm. The width WR may exceed 0 μm and be not more than 5 μm, be not less than 5 μm and not more than 10 μm, be not less than 10 μm and not more than 15 μm, or be not less than 15 μm and not more than 20 μm.

The rough surface region 20D is roughened by the modified lines 22D that each include the plurality of m-plane modified portions 29 that extend along the normal direction Z and oppose each other along the a-axis direction. The rough surface region 20D has the surface roughness Rr that is in accordance with the pitch PR and the width WR of the plurality of m-plane modified portions 29.

With the exception of being formed at the side surface 5B, the rough surface region 20B (the modified lines 22B) has the same structure as the rough surface region 20D (the modified lines 22D). The description of the rough surface region 20D (the modified lines 22D) applies to the description of the rough surface region 20B (the modified lines 22B) upon replacement of "side surface 5D" by "side surface 5B."

Referring to FIG. 3 and FIG. 4, the smooth surface regions 21A to 21D are formed in regions of the side surfaces 5A to 5D that differ from the rough surface regions 20A to 20D. The smooth surface regions 21A to 21D are formed in the regions of the side surfaces 5A to 5D besides the rough surface regions 20A to 20D.

The smooth surface regions 21A to 21D are formed in regions of the side surfaces 5A to 5D at the first main surface 3 side. The smooth surface regions 21A to 21D are formed at the side surfaces 5A to 5D from the first main surface 3 to thickness direction intermediate portions of the SiC semiconductor layer 2. More specifically, the smooth surface regions 21A to 21D are formed in the SiC epitaxial layer 7. The smooth surface regions 21A to 21D expose the SiC epitaxial layer 7.

Even more specifically, the smooth surface regions 21A to 21D cross the boundary between the SiC semiconductor substrate 6 and the SiC epitaxial layer 7 and are formed in both the SiC epitaxial layer 7 and the SiC semiconductor substrate 6. The smooth surface regions 21A to 21D expose both the SiC epitaxial layer 7 and the SiC semiconductor substrate 6.

The smooth surface regions 21A to 21D extend in band shapes along the tangential directions to the first main surface 3. The smooth surface region 21A is formed in a band shape extending rectilinearly along the m-axis direction at the side surface 5A. The smooth surface region 21B is formed in a band shape extending rectilinearly along the a-axis direction at the side surface 5B. The smooth surface region 21C is formed in a band shape extending rectilinearly along the m-axis direction at the side surface 5C. The smooth surface region 21D is formed in a band shape extending rectilinearly along the a-axis direction at the side surface 5D.

The smooth surface region 21A and the smooth surface region 21B are continuous to each other at the corner portion connecting the side surface 5A and the side surface 5B. The smooth surface region 21B and the smooth surface region 21C are continuous to each other at the corner portion connecting the side surface 5B and the side surface 5C. The smooth surface region 21C and the smooth surface region 21D are continuous to each other at the corner portion connecting the side surface 5C and the side surface 5D. The smooth surface region 21D and the smooth surface region 21A are continuous to each other at the corner portion connecting the side surface 5D and the side surface 5A.

The smooth surface regions 21A to 21D are thereby formed integrally such as to surround the SiC semiconductor layer 2. The smooth surface regions 21A to 21D form a single endless (annular) smooth surface region surrounding the SiC semiconductor layer 2 at the side surfaces 5A to 5D.

In the normal direction Z, thicknesses TRs of the smooth surface regions 21A to 21D are of values obtained by subtracting the thicknesses TR of the rough surface regions 20A to 20D from the thickness TL of the SiC semiconductor layer 2 (TRS=TL−TR). The thicknesses TRs of the smooth surface regions 21A to 21D can take on various values in accordance with the thicknesses TR of the rough surface regions 20A to 20D.

The thicknesses TRs of the smooth surface regions 21A to 21D are preferably not less than the thicknesses TR of the rough surface regions 20A to 20D (TRS≤TRS). Ratios TRs/TL of the thicknesses TRs of the smooth surface regions 21A to 21D with respect to the thickness TL of the SiC semiconductor layer 2 are preferably not less than 0.5. More preferably, the thicknesses TRs of the smooth surface regions 21A to 21D exceed the thicknesses TR of the rough surface regions 20A to 20D (TR<TRs). More preferably, the ratios TRs/TL exceed 0.5.

The thickness TRs of the smooth surface region 21A, the thickness TRs of the smooth surface region 21B, the thickness TRs of the smooth surface region 21C, and the thickness TRs of the smooth surface region 21D may be mutually equal or may be mutually different.

Unlike the rough surface regions 20A to 20D, the smooth surface regions 21A to 21D are free from the modified lines 22A to 22D (the modified layers). The smooth surface regions 21A to 21D are constituted of smooth cleavage surfaces formed by the crystal planes of the SiC monocrystal. The smooth surface regions 21A to 21D have the surface roughness Rs that is in accordance with the crystal planes (cleavage surfaces) of the SiC monocrystal.

The smooth surface region 21A is constituted of the a-plane of the SiC monocrystal that forms the side surface 5A. The smooth surface region 21B is constituted of the m-plane of the SiC monocrystal that forms the side surface 5B. The smooth surface region 21C is constituted of the a-plane of the SiC monocrystal that forms the side surface 5C. The smooth surface region 21D is constituted of the m-plane of the SiC monocrystal that forms the side surface 5D.

The rough surface regions 20A to 20D having the surface roughness Rr that is in accordance with the modification of the SiC monocrystal and the smooth surface regions 21A to 21D having the surface roughness Rs that is in accordance with the crystal planes (cleavage surfaces) of the SiC monocrystal are thus formed at the side surfaces 5A to 5D of the SiC semiconductor layer 2.

The insulating side surfaces 11A to 11D of the main surface insulating layer 10 described above are continuous to the smooth surface regions 21A to 21D. The insulating side surfaces 11A to 11D are formed flush with the smooth surface regions 21A to 21D. The insulating side surfaces 11A to 11D are constituted of smooth cleavage surfaces. The insulating side surfaces 11A to 11D, with the smooth surface regions 21A to 21D, thereby form a single smooth surface region.

Referring to FIG. 8, the SiC semiconductor device 1 includes an n type diode region 35 formed in a surface layer portion of the first main surface 3 in the active region 8. In this embodiment, the diode region 35 is formed in a central portion of the first main surface 3. The diode region 35 may be formed in a quadrilateral shape having four sides parallel to the side surfaces 5A to 5D in plan view.

In this embodiment, the diode region 35 is formed using a portion of the SiC epitaxial layer 7. An n type impurity concentration of the diode region 35 is equal to the n type impurity concentration of the SiC epitaxial layer 7. The n type impurity concentration of the diode region 35 may be not less than the n type impurity concentration of the SiC epitaxial layer 7. That is, the diode region 35 may be formed by introduction of an n type impurity into a surface layer portion of the SiC epitaxial layer 7.

The SiC semiconductor device 1 includes a $p^+$ type guard region 36 formed in a surface layer portion of the first main surface 3 in the outer region 9. The guard region 36 is formed in a band shape extending along the diode region 35 in plan view. More specifically, the guard region 36 is formed in an endless shape surrounding the diode region 35 in plan view. The guard region 36 is formed in a quadrilateral annular shape (more specifically, a quadrilateral annular shape with chamfered corner portions or a circular annular shape).

The guard region 36 is thereby formed in a guard ring region. In this embodiment, the diode region 35 is defined by the guard region 36. Also, the active region 8 is defined by the guard region 36.

A p type impurity of the guard region 36 does not have to be activated. In this case, the guard region 36 is formed in a non-semiconductor region. The p type impurity of the guard region 36 may be activated. In this case, the guard region 36 is formed in a p type semiconductor region.

The main surface insulating layer 10 described above includes a diode opening 37 that exposes the diode region 35. The diode opening 37 exposes an inner peripheral edge of the guard region 36 in addition to the diode region 35. The diode opening 37 may be formed in a quadrilateral shape having four sides parallel to the side surfaces 5A to 5D in plan view.

The first main surface electrode layer 12 described above enters into the diode opening 37 from on the main surface insulating layer 10. Inside the diode opening 37, the first main surface electrode layer 12 is electrically connected to the diode region 35. More specifically, the first main surface electrode layer 12 forms a Schottky junction with the diode region 35. The Schottky barrier diode D, having the first main surface electrode layer 12 as an anode and the diode region 35 as a cathode, is thereby formed. The passivation layer 13 and the resin layer 16 described above are formed on the main surface insulating layer 10.

Figure 9:
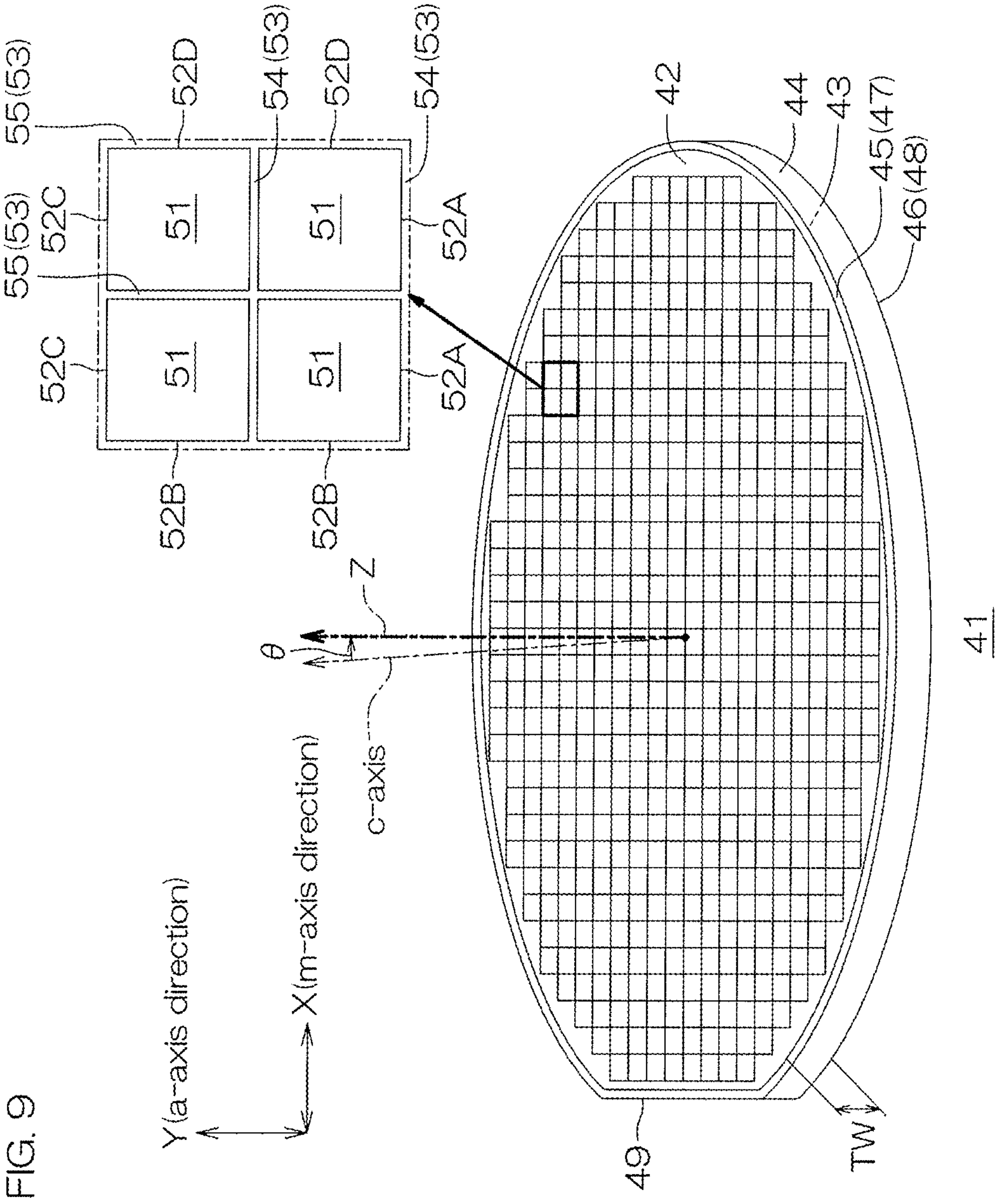
FIG. 9 is a perspective view showing an SiC semiconductor wafer used in manufacturing the SiC semiconductor device shown in FIG. 3.

FIG. 9 is a perspective view showing an SiC semiconductor wafer 41 used in manufacturing the siC semiconductor device 1 shown in FIG. 3.

The SiC semiconductor wafer 41 is a member to be a base of the SiC semiconductor substrate 6. The SiC semiconductor wafer 41 includes a 4H-SiC monocrystal as an example of an SiC monocrystal constituted of a hexagonal crystal. In this embodiment, the SiC semiconductor wafer 41 has an n type impurity concentration corresponding to the n type impurity concentration of the SiC semiconductor substrate 6.

The SiC semiconductor wafer 41 is formed in a plate shape or discoid shape. The SiC semiconductor wafer 41 may be formed in a disk shape. The SiC semiconductor wafer 41 has a first wafer main surface 42 at one side, a second wafer main surface 43 at another side, and a wafer side surface 44 connecting the first wafer main surface 42 and the second wafer main surface 43.

A thickness TW of the SiC semiconductor wafer 41 exceeds the thickness TS of the SiC semiconductor substrate 6 (TS<TW). The thickness TW of the SiC semiconductor wafer 41 is adjusted by grinding to the thickness TS of the SiC semiconductor substrate 6.

The thickness TW may exceed 150 μm and be not more than 750 μm. The thickness TW may exceed 150 μm and be not more than 300 μm, be not less than 300 μm and not more than 450 μm, be not less than 450 μm and not more than 600 μm, or be not less than 600 μm and not more than 750 μm. In view of grinding time of the SiC semiconductor wafer 41, the thickness TW preferably exceeds 150 μm and is not more than 500 μm. The thickness TW is typically not less than 300 μm and not more than 450 μm.

In this embodiment, the first wafer main surface 42 and the second wafer main surface 43 face the c-planes of the SiC monocrystal. The first wafer main surface 42 faces the (0001) plane (silicon plane). The second wafer main surface 43 faces the (000-1) plane (carbon plane) of the SiC monocrystal.

The first wafer main surface 42 and the second wafer main surface 43 have an off angle θ inclined at an angle of not more than 10° in the [11-20] direction with respect to the c-planes of the SiC monocrystal. A normal direction Z to the first wafer main surface 42 is inclined by just the off angle θ with respect to the c-axis (direction) of the SiC monocrystal.

The off angle θ may be not less than 0° and not more than 5.0°. The off angle θ may be set in an angular range of not less than 0° and not more than 1.0°, not less than 1.0° and not more than 1.5°, not less than 1.5° and not more than 2.0°, not less than 2.0° and not more than 2.5°, not less than 2.5° and not more than 3.0°, not less than 3.0° and not more than 3.5°, not less than 3.5° and not more than 4.0°, not less than 4.0° and not more than 4.5°, or not less than 4.5° and not more than 5.0°. The off angle θ preferably exceeds 0°. The off angle θ may be less than 4.0°.

The off angle θ may be set in an angular range of not less than 3.0° and not more than 4.5°. In this case, the off angle θ is preferably set in an angular range of not less than 3.0° and not more than 3.5°, or not less than 3.5° and not more than 4.0°. The off angle θ may be set in an angular range of not less than 1.5° and not more than 3.0°. In this case, the off angle θ is preferably set in an angular range of not less than 1.5° and not more than 2.0°, or not less than 2.0° and not more than 2.5°.

The SiC semiconductor wafer 41 includes a first wafer corner portion 45 connecting the first wafer main surface 42 and the wafer side surface 44, and a second wafer corner portion 46, connecting the second wafer main surface 43 and the wafer side surface 44. The first wafer corner portion 45 has a first chamfered portion 47 that is inclined downwardly from the first wafer main surface 42 toward the wafer side surface 44. The second wafer corner portion 46 has a second chamfered portion 48 that is inclined downwardly from the second wafer main surface 43 toward the wafer side surface 44.

The first chamfered portion 47 may be formed in a convexly curved shape. The second chamfered portion 48 may be formed in a convexly curved shape. The first chamfered portion 47 and the second chamfered portion 48 suppress cracking of the SiC semiconductor wafer 41.

A orientation flat 49, as an example of a mark indicating a crystal orientation of the SiC monocrystal, is formed in the wafer side surface 44. The orientation flat 49 is a notched portion formed in the wafer side surface 44. In this embodiment, the orientation flat 49 extends rectilinearly along the a-axis direction ([11-20] direction) of the SiC monocrystal.

A plurality of (for example, two) orientation flats 49 indicating the crystal orientations may be formed in the wafer side surface 44. The plurality of (for example, two) orientation flats 49 may include a first orientation flat and a second orientation flat.

The first orientation flat may be a notched portion extending rectilinearly along the a-axis direction ([11-20] direction) of the SiC monocrystal. The second orientation flat may be a notched portion extending rectilinearly along the m-axis direction ([1-100] direction) of the SiC monocrystal.

A plurality of device forming regions 51, each corresponding to an SiC semiconductor device 1, are set in the first wafer main surface 42. The plurality of device forming regions 51 are set in a matrix array at intervals in the m-axis direction ([1-100] direction) and the a-axis direction ([11-20] direction).

Each device forming region 51 has four sides 52A, 52B, 52C, and 52D oriented along the crystal orientation of the SiC monocrystal. The four sides 52A to 52D respectively correspond to the four side surfaces 5A to 5D of the SiC semiconductor layer 2. That is, the four sides 52A to 52D include the two sides 52A and 52C oriented along the m-axis direction ([1-100] direction) and the two sides 52B and 52D oriented along the a-axis direction ([11-20] direction).

A cutting schedule line 53 of a Lattice-shaped extending along the m-axis direction ([1-100] direction) and the a-axis direction ([11-20] direction) such as to demarcate the plurality of device forming regions 51 respectively is set in the first wafer main surface 42. The cutting schedule line 53 include a plurality of first cutting schedule lines 54 and a plurality of second cutting schedule lines 55.

The plurality of first cutting schedule lines 54 respectively extend along the m-axis direction ([1-100] direction). The plurality of second cutting schedule lines 55 respectively extend along the a-axis direction ([11-20] direction). After predetermined structures are formed in the plurality of device forming regions 51, the plurality of SiC semiconductor devices 1 are cut out by cutting the SiC semiconductor wafer 41 along the cutting schedule line 53.

FIG. 10A to FIG. 10M are sectional views of an example of a method for manufacturing the SiC semiconductor device 1 shown in FIG. 3. In FIG. 10A to FIG. 10M, for convenience of description, just a region that includes three device forming regions 51 are shown and illustration of other regions is omitted.

Figure 10A:
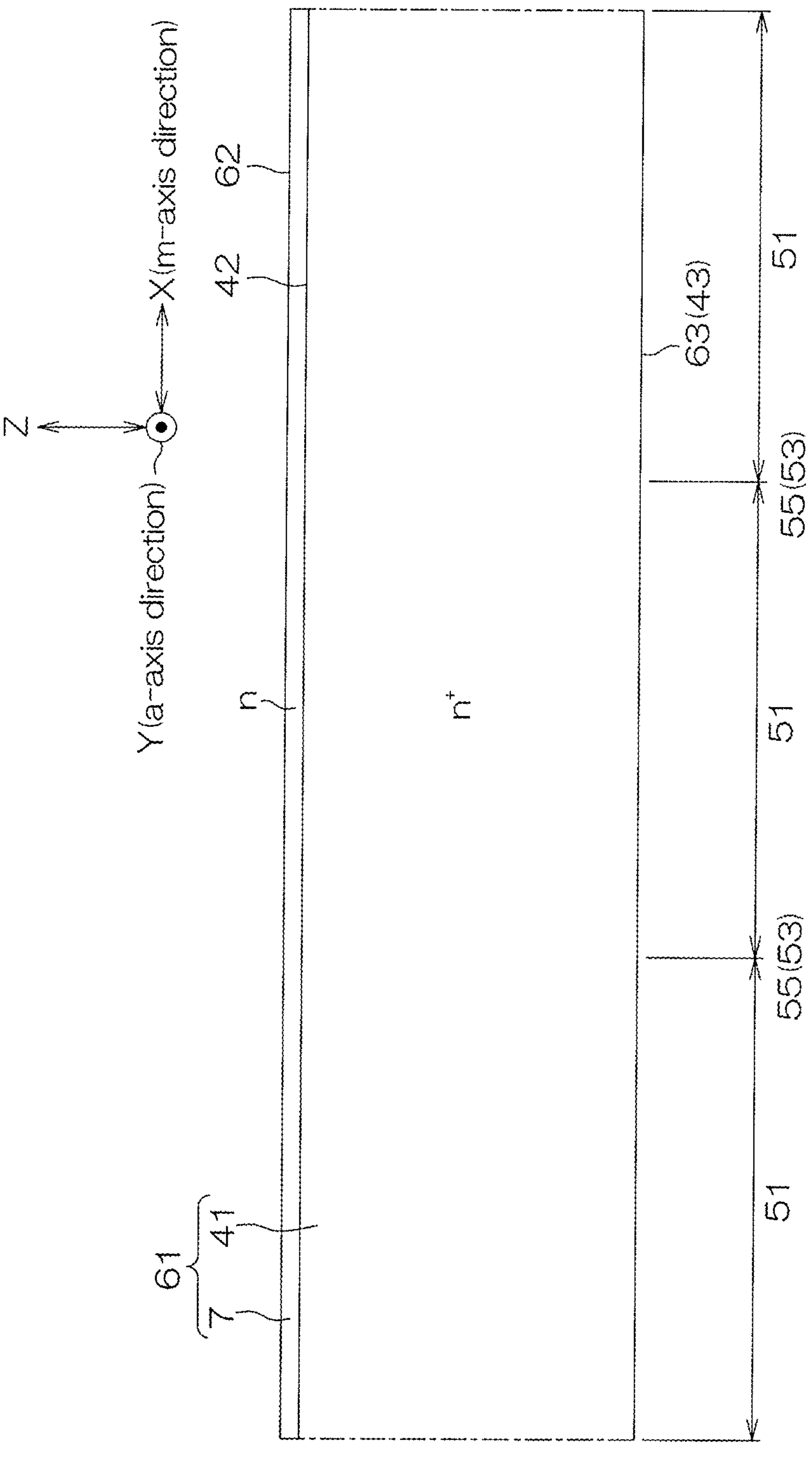
FIG. 10A is a sectional view of an example of a method for manufacturing the SiC semiconductor device shown in FIG. 3.

Referring to FIG. 10A, first, the SiC semiconductor wafer 41 is prepared (see also FIG. 9). Next, the SiC epitaxial layer 7 is formed on the first wafer main surface 42. In the step of forming the SiC epitaxial layer 7, SiC is epitaxially grown from the first wafer main surface 42. A thickness TE of the SiC epitaxial layer 7 may be not less than 1 μm and not more than 50 μm. An SiC semiconductor wafer structure 61 that includes the SiC semiconductor wafer 41 and the SiC epitaxial layer 7 is thereby formed.

The SiC semiconductor wafer structure 61 includes a first main surface 62 and a second main surface 63. The first main surface 62 and the second main surface 63 respectively correspond to the first main surface 3 and the second main surface 4 of the SiC semiconductor layer 2. A thickness TWS of the SiC semiconductor wafer structure 61 may exceed 150 μm and be not more than 800 μm. The thickness TWS preferably exceeds 150 μm and is not more than 550 μm.

Figure 10B:
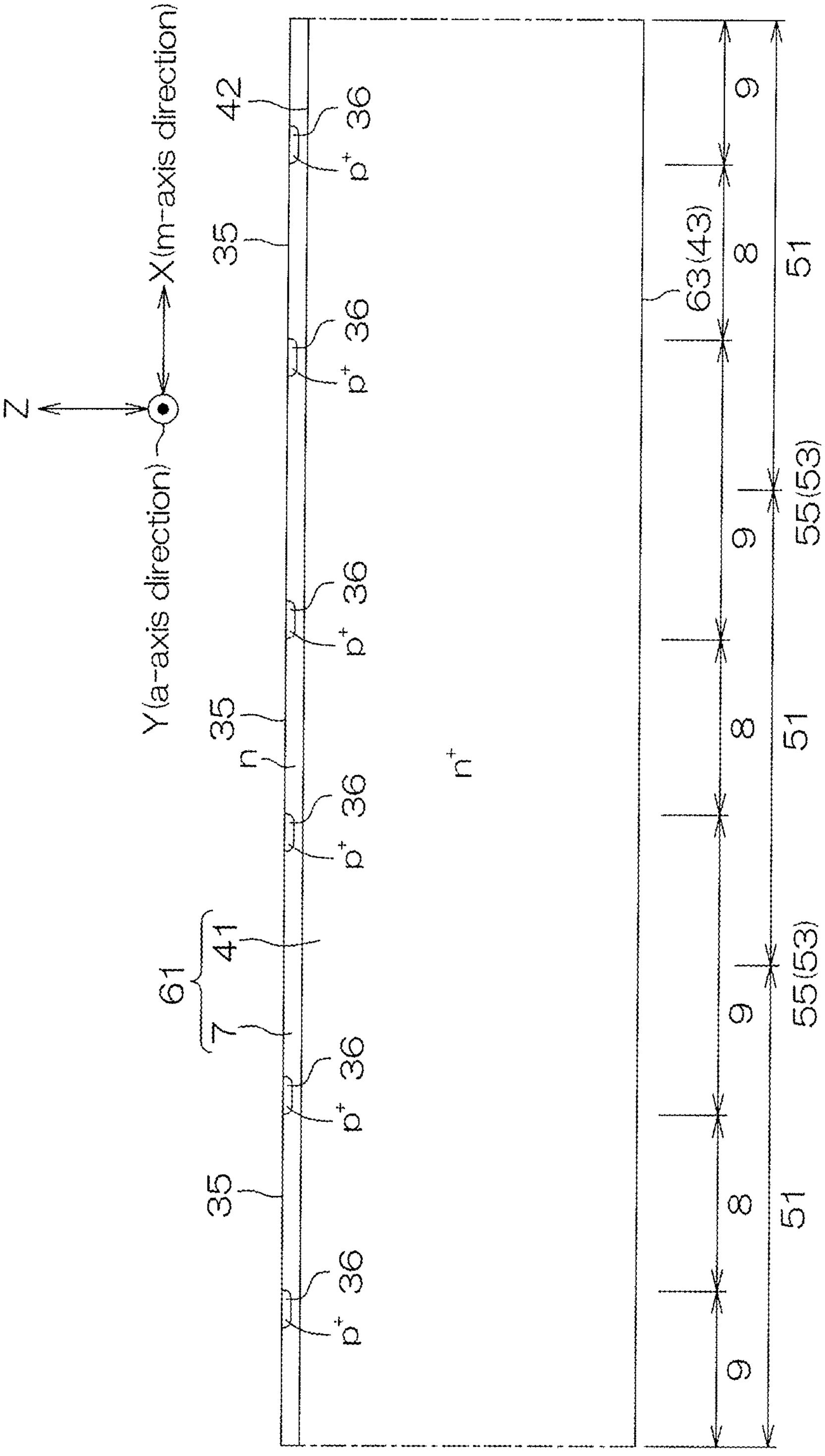
FIG. 10B is a diagram of a step subsequent to that of FIG. 10A.

Next, referring to FIG. 10B, the $p^+$ type guard regions 36 are formed in the first main surface 62. The step of forming the guard regions 36 includes a step of selectively introducing the p type impurity into surface layer portions of the first main surface 62 via an ion implantation mask (not shown). More specifically, the guard regions 36 are formed in surface layer portions of the SiC epitaxial layer 7.

The guard regions 36 demarcate the active regions 8 and the outer regions 9 in the SiC semiconductor wafer structure 61. The n type diode regions 35 are demarcated in regions (active regions 8) surrounded by the guard regions 36. The diode regions 35 may be formed by selectively introducing the n type impurity into surface layer portions of the first main surface 62 via an ion implantation mask (not shown).

Figure 10C:
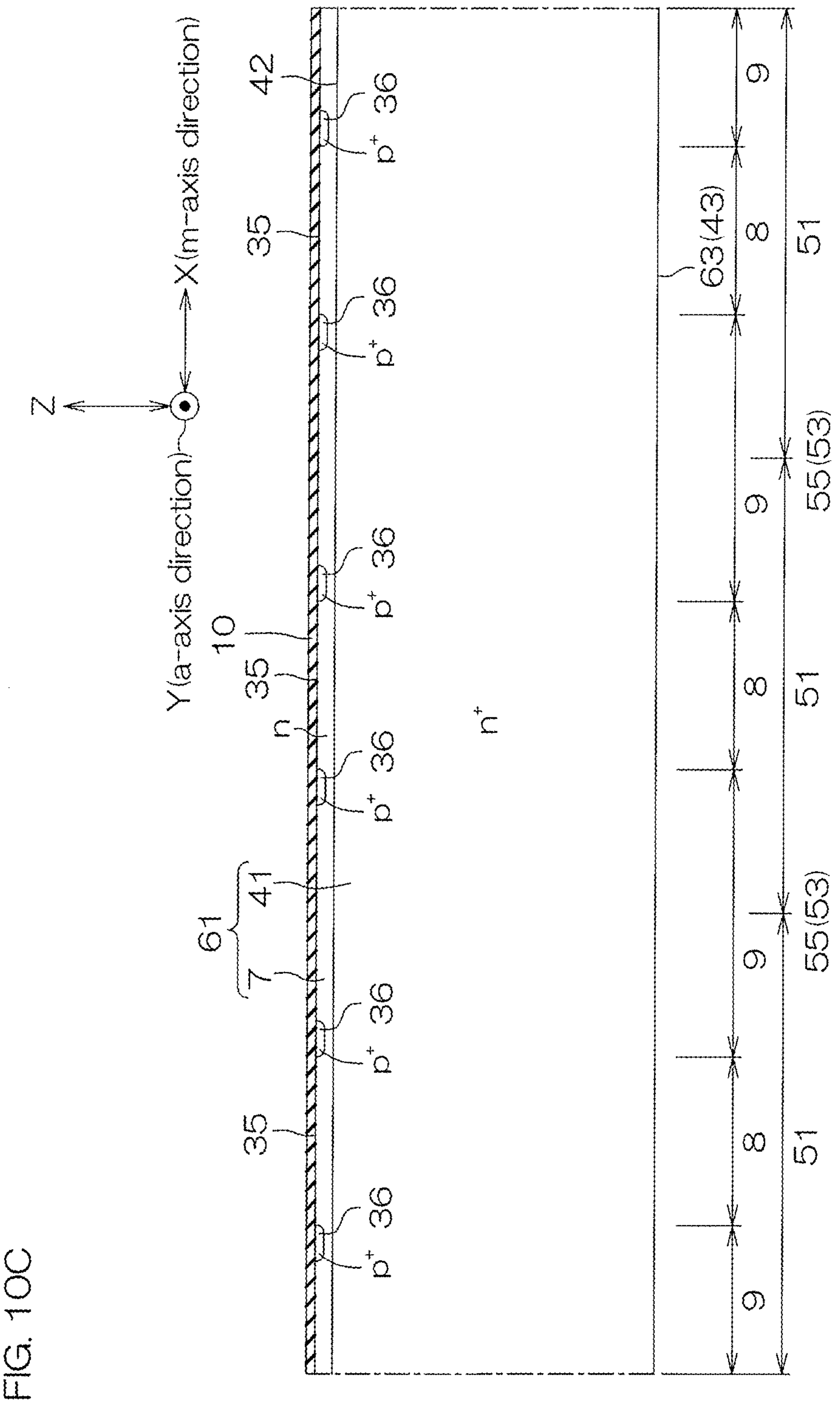
FIG. 10C is a diagram of a step subsequent to that of FIG. 10B.

Next, referring to FIG. 10C, the main surface insulating layer 10 is formed on the first main surface 62. The main surface insulating layer 10 includes silicon oxide ($SiO_2$). The main surface insulating layer 10 may be formed by a CVD (chemical vapor deposition) method or an oxidation treatment method (for example, a thermal oxidation treatment method).

Figure 10D:
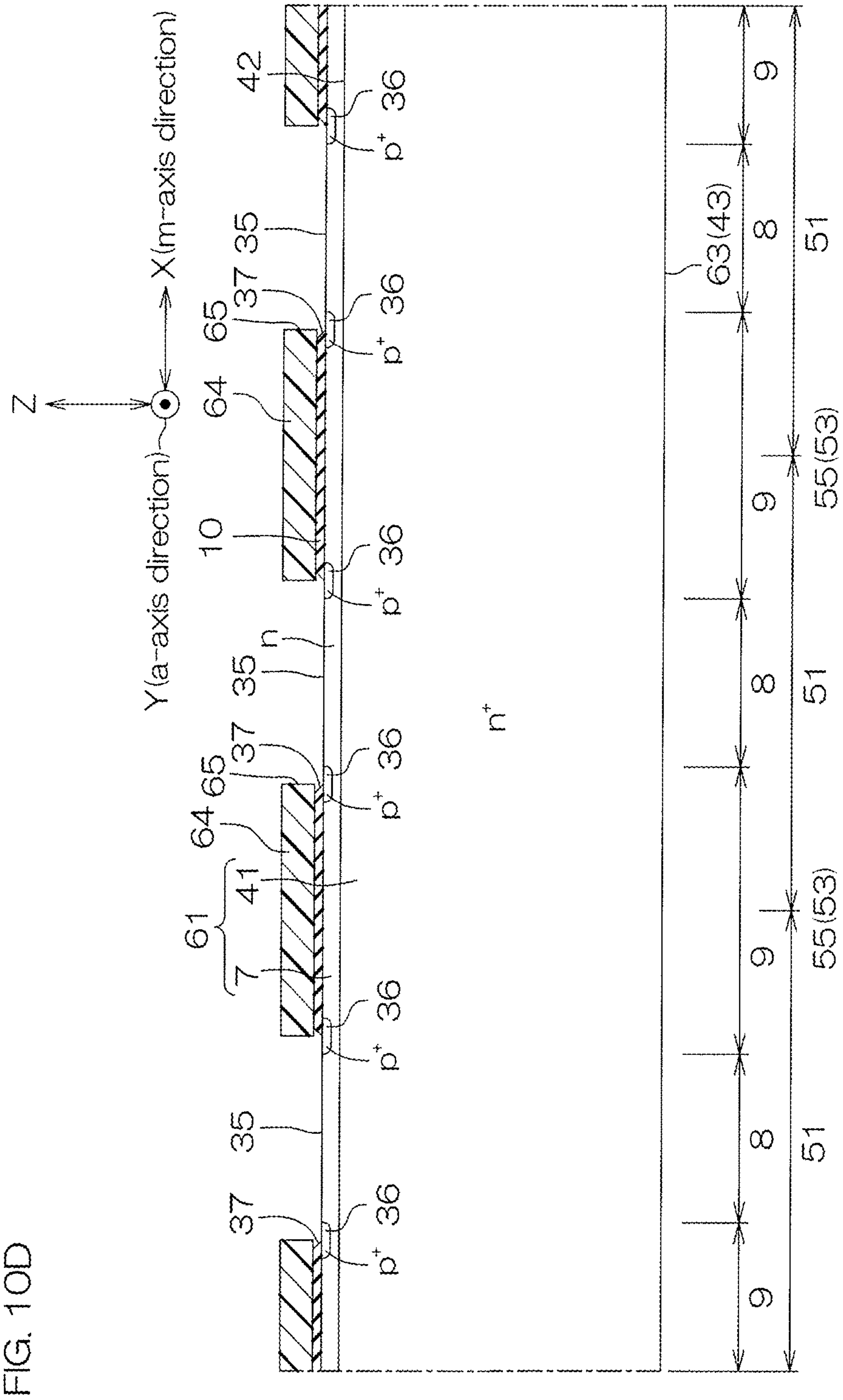
FIG. 10D is a diagram of a step subsequent to that of FIG. 10C.

Next, referring to FIG. 10D, a mask 64 having a predetermined pattern is formed on the main surface insulating layer 10. The mask 64 has a plurality of openings 65. The plurality of openings 65 respectively expose regions in the main surface insulating layer 10 in which the diode openings 37 are to be formed.

Next, unnecessary portions of the main surface insulating layer 10 are removed by an etching method via the mask 64. The diode openings 37 are thereby formed in the main surface insulating layer 10. After the diode openings 37 are formed, the mask 64 is removed.

Figure 10E:
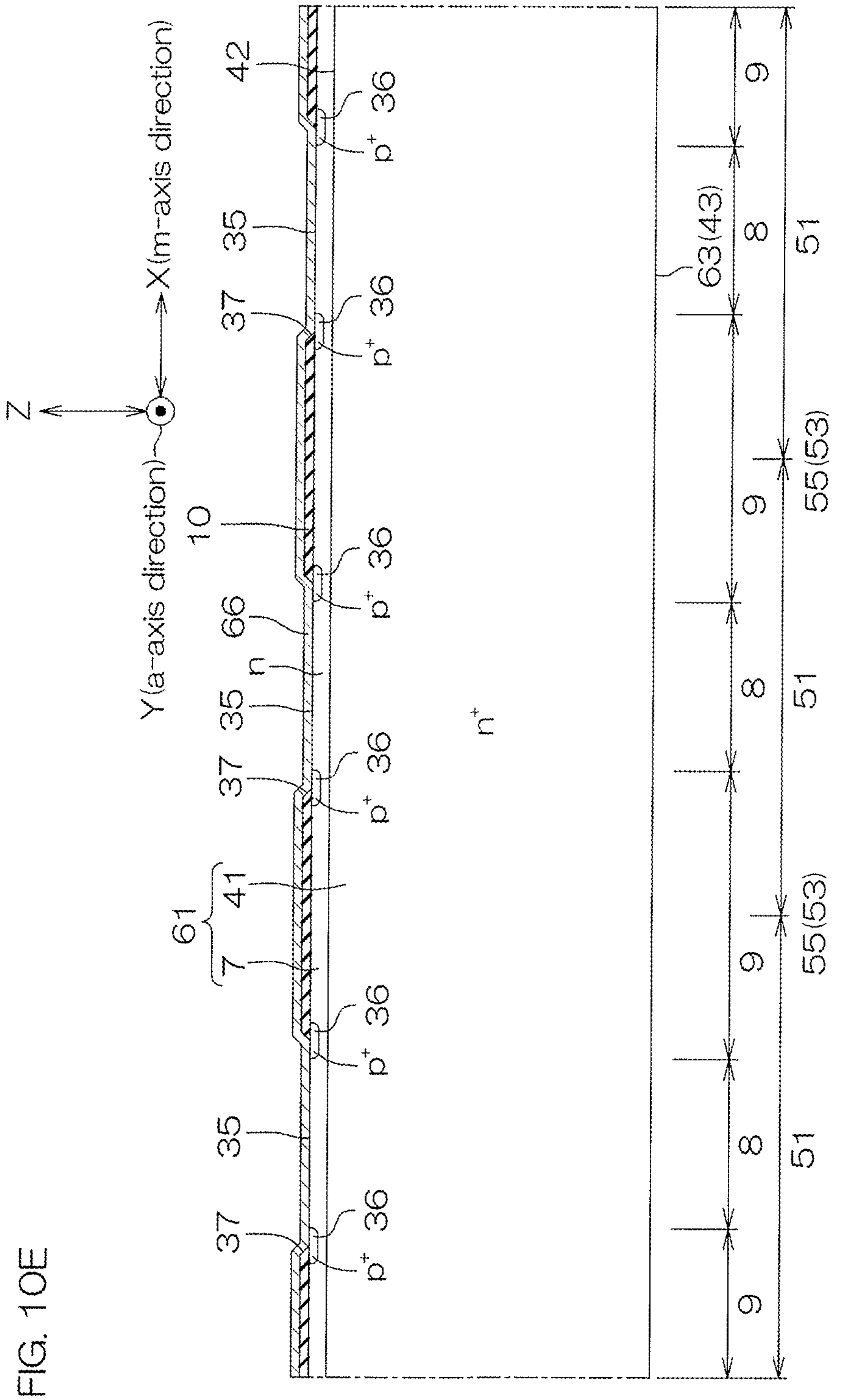
FIG. 10E is a diagram of a step subsequent to that of FIG. 10D.

Next, referring to FIG. 10E, a base electrode layer 66 to be a base of the first main surface electrode layers 12 is formed on the first main surface 62. The base electrode layer 66 is formed over an entire area of the first main surface 62 and covers the main surface insulating layer 10. The first main surface electrode layers 12 may be formed by a vapor deposition method, a sputtering method, or a plating method.

Figure 10F:
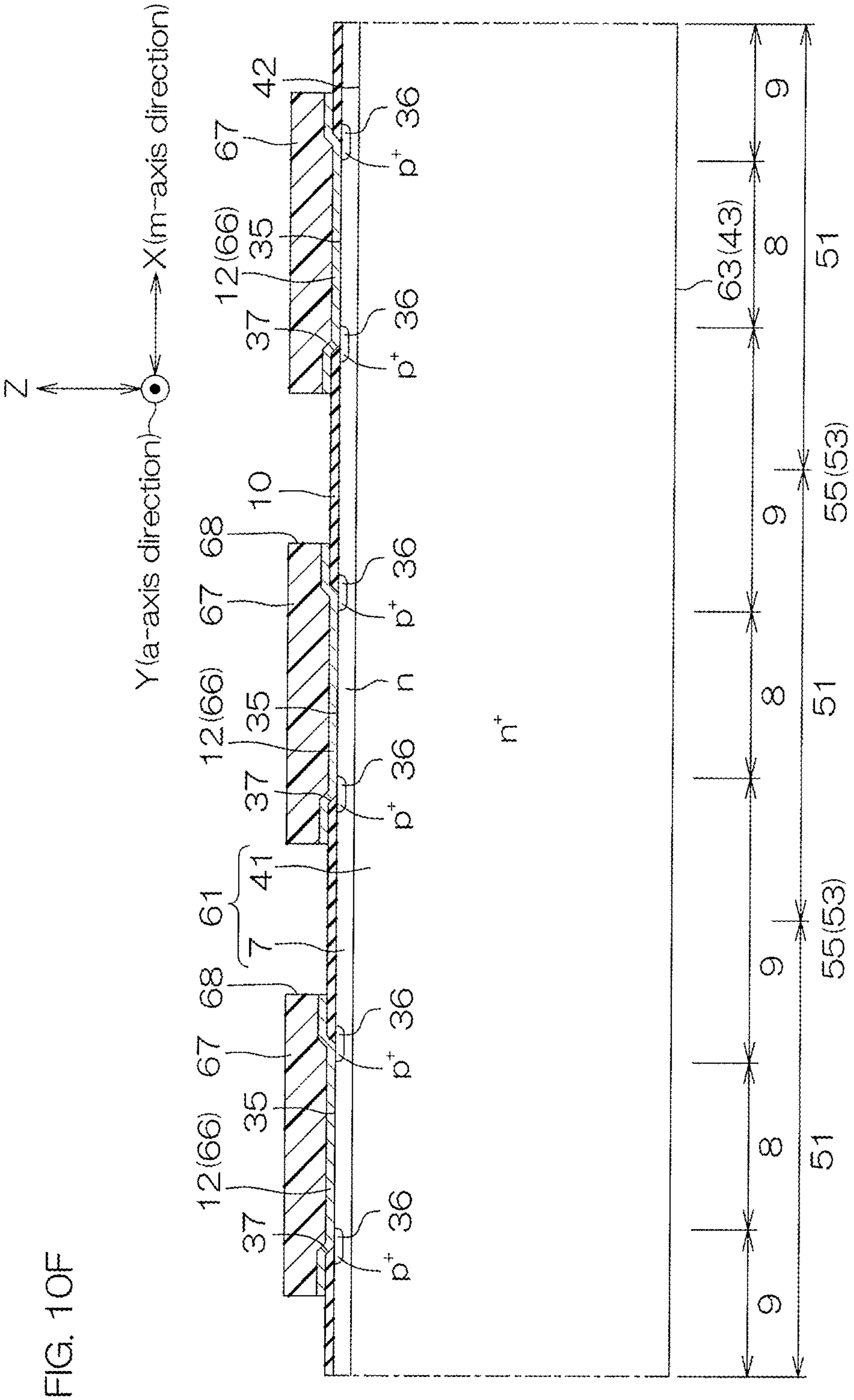
FIG. 10F is a diagram of a step subsequent to that of FIG. 10E.

Next, referring to FIG. 10F, a mask 67 having a predetermined pattern is formed on the base electrode layer 66. The mask 67 has openings 68 that expose regions of the base electrode layer 66 besides regions at which the first main surface electrode layers 12 are to be formed.

Next, unnecessary portions of the base electrode layer 66 are removed by an etching method via the mask 67. The base electrode layer 66 is thereby divided into the plurality of first main surface electrode layers 12. After the first main surface electrode layers 12 are formed, the mask 67 is removed.

Figure 10G:
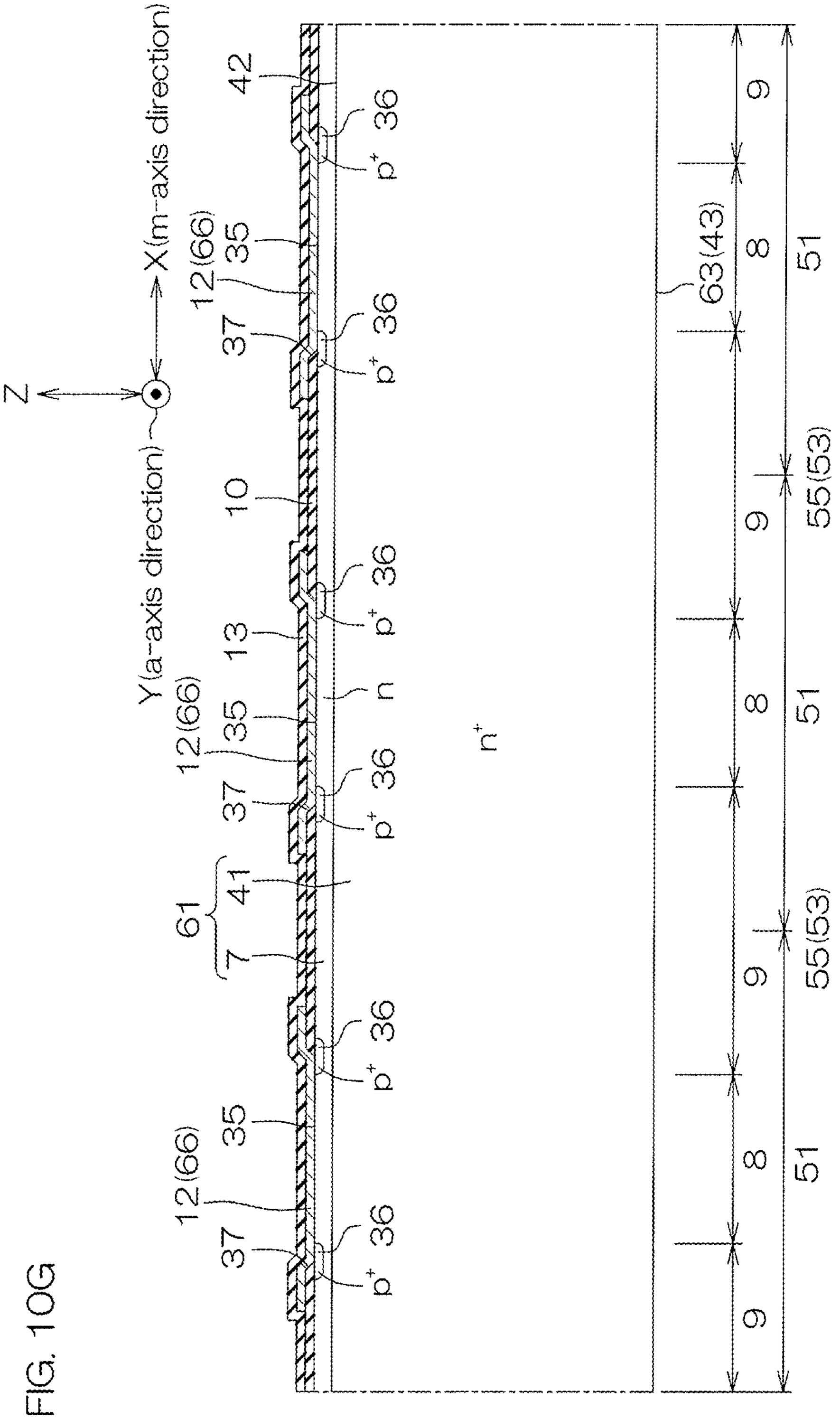
FIG. 10G is a diagram of a step subsequent to that of FIG. 10F.

Next, referring to FIG. 10G, the passivation layer 13 is formed on the first main surface 62. The passivation layer 13 includes silicon nitride (SiN). The passivation layer 13 may be formed by a CVD method.

Figure 10H:
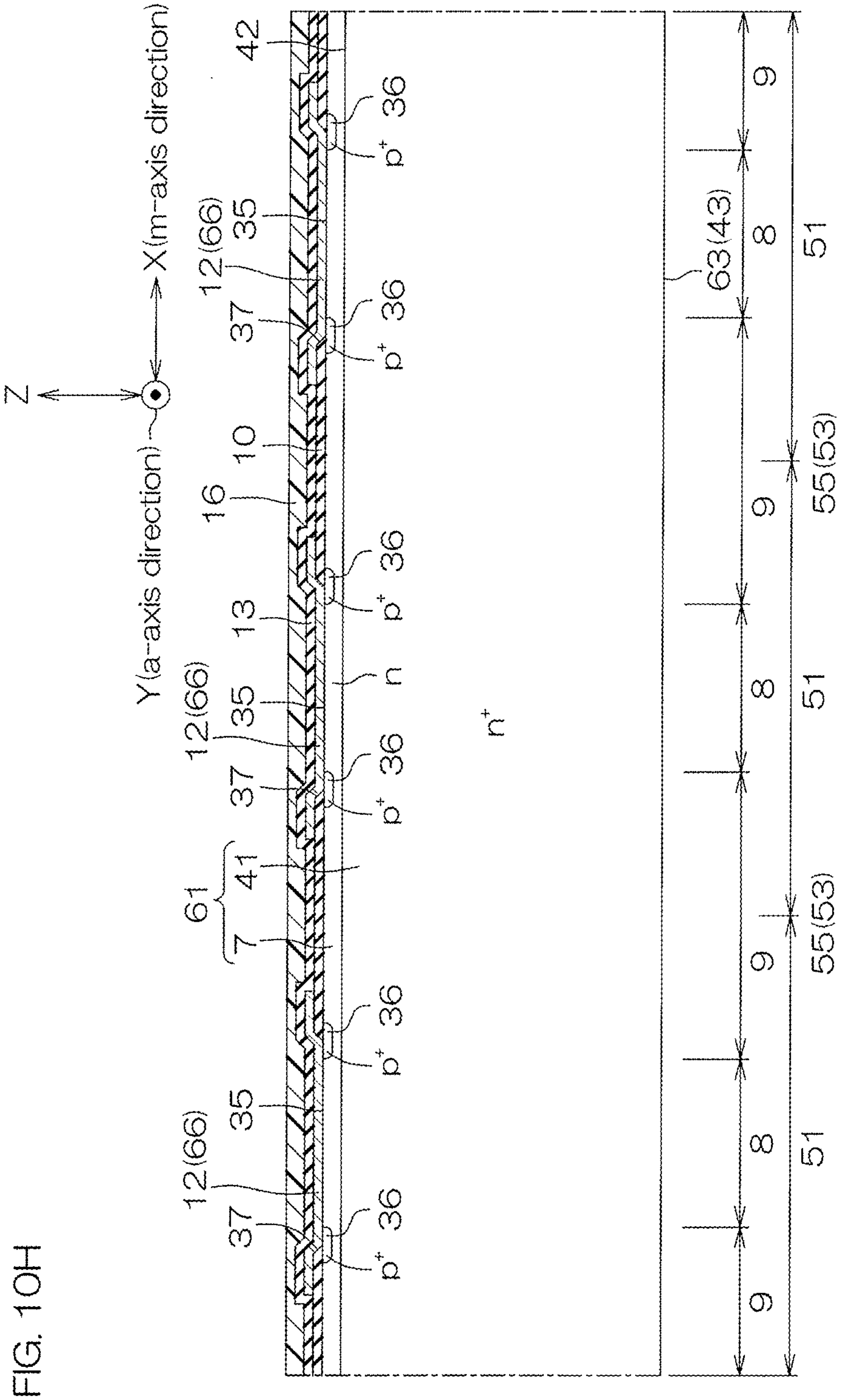
FIG. 10H is a diagram of a step subsequent to that of FIG. 10G.

Next, referring to FIG. 10H, the resin layer 16 is coated onto the passivation layer 13. The resin layer 16 covers the active regions 8 and the outer regions 9 altogether. The resin layer 16 may include a polybenzoxazole as an example of a positive type photosensitive resin.

Figure 10I:
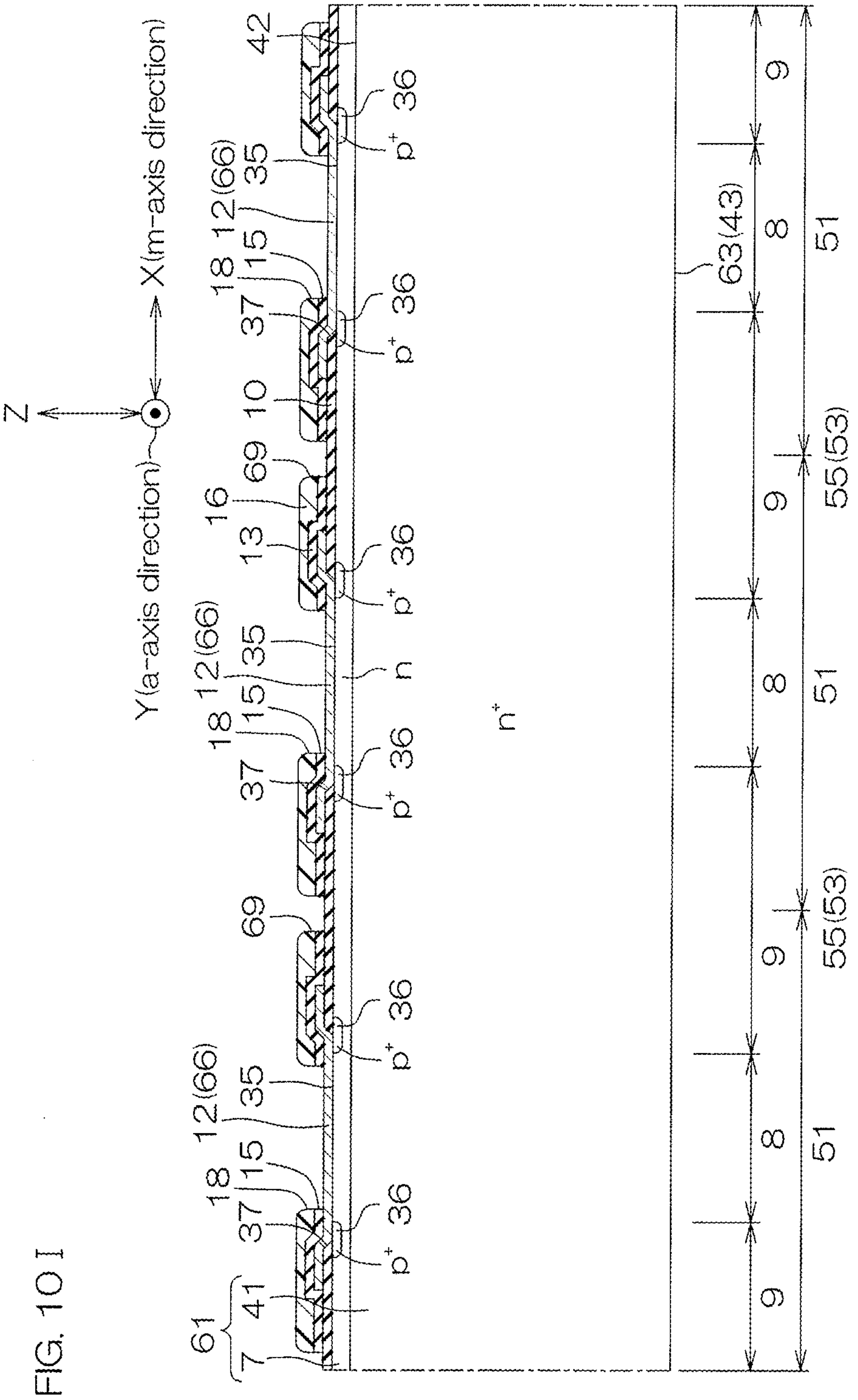
FIG. 10I is a diagram of a step subsequent to that of FIG. 10H.

Next, referring to FIG. 10I, the resin layer 16 is exposed selectively and thereafter developed. The pad openings 18 are thereby formed in the resin layer 16. Also, dicing streets 69 oriented along the cutting schedule line 53 (the sides 52A to 52D of the respective device forming regions 51) are demarcated in the resin layer 16.

Next, unnecessary portions of the passivation layer 13 are removed. The unnecessary portions of the passivation layer 13 may be removed by an etching method via the resin layer 16. The sub pad openings 15 are thereby formed in the passivation layer 13. Also, the dicing streets 69 oriented along the cutting schedule line 53 are demarcated in the passivation layer 13.

With this embodiment, the step of removing the unnecessary portions of the passivation layer 13 using the resin layer 16 was described. However, the resin layer 16 and the pad openings 18 may be formed after forming the sub pad openings 15 in the passivation layer 13. In this case, before the step of forming the resin layer 16, the unnecessary portions of the passivation layer 13 are removed by an etching method via a mask to form the sub pad openings 15. According to this step, the passivation layer 13 can be formed in any shape.

Figure 10J:
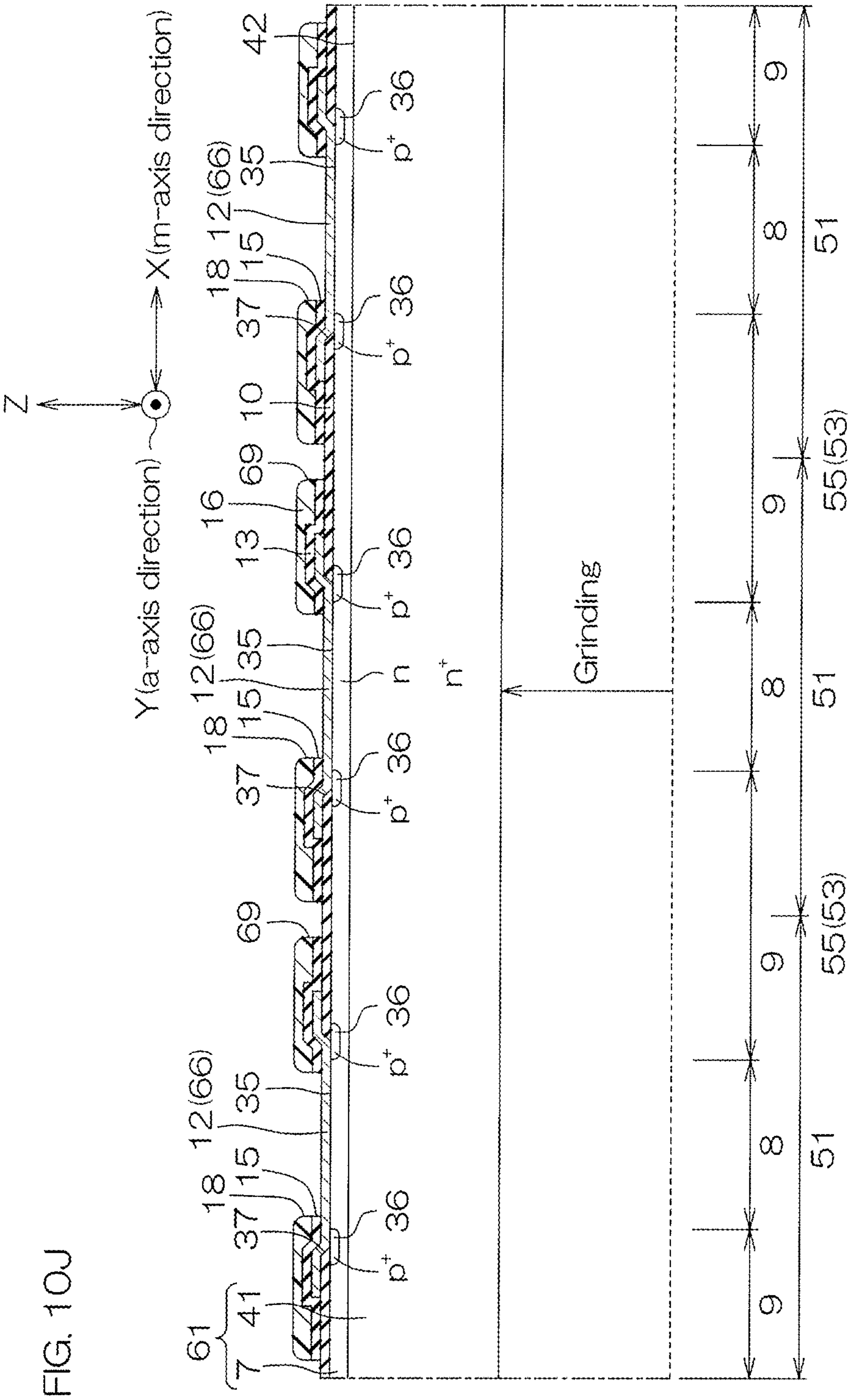
FIG. 10J is a diagram of a step subsequent to that of FIG. 10I.

Next, referring to FIG. 10J, the second main surface 63 (second wafer main surface 43) is ground. The SiC semiconductor wafer structure 61 (SiC semiconductor wafer 41) is thereby thinned. Also, grinding marks are formed in the second main surface 63 (second wafer main surface 43). The SiC semiconductor wafer structure 61 is ground until it is of the thickness TWS corresponding to the thickness TL of the SiC semiconductor layer 2.

The SiC semiconductor wafer structure 61 may be ground to be of the thickness TWS of not less than 40 μm and not more than 200 μm. That is, the SiC semiconductor wafer 41 is ground until it is of the thickness TW corresponding to the thickness TS of the SiC semiconductor substrate 6. The SiC semiconductor wafer 41 may be ground to be of the thickness TW of not less than 40 μm and not more than 150 μm.

Figure 10K:
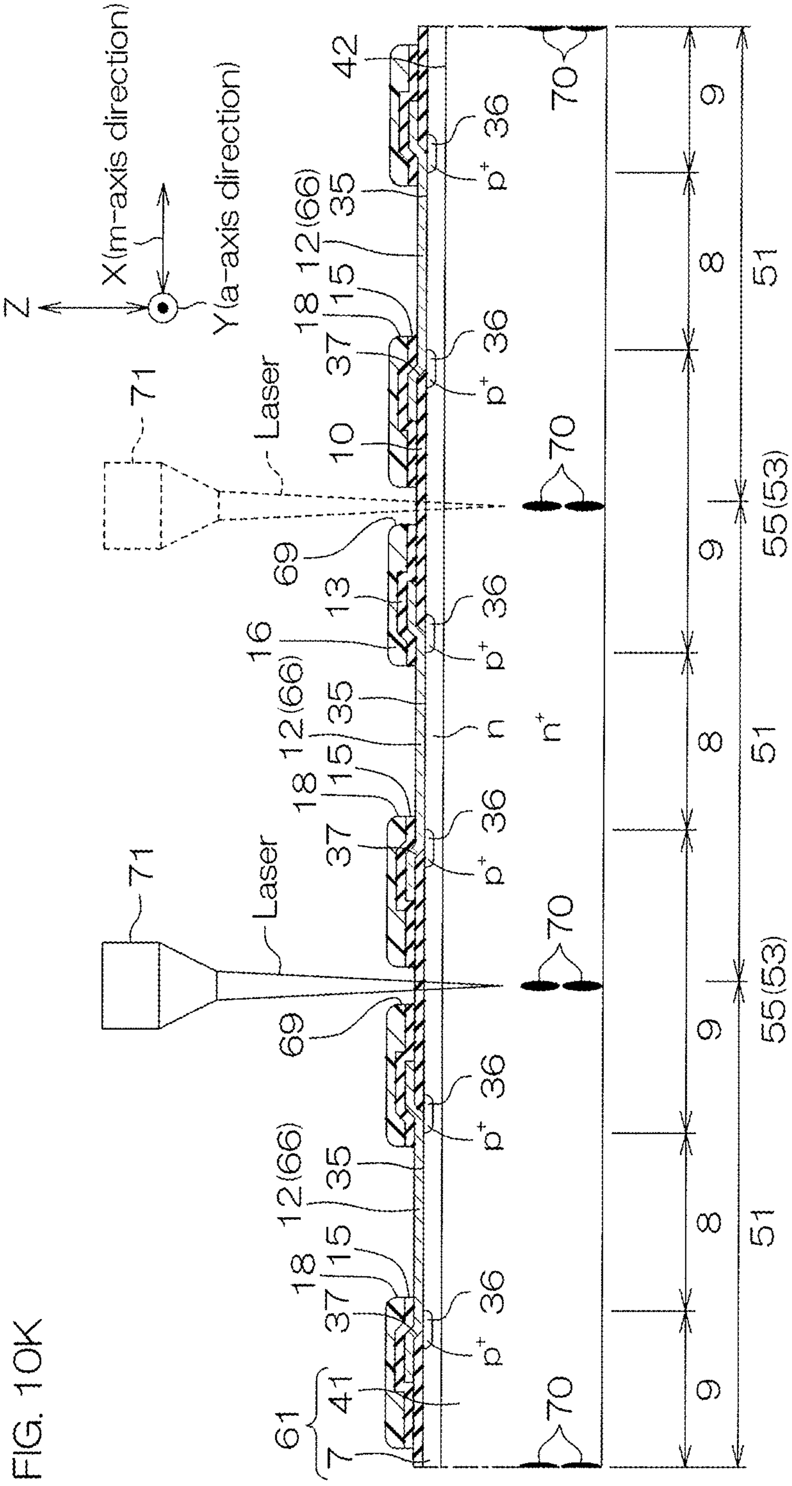
FIG. 10K is a diagram of a step subsequent to that of FIG. 10J.

Next, referring to FIG. 10K, a plurality of modified lines 70 (modified layers) that are to be bases of the rough surface regions 20A to 20D (the modified lines 22A to 22D) are formed. In the step of forming the modified lines 70, pulsed laser light is irradiated toward the SiC semiconductor wafer structure 61 from a laser light irradiation apparatus 71.

The laser light is irradiated onto the SiC semiconductor wafer structure 61 from the first main surface 62 side and via the main surface insulating layer 10. The laser light may be irradiated directly onto the SiC semiconductor wafer structure 61 from the second main surface 63 side.

A light converging portion (focal point) of the laser light is set to thickness direction intermediate portions of the SiC semiconductor wafer structure 61. A laser light irradiation position with respect to the SiC semiconductor wafer structure 61 is moved along the cutting schedule line 53 (the four sides 52A to 52D of the respective device forming regions 51). More specifically, the laser light irradiation position with respect to the SiC semiconductor wafer structure 61 is moved along the first cutting schedule lines 54. Also, the laser light irradiation position with respect to the SiC semiconductor wafer structure 61 is moved along the second cutting schedule lines 55.

The plurality of modified lines 70 that extend along the cutting schedule line 53 (the four sides 52A to 52D of the respective device forming regions 51) and in which a crystal state of the SiC monocrystal is modified to be of the property differing from other regions are thereby formed in the thickness direction intermediate portions of the SiC semiconductor wafer structure 61. The plurality of modified lines 70 are formed one layer or a plurality (two layers or more; two layers in this embodiment) each in a relationship of one-to-one correspondence with respect to the four sides 52A to 52D of each device forming region 51.

Each of the two modified lines 70 oriented along the sides 52A and 52C of the device forming region 51 includes the a-plane modified portion 28. Each of the two modified lines 70 oriented along the sides 52B and 52D of the device forming region 51 includes the m-plane modified portion 29.

The plurality of modified lines 70 are also laser processing marks formed in the thickness direction intermediate portions of the SiC semiconductor wafer structure 61. More specifically, the a-plane modified portions 28 and the m-plane modified portions 29 of the modified lines 70 are laser processing marks. The light converging portion (focal point), laser energy, pulse duty ratio, irradiation speed, etc., of the laser light are set to arbitrary values in accordance with positions, sizes, shapes, thicknesses, etc., of the modified lines 70 (rough surface regions 20A to 20D) to be formed.

Figure 10L:
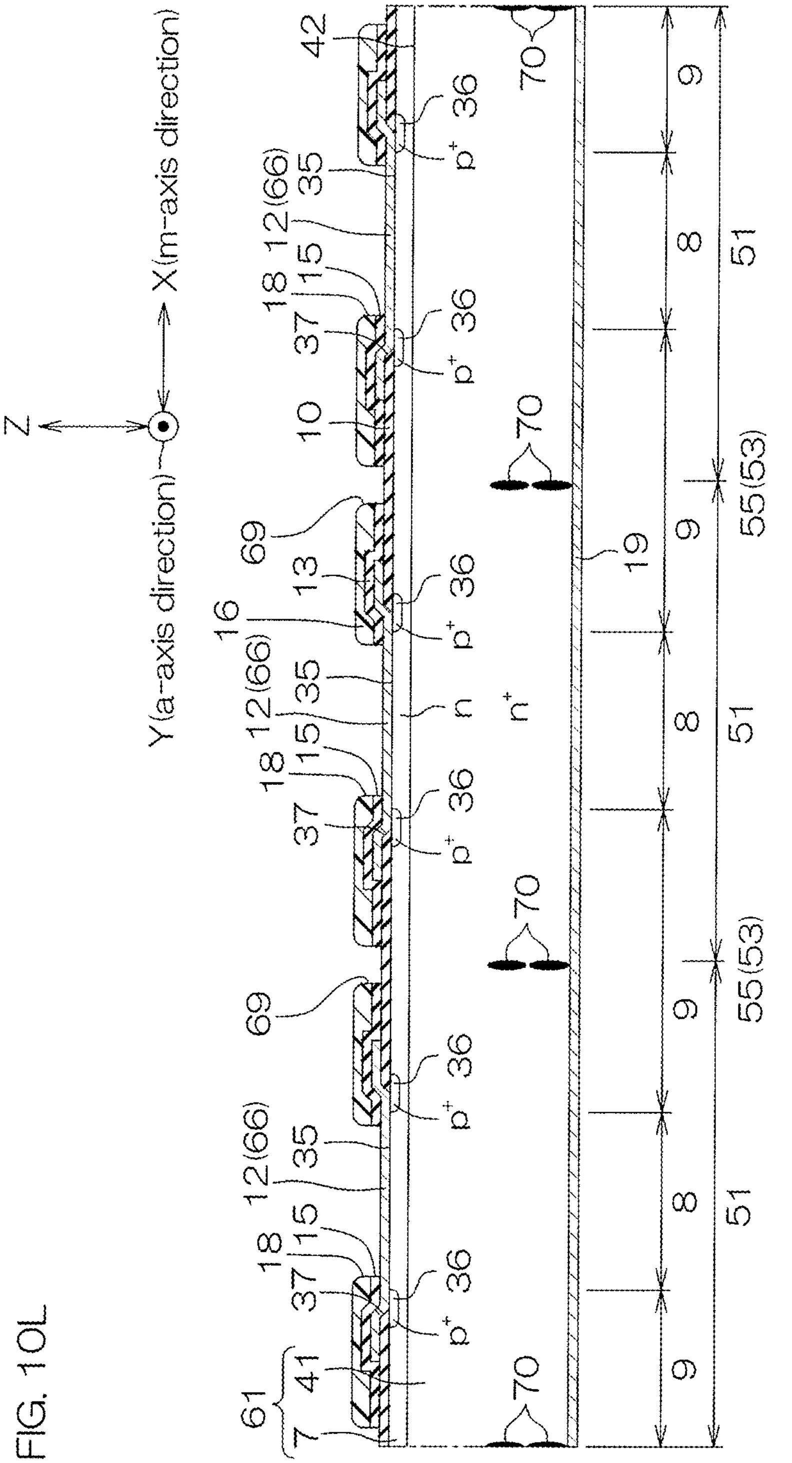
FIG. 10L is a diagram of a step subsequent to that of FIG. 10K.

Next, referring to FIG. 10L, the second main surface electrode layer 19 is formed on the second main surface 63. The second main surface electrode layer 19 may be formed by a vapor deposition method, a sputtering method, or a plating method. An annealing treatment may be performed on the second main surface 63 (ground surface) before the step of forming the second main surface electrode layer 19. The annealing treatment may be performed by a laser annealing treatment method using laser light.

According to the laser annealing treatment method, the SiC monocrystal at a surface layer portion of the second main surface 63 is modified and an Si amorphous layer is formed. In this case, the SiC semiconductor device 1 having the Si amorphous layer at a surface layer portion of the second main surface 4 of the SiC semiconductor layer 2 is manufactured. At the second main surface 4, the grinding marks and the Si amorphous layer coexist. According to the laser annealing treatment method, an ohmic property of the second main surface electrode layer 19 with respect to the second main surface 4 can be improved.

Figure 10M:
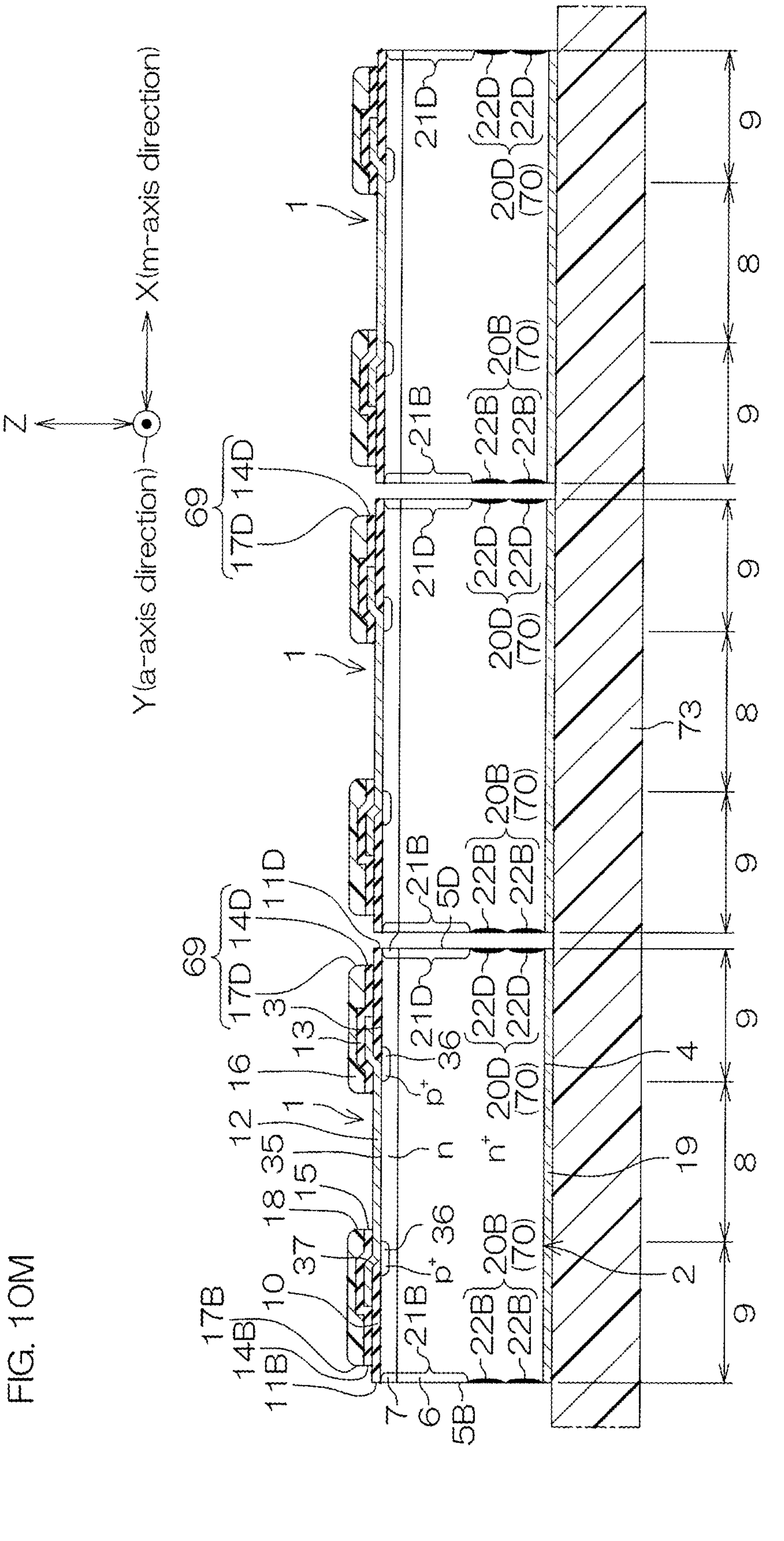
FIG. 10M is a diagram of a step subsequent to that of FIG. 10L.

Next, referring to FIG. 10M, the plurality of SiC semiconductor devices 1 are cut out from the SiC semiconductor wafer structure 61. In this step, a tape-shaped supporting member 73 is adhered onto the second main surface 63 side. Next, an external force is applied to the cutting schedule line 53 via the supporting member 73 from the second main surface 63 side. The external force applied to the cutting schedule line 53 may be applied by a pressing member, such as a blade, etc.

The supporting member 73 may be adhered onto the first main surface 62 side. In this case, the external force may be applied to the cutting schedule line 53 via the supporting member 73 from the first main surface 62 side. The external force may be applied by a pressing member, such as a blade, etc.

An elastic supporting member 73 may be adhered to the first main surface 62 side or the second main surface 63 side.

In this case, the SiC semiconductor wafer structure 61 may be cleaved by stretching the elastic supporting member 73 in the m-axis direction and the a-axis direction.

If the SiC semiconductor wafer structure 61 is to be cleaved using the supporting member 73, it is preferable to adhere the supporting member 73 onto the second main surface 63 side with few obstacles. The SiC semiconductor wafer structure 61 is thus cleaved along the cutting schedule line 53 with the modified lines 70 and the boundary modified lines 72 as starting points and the plurality of SiC semiconductor devices 1 are cut out from the single SiC semiconductor wafer structure 61 (SiC semiconductor wafer 41).

Portions of the modified lines 70 that are oriented along the sides 52A of the respective device forming regions 51 become the rough surface regions 20A (modified lines 22A). Portions of the modified lines 70 that are oriented along the sides 52B of the respective device forming regions 51 become the rough surface regions 20B (modified lines 22B). Portions of the modified lines 70 that are oriented along the sides 52C of the respective device forming regions 51 become the rough surface regions 20C (modified lines 22C). Portions of the modified lines 70 that are oriented along the sides 52D of the respective device forming regions 51 become the rough surface regions 20D (modified lines 22D). The SiC semiconductor devices 1 are manufactured through steps including the above.

In this embodiment, the step of grinding the SiC semiconductor wafer structure 61 (FIG. 10J) is performed before the step of forming the modified lines 70 (FIG. 10K). However, the step of grinding the SiC semiconductor wafer structure 61 (FIG. 10J) may be performed at any timing after the step of preparing the SiC semiconductor wafer 41 (FIG. 10A) and before the step of forming the second main surface electrode layer 19 (FIG. 10L).

For example, the step of grinding the SiC semiconductor wafer structure 61 (FIG. 10J) may be performed before the step of forming the SiC epitaxial layer 7 (FIG. 10A). Also, the step of grinding the SiC semiconductor wafer structure 61 (FIG. 10J) may be performed after the step of forming the modified lines 70 (FIG. 10K).

Also, the step of grinding the SiC semiconductor wafer structure 61 (FIG. 10J) may be performed over a plurality of times at any timing after the step of preparing the SiC semiconductor wafer 41 (FIG. 10A) and before the step of forming the modified lines 70 (FIG. 10K). Also, the step of grinding the SiC semiconductor wafer structure 61 (FIG. 10J) may be performed over a plurality of times at any timing after the step of preparing the SiC semiconductor wafer 41 (FIG. 10A) and before the step of forming the second main surface electrode layer 19 (FIG. 10L).

Figure 11:
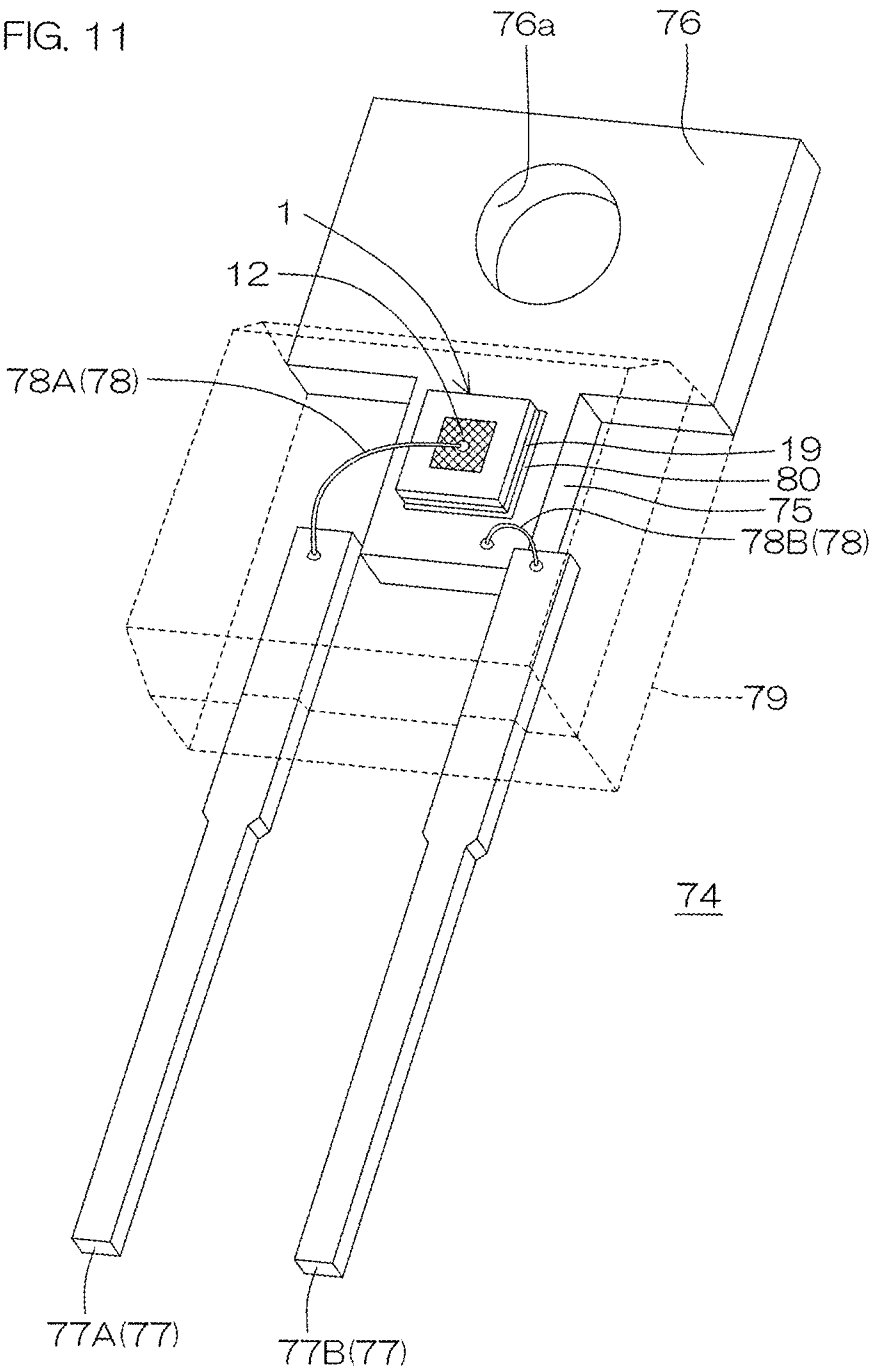
FIG. 11 is a perspective view, as seen through a sealing resin, of a semiconductor package incorporating the SiC semiconductor device shown in FIG. 3.

FIG. 11 is a perspective view, as seen through a sealing resin 79, of a semiconductor package 74 incorporating the SiC semiconductor device 1 shown in FIG. 3.

Referring to FIG. 11, the semiconductor package 74 in this embodiment is of a so-called TO-220 type. The semiconductor package 74 includes the SiC semiconductor device 1, a pad portion 75, a heat sink 76, a plurality of (in this embodiment, two) terminals 77, a plurality of (in this embodiment, two) conductive wires 78, and a sealing resin 79. The pad portion 75, the heat sink 76, and the plurality of terminals 77 form a lead frame as an example of a connection object.

The pad portion 75 includes a metal plate. The pad portion 75 may include iron, gold, silver, copper, aluminum, etc. The pad portion 75 is formed in a quadrilateral shape in plan view. The pad portion 75 has a plane area not less than a plane area of the SiC semiconductor device 1. The SiC semiconductor device 1 is arranged on the pad portion 75.

The second main surface electrode layer 19 of the SiC semiconductor device 1 is electrically connected to the pad portion 75 via a conductive bonding material 80. The conductive bonding material 80 is interposed in a region between the second main surface electrode layer 19 and the pad portion 75.

The conductive bonding material 80 may be a metal paste or a solder. The metal paste may be a conductive paste including Au (gold), Ag (silver), or Cu (copper). The conductive bonding material 80 is preferably constituted of the solder. The solder may be a lead-free type solder. The solder may include at least one type of material among SnAgCu, SnZnBi, SnCu, SnCuNi, and SnSbNi.

The heat sink 76 is connected to one side of the pad portion 75. In this embodiment, the pad portion 75 and the heat sink 76 are formed of a single metal plate. A penetrating hole 76*a* is formed in the heat sink 76. The penetrating hole 76*a* is formed in a circular shape.

The plurality of terminals 77 are aligned along a side opposite the heat sink 76 with respect to the pad portion 75. The plurality of terminals 77 includes a metal plate respectively. The terminals 77 may include iron, gold, silver, copper, aluminum, etc.

The plurality of terminals 77 include a first terminal 77A and a second terminal 77B. The first terminal 77A and the second terminal 77B are aligned at an interval along a side of the pad portion 75 opposite the heat sink 76. The first terminal 77A and the second terminal 77B extend in band shapes along a direction orthogonal to a direction of alignment thereof.

The plurality of conductive wires 78 may be bonding wires, etc. The plurality of conductive wires 78 include a conductive wire 78A and a conductive wire 78B. The conductive wire 78A is electrically connected to the first terminal 77A and the first main surface electrode layer 12 of the SiC semiconductor device 1. The first terminal 77A is thereby electrically connected to the first main surface electrode layer 12 of the SiC semiconductor device 1 via the conductive wire 78A.

The conductive wire 78B is electrically connected to the second terminal 77B and the pad portion 75. The second terminal 77B is thereby electrically connected to the second main surface electrode layer 19 of the SiC semiconductor device 1 via the conductive wire 78B. The second terminal 77B may be formed integral to the pad portion 75.

The sealing resin 79 seals the SiC semiconductor device 1, the pad portion 75, and the plurality of conductive wires 78 such as to expose the heat sink 76 and portions of the plurality of terminals 77. The sealing resin 79 is formed in a rectangular parallelepiped shape.

The configuration of the semiconductor package 74 is not restricted to TO-220. A SOP (small outline package), a QFN (quad for non-lead package), a DFP (dual flat package), a DIP (dual inline package), a QFP (quad flat package), a SIP (single inline package), a SOJ (small outline J-leaded package), or any of various similar configurations may be applied as the semiconductor package 74.

Figure 12:
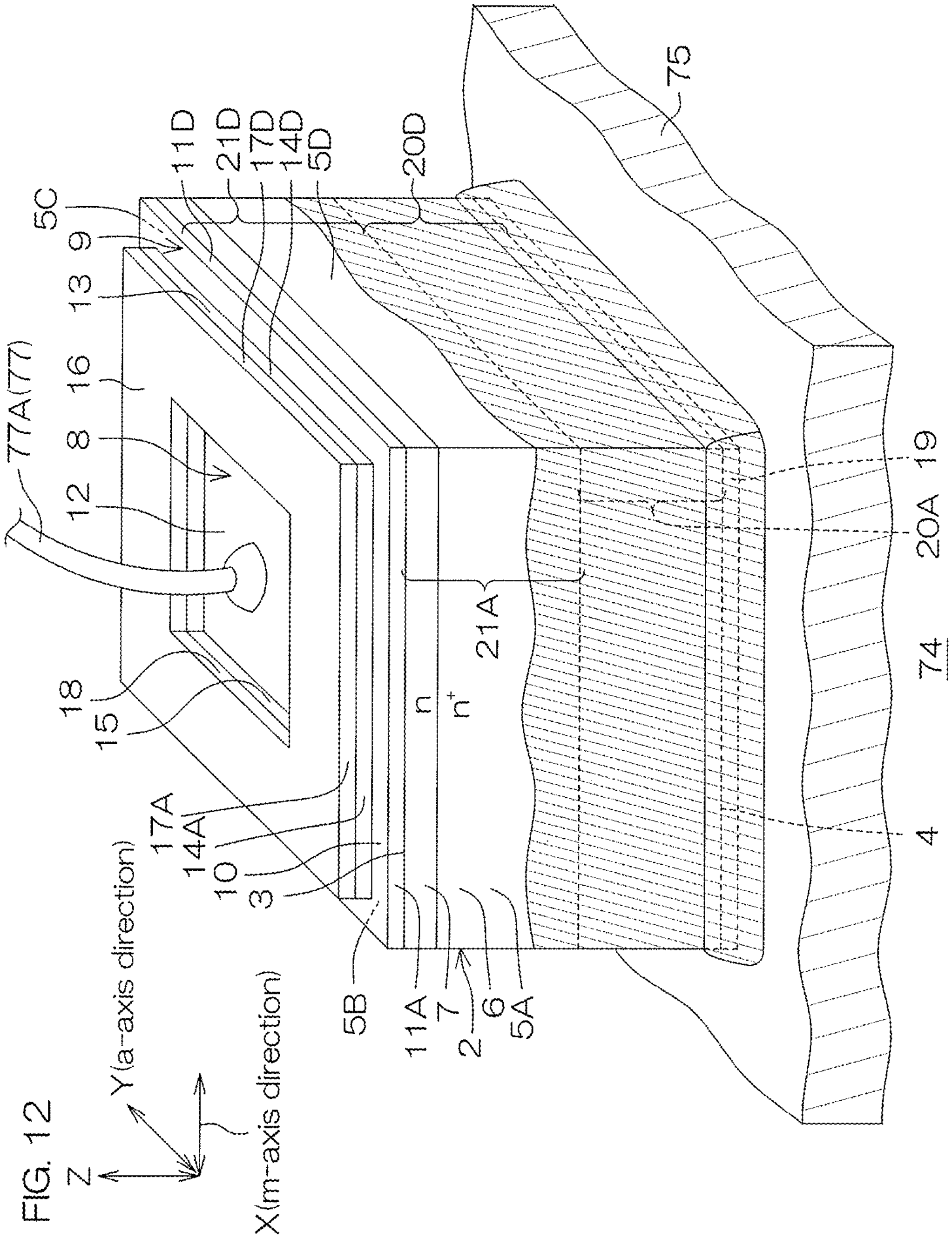
FIG. 12 is a perspective view specifically showing a mounting state of the SiC semiconductor device shown in FIG. 11.

FIG. 12 is a perspective view specifically showing a mounting state of the SiC semiconductor device 1 shown in FIG. 11.

Referring to FIG. 12, the SiC semiconductor device 1 is arranged on the pad portion 75 in a posture where the second main surface 4 opposes the pad portion 75. The second main surface electrode layer 19 is electrically connected to the pad portion 75 via the conductive bonding material 80.

The conductive bonding material 80 includes a conductive bonding material film 80*a* formed in a film on the side surfaces 5A to 5D. The conductive bonding material film 80*a* is a region where a portion of the conductive bonding material 80 wet-spreads to the side surfaces 5A to 5D as a film form. When the rough surface regions 20A to 20D are formed at the side surface 5A to 5D, the conductive bonding material 80 wet-spreads to the side surfaces 5A to 5D by a capillary phenomenon occurring at the rough surface regions 20A to 20D. In FIG. 12, a configuration example is shown where the conductive bonding material 80 wet-spreads across entire areas of the rough surface regions 20A to 20D and covers the entire areas of the rough surface regions 20A to 20D.

The SiC semiconductor device 1 includes the smooth surface regions 21A to 21D formed at the side surfaces 5A to 5D. The smooth surface regions 21A to 21D are formed in regions of the side surfaces 5A to 5D between the first main surface 3 and the rough surface regions 20A to 20D. The smooth surface regions 21A to 21D have the surface roughness Rs less than the surface roughness Rr of the rough surface regions 20A to 20D ($Rs<Rr$).

The capillary phenomenon occurring at the rough surface regions 20A to 20D is suppressed by the smooth surface regions 21A to 21D. The wet-spreading of the conductive bonding material 80 at the side surfaces 5A to 5D is thus suppressed by the smooth surface regions 21A to 21D. In this embodiment, the conductive bonding material film 80*a* crosses boundaries of the rough surface regions 20A to 20D and the smooth surface regions 21A to 21D and has end portions positioned at thickness direction intermediate portions of the smooth surface regions 21A to 21D.

The smooth surface regions 21A to 21D are formed in regions of the side surfaces 5A to 5D at the first main surface 3 side with respect to the rough surface regions 20A to 20D. Flowing around of the conductive bonding material 80 to the first main surface 3 is thereby suppressed appropriately by the smooth surface regions 21A to 21D.

Thus, with the SiC semiconductor device 1, short-circuiting of the SiC semiconductor layer 2 via the conductive bonding material 80 (conductive bonding material film 80*a*) is suppressed by the smooth surface regions 21A to 21D. More specifically, short-circuiting between the first main surface electrode layer 12 and the second main surface electrode layer 19 (pad portion 75) via the conductive bonding material 80 (conductive bonding material film 80*a*) is suppressed by the smooth surface regions 21A to 21D. This short-circuiting may include that due to a discharge phenomenon between the conductive bonding material 80 (conductive bonding material film 80*a*) and the first main surface electrode layer 12.

The risk of short-circuiting that accompanies the forming of the conductive bonding material film 80*a* increases as areas of the side surfaces 5A to 5D decrease. That is, the smaller the thickness TL of the SiC semiconductor layer 2, the higher the risk of short-circuiting that accompanies the forming of the conductive bonding material film 80*a*. The structure in which the forming of the conductive bonding material film 80*a* is suppressed by the smooth surface regions 21A to 21D is especially effective when the thickness TL of the SiC semiconductor layer 2 is not less than 40 μm and not more than 200 μm.

As described above, with the SiC semiconductor device 1, the capillary phenomenon occurring at the rough surface regions 20A to 20D can be suppressed by the smooth surface regions 21A to 21D and therefore the wet-spreading of the conductive bonding material 80 at the side surfaces 5A to 5D can be suppressed. The short-circuiting due to the wet-spreading of the conductive bonding material 80 can thus be suppressed.

Also, with the SiC semiconductor device 1, the rough surface regions 20A to 20D are formed in the regions at the second main surface 4 side and the smooth surface regions 21A to 21D are formed in the regions at the first main surface 3 side with respect to the rough surface regions 20A to 20D. The flowing around of the conductive bonding material 80 to the first main surface 3 can thereby be suppressed appropriately. The short-circuiting due to the wet-spreading of the conductive bonding material 80 can thus be suppressed appropriately.

In particular, with the SiC semiconductor device 1, the rough surface regions 20A to 20D are formed in the SiC semiconductor substrate 6 and the smooth surface regions 21A to 21D are formed in the SiC epitaxial layer 7. Wet-spreading of the conductive bonding material 80 to the SiC epitaxial layer 7 can thereby be suppressed appropriately. Short-circuiting and fluctuation of electrical characteristics of the functional device (the Schottky barrier diode D in this embodiment) due to the conductive bonding material 80 can thus be suppressed.

In such a structure, the smooth surface regions 21A to 21D preferably cross the boundary between the SiC semiconductor substrate 6 and the SiC epitaxial layer 7 and are formed in the SiC semiconductor substrate 6 and the SiC epitaxial layer 7.

Also, with the SiC semiconductor device 1, the main surface insulating layer 10 and the first main surface electrode layer 12 formed on the first main surface 3 are included. The main surface insulating layer 10 has the insulating side surfaces 11A to 11D that are continuous to the side surfaces 5A to 5D. The main surface insulating layer 10 improves an insulating property between the side surfaces 5A to 5D and the first main surface electrode layer 12 in the structure in which the rough surface regions 20A to 20D are formed at the side surfaces 5A to 5D.

The wet-spreading of the conductive bonding material 80 can thereby be suppressed and at the same time, the short-circuiting due to the wet-spreading of the conductive bonding material 80 can be suppressed appropriately. Such a structure is also effective in terms of suppressing the discharge phenomenon between the conductive bonding material 80 (conductive bonding material film 80*a*) and the first main surface electrode layer 12.

Figure 13A:
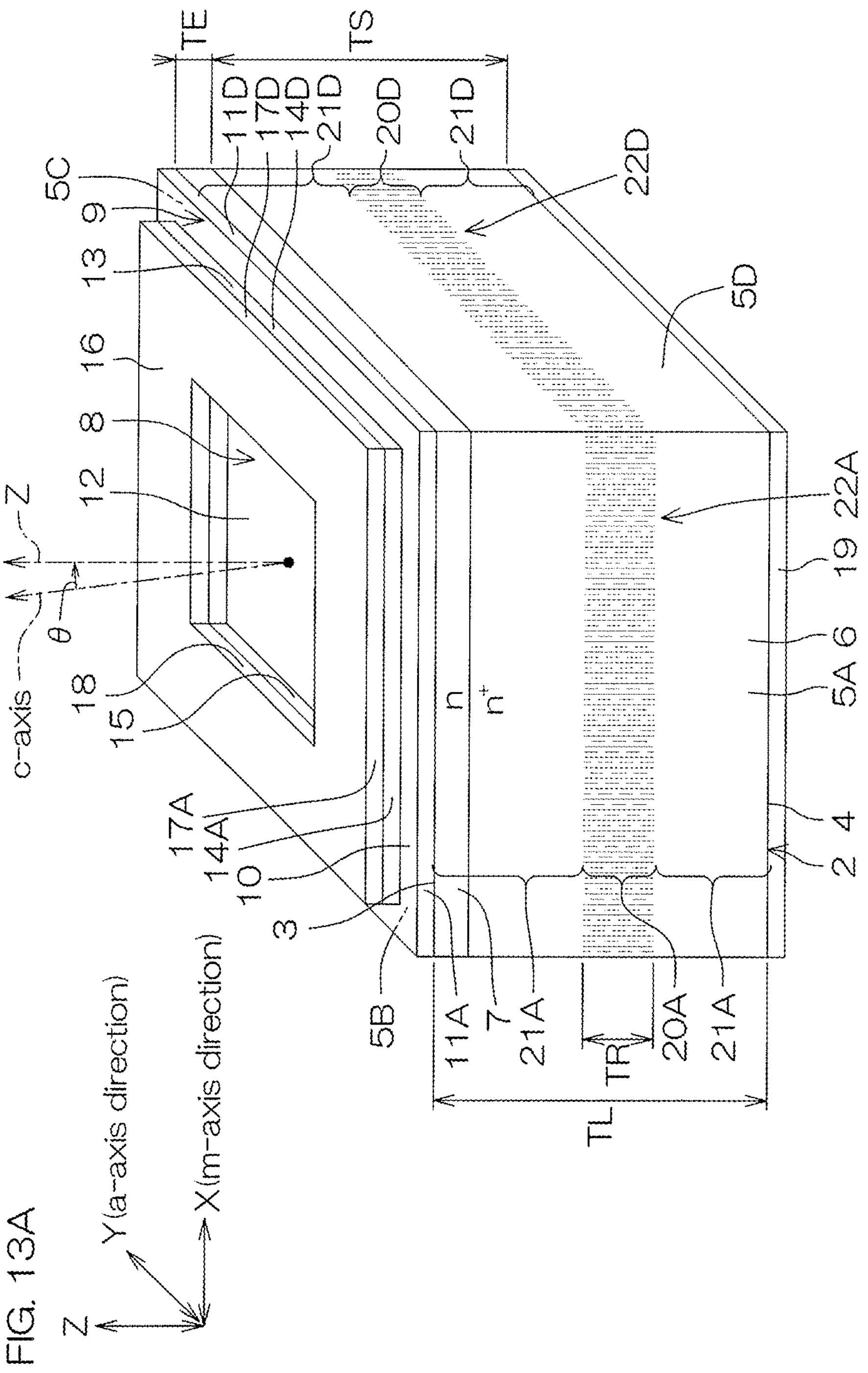
FIG. 13A is a perspective view showing the SiC semiconductor device shown in FIG. 3 and is a perspective view showing a second configuration example of the modified lines.

FIG. 13A is a perspective view of the SiC semiconductor device 1 shown in FIG. 3 and is a perspective view of a second configuration example of the modified lines 22A to 22D (the rough surface regions 20A to 20D and the smooth surface regions 21A to 21D). In the following, structures corresponding to structures described with the SiC semiconductor device 1 shall be provided with the same reference signs and description thereof shall be omitted.

The rough surface regions 20A to 20D according to the first configuration example are formed at the side surfaces 5A to 5D from the corner portions at the second main surface 4 side to the thickness direction intermediate portions of the SiC semiconductor layer 2. On the other hand, the rough surface regions 20A to 20D according to the second configuration example are formed at intervals toward the first main surface 3 side from the second main surface 4 and expose surface layer portions of the second main surface 4 from the side surfaces 5A to 5D.

Also, the rough surface regions 20A to 20D respectively include one layer each of the modified lines 22A to 22D. The modified lines 22A to 22D are respectively formed one each at thickness direction intermediate portions of the SiC semiconductor layer 2 at the side surfaces 5A to 5D in a relationship of one-to-one correspondence.

In this configuration, the smooth surface regions 21A to 21D are formed in regions of the side surfaces 5A to 5D at the second main surface 4 side in addition to the regions at the first main surface 3 side. The smooth surface regions 21A to 21D at the second main surface 4 side are formed from the second main surface 4 to thickness direction intermediate portions of the SiC semiconductor layer 2. The smooth surface regions 21A to 21D at the second main surface 4 side are formed in the SiC semiconductor substrate 6.

The rough surface regions 20A to 20D according to the second configuration example are formed by adjusting the light converging portion (focal point), etc., of the laser light in the step of forming the modified lines 70 (the rough surface regions 20A to 20D) (see also FIG. 10K).

As described above, even in a case where the rough surface regions 20A to 20D and the smooth surface regions 21A to 21D according to the second configuration example are formed, the same effects as in the case of forming the rough surface regions 20A to 20D and the smooth surface regions 21A to 21D according to the first configuration example can be exhibited.

In particular, the SiC semiconductor device 1 having the rough surface regions 20A to 20D and the smooth surface regions 21A to 21D according to the second configuration example has the smooth surface regions 21A to 21D in the regions of the side surface 5A to 5D at the second main surface 4 side as well. The wet-spreading of the conductive bonding material 80 can thereby be suppressed in the regions of the side surface 5A to 5D at the second main surface 4 side. The short-circuiting due to the wet-spreading of the conductive bonding material 80 can thus be suppressed appropriately.

Also, in the process of manufacturing the SiC semiconductor device 1, the step of grinding the SiC semiconductor wafer structure 61 is performed (FIG. 10J). By the thinned SiC semiconductor wafer structure 61 (SiC semiconductor wafer 41), the SiC semiconductor wafer structure 61 (SiC semiconductor wafer 41) can be cleaved appropriately without forming a plurality of the modified lines 70 (the rough surface regions 20A to 20D) at intervals in the normal direction Z.

In other words, the step of thinning the SiC semiconductor wafer structure 61 (SiC semiconductor wafer 41) is performed and therefore the SiC semiconductor wafer structure 61 can be cleaved appropriately by a single layer of the modified lines 70. Time reduction of the step of forming the modified lines 70 can thus be achieved.

It is thereby made unnecessary to form pluralities of the rough surface regions 20A to 20D at intervals in a thickness direction of the SiC semiconductor layer 2 at the side surfaces 5A to 5D and therefore forming areas of the rough surface regions 20A to 20D can be reduced appropriately. Wet-spreading of the conductive bonding material 80 due to the rough surface regions 20A to 20D can thereby be suppressed appropriately.

In this case, the second main surface 4 of the SiC semiconductor layer 2 is constituted of the ground surface. The SiC semiconductor device 1 preferably includes the SiC semiconductor layer 2 having the thickness TL that is not less than 40 μm and not more than 200 μm. The SiC semiconductor layer 2 having such thickness TL can be cut out appropriately from the SiC semiconductor wafer structure 61 (SiC semiconductor wafer 41).

In the SiC semiconductor layer 2, the thickness TS of the SiC semiconductor substrate 6 may be not less than 40 μm and not more than 150 μm. The thickness TE of the SiC epitaxial layer 7 in the SiC semiconductor layer 2 may be not less than 1 μm and not more than 50 μm. The thinning of the SiC semiconductor layer 2 is also effective in terms of reducing resistance value.

Figure 13B:
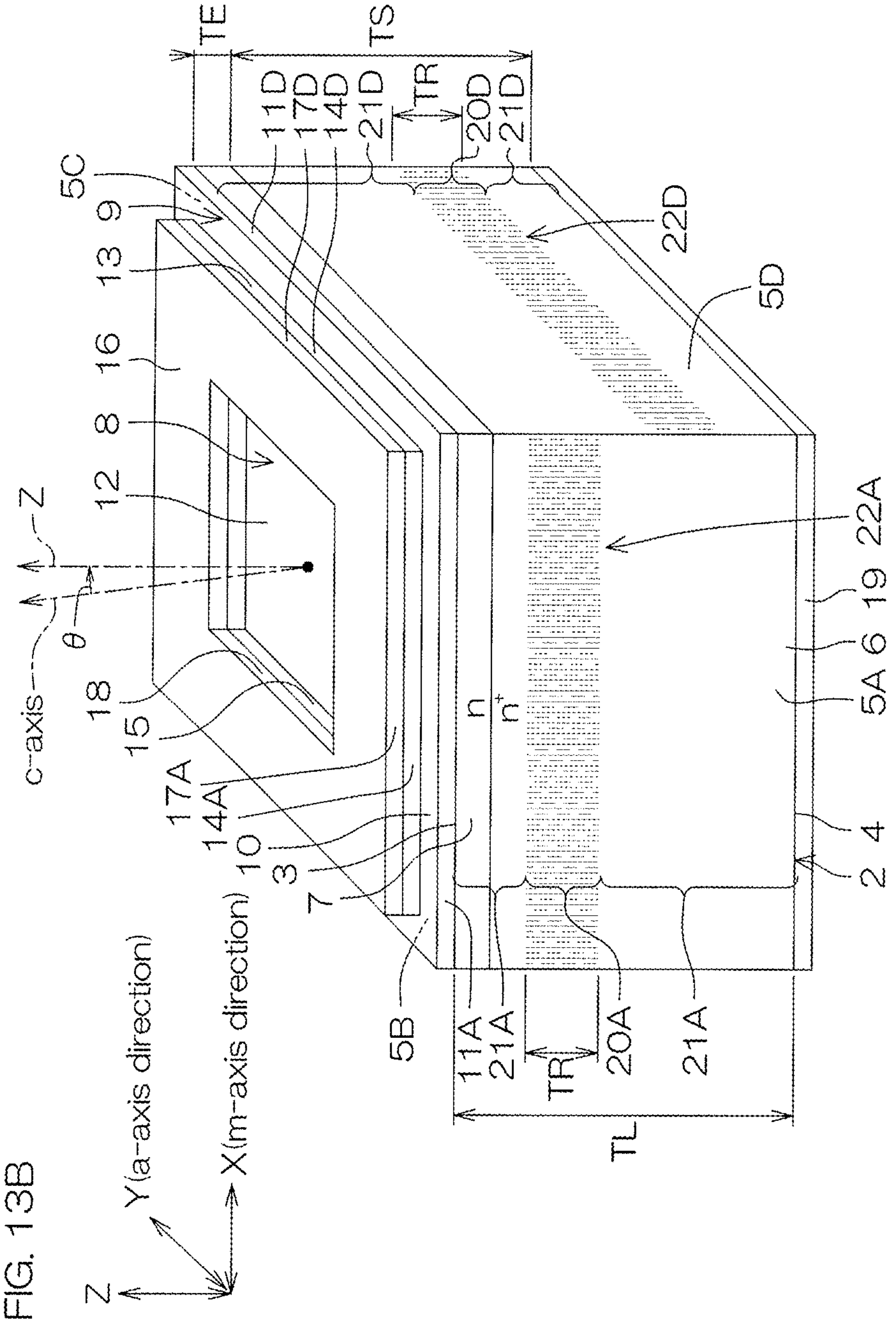
FIG. 13B is a perspective view showing the SiC semiconductor device shown in FIG. 3 and is a perspective view showing a third configuration example of the modified lines.

FIG. 13B is a perspective view of the SiC semiconductor device 1 shown in FIG. 3 and is a perspective view of a third configuration example of the modified lines 22A to 22D (the rough surface regions 20A to 20D and the smooth surface regions 21A to 21D). In the following, structures corresponding to the structures described with the SiC semiconductor device 1 shall be provided with the same reference signs and description thereof shall be omitted.

The rough surface regions 20A to 20D according to the first configuration example are continuous to each other at the corner portions connecting the side surfaces 5A to 5D. On the other hand, the rough surface regions 20A to 20D according to the third configuration example are formed at intervals from each other at the corner portions connecting the side surfaces 5A to 5D.

Also, the rough surface regions 20A to 20D are formed at intervals toward the first main surface 3 side from the second main surface 4. The rough surface regions 20A to 20D expose the surface layer portions of the second main surface 4 from the side surfaces 5A to 5D. Also, the rough surface regions 20A to 20D respectively include one layer each of the modified lines 22A to 22D. The modified lines 22A to 22D are respectively formed one each at thickness direction intermediate portions of the SiC semiconductor layer 2 at the side surfaces 5A to 5D in a relationship of one-to-one correspondence.

The rough surface region 20A and the rough surface region 20B are formed at an interval from each other in the normal direction Z at the corner portion connecting the side surface 5A and the side surface 5B. The rough surface region 20B and the rough surface region 20C are formed at an interval from each other in the normal direction Z at the corner portion connecting the side surface 5B and the side surface 5C. The rough surface region 20C and the rough surface region 20D are formed at an interval from each other in the normal direction Z at the corner portion connecting the side surface 5C and the side surface 5D. The rough surface region 20D and the rough surface region 20A are formed at an interval from each other in the normal direction Z at the corner portion connecting the side surface 5D and the side surface 5A.

At least one of the rough surface regions 20A to 20D may be formed at an interval from the others of the rough surface regions 20A to 20D at a corner portion connecting any of the side surfaces 5A to 5D. Two or three of the rough surface regions 20A to 20D may be continuous to each other at a corner portion or corner portions connecting any of the side surfaces 5A to 5D.

In this configuration, the smooth surface regions 21A to 21D are formed in regions of the side surfaces 5A to 5D at the second main surface 4 side in addition to the regions at the first main surface 3 side. The smooth surface regions 21A to 21D at the second main surface 4 side are formed from the second main surface 4 to thickness direction intermediate portions of the SiC semiconductor layer 2. The smooth surface regions 21A to 21D at the second main surface 4 side are formed in the SiC semiconductor substrate 6.

The rough surface regions 20A to 20D according to the third configuration example are formed by adjusting the light converging portion (focal point), etc., of the laser light in the step of forming the modified lines 70 (the rough surface regions 20A to 20D) (see also FIG. 10K).

As described above, even in a case where the rough surface regions 20A to 20D and the smooth surface regions 21A to 21D according to the third configuration example are formed, the same effects as in the case of forming the rough surface regions 20A to 20D and the smooth surface regions 21A to 21D according to the first configuration example and the second configuration example can be exhibited.

Figure 13C:
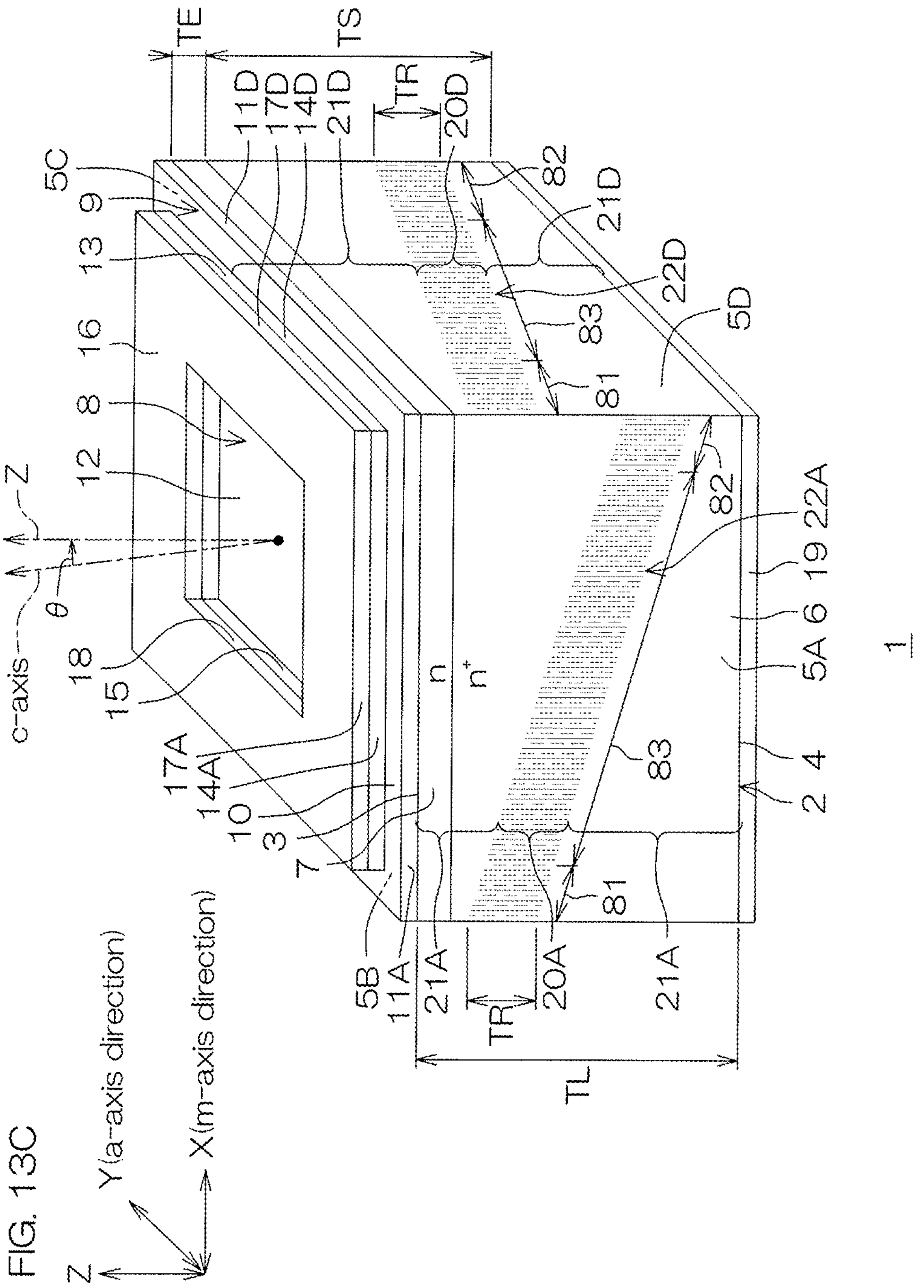
FIG. 13C is a perspective view showing the SiC semiconductor device shown in FIG. 3 and is a perspective view showing a fourth configuration example of the modified lines.

FIG. 13C is a perspective view of the siC semiconductor device 1 shown in FIG. 3 and is a perspective view of a fourth configuration example of the modified lines 22A to 22D (the rough surface regions 20A to 20D and the smooth surface regions 21A to 21D). In the following, structures corresponding to the structures described with the SiC semiconductor device 1 shall be provided with the same reference signs and description thereof shall be omitted.

The rough surface regions 20A to 20D according to the first configuration example are formed in band shapes extending rectilinearly along the tangential directions to the first main surface 3. On the other hand, the rough surface regions 20A to 20D according to the fourth configuration example are formed in band shapes extending in slope shapes inclined downwardly from the first main surface 3 toward the second main surface 4.

Also, the rough surface regions 20A to 20D are formed at intervals toward the first main surface 3 side from the second main surface 4. The rough surface regions 20A to 20D expose the surface layer portions of the second main surface 4 from the side surfaces 5A to 5D. Also, the rough surface regions 20A to 20D respectively include one layer each of the modified lines 22A to 22D. The modified lines 22A to 22D are respectively formed one each at thickness direction intermediate portions of the SiC semiconductor layer 2 at the side surfaces 5A to 5D in a relationship of one-to-one correspondence.

More specifically, the rough surface regions 20A to 20D according to the fourth configuration example each include a first end portion region 81, a second end portion region 82, and a slope region 83. The first end portion regions 81 are positioned at the first main surface 3 side in vicinities of the corner portions of the SiC semiconductor layer 2. The second end portion regions 82 are positioned at the second main surface 4 sides with respect to the first end portion regions 81 in the vicinities of the corner portions of the SiC semiconductor layer 2. The slope regions 83 are inclined downwardly from the first main surface 3 toward the second main surface 4 in regions between the first end portion regions 81 and the second end portion regions 82.

The first end portion region 81 of the rough surface region 20A and the first end portion region 81 of the rough surface region 20B may be positioned at the corner portion connecting the side surface 5A and the side surface 5B. The second end portion region 82 of the rough surface region 20A and the second end portion region 82 of the rough surface region 20B may be positioned at the corner portion connecting the side surface 5A and the side surface 5B.

The first end portion region 81 of the rough surface region 20A and the second end portion region 82 of the rough surface region 20B may be positioned at the corner portion connecting the side surface 5A and the side surface 5B. The second end portion region 82 of the rough surface region 20A and the first end portion region 81 of the rough surface region 20B may be positioned at the corner portion connecting the side surface 5A and the side surface 5B. The rough surface region 20A and the rough surface region 20B may be continuous to each other or may be formed at an interval from each other at the corner portion connecting the side surface 5A and the side surface 5B.

The first end portion region 81 of the rough surface region 20B and the first end portion region 81 of the rough surface region 20C may be positioned at the corner portion connecting the side surface 5B and the side surface 5C. The second end portion region 82 of the rough surface region 20B and the second end portion region 82 of the rough surface region 20C may be positioned at the corner portion connecting the side surface 5B and the side surface 5C.

The first end portion region 81 of the rough surface region 20B and the second end portion region 82 of the rough surface region 20C may be positioned at the corner portion connecting the side surface 5B and the side surface 5C. The second end portion region 82 of the rough surface region 20B and the first end portion region 81 of the rough surface region 20C may be positioned at the corner portion connecting the side surface 5B and the side surface 5C. The rough surface region 20B and the rough surface region 20C may be continuous to each other or may be formed at an interval from each other at the corner portion connecting the side surface 5B and the side surface 5C.

The first end portion region 81 of the rough surface region 20C and the first end portion region 81 of the rough surface region 20D may be positioned at the corner portion connecting the side surface 5C and the side surface 5D. The second end portion region 82 of the rough surface region 20C and the second end portion region 82 of the rough surface region 20D may be positioned at the corner portion connecting the side surface 5C and the side surface 5D.

The first end portion region 81 of the rough surface region 20C and the second end portion region 82 of the rough surface region 20D may be positioned at the corner portion connecting the side surface 5C and the side surface 5D. The second end portion region 82 of the rough surface region 20C and the first end portion region 81 of the rough surface region 20D may be positioned at the corner portion connecting the side surface 5C and the side surface 5D. The rough surface region 20C and the rough surface region 20D may be continuous to each other or may be formed at an interval from each other at the corner portion connecting the side surface 5C and the side surface 5D.

The first end portion region 81 of the rough surface region 20D and the first end portion region 81 of the rough surface region 20A may be positioned at the corner portion connecting the side surface 5D and the side surface 5A. The second end portion region 82 of the rough surface region 20D and the second end portion region 82 of the rough surface region 20A may be positioned at the corner portion connecting the side surface 5D and the side surface 5A.

The first end portion region 81 of the rough surface region 20D and the second end portion region 82 of the rough surface region 20A may be positioned at the corner portion connecting the side surface 5D and the side surface 5A. The second end portion region 82 of the rough surface region 20D and the first end portion region 81 of the rough surface region 20A may be positioned at the corner portion connecting the side surface 5D and the side surface 5A. The rough surface region 20D and the rough surface region 20A may be continuous to each other or may be formed at an interval from each other at the corner portion connecting the side surface 5D and the side surface 5A.

In this configuration, the smooth surface regions 21A to 21D are formed in regions of the side surfaces 5A to 5D at the second main surface 4 side in addition to the regions at the first main surface 3 side. The smooth surface regions 21A to 21D at the second main surface 4 side are formed from the second main surface 4 to thickness direction intermediate portions of the SiC semiconductor layer 2. The smooth surface regions 21A to 21D at the second main surface 4 side are formed in the SiC semiconductor substrate 6.

The rough surface regions 20A to 20D according to the fourth configuration example are formed by adjusting the light converging portion (focal point), etc., of the laser light in the step of forming the modified lines 70 (the rough surface regions 20A to 20D) (see also FIG. 10K).

As described above, even in a case where the rough surface regions 20A to 20D and the smooth surface regions 21A to 21D according to the fourth configuration example are formed, the same effects as in the case of forming the rough surface regions 20A to 20D and the smooth surface regions 21A to 21D according to the first configuration example and the second configuration example can be exhibited.

In particular, with the modified lines 70 that are to be bases of the rough surface regions 20A to 20D according to the fourth configuration example, the cleaving starting points can be formed in different regions in a thickness direction of the SiC semiconductor wafer structure 61 (SiC semiconductor wafer 41). The SiC semiconductor wafer structure 61 can thereby be cleaved appropriately even when the modified lines 70 (the rough surface regions 20A to 20D) constituted of a single layer are formed.

Figure 13D:
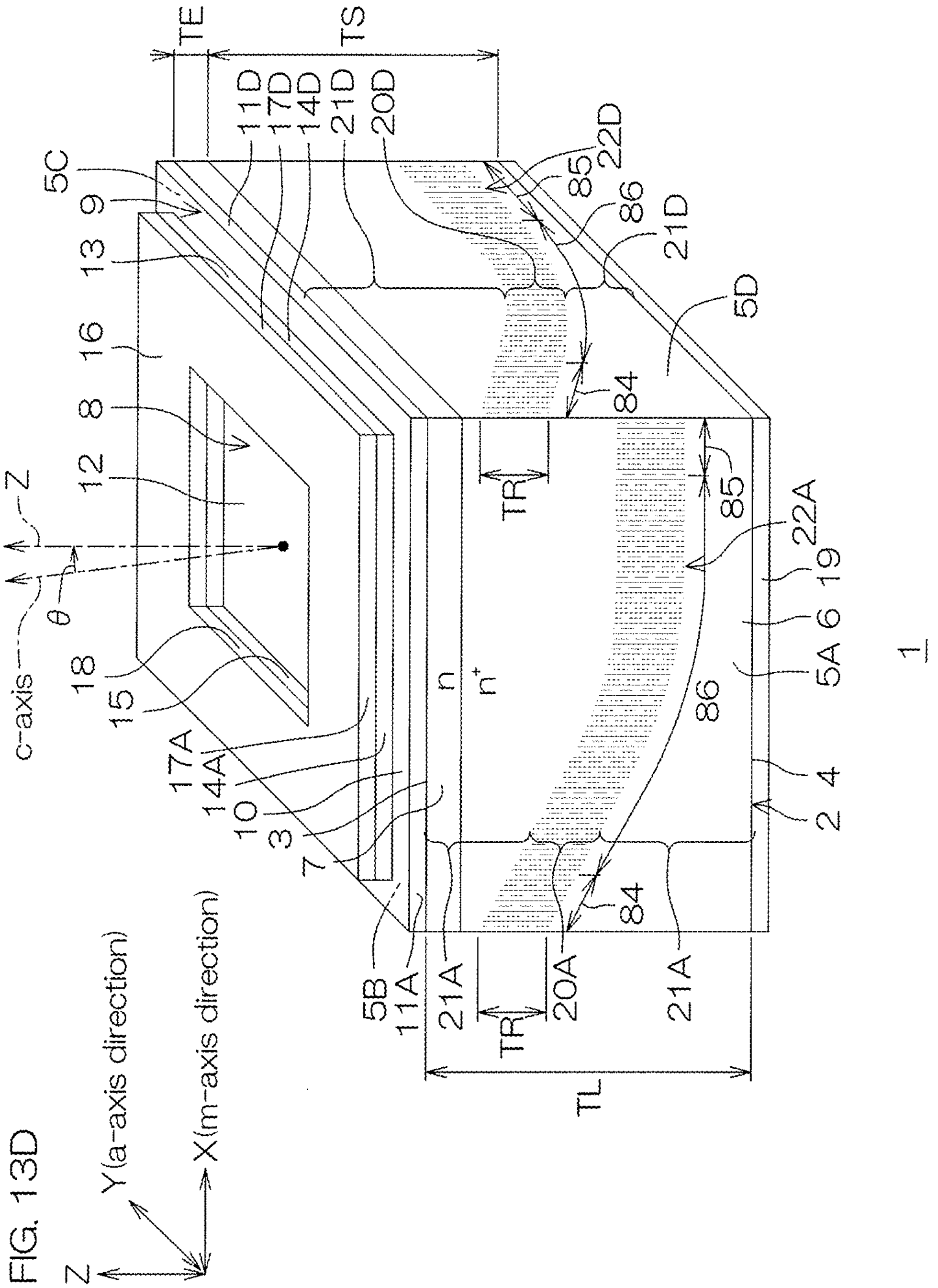
FIG. 13D is a perspective view showing the SiC semiconductor device shown in FIG. 3 and is a perspective view showing a fifth configuration example of the modified lines.

FIG. 13D is a perspective view of the SiC semiconductor device 1 shown in FIG. 3 and is a perspective view of a fifth configuration example of the modified lines 22A to 22D (the rough surface regions 20A to 20D and the smooth surface regions 21A to 21D). In the following, structures corresponding to the structures described with the SiC semiconductor device 1 shall be provided with the same reference signs and description thereof shall be omitted.

The rough surface regions 20A to 20D according to the first configuration example are formed in band shapes extending rectilinearly along the tangential directions to the first main surface 3. On the other hand, the rough surface regions 20A to 20D according to the fifth configuration example are formed in band shapes extending such as to be inclined downwardly in curves (curved shapes) from the first main surface 3 toward the second main surface 4.

Also, the rough surface regions 20A to 20D are formed at intervals toward the first main surface 3 side from the second main surface 4. The rough surface regions 20A to 20D expose the surface layer portions of the second main surface 4 from the side surfaces 5A to 5D. Also, the rough surface regions 20A to 20D respectively include one layer each of the modified lines 22A to 22D. The modified lines 22A to 22D are respectively formed one each at thickness direction intermediate portions of the SiC semiconductor layer 2 at the side surfaces 5A to 5D in a relationship of one-to-one correspondence.

More specifically, the rough surface regions 20A to 20D according to the fifth configuration example each include a first end portion region 84, a second end portion region 85, and a curved region 86. The first end portion regions 84 are positioned at the first main surface 3 side in vicinities of the corner portions of the SiC semiconductor layer 2. The second end portion regions 85 are positioned at the second main surface 4 side with respect to the first end portion regions 84 in the vicinities of the corner portions of the SiC semiconductor layer 2. The curved regions 86 are inclined downwardly from the first main surface 3 toward the second main surface 4 in concavely curved shapes and connect the first end portion regions 84 and the second end portion regions 85. The curved regions 86 may be inclined downwardly from the first main surface 3 toward the second main surface 4 in convexly curved shapes.

The first end portion region 84 of the rough surface region 20A and the first end portion region 84 of the rough surface region 20B may be positioned at the corner portion connecting the side surface 5A and the side surface 5B. The second end portion region 85 of the rough surface region 20A and the second end portion region 85 of the rough surface region 20B may be positioned at the corner portion connecting the side surface 5A and the side surface 5B.

The first end portion region 84 of the rough surface region 20A and the second end portion region 85 of the rough surface region 20B may be positioned at the corner portion connecting the side surface 5A and the side surface 5B. The second end portion region 85 of the rough surface region 20A and the first end portion region 84 of the rough surface region 20B may be positioned at the corner portion connecting the side surface 5A and the side surface 5B. The rough surface region 20A and the rough surface region 20B may be continuous to each other or may be formed at an interval from each other at the corner portion connecting the side surface 5A and the side surface 5B.

The first end portion region 84 of the rough surface region 20B and the first end portion region 84 of the rough surface region 20C may be positioned at the corner portion connecting the side surface 5B and the side surface 5C. The second end portion region 85 of the rough surface region 20B and the second end portion region 85 of the rough surface region 20C may be positioned at the corner portion connecting the side surface 5B and the side surface 5C.

The first end portion region 84 of the rough surface region 20B and the second end portion region 85 of the rough surface region 20C may be positioned at the corner portion connecting the side surface 5B and the side surface 5C. The second end portion region 85 of the rough surface region 20B and the first end portion region 84 of the rough surface region 20C may be positioned at the corner portion connecting the side surface 5B and the side surface 5C. The rough surface region 20B and the rough surface region 20C may be continuous to each other or may be formed at an interval from each other at the corner portion connecting the side surface 5B and the side surface 5C.

The first end portion region 84 of the rough surface region 20C and the first end portion region 84 of the rough surface region 20D may be positioned at the corner portion connecting the side surface 5C and the side surface 5D. The second end portion region 85 of the rough surface region 20C and the second end portion region 85 of the rough surface region 20D may be positioned at the corner portion connecting the side surface 5C and the side surface 5D.

The first end portion region 84 of the rough surface region 20C and the second end portion region 85 of the rough surface region 20D may be positioned at the corner portion connecting the side surface 5C and the side surface 5D. The second end portion region 85 of the rough surface region 20C and the first end portion region 84 of the rough surface region 20D may be positioned at the corner portion connecting the side surface 5C and the side surface 5D. The rough surface region 20C and the rough surface region 20D may be continuous to each other or may be formed at an interval from each other at the corner portion connecting the side surface 5C and the side surface 5D.

The first end portion region 84 of the rough surface region 20D and the first end portion region 84 of the rough surface region 20A may be positioned at the corner portion connecting the side surface 5D and the side surface 5A. The second end portion region 85 of the rough surface region 20D and the second end portion region 85 of the rough surface region 20A may be positioned at the corner portion connecting the side surface 5D and the side surface 5A.

The first end portion region 84 of the rough surface region 20D and the second end portion region 85 of the rough surface region 20A may be positioned at the corner portion connecting the side surface 5D and the side surface 5A. The second end portion region 85 of the rough surface region 20D and the first end portion region 84 of the rough surface region 20A may be positioned at the corner portion connecting the side surface 5D and the side surface 5A. The rough surface region 20D and the rough surface region 20A may be continuous to each other or may be formed at an interval from each other at the corner portion connecting the side surface 5D and the side surface 5A.

In this configuration, the smooth surface regions 21A to 21D are formed in regions of the side surfaces 5A to 5D at the second main surface 4 side in addition to the regions at the first main surface 3 side. The smooth surface regions 21A to 21D at the second main surface 4 side are formed from the second main surface 4 to thickness direction intermediate portions of the SiC semiconductor layer 2. The smooth surface regions 21A to 21D at the second main surface 4 side are formed in the SiC semiconductor substrate 6.

The rough surface regions 20A to 20D according to the fifth configuration example are formed by adjusting the light converging portion (focal point), etc., of the laser light in the step of forming the modified lines 70 (the rough surface regions 20A to 20D) (see also FIG. 10K).

As described above, even in a case where the rough surface regions 20A to 20D and the smooth surface regions 21A to 21D according to the fifth configuration example are formed, the same effects as in the case of forming the rough surface regions 20A to 20D and the smooth surface regions 21A to 21D according to the first configuration example and the second configuration example can be exhibited.

In particular, with the modified lines 70 that are to be bases of the rough surface regions 20A to 20D according to the fifth configuration example, the cleaving starting points can be formed in different regions in the thickness direction of the SiC semiconductor wafer structure 61 (SiC semiconductor wafer 41). The SiC semiconductor wafer structure 61 can thereby be cleaved appropriately even when the modified lines 70 (the rough surface regions 20A to 20D) constituted of a single layer are formed.

Figure 13E:
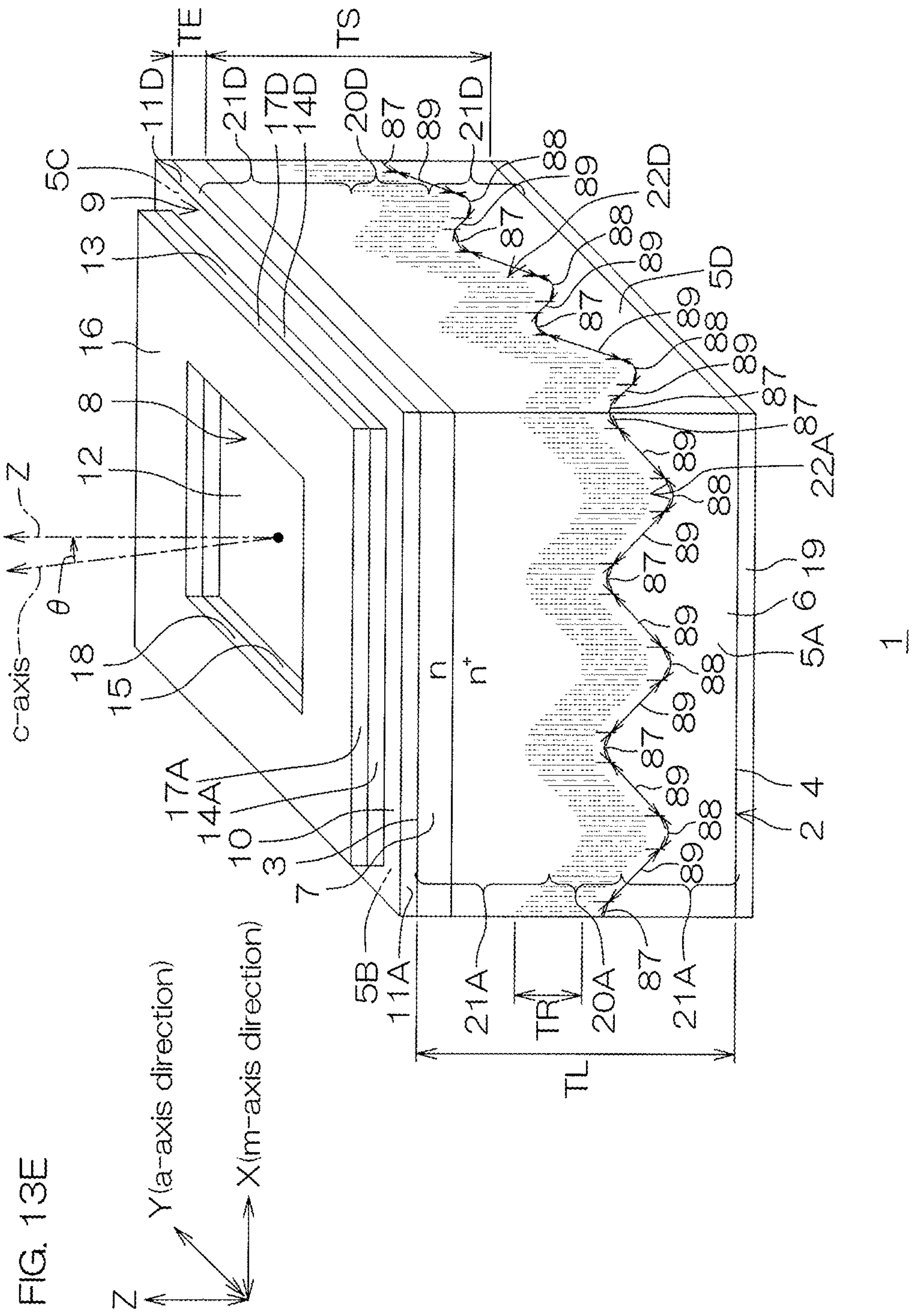
FIG. 13E is a perspective view showing the SiC semiconductor device shown in FIG. 3 and is a perspective view showing a sixth configuration example of the modified lines.

FIG. 13E is a perspective view of the SiC semiconductor device 1 shown in FIG. 3 and is a perspective view of a sixth configuration example of the modified lines 22A to 22D (the rough surface regions 20A to 20D and the smooth surface regions 21A to 21D). In the following, structures corresponding to the structures described with the SiC semiconductor device 1 shall be provided with the same reference signs and description thereof shall be omitted.

The rough surface regions 20A to 20D according to the first configuration example are formed in band shapes extending rectilinearly along the tangential directions to the first main surface 3. On the other hand, the rough surface regions 20A to 20D according to the sixth configuration example are formed in band shapes extending in curves (curved shapes) meandering from the first main surface 3 toward the second main surface 4.

Also, the rough surface regions 20A to 20D are formed at intervals toward the first main surface 3 side from the second main surface 4. The rough surface regions 20A to 20D expose the surface layer portions of the second main surface 4 from the side surfaces 5A to 5D. Also, the rough surface regions 20A to 20D respectively include one layer each of the modified lines 22A to 22D. The modified lines 22A to 22D are respectively formed one each at thickness direction intermediate portions of the SiC semiconductor layer 2 at the side surfaces 5A to 5D in a relationship of one-to-one correspondence.

More specifically, the rough surface regions 20A to 20D each include a plurality of first regions 87, a plurality of second regions 88, and a plurality of connecting regions 89. The plurality of first regions 87 are positioned at regions at the first main surface 3 side. The plurality of second regions 88 are positioned at regions at the second main surface 4 side with respect to the plurality of first regions 87. Each of the plurality of curved regions 86 connects the corresponding first region 87 and second region 88.

The rough surface region 20A and the rough surface region 20B may be continuous to each other or may be formed at an interval from each other at the corner portion connecting the side surface 5A and the side surface 5B. The rough surface region 20B and the rough surface region 20C may be continuous to each other or may be formed at an interval from each other at the corner portion connecting the side surface 5B and the side surface 5C.

The rough surface region 20C and the rough surface region 20D may be continuous to each other or may be formed at an interval from each other at the corner portion connecting the side surface 5C and the side surface 5D. The rough surface region 20D and the rough surface region 20A may be continuous to each other or may be formed at an interval from each other at the corner portion connecting the side surface 5D and the side surface 5A.

In this configuration, the smooth surface regions 21A to 21D are formed in regions of the side surfaces 5A to 5D at the second main surface 4 side in addition to the regions at the first main surface 3 side. The smooth surface regions 21A to 21D at the second main surface 4 side are formed from the second main surface 4 to thickness direction intermediate portions of the SiC semiconductor layer 2. The smooth surface regions 21A to 21D at the second main surface 4 side are formed in the SiC semiconductor substrate 6.

Meandering cycles of the rough surface regions 20A to 20D are arbitrary. The rough surface regions 20A to 20D may each be formed in a band shape extending in a concavely curved shape from the first main surface 3 toward the second main surface 4. In this case, each of the rough surface regions 20A to 20D may include two first regions 87, one second region 88, and two connecting regions 89.

Also, the rough surface regions 20A to 20D may each be formed in a band shape extending in a convexly curved shape from the second main surface 4 toward the first main surface 3. In this case, each of the rough surface regions 20A to 20D may include one first region 87, two second regions 88, and two connecting regions 89.

The rough surface regions 20A to 20D according to the sixth configuration example are formed by adjusting the light converging portion (focal point), etc., of the laser light in the step of forming the modified lines 70 (the rough surface regions 20A to 20D) (see also FIG. 10K).

As described above, even in a case where the rough surface regions 20A to 20D and the smooth surface regions 21A to 21D according to the sixth configuration example are formed, the same effects as in the case of forming the rough surface regions 20A to 20D and the smooth surface regions

21A to 21D according to the first configuration example and the second configuration example can be exhibited.

In particular, with the modified lines 70 that are to be bases of the rough surface regions 20A to 20D according to the sixth configuration example, the cleaving starting points can be formed in different regions in the thickness direction of the SiC semiconductor wafer structure 61 (SiC semiconductor wafer 41). The SiC semiconductor wafer structure 61 can thereby be cleaved appropriately even when the modified lines 70 (the rough surface regions 20A to 20D) constituted of a single layer are formed.

Figure 13F:
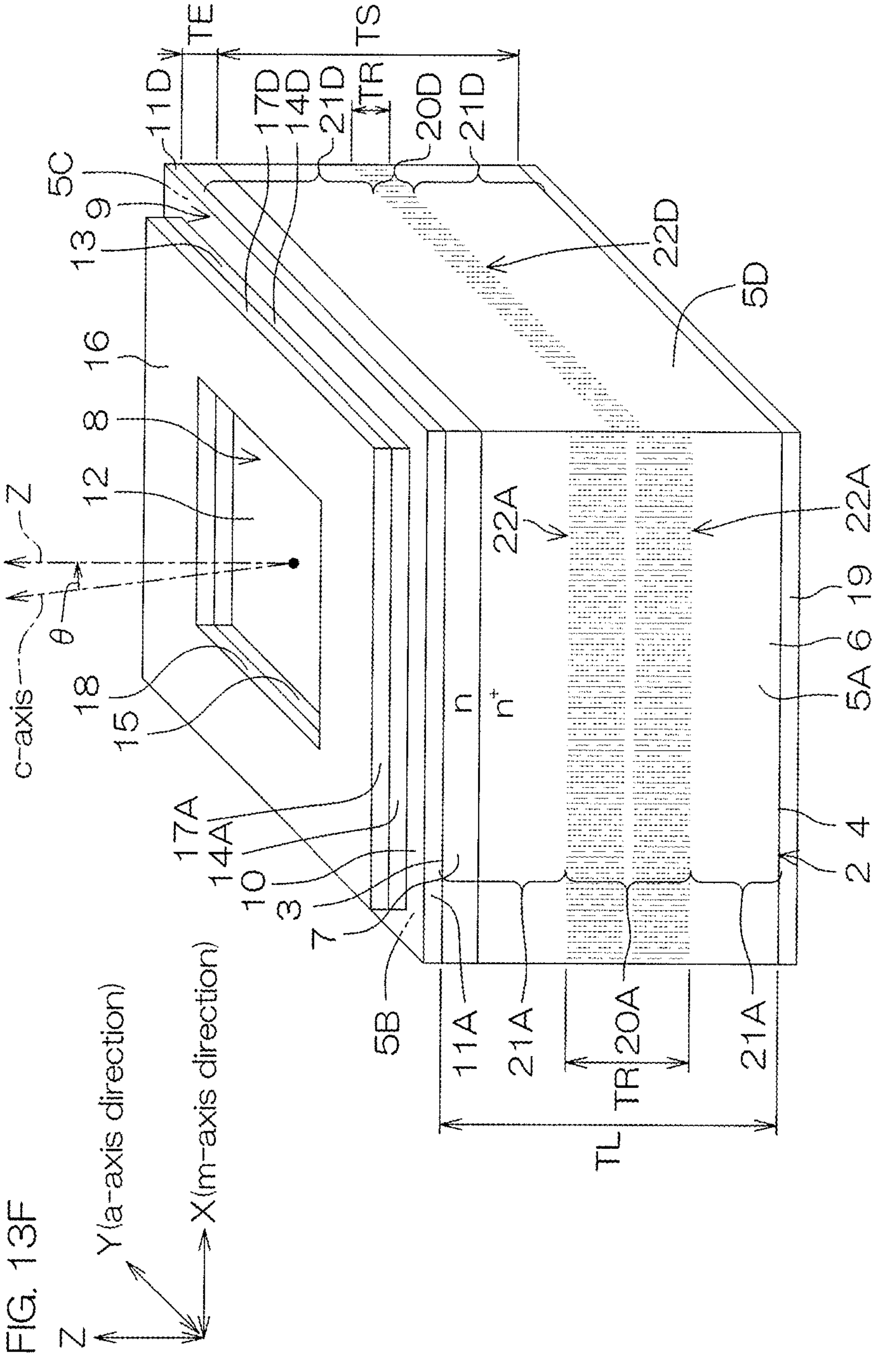
FIG. 13F is a perspective view showing the SiC semiconductor device shown in FIG. 3 and is a perspective view showing a seventh configuration example of the modified lines.

FIG. 13F is a perspective view of the SiC semiconductor device 1 shown in FIG. 3 and is a perspective view of a seventh configuration example of the modified lines 22A to 22D (the rough surface regions 20A to 20D and the smooth surface regions 21A to 21D). In the following, structures corresponding to the structures described with the SiC semiconductor device 1 shall be provided with the same reference signs and description thereof shall be omitted.

The rough surface regions 20A to 20D according to the first configuration example are formed to equal shapes at the side surfaces 5A to 5D. On the other hand, the rough surface regions 20A to 20D according to the seventh configuration example are formed at different occupying ratios RA, RB, RC, and RD at the side surfaces 5A to 5D. The occupying ratios RA to RD are ratios of the rough surface regions 20A to 20D occupying the side surfaces 5A to 5D occupied.

Also, the rough surface regions 20A to 20D are formed at intervals toward the first main surface 3 side from the second main surface 4. The rough surface regions 20A to 20D expose the surface layer portions of the second main surface 4 from the side surfaces 5A to 5D. The rough surface regions 20A to 20D respectively include two layers each of the modified lines 22A and 22C and the rough surface regions 20B and 20D respectively include one layer each of the modified lines 22B and 22D. The modified lines 22A to 22D may instead be respectively formed one each at thickness direction intermediate portions of the SiC semiconductor layer 2 at the side surfaces 5A to 5D in a relationship of one-to-one correspondence.

The occupying ratios RA to RD differ in accordance with the crystal planes of the SiC monocrystal. The occupying ratios RB and RD of the rough surface regions 20B and 20D formed at the m-planes of the SiC monocrystal are not more than the occupying ratios RA and RC of the rough surface regions 20A and 20C formed at the a-planes of the SiC monocrystal (RB, RDSRA, RC). More specifically, the occupying ratios RB and RD are less than occupying ratios RA and RC (RB, RD<RA, RC).

The occupying ratios RA and RC of the rough surface regions 20A and 20C may be mutually equal or may be mutually different. The occupying ratios RB and RD of the rough surface regions 20B and 20D may be mutually equal or may be mutually different.

In this configuration, surface areas of the rough surface regions 20B and 20D with respect to the side surfaces 5B and 5D are less than surface areas of the rough surface regions 20A and 20C with respect to the side surfaces 5A and 5C. In this configuration, the thicknesses TR of the rough surface regions 20B and 20D are less than the thicknesses TR of the rough surface regions 20A and 20C.

In this configuration, the smooth surface regions 21A to 21D are formed in regions of the side surfaces 5A to 5D at the second main surface 4 side in addition to the regions at the first main surface 3 side. The smooth surface regions 21A to 21D at the second main surface 4 side are formed from the second main surface 4 to thickness direction intermediate portions of the SiC semiconductor layer 2. The smooth surface regions 21A to 21D at the second main surface 4 side are formed in the SiC semiconductor substrate 6.

The rough surface regions 20A to 20D according to the seventh configuration example are formed by adjusting the light converging portion (focal point), etc., of the laser light in the step of forming the modified lines 70 (the rough surface regions 20A to 20D) (see also FIG. 10K).

As described above, even in a case where the rough surface regions 20A to 20D and the smooth surface regions 21A to 21D according to the seventh configuration example are formed, the same effects as in the case of forming the rough surface regions 20A to 20D and the smooth surface regions 21A to 21D according to the first configuration example and the second configuration example can be exhibited.

In particular, the rough surface regions 20A to 20D according to the seventh configuration example are respectively formed at the different occupying ratios RA to RD at the side surfaces 5A to 5D. More specifically, the rough surface regions 20A to 20D have occupying ratios RA to RD that differ in accordance with the crystal planes of the SiC monocrystal. The occupying ratios RB and RD of the rough surface regions 20B and 20D formed at the m-planes of the SiC monocrystal are not more than the occupying ratios RA and RC of the rough surface regions 20A and 20C formed at the a-planes of the SiC monocrystal (RB, RDSRA, RC).

In a plan view of viewing the c-plane (silicon plane) from the c-axis, the SiC monocrystal has a physical property of cracking easily along the nearest atom directions (see also FIG. 1 and FIG. 2) and not cracking easily along directions intersecting the nearest atom directions. The nearest atom directions are the a-axis direction and directions equivalent thereto. The crystal planes oriented along the nearest atom directions are the m-planes and planes equivalent thereto. The directions intersecting the nearest atom directions are the m-axis direction and directions equivalent thereto. The crystal planes oriented along the directions intersecting the nearest atom directions are the a-planes and planes equivalent thereto.

Therefore, even if, in the step of forming the modified lines 70 (the rough surface regions 20A to 20D), the modified lines 70 (the rough surface regions 20A to 20D) having comparatively large occupying ratios are not formed at the crystal planes oriented along the nearest atom directions of the SiC monocrystal, the SiC monocrystal can be cut (cleaved) appropriately because these crystal planes have the property of cracking comparatively easily (see also FIG. 10L).

That is, in the step of forming the modified lines 70 (the rough surface regions 20A to 20D), the occupying ratios of the modified lines 70 (the rough surface regions 20A to 20D) oriented along the second cutting schedule lines 55 extending in the a-axis direction can be made smaller than the occupying ratios of the modified lines 70 (the rough surface regions 20A to 20D) oriented along the first cutting schedule lines 54 extending in the m-axis direction.

On the other hand, the modified lines 70 having the comparatively large occupying ratios are formed at the crystal planes oriented along the directions intersecting the nearest atom directions of the SiC monocrystal. Inappropriate cutting (cleaving) of the SiC semiconductor wafer structure 61 can thereby be suppressed and generation of cracks due to the physical property of the SiC monocrystal can thus be suppressed appropriately.

Thus, with the rough surface regions 20A to 20D and the smooth surface regions 21A to 21D according to the seventh configuration example, the physical property of the SiC monocrystal can be used to adjust and reduce the occupying ratios RA to RD of the rough surface regions 20A to 20D with respect to the side surfaces 5A to 5D. In other words, the physical property of the SiC monocrystal can be used to increase occupying ratios of the smooth surface regions 21A to 21D with respect to the side surfaces 5A to 5D. Consequently, the short-circuiting due to the wet-spreading of the conductive bonding material 80 can be suppressed appropriately. Time reduction of the step of forming the modified lines 70 can also be achieved.

The occupying ratios RA to RD may be adjusted by the surface areas of the rough surface regions 20A to 20D with respect to the side surfaces 5A to 5D. The occupying ratios RA to RD may be adjusted by the thicknesses TR of the rough surface regions 20A to 20D. The occupying ratios RA to RD may be adjusted by the numbers of layers of the modified lines 22A to 22D included in the rough surface regions 20A to 20D.

Figure 13G:
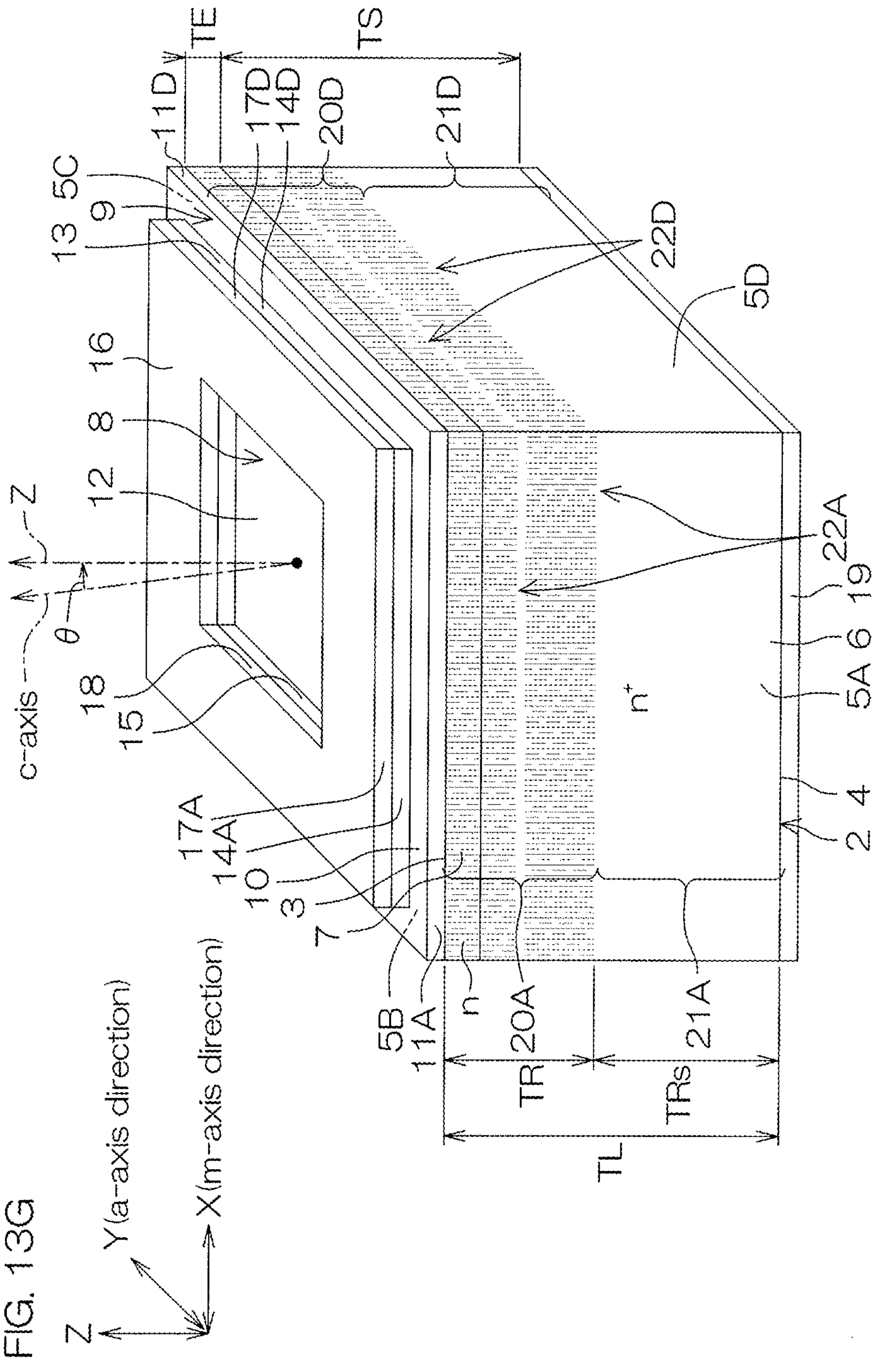
FIG. 13G is a perspective view showing the SiC semiconductor device shown in FIG. 3 and is a perspective view showing an eighth configuration example of the modified lines.

FIG. 13G is a perspective view of the SiC semiconductor device 1 shown in FIG. 3 and is a perspective view of an eighth configuration example of the modified lines 22A to 22D (the rough surface regions 20A to 20D and the smooth surface regions 21A to 21D). In the following, structures corresponding to the structures described with the siC semiconductor device 1 shall be provided with the same reference signs and description thereof shall be omitted.

In the first configuration example, the rough surface regions 20A to 20D are formed in the regions of the side surfaces 5A to 5D at the second main surface 4 side and the smooth surface regions 21A to 21D are formed in the regions of the side surfaces 5A to 5D at the first main surface 3 side. On the other hand, in the eighth configuration example, the rough surface regions 20A to 20D are formed in regions of the side surfaces 5A to 5D at the first main surface 3 side and the smooth surface regions 21A to 21D are formed in regions of the side surfaces 5A to 5D at the second main surface 4 side. In this configuration, the rough surface regions 20A to 20D respectively include two layers each of the modified lines 22A to 22D.

More specifically, the rough surface regions 20A to 20D are formed at intervals toward the first main surface 3 side from the second main surface 4 at the side surfaces 5A to 5D. The rough surface regions 20A to 20D expose surface layer portions of the second main surface 4 from the side surfaces 5A to 5D.

In this configuration, the rough surface regions 20A to 20D are formed in the SiC epitaxial layer 7. More specifically, the rough surface regions 20A to 20D cross the boundary between the SiC semiconductor substrate 6 and the SiC epitaxial layer 7 and are formed in both the SiC epitaxial layer 7 and the SiC semiconductor substrate 6.

The smooth surface regions 21A to 21D are formed from the second main surface 4 to thickness direction intermediate portions of the SiC semiconductor layer 2. In regions of the side surface 5A to 5D at the second main surface 4 side, the smooth surface regions 21A to 21D are formed in the SiC semiconductor substrate 6.

In this configuration, the first main surface 3 is formed in a mounting surface and the second main surface 4 is formed in a non-mounting surface. That is, the SiC semiconductor layer 2 is face-down mounted on a connection object in a posture where the first main surface 3 opposes the connection object.

The rough surface regions 20A to 20D according to the eighth configuration example are formed by adjusting the light converging portion (focal point), etc., of the laser light in the step of forming the modified lines 70 (the rough surface regions 20A to 20D) (see also FIG. 10K).

As described above, in a case where the rough surface regions 20A to 20D and the smooth surface regions 21A to 21D according to the eighth configuration example are formed, the conductive bonding material 80 can be suppressed from wet-spreading toward the second main surface 4 side from the first main surface 3 side. Therefore, the same effects as in the case of forming the rough surface regions 20A to 20D and the smooth surface regions 21A to 21D according to the first configuration example can be exhibited.

The SiC semiconductor device 1 that includes at least two types of the modified lines 22A to 22D (the rough surface regions 20A to 20D and the smooth surface regions 21A to 21D) according to the first configuration example, second configuration example, third configuration example, fourth configuration example, fifth configuration example, sixth configuration example, seventh configuration example, and eighth configuration example (hereinafter referred to simply as the "first to eighth configuration examples") at the same time may be formed.

Also, features of the modified lines 22A to 22D (the rough surface regions 20A to 20D and the smooth surface regions 21A to 21D) according to the first to eighth configuration examples may be combined among each other in any mode or any configuration. That is, the modified lines 22A to 22D (the rough surface regions 20A to 20D and the smooth surface regions 21A to 21D) having configurations combining at least two features among the features of the modified lines 22A to 22D (the rough surface regions 20A to 20D and the smooth surface regions 21A to 21D) according to the first to eighth configuration examples may be adopted.

In the second to seventh configuration examples, the smooth surface regions 21A to 21D are formed in the regions of the side surfaces 5A to 5D at the second main surface 4 side. Therefore, with the SiC semiconductor device 1 shown in any of the second to seventh configuration examples, the SiC semiconductor layer 2 may be face-down mounted on a connection object in an posture where the first main surface 3 opposes the connection object as in the eighth configuration example. That is, in the second to seventh configuration examples, the first main surface 3 may be the mounting surface and the second main surface 4 may be the non-mounting surface.

Also, the features of the rough surface regions 20A to 20D (the smooth surface regions 21A to 21D) according to the fourth configuration example may be combined with the features of the rough surface regions 20A to 20D (the smooth surface regions 21A to 21D) according to the sixth configuration example. In this case, band-shaped rough surface regions 20A to 20D inclined downwardly from the first main surface 3 toward the second main surface 4 and extending in curves (curved shapes) meandering from the first main surface 3 toward the second main surface 4 are formed.

The structures of modified lines 22A to 22D according to ninth to fifteenth configuration examples shall now be described with reference to FIG. 13H to FIG. 13S. In each of the ninth to fifteenth configuration examples, the SiC semiconductor device 1 that enables influences on the SiC semiconductor layer 2 due to the modified lines 22A to 22D to be reduced is provided.

Figure 13H:
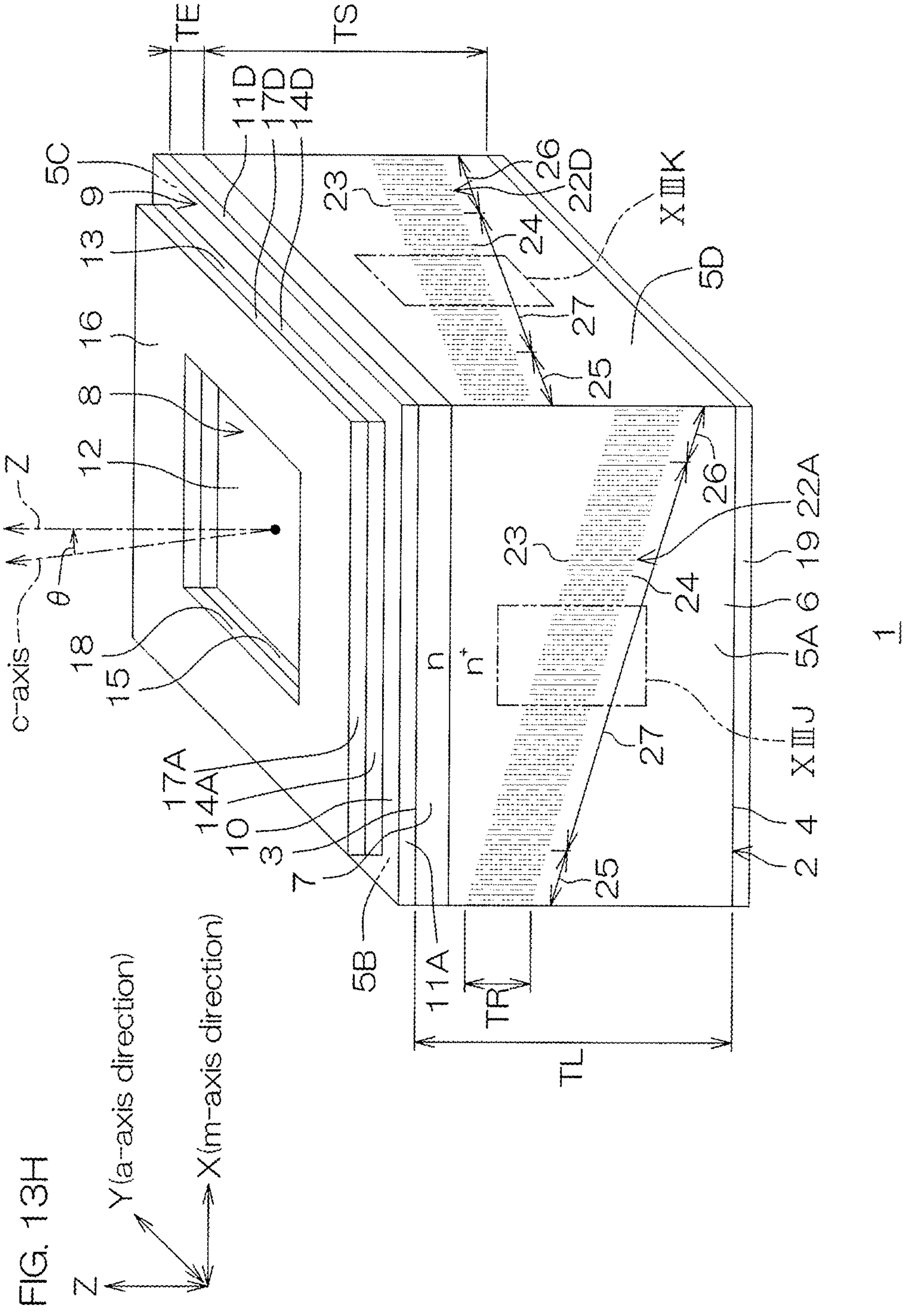
FIG. 13H is a perspective view as viewed from one angle of the SiC semiconductor device shown in FIG. 3 and is a perspective view of the ninth configuration example of the modified lines.
Figure 13I:
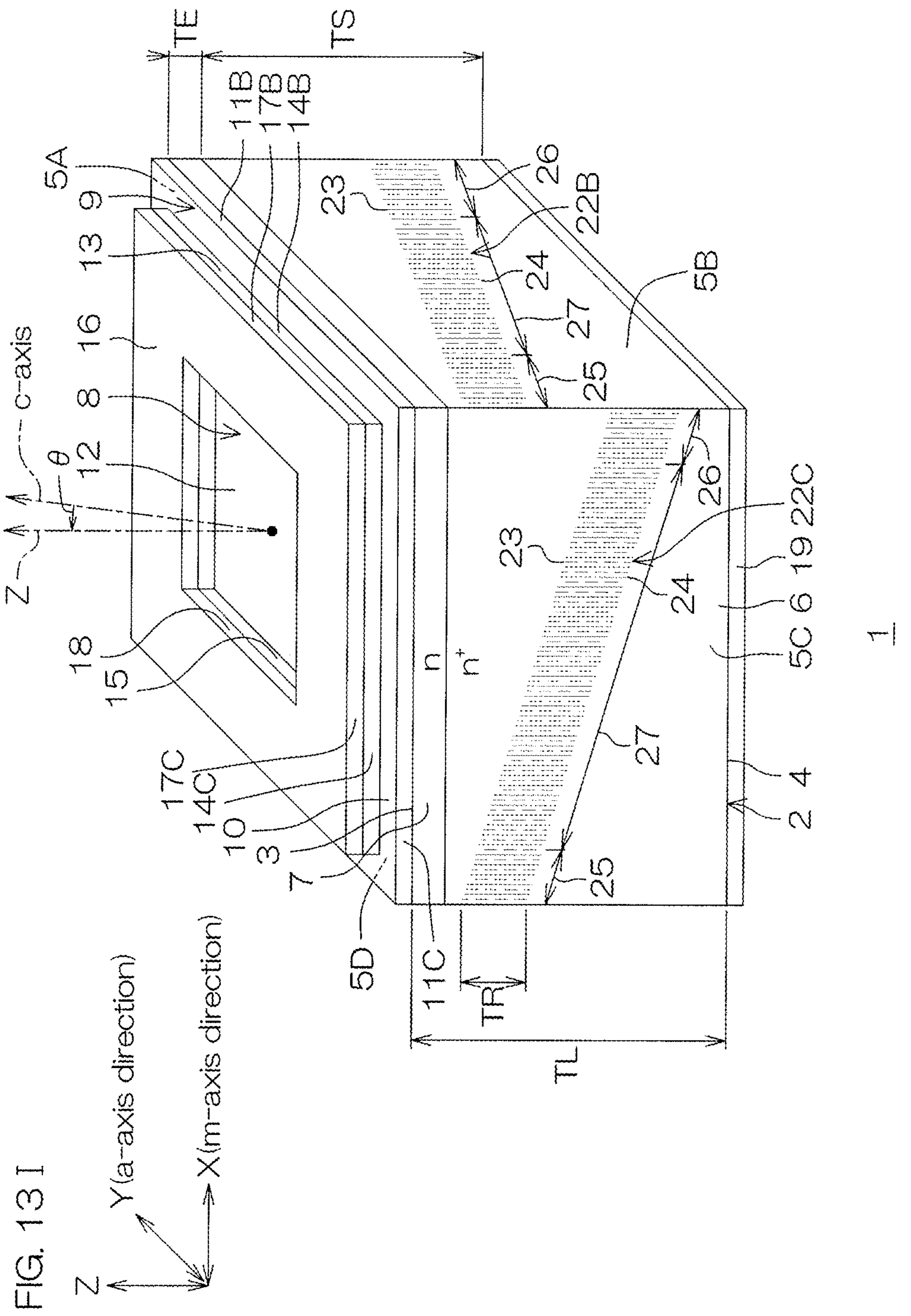
FIG. 13I is a perspective view as viewed from another angle of the SiC semiconductor device shown in FIG. 13H.
Figure 13J:
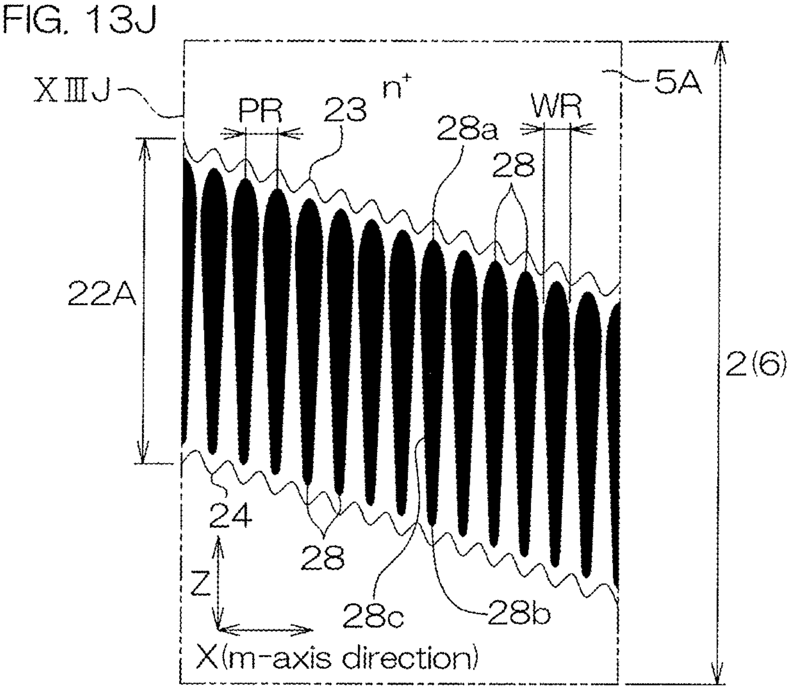
FIG. 13J is an enlarged view of a region XIIIJ shown in FIG. 13H.
Figure 13K:
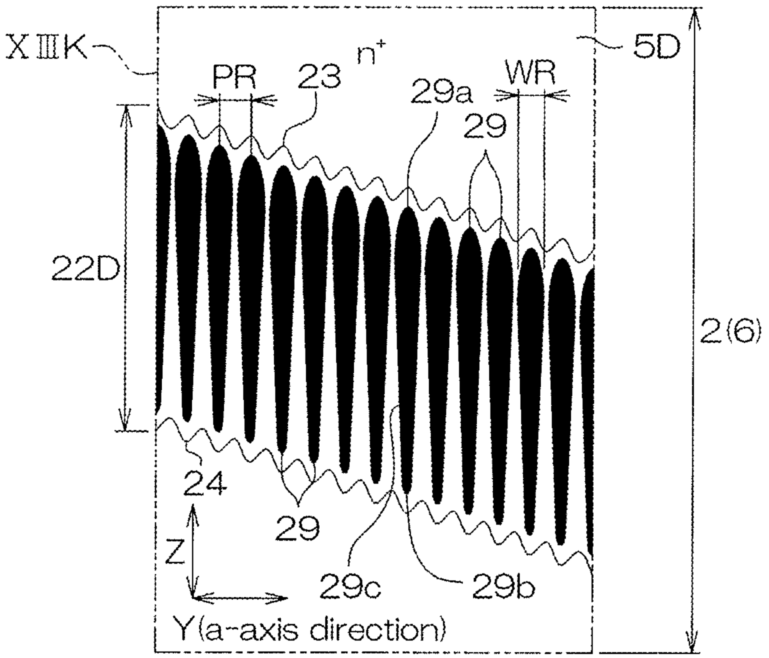
FIG. 13K is an enlarged view of a region XIIIK shown in FIG. 13H.

FIG. 13H is a perspective view as viewed from one angle of the SiC semiconductor device 1 shown in FIG. 3 and is a perspective view of the ninth configuration example of the modified lines 22A to 22D. FIG. 13I is a perspective view as viewed from another angle of the SiC semiconductor device 1 shown in FIG. 13H. FIG. 13J is an enlarged view of a region XIIIJ shown in FIG. 13H. FIG. 13K is an enlarged view of a region XIIIK shown in FIG. 13H.

Referring to FIG. 13H to FIG. 13K, the SiC semiconductor device 1 has the modified lines 22A to 22D (modified layers) formed respectively at the side surfaces 5A to 5D of the SiC semiconductor layer 2. More specifically, the modified lines 22A to 22D are respectively formed one layer each at the side surfaces 5A to 5D in a relationship of one-to-one correspondence.

In this configuration, each of the modified lines 22A to 22D is constituted of a single layer. That is, the modified lines 22A to 22D include one layer of the modified line 22A formed at the side surface 5A, one layer of the modified line 22B formed at the side surface 5B, one layer of the modified line 22C formed at the side surface 5C, and one layer of the modified line 22D formed at the side surface 5D.

The one layer of the modified line 22A may include a mode where, by a plurality of the modified lines 22A being formed mutually overlappingly, it can be deemed that one layer of the modified line 22A constituted of the plurality of modified lines 22A is formed. The one layer of the modified line 22B may include a mode where, by a plurality of the modified lines 22B being formed mutually overlappingly, it can be deemed that one layer of the modified line 22B constituted of the plurality of modified lines 22B is formed.

The one layer of the modified line 22C may include a mode where, by a plurality of the modified lines 22C being formed mutually overlappingly, it can be deemed that one layer of the modified line 22C constituted of the plurality of modified lines 22C is formed. The one layer of the modified line 22D may include a mode where, by a plurality of the modified lines 22D being formed mutually overlappingly, it can be deemed that one layer of the modified line 22D constituted of the plurality of modified lines 22D is formed.

However, these cases require the modified lines 22A to 22D to be formed a plurality each at the respective side surfaces 5A to 5D and therefore cannot be said to be preferable from standpoints of increase in workload, delay in manufacturing time, etc. It is therefore preferable for the modified lines 22A to 22D that are each constituted of a single layer to be respectively formed at the respective side surfaces 5A to 5D.

The modified lines 22A to 22D respectively include portions that extend in band shapes along the tangential directions to the first main surface 3 and extend inclinedly with respect to the first main surface 3. Also, the modified lines 22A to 22D respectively include portions that intersect the normal to the first main surface 3. Also, the modified lines 22A to 22D respectively include portions that intersect tangents to the first main surface 3.

In this configuration, the modified lines 22A to 22D are inclined downwardly rectilinearly from the first main surface 3 toward the second main surface 4. That is, the modified lines 22A to 22D include portions that extend rectilinearly from the first main surface 3 toward the second main surface 4.

More specifically, the modified lines 22A to 22D each include, in regard to the normal direction Z, a first end portion 23 at the first main surface 3 side and a second end portion 24 at the second main surface 4 side. The modified lines 22A to 22D are respectively inclined such that the first end portions 23 and the second end portions 24 run parallel to each other. Inclination angles and inclination directions of the modified lines 22A to 22D are arbitrary and not restricted to a specific angle and direction.

The modified line 22A extends in a band shape along the m-axis of the SiC monocrystal at the side surface 5A and is inclined at an arbitrary angle with respect to the m-axis. The modified line 22B extends in a band shape along the a-axis of the SiC monocrystal at the side surface 5B and is inclined at an arbitrary angle with respect to the a-axis. The modified line 22C extends in a band shape along the m-axis of the SiC monocrystal at the side surface 5C and is inclined at an arbitrary angle with respect to the m-axis. The modified line 22D extends in a band shape along the a-axis of the SiC monocrystal at the side surface 5D and is inclined at an arbitrary angle with respect to the a-axis.

The modified lines 22A to 22D are formed at intervals toward the second main surface 4 side from the first main surface 3. The modified lines 22A to 22D expose surface layer portions of the first main surface 3 from the side surfaces 5A to 5D. Also, the modified lines 22A to 22D are formed at intervals toward the first main surface 3 side from the second main surface 4. The modified lines 22A to 22D expose surface layer portions of the second main surface 4 of the SiC semiconductor layer 2 from the side surfaces 5A to 5D.

The modified lines 22A to 22D thereby bipartition the respective side surfaces 5A to 5D of the SiC semiconductor layer 2 into a region at the first main surface 3 side and a region at the second main surface 4 side in side views as viewed from normal directions to the respective side surfaces 5A to 5D of the SiC semiconductor layer 2. Also, the modified lines 22A to 22D are not formed in the main surface insulating layer 10, the passivation layer 13, and the resin layer 16.

The modified lines 22A to 22D are formed in the SiC semiconductor substrate 6. The modified lines 22A to 22D are formed at intervals toward the second main surface 4 side from the boundary between the SiC semiconductor substrate 6 and the SiC epitaxial layer 7. The modified lines 22A to 22D thereby expose the SiC epitaxial layer 7 at the surface layer portions of the first main surface 3. That is, the SiC epitaxial layer 7 is included in the regions at the first main surface 3 side among the regions resulting from the bipartitioning by the modified lines 22A to 22D at the respective side surfaces 5A to 5D.

The modified lines 22A to 22D each include a first region 25, a second region 26, and a connecting region 27 such that the first end portion 23 and the second end portion 24 are positioned at different regions in the thickness direction of the SiC semiconductor layer 2 (the normal direction z).

The first regions 25 are regions in which the first end portions 23 and the second end portions 24 of the modified lines 22A to 22D are formed at the first main surface 3 side. In this configuration, the first regions 25 are positioned at vicinities of the corner portions of the SiC semiconductor layer 2. Preferably, a portion or an entirety of each first region 25 is formed at the first main surface 3 side with respect to a thickness direction middle portion of the SiC semiconductor layer 2.

The second regions 26 are regions in which the first end portions 23 and the second end portions 24 of the modified lines 22A to 22D are formed shifted toward the second main surface 4 side with respect to the first regions 25. In this configuration, the second regions 26 are formed in vicinities of the corner portions of the SiC semiconductor layer 2. The first end portion 23 in the second region 26 is positioned at the second main surface 4 side with respect to the first end portion 23 in the first region 25. The first end portion 23 in the second region 26 may be positioned at the second main surface 4 side with respect to the second end portion 24 in the first region 25. Preferably, a portion or an entirety of each second region 26 is positioned at the second main surface 4 side with respect to the thickness direction middle portion of the SiC semiconductor layer 2.

The connecting regions 27 are inclined downwardly from the first regions 25 toward the second regions 26 and connect the first regions 25 and the second regions 26. In this configuration, the connecting regions 27 extend rectilinearly. If the first regions 25 and the second regions 26 sandwich the thickness direction middle portion of the SiC semiconductor layer 2, the connecting regions 27 connect the first regions 25 and the second regions 26 upon crossing the thickness direction middle portion of the SiC semiconductor layer 2.

The first region 25 of the modified line 22A and the first region 25 of the modified line 22B may be positioned at the corner portion connecting the side surface 5A and the side surface 5B. The second region 26 of the modified line 22A and the second region 26 of the modified line 22B may be positioned at the corner portion connecting the side surface 5A and the side surface 5B.

The first region 25 of the modified line 22A and the second region 26 of the modified line 22B may be positioned at the corner portion connecting the side surface 5A and the side surface 5B. The second region 26 of the modified line 22A and the first region 25 of the modified line 22B may be positioned at the corner portion connecting the side surface 5A and the side surface 5B. The modified line 22A and the modified line 22B may be continuous to each other or may be formed at an interval from each other at the corner portion connecting the side surface 5A and the side surface 5B.

The first region 25 of the modified line 22B and the first region 25 of the modified line 22C may be positioned at the corner portion connecting the side surface 5B and the side surface 5C. The second region 26 of the modified line 22B and the second region 26 of the modified line 22C may be positioned at the corner portion connecting the side surface 5B and the side surface 5C.

The first region 25 of the modified line 22B and the second region 26 of the modified line 22C may be positioned at the corner portion connecting the side surface 5B and the side surface 5C. The second region 26 of the modified line 22B and the first region 25 of the modified line 22C may be positioned at the corner portion connecting the side surface 5B and the side surface 5C. The modified line 22B and the modified line 22C may be continuous to each other or may be formed at an interval from each other at the corner portion connecting the side surface 5B and the side surface 5C.

The first region 25 of the modified line 22C and the first region 25 of the modified line 22D may be positioned at the corner portion connecting the side surface 5C and the side surface 5D. The second region 26 of the modified line 22C and the second region 26 of the modified line 22D may be positioned at the corner portion connecting the side surface 5C and the side surface 5D.

The first region 25 of the modified line 22C and the second region 26 of the modified line 22D may be positioned at the corner portion connecting the side surface 5C and the side surface 5D. The second region 26 of the modified line 22C and the first region 25 of the modified line 22D may be positioned at the corner portion connecting the side surface 5C and the side surface 5D. The modified line 22C and the modified line 22D may be continuous to each other or may be formed at an interval from each other at the corner portion connecting the side surface 5C and the side surface 5D.

The first region 25 of the modified line 22D and the first region 25 of the modified line 22A may be positioned at the corner portion connecting the side surface 5D and the side surface 5A. The second region 26 of the modified line 22D and the second region 26 of the modified line 22A may be positioned at the corner portion connecting the side surface 5D and the side surface 5A.

The first region 25 of the modified line 22D and the second region 26 of the modified line 22A may be positioned at the corner portion connecting the side surface 5D and the side surface 5A. The second region 26 of the modified line 22D and the first region 25 of the modified line 22A may be positioned at the corner portion connecting the side surface 5D and the side surface 5A. The modified line 22D and the modified line 22A may be continuous to each other or may be formed at an interval from each other at the corner portion connecting the side surface 5D and the side surface 5A.

The modified line 22A and the modified line 22C may extend in mutually intersecting directions in side views of viewing the side surfaces 5A and 5C from the a-axis direction. The modified line 22A and the modified line 22C may extend in parallel to each other in the side views of viewing the side surfaces 5A and 5C from the a-axis direction.

The modified line 22B and the modified line 22D may extend in mutually intersecting directions in side views of viewing the side surfaces 5B and 5D from the m-axis direction. The modified line 22B and the modified line 22D may extend in parallel to each other in the side views of viewing the side surfaces 5B and 5D from the m-axis direction.

All of the modified lines 22A to 22D may be formed at intervals from each other at the corner portions of the SiC semiconductor layer 2. Also, at least two of the modified lines 22A and 22D may be continuous to each other at the corner portions of the SiC semiconductor layer 2.

All of the modified lines 22A to 22D may be continuous to each other at the corner portions of the Sic semiconductor layer 2. That is, the modified lines 22A to 22D may be formed integrally such as to surround the SiC semiconductor layer 2. In this case, the modified lines 22A to 22D form a single endless (annular) modified line surrounding the SiC semiconductor layer 2 at the side surfaces 5A to 5D.

In the normal direction Z, thicknesses TR of the modified lines 22A to 22D are preferably not more than the thickness TL of the SiC semiconductor layer 2 (TRETL). The thicknesses TR of the modified lines 22A to 22D are more preferably less than the thickness TS of the SiC semiconductor substrate 6 (TR<TS).

The thicknesses TR of the modified lines 22A to 22D may be not less than the thickness TE of the SiC epitaxial layer 7 (TR≥TE). The thickness TR of the modified line 22A, the thickness TR of the modified line 22B, the thickness TR of the modified line 22C, and the thickness TR of the modified line 22D may be mutually equal or may be mutually different.

Ratios TR/TL of the thicknesses TR of the modified lines 22A to 22D with respect to the thickness TL of the SiC semiconductor layer 2 are preferably not less than 0.1 and less than 1.0. The ratios TR/TL may be not less than 0.1 and not more than 0.2, not less than 0.2 and not more than 0.4, not less than 0.4 and not more than 0.6, not less than 0.6 and not more than 0.8, or not less than 0.8 and less than 1.0.

The ratios TR/TL may be not less than 0.1 and not more than 0.2, not less than 0.2 and not more than 0.3, not less than 0.3 and not more than 0.4, not less than 0.4 and not more than 0.5, not less than 0.5 and not more than 0.6, not less than 0.6 and not more than 0.7, not less than 0.7 and not more than 0.8, not less than 0.8 and not more than 0.9, or not less than 0.9 and less than 1.0. The ratios TR/TL are preferably not less than 0.2 and not more than 0.5.

More preferably, ratios TR/TS of the thicknesses TR of the modified lines 22A to 22D with respect to the thickness TS of the SiC semiconductor substrate 6 are not less than 0.1 and less than 1.0. The ratios TR/TS may be not less than 0.1 and not more than 0.2, not less than 0.2 and not more than 0.4, not less than 0.4 and not more than 0.6, not less than 0.6 and not more than 0.8, or not less than 0.8 and less than 1.0.

The ratios TR/TS may be not less than 0.1 and not more than 0.2, not less than 0.2 and not more than 0.3, not less than 0.3 and not more than 0.4, not less than 0.4 and not more than 0.5, not less than 0.5 and not more than 0.6, not less than 0.6 and not more than 0.7, not less than 0.7 and not more than 0.8, not less than 0.8 and not more than 0.9, or not less than 0.9 and less than 1.0. The ratios TR/TS are preferably not less than 0.2 and not more than 0.5.

The modified lines 22A to 22D according to the ninth configuration example are formed by adjusting the light converging portion (focal point), laser energy, pulse duty ratio, irradiation speed, etc., of the laser light in the step of forming the modified lines 70 (the modified lines 22A to 22D) (see also FIG. 10K). Specific shapes of the modified lines 70 formed in the step of the step of forming the modified lines 70 (the modified lines 22A to 22D) shall now be described with reference to FIG. 13L and FIG. 13M.

Figure 13L:
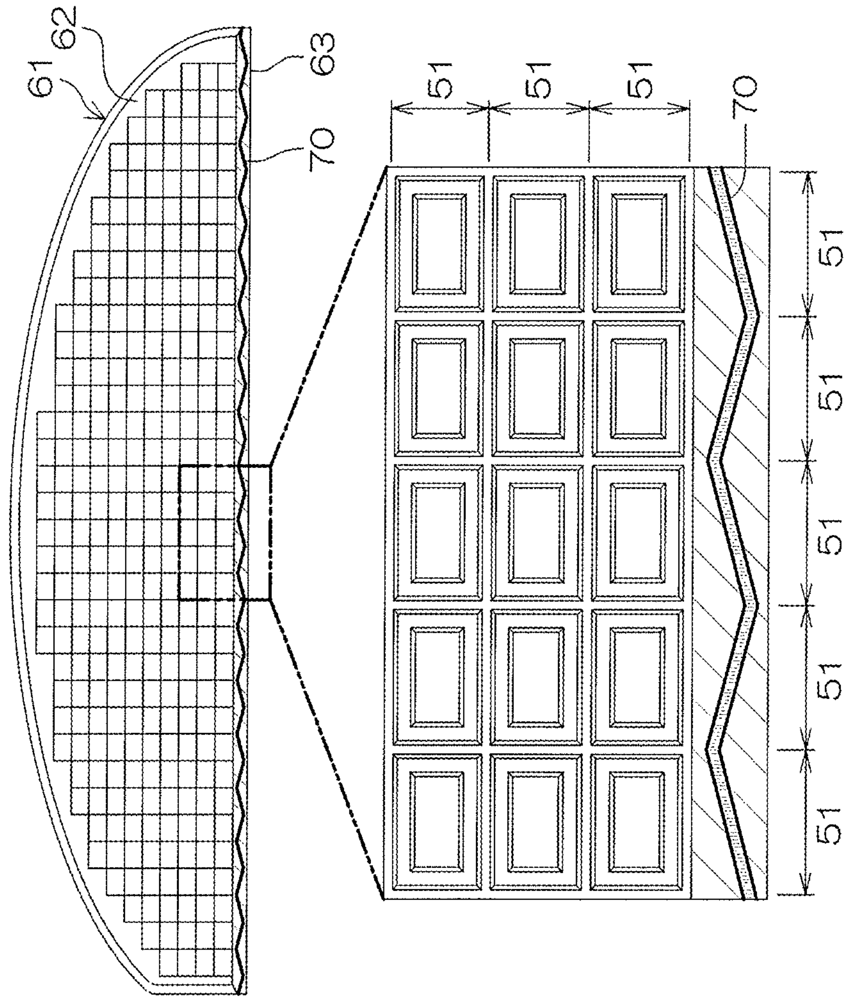
FIG. 13L is a partial sectional view of an SiC semiconductor wafer structure and is a partial sectional view for describing a first configuration example of modified lines formed in the step of FIG. 10K.

FIG. 13L is a partial sectional view of the SiC semiconductor wafer structure 61 and is a partial sectional view for describing a first configuration example of the modified lines 70 formed in the step of FIG. 10K.

Referring to FIG. 13L, a position of the light converging portion (focal point) of the laser light with respect to the thickness direction of the SiC semiconductor wafer structure 61 is adjusted in accordance with the laser light irradiation position for the first cutting schedule lines 54. In this configuration, the modified lines 70 each being in the shape of a zigzag, curved shape, or curve that bends (meanders) a plurality of times toward the first main surface 62 side and the second main surface 63 side and extending along the corresponding first cutting schedule line 54 are formed.

The modified lines 70 each being in the shape of a curve that extends along the corresponding first cutting schedule line 54 and meanders a plurality of times toward the first main surface 62 side and the second main surface 63 side may be formed by adjusting the light converging portion (focal point) of the laser light. A bending cycle (meandering cycle) of each modified line 70 along the corresponding first cutting schedule line 54 takes on an arbitrary value in accordance with an external appearance (shape of the modified lines 22A and 22C) of the SiC semiconductor device 1 cut out from the SiC semiconductor wafer structure 61.

Although specific illustration shall be omitted, the same step as the step performed for the first cutting schedule lines 54 is performed for the second cutting schedule lines 55 as well. That is, the position of the light converging portion (focal point) of the laser light with respect to the thickness direction of the SiC semiconductor wafer structure 61 is adjusted in accordance with the laser light irradiation position for the second cutting schedule lines 55. In this configuration, the modified lines 70 each being in the shape of a zigzag, curved shape, or curve that bends (meanders) a plurality of times toward the first main surface 62 side and the second main surface 63 side and extending along the corresponding second cutting schedule line 55 are formed.

The modified lines 70 each being in the shape of a curve that extends along the corresponding second cutting schedule line 55 and meanders a plurality of times toward the first main surface 62 side and the second main surface 63 side may be formed by adjusting the light converging portion (focal point) of the laser light. The bending cycle (meandering cycle) of each modified line 70 along the corresponding second cutting schedule line 55 takes on an arbitrary value in accordance with the external appearance (shape of the modified lines 22B and 22D) of the SiC semiconductor device 1 cut out from the SiC semiconductor wafer structure 61.

The plurality of modified lines 70 are thus formed one layer each in the relationship of one-to-one correspondence with respect to the four sides 52A to 52D of each device forming region 51.

Figure 13M:
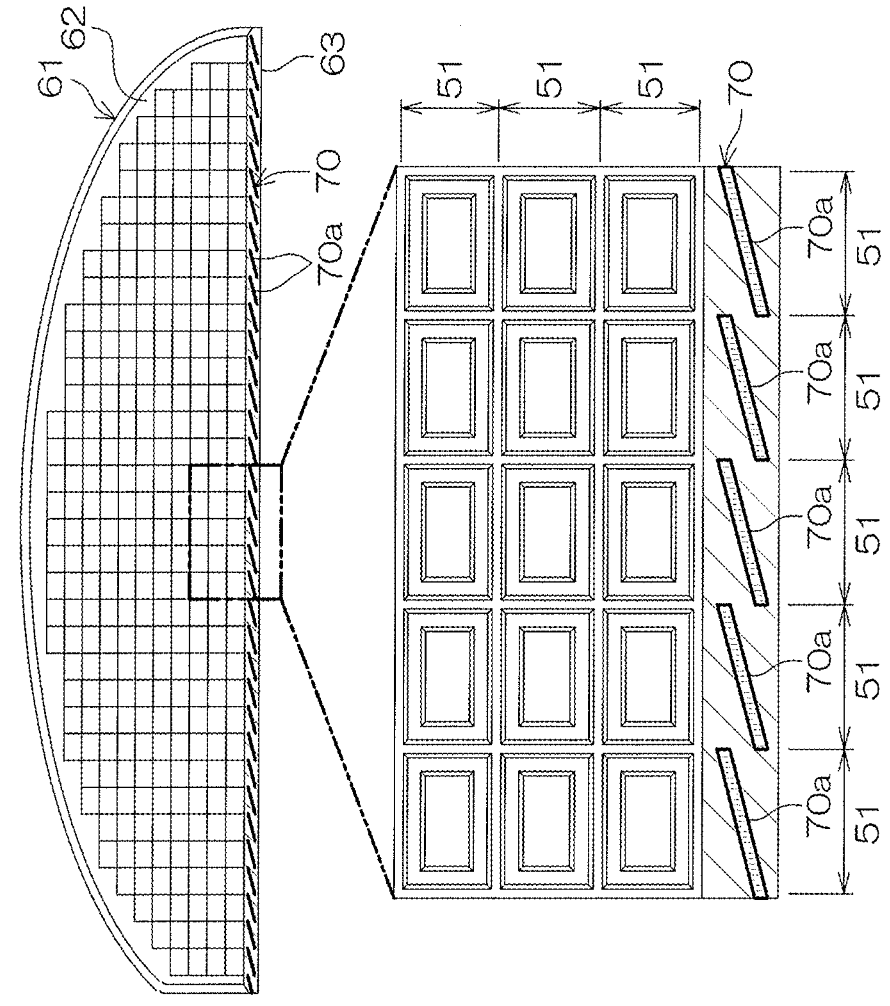
FIG. 13M is a partial sectional view of an SiC semiconductor wafer structure and is a partial sectional view for describing a second configuration example of modified lines formed in the step of FIG. 10K.

FIG. 13M is a partial sectional view of the SiC semiconductor wafer structure 61 and is a partial sectional view for describing a second configuration example of the modified lines 70 formed in the step of FIG. 10K.

The modified lines 70 according to the first configuration example are formed in band shapes extending continuously along the first cutting schedule lines 54 (second cutting schedule lines 55). However, the modified lines 70 may each be formed intermittently along the corresponding first cutting schedule line 54 (second cutting schedule line 55) as shown in FIG. 13M. In this case, each modified line 70 preferably has a plurality of divided portions 70*a* formed one layer each in the relationship of one-to-one correspondence with respect to the respective four sides 52A to 52D of each device forming region 51. The plurality of divided portions 70*a* respectively correspond to the modified lines 22A to 22D.

The plurality of modified lines 70 each including the plurality of divided portions 70*a* formed one layer each in the relationship of one-to-one correspondence with respect to the four sides 52A to 52D of each device forming region 51 are thus formed.

As described above, with the SiC semiconductor device 1 (see FIG. 13H to FIG. 13M), the modified lines 22A to 22D extending in band shapes inclined with respect to the first main surface 3 are respectively formed one layer each at the respective side surfaces 5A to 5D of the SiC semiconductor layer 2. More specifically, the modified lines 22A to 22D each have the first region 25 formed at the first main surface 3 side, the second region 26 formed shifted to the second main surface 4 side with respect to the first region 25, and the connecting region 27 connecting the first region and the second region 26.

Cutting starting points can thereby be formed appropriately in regions at the first main surface 3 side and regions at the second main surface 4 side by the modified lines 22A to 22D of one layer each. Therefore, when manufacturing the SiC semiconductor device 1 (see FIG. 13H to FIG. 13M), the SiC semiconductor wafer structure 61 (SiC semiconductor wafer 41) can be cut appropriately without forming a plurality of the modified lines 70 along the thickness direction of the SiC semiconductor wafer structure 61 (SiC semiconductor wafer 41). Consequently, forming regions of the modified lines 22A to 22D can be reduced appropriately at the respective side surfaces 5A to 5D of the SiC semiconductor layer 2. The influences on the SiC semiconductor layer 2 due to the modified lines 22A to 22D can thus be reduced.

In particular, with the SiC semiconductor device 1 (see FIG. 13H to FIG. 13M), the step of thinning the SiC semiconductor wafer structure 61 (SiC semiconductor wafer 41) is performed and therefore the SiC semiconductor wafer structure 61 can be cleaved appropriately by the single layer of the modified lines 70 (modified lines 22A to 22D).

In other words, by the thinned SiC semiconductor wafer structure 61 (SiC semiconductor wafer 41), the SiC semiconductor wafer structure 61 (SiC semiconductor wafer 41) can be cleaved appropriately without forming a plurality of the modified lines 70 (modified lines 22A to 22D) at intervals in the normal direction Z. The forming regions of the modified lines 22A to 22D at the respective side surfaces 5A to 5D of the SiC semiconductor layer 2 can thereby be reduced even more appropriately. Time reduction of the step of forming the modified lines 70 can also be achieved.

In this case, the second main surface 4 of the SiC semiconductor layer 2 is constituted of the ground surface. The SiC semiconductor device 1 (see FIG. 13H to FIG. 13M) preferably includes the SiC semiconductor layer 2 having the thickness TL that is not less than 40 μm and not more than 200 μm. The SiC semiconductor layer 2 having such thickness TL can be cut out appropriately from the SiC semiconductor wafer structure 61 (SiC semiconductor wafer 41).

In the SiC semiconductor layer 2, the thickness TS of the SiC semiconductor substrate 6 may be not less than 40 μm and not more than 150 μm. The thickness TE of the SiC epitaxial layer 7 in the SiC semiconductor layer 2 may be not less than 1 μm and not more than 50 μm. The thinning of the SiC semiconductor layer 2 is also effective in terms of reducing resistance value.

As examples of the influences on the SiC semiconductor layer 2 due to the modified lines, fluctuation of electrical characteristics of the SiC semiconductor layer 2 due to the modified lines, generation of cracks in the SiC semiconductor layer 2 with the modified lines as starting points, etc., can be cited. Fluctuation of leak current characteristics can be cited as an example of the fluctuation of electrical characteristics of the SiC semiconductor layer 2 due to the modified lines.

An SiC semiconductor device may be sealed by the sealing resin 79 as shown in FIG. 11. In this case, it can be considered that mobile ions in the sealing resin 79 will enter into the SiC semiconductor layer 2 via a modified line. With a structure where the plurality of modified lines are formed at intervals along the normal direction Z over entire areas of the respective side surfaces 5A to 5D, there is increased risk of current path formation due to such an external structure.

Also, with the structure where the plurality of modified lines are formed along the normal direction Z over the entire areas of the respective side surfaces 5A to 5D of the SiC semiconductor layer 2, there is also increased risk of generation of cracks in the SiC semiconductor layer 2. Therefore, by restricting the forming regions of the modified lines 22A to 22D as in the SiC semiconductor device 1 (see FIG. 13H to FIG. 13M), fluctuation of the electrical characteristics of the SiC semiconductor layer 2 and generation of cracks can be suppressed.

Also, with the SiC semiconductor device 1 (see FIG. 13H to FIG. 13M), the modified lines 22A to 22D are formed at intervals toward the second main surface 4 side from the first main surface 3. Stress concentrates readily at corner portions connecting the first main surface 3 and the side surfaces 5A to 5D. Therefore, by forming the modified lines 22A to 22D at intervals from the corner portions connecting the first main surface 3 and the side surfaces 5A to 5D, generation of cracks at the corner portions of the SiC semiconductor layer 2 can be suppressed appropriately.

In particular, with the SiC semiconductor device 1 (see FIG. 13H to FIG. 13M), the modified lines 22A to 22D are formed in the SiC semiconductor substrate 6 while avoiding the SiC epitaxial layer 7. That is, the modified lines 22A to 22D expose the SiC epitaxial layer 7 in which a main portion of the functional device (the Schottky barrier diode D in this embodiment) is formed. Thereby, influences on the functional device due to the modified lines 22A to 22D can also be reduced appropriately.

Also, with the SiC semiconductor device 1 (see FIG. 13H to FIG. 13M), the modified lines 22A to 22D are formed at intervals toward the first main surface 3 side from the second main surface 4. Stress concentrates readily at corner portions connecting the second main surface 4 and the side surfaces 5A to 5D. Therefore, by forming the modified lines 22A to 22D at intervals from the corner portions connecting the second main surface 4 and the side surfaces 5A to 5D, generation of cracks at the corner portions of the SiC semiconductor layer 2 can be suppressed appropriately.

Also, with the SiC semiconductor device 1 (see FIG. 13H to FIG. 13M), the main surface insulating layer 10 and the first main surface electrode layer 12 formed on the first main surface 3 are included. The main surface insulating layer 10 has the insulating side surfaces 11A to 11D that are continuous to the side surfaces 5A to 5D of the SiC semiconductor layer 2. The main surface insulating layer 10 improves an insulating property between the side surfaces 5A to 5D and the first main surface electrode layer 12 in the structure in which the modified lines 22A to 22D are formed. Stability of the electrical characteristics of the SiC semiconductor layer 2 can thereby be improved in the structure in which the modified lines 22A to 22D are formed in the side surfaces 5A to 5D.

Figure 13N:
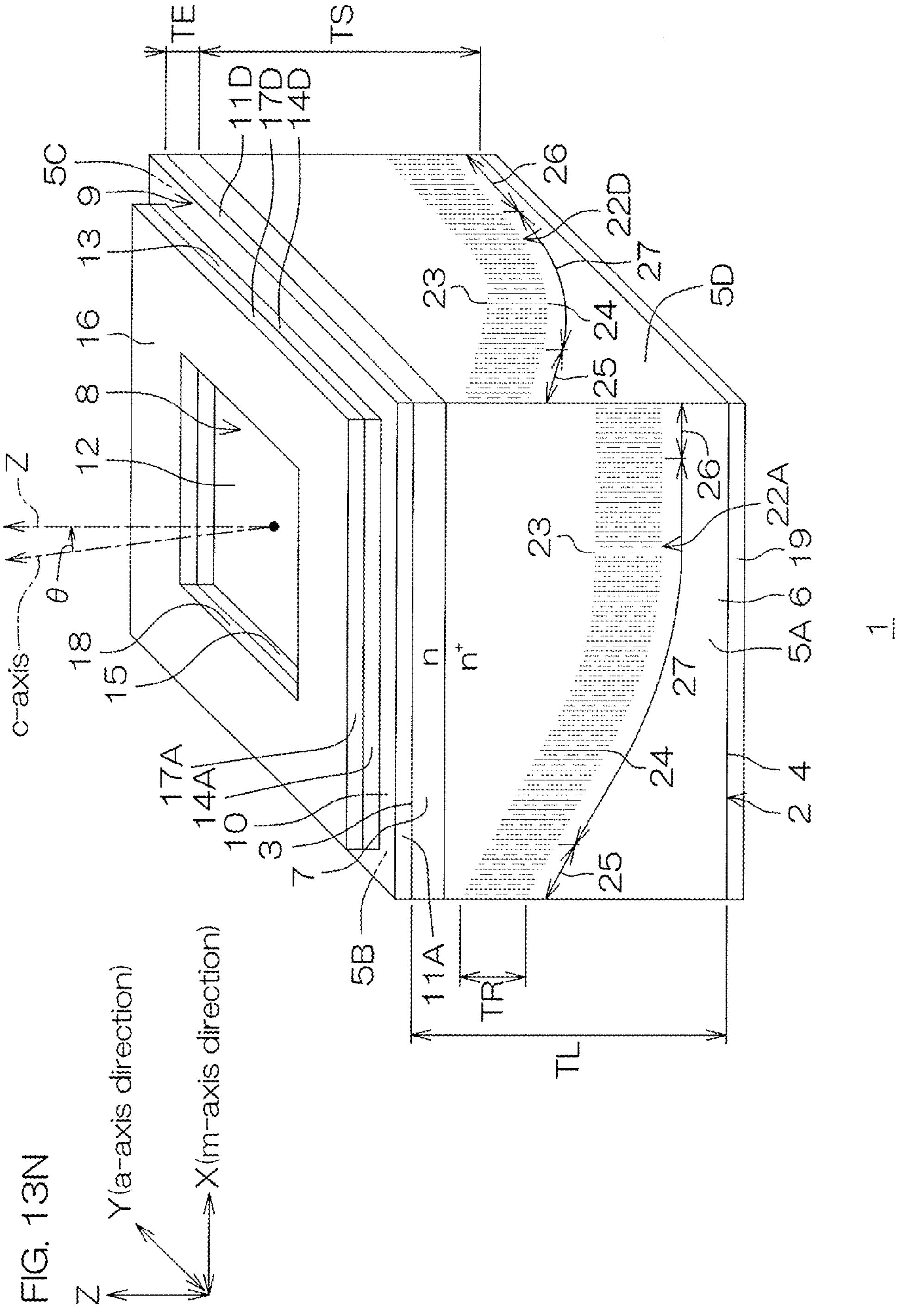
FIG. 13N is a perspective view showing the SiC semiconductor device shown in FIG. 3 and is a perspective view showing a tenth configuration example of the modified lines.

FIG. 13N is a perspective view of the SiC semiconductor device 1 shown in FIG. 3 and is a perspective view of a tenth configuration example of the modified lines 22A to 22D. In the following, structures corresponding to the structures described with the SiC semiconductor device 1 shall be provided with the same reference signs and description thereof shall be omitted.

With the modified lines 22A to 22D according to the ninth configuration example, the connecting regions 27 are inclined downwardly rectilinearly from the first regions 25 toward the second regions 26. On the other hand, with the modified lines 22A to 22D according to the tenth configuration example, the connecting regions 27 are inclined downwardly from the first regions 25 toward the second regions 26 in concavely curved shapes. That is, the modified lines 22A to 22D according to the tenth configuration example include portions extending in a concavely curved shape from the first main surface 3 toward the second main surface 4.

The modified lines 22A to 22D according to the tenth configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the tenth configuration example are formed, the same effects as in the case of forming the modified lines 22A to 22D according to the ninth configuration example can be exhibited.

Figure 13O:
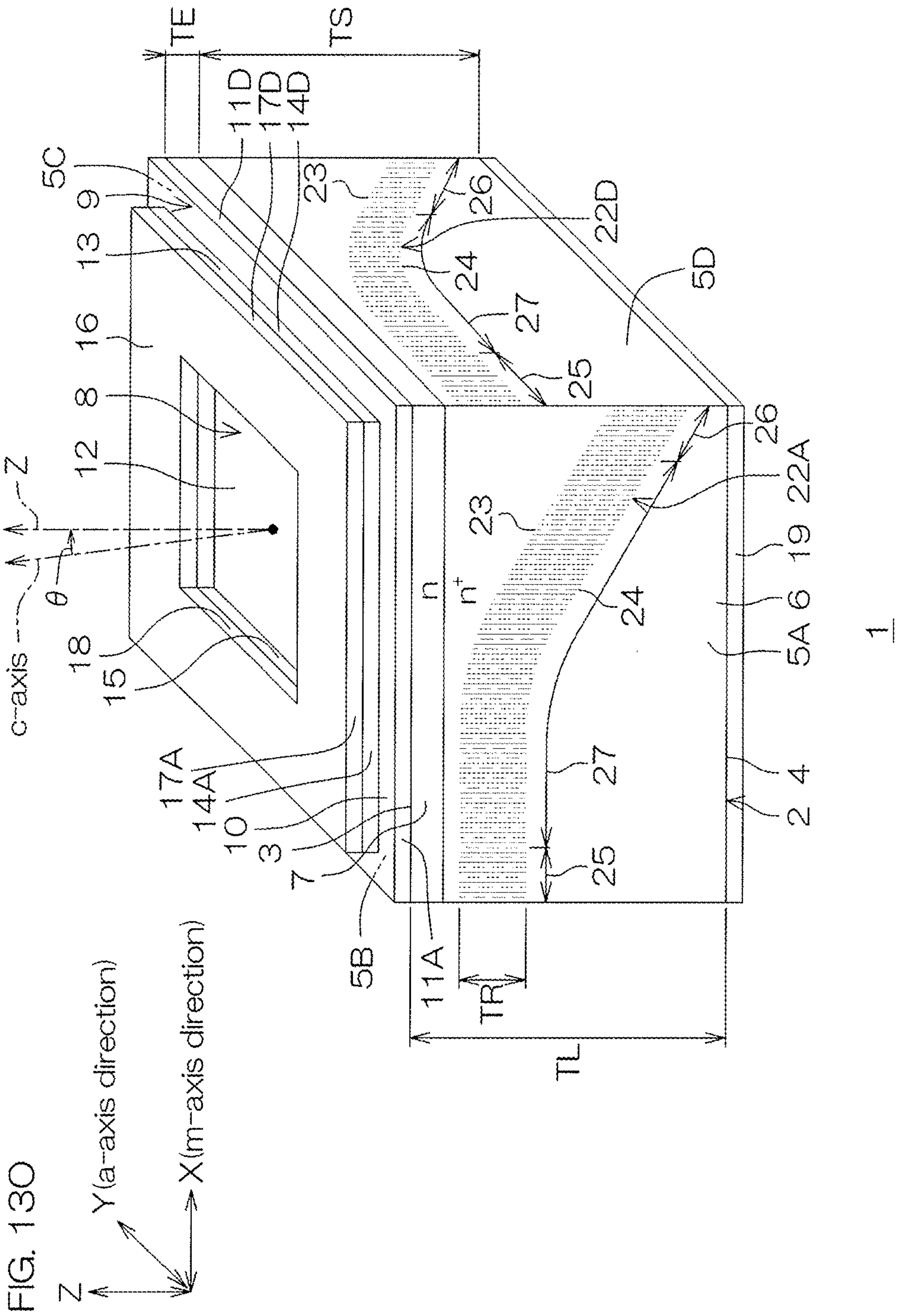
FIG. 13O is a perspective view showing the SiC semiconductor device shown in FIG. 3 and is a perspective view showing an eleventh configuration example of the modified lines.

FIG. 13O is a perspective view of the siC semiconductor device 1 shown in FIG. 3 and is a perspective view of an eleventh configuration example of the modified lines 22A to 22D. In the following, structures corresponding to the structures described with the SiC semiconductor device 1 shall be provided with the same reference signs and description thereof shall be omitted.

With the modified lines 22A to 22D according to the ninth configuration example, the connecting regions 27 are inclined downwardly rectilinearly from the first regions 25 toward the second regions 26. On the other hand, with the modified lines 22A to 22D according to the eleventh configuration example, the connecting regions 27 are inclined downwardly from the first regions 25 toward the second regions 26 in convexly curved shapes. That is, the modified lines 22A to 22D according to the eleventh configuration example include portions extending in a convexly curved shape from the second main surface 4 toward the first main surface 3.

The modified lines 22A to 22D according to the eleventh configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the eleventh configuration example are formed, the same effects as in the case of forming the modified lines 22A to 22D according to the ninth configuration example can be exhibited.

Figure 13P:
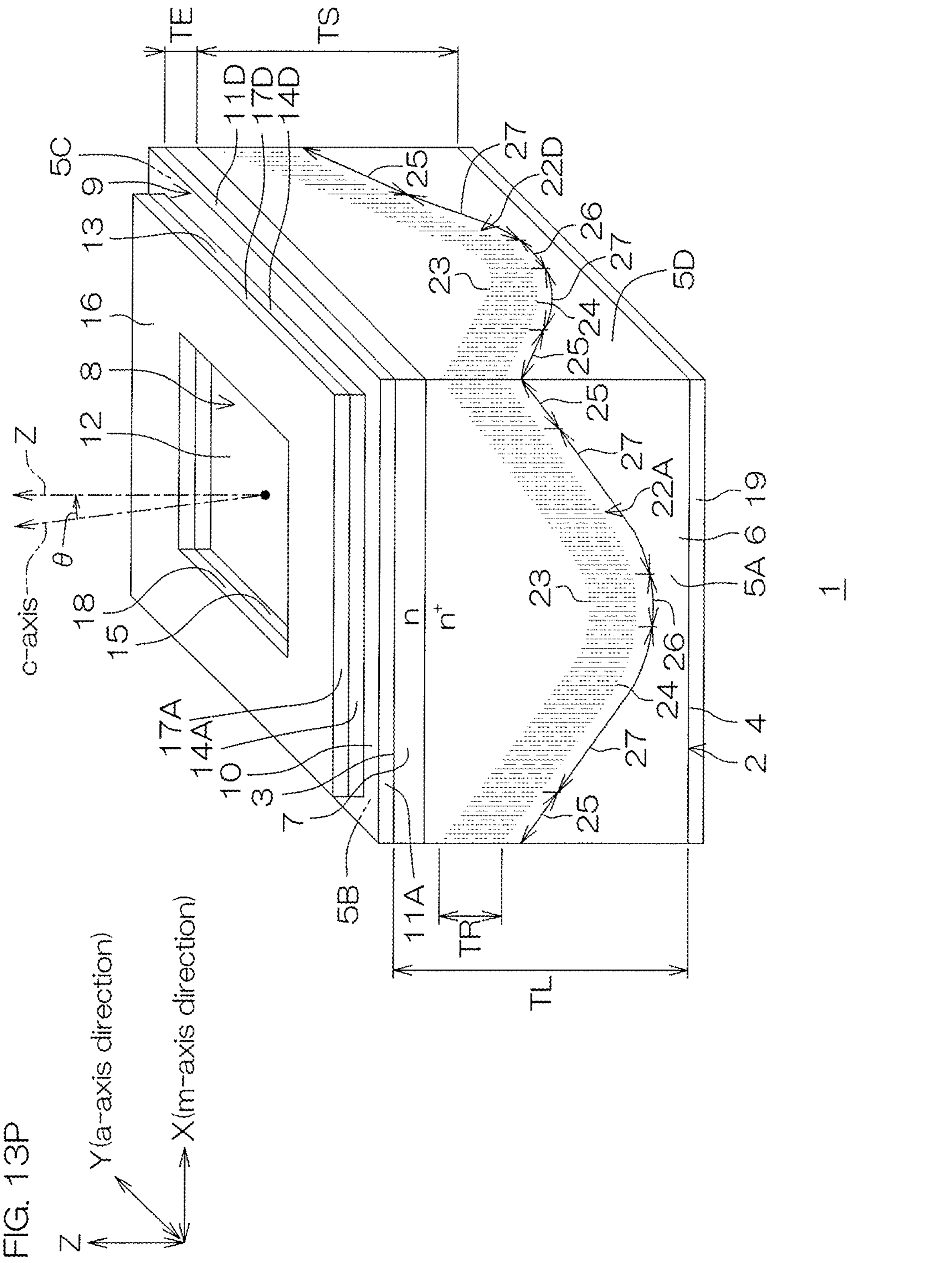
FIG. 13P is a perspective view showing the SiC semiconductor device shown in FIG. 3 and is a perspective view showing a twelfth configuration example of the modified lines.
Figure 13Q:
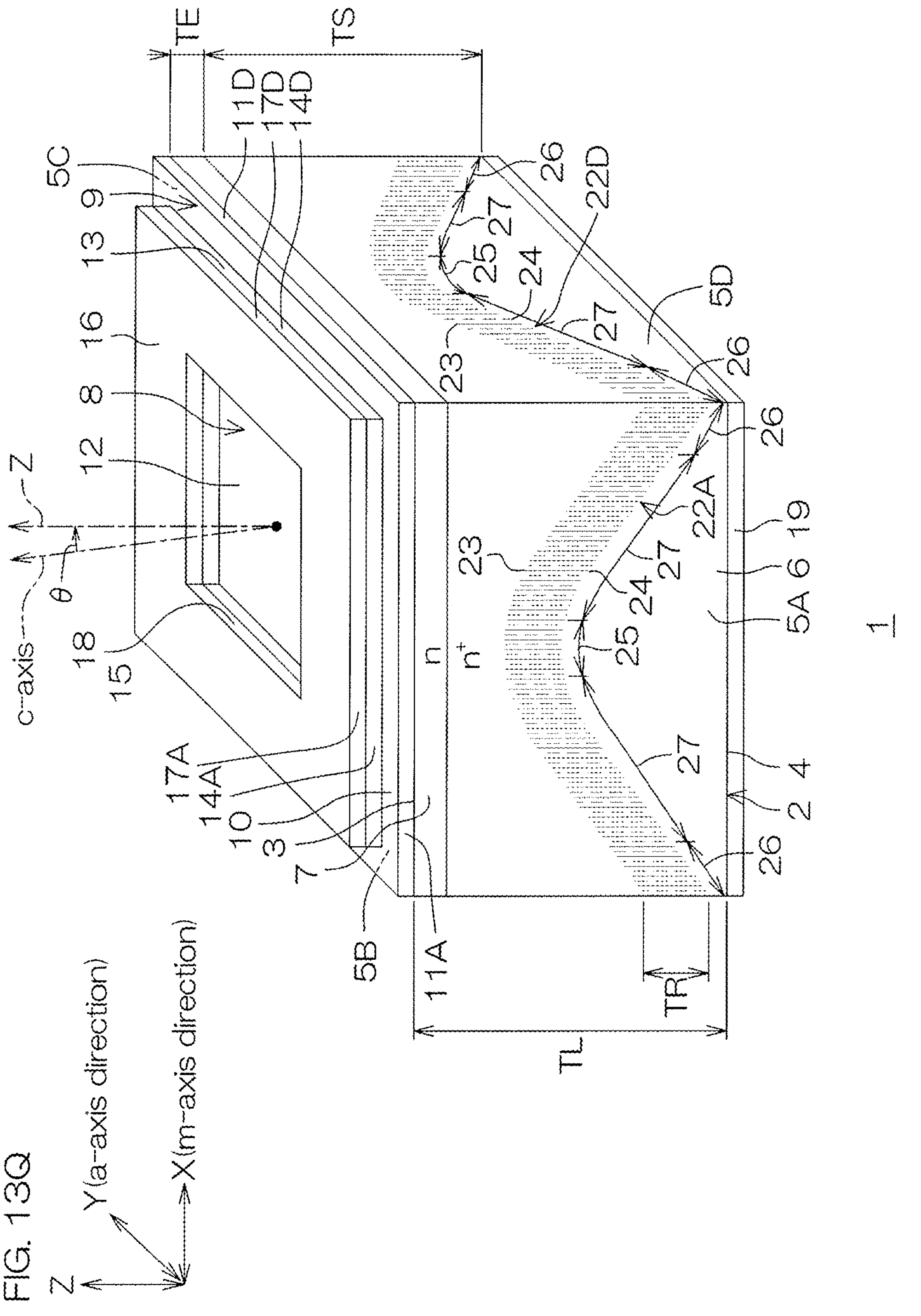
FIG. 13R is a perspective view showing the SiC semiconductor device shown in FIG. 3 and is a perspective view showing a fourteenth configuration example of the modified lines.
FIG. 13S is a perspective view showing the SiC semiconductor device shown in FIG. 3 and is a perspective view showing a fifteenth configuration example of the modified lines.
FIG. 13T is a perspective view showing the SiC semiconductor device shown in FIG. 3 and is a perspective view showing a sixteenth configuration example of the modified lines.
FIG. 13U is a perspective view as viewed from another angle of the SiC semiconductor device shown in FIG. 3.
FIG. 13V is a perspective view showing the SiC semiconductor device shown in FIG. 3 and is a perspective view showing a seventeenth configuration example of the modified lines.
FIG. 13W is a perspective view showing the SiC semiconductor device shown in FIG. 3 and is a perspective view showing an eighteenth configuration example of the modified lines.
FIG. 13X is a perspective view showing the SiC semiconductor device shown in FIG. 3 and is a perspective view showing a nineteenth configuration example of the modified lines.
FIG. 13Y is a perspective view showing the SiC semiconductor device shown in FIG. 3 and is a perspective view showing a twentieth configuration example of the modified lines.
FIG. 13Z is a perspective view showing the SiC semiconductor device shown in FIG. 3 and is a perspective view showing a twenty first configuration example of the modified lines.

FIG. 13P is a perspective view of the SiC semiconductor device 1 shown in FIG. 3 and is a perspective view of a twelfth configuration example of the modified lines 22A to 22D. In the following, structures corresponding to the structures described with the SiC semiconductor device 1 shall be provided with the same reference signs and description thereof shall be omitted.

The modified lines 22A to 22D according to the ninth configuration example are each formed in a rectilinearly extending band shape inclined downwardly from the first main surface 3 toward the second main surface 4. On the other hand, the modified lines 22A to 22D according to the twelfth configuration example are each formed in a band shape extending in a concavely curved shape from the first main surface 3 toward the second main surface 4.

That is, the modified lines 22A to 22D according to the configuration example include portions extending in concavely curved shapes from the first main surface 3 toward the second main surface 4. The modified lines 22A to 22D extend in the concavely curved shapes such that the first end portions 23 and the second end portions 24 run parallel to each other.

More specifically, each of the modified lines 22A to 22D according to the twelfth configuration example includes two first regions 25, one second region 26, and two connecting regions 27. The two first regions 25 are respectively formed at the two corner portions of the corresponding side surface among the side surfaces 5A to 5D. The one second region 26 is formed in a region between the two first regions 25 at the corresponding side surface among the side surfaces 5A to 5D. Each of the two connecting regions 27 connects the corresponding first region 25 and second region 26 at the corresponding side surface among the side surfaces 5A to 5D.

At each of the modified line 22A and modified line 22C, the plurality of a-plane modified portions 28 are formed at intervals from each other in a mode where a distance between the first main surface 3 and each one end portion 28*a* increases gradually from the first region 25 toward the second region 26 and thereafter decreases gradually from the second region 26 toward the first region 25.

At each of the modified line 22B and modified line 22D, the plurality of m-plane modified portions 29 are formed at intervals from each other in a mode where a distance between the first main surface 3 and each one end portion 29*a* increases gradually from the first region 25 toward the second region 26 and thereafter decreases gradually from the second region 26 toward the first region 25.

The modified lines 22A to 22D according to the twelfth configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the twelfth configuration example are formed, the same effects as in the case of forming the modified lines 22A to 22D according to the ninth configuration example can be exhibited.

FIG. 13O is a perspective view of the SiC semiconductor device 1 shown in FIG. 3 and is a perspective view of a thirteenth configuration example of the modified lines 22A to 22D. In the following, structures corresponding to the structures described with the SiC semiconductor device 1 shall be provided with the same reference signs and description thereof shall be omitted.

The modified lines 22A to 22D according to the ninth configuration example are each formed in a rectilinearly extending band shape inclined downwardly from the first main surface 3 toward the second main surface 4. On the other hand, the modified lines 22A to 22D according to the thirteenth configuration example are each formed in a band shape extending in a convexly curved shape from the second main surface 4 toward the first main surface 3.

That is, the modified lines 22A to 22D according to the thirteenth configuration example include portions extending in a convexly curved shape from the second main surface 4 toward the first main surface 3. The modified lines 22A to 22D extend in the convexly curved shapes such that the first end portions 23 and the second end portions 24 run parallel to each other.

More specifically, each of the modified lines 22A to 22D according to the thirteenth configuration example includes one first region 25, two second regions 26, and two connecting regions 27. The one first region 25 is formed at a length direction middle portion of the corresponding side surface among the side surfaces 5A to 5D. The two second regions 26 are respectively formed at the two corner portions of the corresponding side surface among the side surfaces 5A to 5D. That is, the one first region 25 is formed in a region between the two second regions 26 at the corresponding side surface among the side surfaces 5A to 5D. Each of the two connecting regions 27 connects the corresponding first region and second region 26 at the corresponding side surface among the side surfaces 5A to 5D.

At each of the modified line 22A and modified line 22C, the plurality of a-plane modified portions 28 are formed at intervals from each other in a mode where the distance between the first main surface 3 and each one end portion 28*a* decreases gradually from the second region 26 toward the first region 25 and thereafter increases gradually from the first region 25 toward the second region 26.

At each of the modified line 22B and modified line 22D, the plurality of m-plane modified portions 29 are formed at intervals from each other in a mode where the distance between the first main surface 3 and each one end portion 29*a* decreases gradually from the second region 26 toward the first region 25 and thereafter increases gradually from the first region 25 toward the second region 26.

The modified lines 22A to 22D according to the thirteenth configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the thirteenth configuration example are formed, the same effects as in the case of forming the modified lines 22A to 22D according to the ninth configuration example can be exhibited.

Figure 13R:
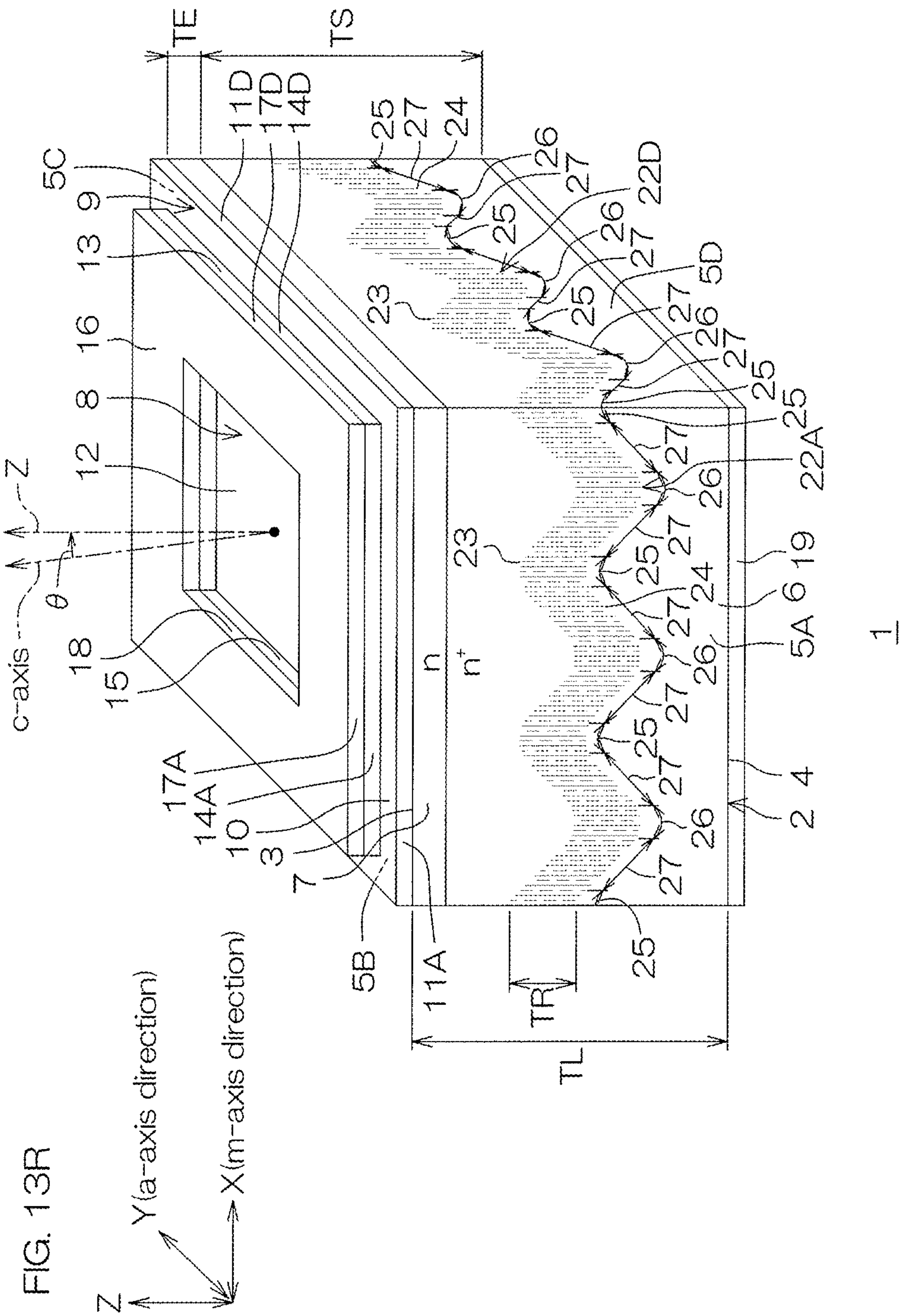

FIG. 13R is a perspective view of the SiC semiconductor device 1 shown in FIG. 3 and is a perspective view of a fourteenth configuration example of the modified lines 22A to 22D. In the following, structures corresponding to the structures described with the SiC semiconductor device 1 shall be provided with the same reference signs and description thereof shall be omitted.

The modified lines 22A to 22D according to the ninth configuration example are each formed in a rectilinearly extending band shape inclined downwardly from the first main surface 3 toward the second main surface 4. On the other hand, the modified lines 22A to 22D according to the fourteenth configuration example are each formed in a band shape extending in a curve (curved shape) meandering from the first main surface 3 toward the second main surface 4.

That is, the modified lines 22A to 22D according to the fourteenth configuration example include portions extending in concavely curved shapes from the first main surface 3 toward the second main surface 4 and portions extending in convexly curved shapes from the second main surface 4 toward the first main surface 3. More specifically, the modified lines 22A to 22D extend in the meandering curves (curved shapes) such that the first end portions 23 and the second end portions 24 run parallel to each other.

More specifically, each of the modified lines 22A to 22D according to the fourteenth configuration example includes a plurality of first regions 25, a plurality of second regions 26, and a plurality of connecting regions 27. The plurality of first regions 25 are formed at intervals from each other along the tangential direction to the first main surface 3 at the corresponding side surface among the side surfaces 5A to 5D.

The plurality of second regions 26 are formed at intervals from each other along the tangential direction to the first main surface 3 at the corresponding side surface among the side surfaces 5A to 5D. Each second region 26 is formed in a region between two mutually adjacent first regions 25. Each of the plurality of connecting regions 27 connects the corresponding first region 25 and second region 26 at the corresponding side surface among the side surfaces 5A to 5D.

At each of the modified line 22A and modified line 22C, the plurality of a-plane modified portions 28 are formed at intervals from each other in a mode where the distance between the first main surface 3 and each one end portion 28*a* decreases gradually from the second region 26 toward the first region 25 and thereafter increases gradually from the first region 25 toward the second region 26.

At each of the modified line 22B and modified line 22D, the plurality of m-plane modified portions 29 are formed at intervals from each other in a mode where the distance between the first main surface 3 and each one end portion 29*a* decreases gradually from the second region 26 toward the first region 25 and thereafter increases gradually from the first region 25 toward the second region 26.

The modified lines 22A to 22D according to the fourteenth configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the fourteenth configuration example are formed, the same effects as in the case of forming the modified lines 22A to 22D according to the ninth configuration example can be exhibited.

Figure 13S:
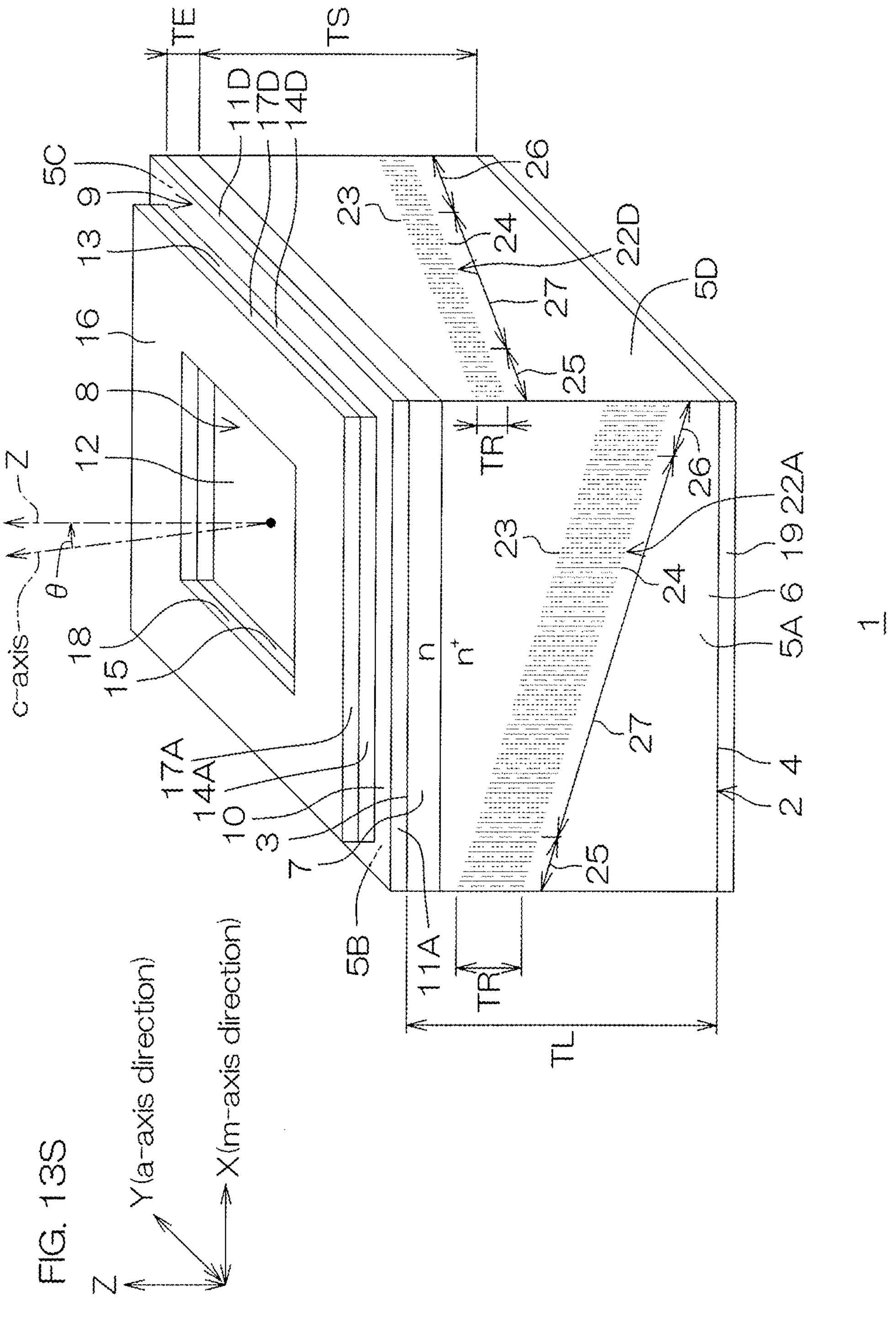

FIG. 13S is a perspective view of the SiC semiconductor device 1 shown in FIG. 3 and is a perspective view of a fifteenth configuration example of the modified lines 22A to 22D. In the following, structures corresponding to the structures described with the SiC semiconductor device 1 shall be provided with the same reference signs and description thereof shall be omitted.

The modified lines 22A to 22D according to the ninth configuration example are formed to equal shapes at the side surfaces 5A to 5D. On the other hand, the modified lines 22A to 22D according to the fifteenth configuration example are formed at different occupying ratios RA, RB, RC, and RD at the side surfaces 5A to 5D. The occupying ratios RA to RD are ratios of the modified lines 22A to 22D occupying the side surfaces 5A to 5D.

More specifically, the occupying ratios RA to RD differ in accordance with the crystal planes of the SiC monocrystal. The occupying ratios RB and RD of the modified lines 22B and 22D formed at the m-planes of the SiC monocrystal are not more than the occupying ratios RA and RC of the modified lines 22A and 22C formed at the a-planes of the SiC monocrystal (RB, RD≤RA, RC). More specifically, the occupying ratios RB and RD are less than occupying ratios RA and RC (RB, RD<RA, RC).

The occupying ratios RA and RC of the modified lines 22A and 22C may be mutually equal or may be mutually different. Also, the occupying ratios RB and RD of the modified lines 22B and 22D may be mutually equal or may be mutually different. In this configuration, surface areas of the modified lines 22B and 22D with respect to the side surfaces 5B and 5D are less than surface areas of the modified lines 22A and 22C with respect to the side surfaces 5A and 5C. In this configuration, the thicknesses TR of the modified lines 22B and 22D are less than the thicknesses TR of the modified lines 22A and 22C.

The modified lines 22A to 22D according to the fifteenth configuration example are formed by adjusting the light converging portion (focal point), etc., of the laser light in the step of forming the modified lines 70 (see also FIG. 10K).

Even in a case where the modified lines 22A to 22D according to the fifteenth configuration example are formed, the same effects as in the case of forming the modified lines 22A to 22D according to the ninth configuration example can be exhibited. In particular, the modified lines 22A to 22D according to the fifteenth configuration example are respectively formed at different occupying ratios RA to RD at the side surfaces 5A to 5D. More specifically, the modified lines 22A to 22D have the occupying ratios RA to RD that differ in accordance with the crystal planes of the SiC monocrystal.

The occupying ratios RB and RD of the modified lines 22B and 22D formed at the m-planes of the SiC monocrystal are not more than the occupying ratios RA and RC of the modified lines 22A and 22C formed at the a-planes of the SiC monocrystal (RB, RD≤RA, RC).

In a plan view of viewing the c-plane (silicon plane) from the c-axis, the SiC monocrystal has a physical property of cracking easily along the nearest atom directions (see also FIG. 1 and FIG. 2) and not cracking easily along directions intersecting the nearest atom directions. The nearest atom directions are the a-axis direction and directions equivalent thereto. The crystal planes oriented along the nearest atom directions are the m-planes and planes equivalent thereto. The directions intersecting the nearest atom directions are the m-axis direction and directions equivalent thereto. The crystal planes oriented along the directions intersecting the nearest atom directions are the a-planes and planes equivalent thereto.

Therefore, even if, in the step of forming the modified lines 70, the modified lines 70 having comparatively large occupying ratios are not formed at the crystal planes oriented along the nearest atom directions of the SiC monocrystal, the SiC monocrystal can be cut (cleaved) appropriately because these crystal planes have the property of cracking comparatively easily (see also FIG. 10L).

That is, in the step of forming the modified lines 70, the occupying ratios of the modified lines 70 oriented along the second cutting schedule lines 55 extending in the a-axis direction can be made smaller than the occupying ratios of the modified lines 70 oriented along the first cutting schedule lines 54 extending in the m-axis direction.

On the other hand, the modified lines 70 having the comparatively large occupying ratios are formed at the crystal planes oriented along the directions intersecting the nearest atom directions of the SiC monocrystal. Inappropriate cutting (cleaving) of the SiC semiconductor wafer structure 61 can thereby be suppressed and generation of cracks due to the physical property of the SiC monocrystal can thus be suppressed appropriately.

Thus, with the modified lines 22A to 22D according to the fifteenth configuration example, the physical property of the SiC monocrystal can be used to adjust and reduce the occupying ratios RA to RD of the modified lines 22A to 22D with respect to the side surfaces 5A to 5D. The influences on the SiC semiconductor layer 2 due to the modified lines 22A to 22D can thereby be reduced further. Time reduction of the step of forming the modified lines 70 can also be achieved.

The occupying ratios RA to RD may be adjusted by the surface areas of the modified lines 22A to 22D with respect to the side surfaces 5A to 5D. The occupying ratios RA to RD may be adjusted by the thicknesses TR of the modified lines 22A to 22D.

The SiC semiconductor device 1 that includes at least two types of the modified lines 22A to 22D according to the ninth configuration example, tenth configuration example, eleventh configuration example, twelfth configuration example, thirteenth configuration example, fourteenth configuration example, and fifteenth configuration example (hereinafter referred to simply as the "ninth to fifteenth configuration examples") at the same time may be formed.

Also, features of the modified lines 22A to 22D according to the ninth to fifteenth configuration examples may be combined among each other in any mode or any configuration. That is, the modified lines 22A to 22D having configurations combining at least two features among the features of the modified lines 22A to 22D according to the ninth to fifteenth configuration examples may be adopted. For example, the features of the modified lines 22A to 22D according to the fifteenth configuration example may be combined with the features of the modified lines 22A to 22D according to the tenth to fourteenth configuration examples.

The structures of modified lines 22A to 22D according to sixteenth to twenty first configuration examples shall now be described with reference to FIG. 13T to FIG. 13Z. In each of the sixteenth to twenty first configuration examples, the SiC semiconductor device 1 that enables the influences on the SiC semiconductor layer 2 due to the modified lines 22A to 22D to be reduced is provided.

Figure 13T:
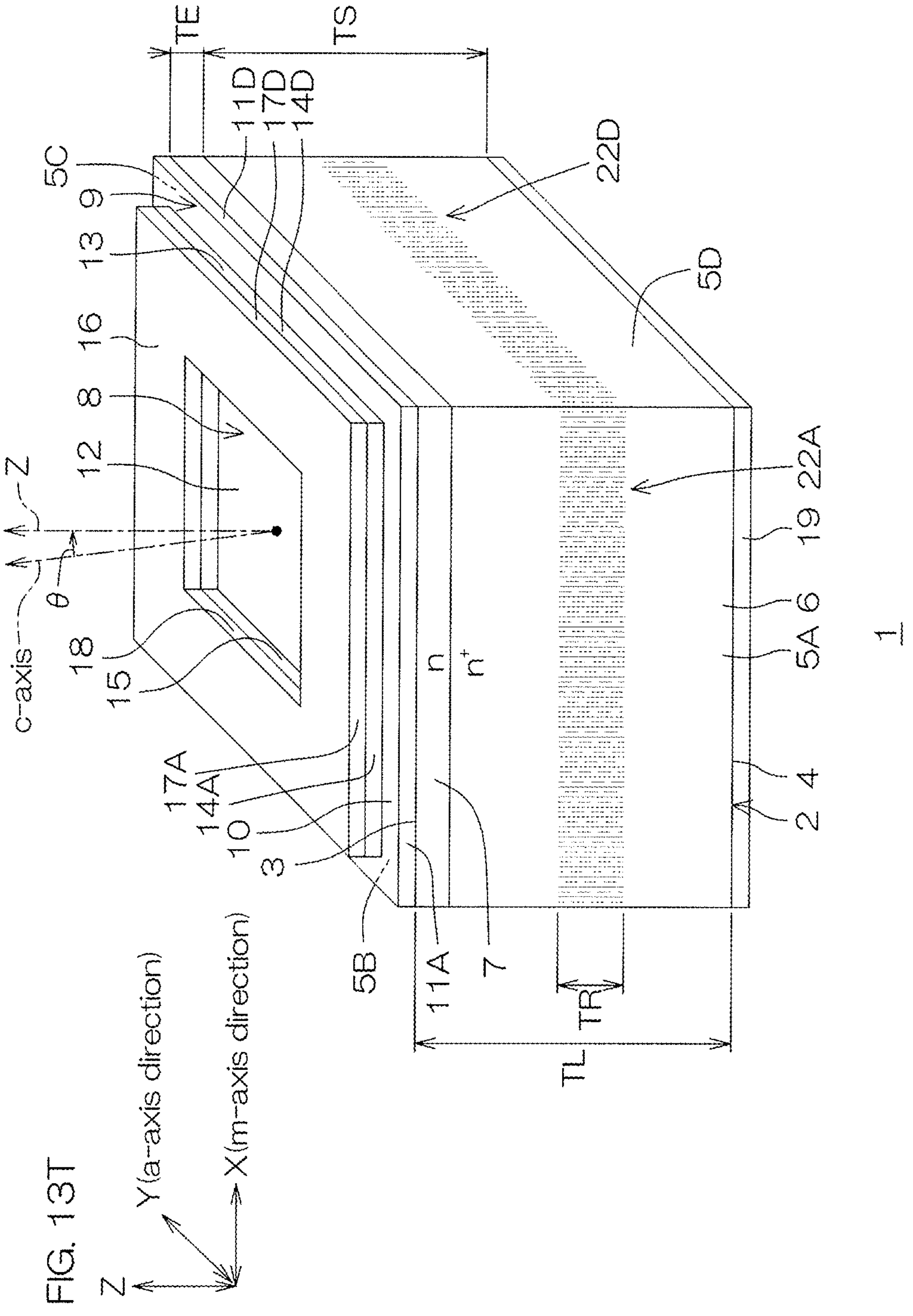
Figure 13U:
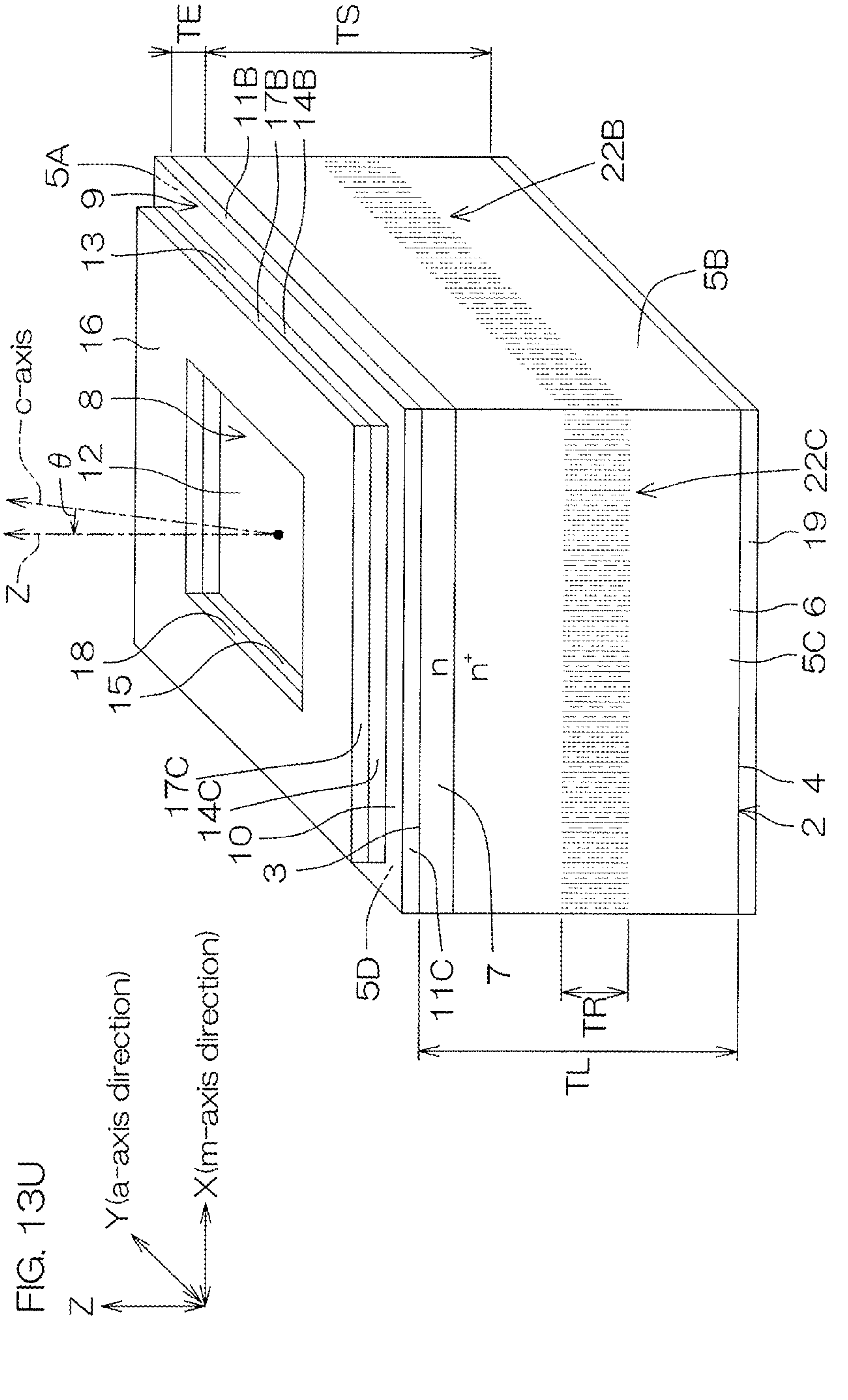

FIG. 13T is a perspective view showing the SiC semiconductor device 1 shown in FIG. 3 and is a perspective view showing a sixteenth configuration example of the modified lines 22A to 22D. FIG. 13U is a perspective view as viewed from another angle of the SiC semiconductor device 1 shown in FIG. 3.

Referring to FIG. 13T and FIG. 13U, the SiC semiconductor device 1 has the modified lines 22A to 22D (modified layers) formed respectively at the side surfaces 5A to 5D of the SiC semiconductor layer 2. More specifically, the modified lines 22A to 22D are respectively formed one layer each at the side surfaces 5A to 5D in a relationship of one-to-one correspondence.

In this configuration, each of the modified lines 22A to 22D is constituted of a single layer. That is, the modified lines 22A to 22D include one layer of the modified line 22A formed at the side surface 5A, one layer of the modified line 22B formed at the side surface 5B, one layer of the modified line 22C formed at the side surface 5C, and one layer of the modified line 22D formed at the side surface 5D.

The one layer of the modified line 22A may include a mode where, by a plurality of the modified lines 22A being formed mutually overlappingly, it can be deemed that one layer of the modified line 22A constituted of the plurality of modified lines 22A is formed. The one layer of the modified line 22B may include a mode where, by a plurality of the modified lines 22B being formed mutually overlappingly, it can be deemed that one layer of the modified line 22B constituted of the plurality of modified lines 22B is formed.

The one layer of the modified line 22C may include a mode where, by a plurality of the modified lines 22C being formed mutually overlappingly, it can be deemed that one layer of the modified line 22C constituted of the plurality of modified lines 22C is formed. The one layer of the modified line 22D may include a mode where, by a plurality of the modified lines 22D being formed mutually overlappingly, it can be deemed that one layer of the modified line 22D constituted of the plurality of modified lines 22D is formed.

However, these cases require the modified lines 22A to 22D to be formed a plurality each at the respective side surfaces 5A to 5D and therefore cannot be said to be preferable from standpoints of increase in workload, delay in manufacturing time, etc. It is therefore preferable for the modified lines 22A to 22D that are each constituted of a single layer to be respectively formed at the respective side surfaces 5A to 5D.

The modified lines 22A to 22D extend in band shapes along the tangential directions to the first main surface 3. The tangential directions to the first main surface 3 are directions orthogonal to the normal direction Z. The tangential directions include the first direction X (the m-axis direction of the SiC monocrystal) and the second direction Y (the a-axis direction of the SiC monocrystal).

More specifically, the modified line 22A is formed in a band shape extending rectilinearly along the m-axis direction at the side surface 5A. Also, the modified line 22B is formed in a band shape extending rectilinearly along the a-axis direction at the side surface 5B. Also, the modified line 22C is formed in a band shape extending rectilinearly along the m-axis direction at the side surface 5C. Also, the modified line 22D is formed in a band shape extending rectilinearly along the a-axis direction at the side surface 5D.

The modified lines 22A to 22D are formed at intervals toward the second main surface 4 side from the first main surface 3. The modified lines 22A to 22D expose surface layer portions of the first main surface 3 from the side surfaces 5A to 5D. Also, the modified lines 22A to 22D are formed at intervals toward the first main surface 3 side from the second main surface 4. The modified lines 22A to 22D expose surface layer portions of the second main surface 4 from the side surfaces 5A to 5D.

The modified lines 22A to 22D thereby bipartition the respective side surfaces 5A to 5D of the SiC semiconductor layer 2 into a region at the first main surface 3 side and a region at the second main surface 4 side in side views as viewed from normal directions to the respective side surfaces 5A to 5D of the SiC semiconductor layer 2. Stripe patterns extending in the tangential directions of the first main surface 3 are formed in the respective side surfaces 5A to 5D by the modified lines 22A to 22D, the surface layer portions of the first main surface 3, and the surface layer portions of the second main surface 4. Also, the modified lines 22A to 22D are not formed in the main surface insulating layer 10, the passivation layer 13, and the resin layer 16.

The modified lines 22A to 22D are formed in the SiC semiconductor substrate 6. The modified lines 22A to 22D are formed at intervals toward the second main surface 4 side from the boundary between the SiC semiconductor substrate 6 and the SiC epitaxial layer 7. The modified lines 22A to 22D thereby expose the SiC epitaxial layer 7 at the surface layer portions of the first main surface 3. That is, the SiC epitaxial layer 7 is included in the regions at the first main surface 3 side among the regions resulting from the bipartitioning by the modified lines 22A to 22D at the respective side surfaces 5A to 5D.

The modified line 22A and the modified line 22B are continuous to each other at the corner portion connecting the side surface 5A and the side surface 5B. The modified line 22B and the modified line 22C are continuous to each other at the corner portion connecting the side surface 5B and the side surface 5C. The modified line 22C and the modified line 22D are continuous to each other at the corner portion connecting the side surface 5C and the side surface 5D. The modified line 22D and the modified line 22A are continuous to each other at the corner portion connecting the side surface 5D and the side surface 5A.

The modified lines 22A to 22D are thereby formed integrally such as to surround the SiC semiconductor layer 2. That is, the modified lines 22A to 22D form a single endless (annular) modified line surrounding the SiC semiconductor layer 2 at the side surfaces 5A to 5D of the SiC semiconductor layer 2.

In the normal direction Z, thicknesses TR of the modified lines 22A to 22D are preferably not more than the thickness TL of the SiC semiconductor layer 2 (TRSTL). The thicknesses TR of the modified lines 22A to 22D are more preferably less than the thickness TS of the SiC semiconductor substrate 6 (TR<TS).

The thicknesses TR of the modified lines 22A to 22D may be not less than the thickness TE of the SiC epitaxial layer 7 (TR≥TE). The thickness TR of the modified line 22A, the thickness TR of the modified line 22B, the thickness TR of the modified line 22C, and the thickness TR of the modified line 22D may be mutually equal or may be mutually different.

Ratios TR/TL of the thicknesses TR of the modified lines 22A to 22D with respect to the thickness TL of the SiC semiconductor layer 2 are preferably not less than 0.1 and less than 1.0. The ratios TR/TL may be not less than 0.1 and not more than 0.2, not less than 0.2 and not more than 0.4, not less than 0.4 and not more than 0.6, not less than 0.6 and not more than 0.8, or not less than 0.8 and less than 1.0.

The ratios TR/TL may be not less than 0.1 and not more than 0.2, not less than 0.2 and not more than 0.3, not less than 0.3 and not more than 0.4, not less than 0.4 and not more than 0.5, not less than 0.5 and not more than 0.6, not less than 0.6 and not more than 0.7, not less than 0.7 and not more than 0.8, not less than 0.8 and not more than 0.9, or not less than 0.9 and less than 1.0. The ratios TR/TL are preferably not less than 0.2 and not more than 0.5.

More preferably, ratios TR/TS of the thicknesses TR of the modified lines 22A to 22D with respect to the thickness TS of the SiC semiconductor substrate 6 are not less than 0.1 and less than 1.0. The ratios TR/TS may be not less than 0.1 and not more than 0.2, not less than 0.2 and not more than 0.4, not less than 0.4 and not more than 0.6, not less than 0.6 and not more than 0.8, or not less than 0.8 and less than 1.0.

The ratios TR/TS may be not less than 0.1 and not more than 0.2, not less than 0.2 and not more than 0.3, not less than 0.3 and not more than 0.4, not less than 0.4 and not more than 0.5, not less than 0.5 and not more than 0.6, not less than 0.6 and not more than 0.7, not less than 0.7 and not more than 0.8, not less than 0.8 and not more than 0.9, or not less than 0.9 and less than 1.0. The ratios TR/TS are preferably not less than 0.2 and not more than 0.5.

The modified lines 22A to 22D according to the sixteen configuration example are formed by adjusting the light converging portion (focal point), laser energy, pulse duty ratio, irradiation speed, etc., of the laser light in the step of forming the modified lines 70 (the modified lines 22A to 22D) (see also FIG. 10K).

As described above, the SiC semiconductor device 1 (see FIG. 13T and FIG. 13U) includes the plurality of modified lines 22A to 22D respectively formed one layer each at the side surfaces 5A to 5D of the SiC semiconductor layer 2. With the SiC semiconductor device 1 (see FIG. 13T and FIG. 13U), the modified lines 22A to 22D are respectively formed just one layer each at the side surfaces 5A to 5D of the SiC semiconductor layer 2. The influences on the SiC semiconductor layer 2 due to the modified lines 22A to 22D can thereby be reduced.

As examples of the influences on the SiC semiconductor layer 2 due to the modified lines, fluctuation of electrical characteristics of the SiC semiconductor layer 2 due to the modified lines, generation of cracks in the SiC semiconductor layer 2 with the modified lines as starting points, etc., can be cited. Fluctuation of leak current characteristics can be cited as an example of the fluctuation of electrical characteristics of the SiC semiconductor layer 2 due to the modified lines.

An SiC semiconductor device may be sealed by the sealing resin 79 as shown in FIG. 11. In this case, it can be considered that mobile ions in the sealing resin 79 will enter into the SiC semiconductor layer 2 via a modified line. With a structure where the plurality of modified lines are formed at intervals along the normal direction Z over entire areas of the respective side surfaces 5A to 5D, there is increased risk of current path formation due to such an external structure.

Also, with the structure where the plurality of modified lines are formed along the normal direction Z over the entire areas of the respective side surfaces 5A to 5D of the SiC semiconductor layer 2, there is also increased risk of generation of cracks in the SiC semiconductor layer 2. Therefore, by restricting the forming regions of the modified lines 22A to 22D as in the SiC semiconductor device 1 (see FIG.

13T and FIG. 13U), fluctuation of the electrical characteristics of the SiC semiconductor layer 2 and generation of cracks can be suppressed.

In particular, with the SiC semiconductor device 1 (see FIG. 13T and FIG. 13U), the step of thinning the SiC semiconductor wafer structure 61 (SiC semiconductor wafer 41) is performed and therefore the SiC semiconductor wafer structure 61 can be cleaved appropriately by the single layer of the modified lines 70 (modified lines 22A to 22D).

In other words, by the thinned SiC semiconductor wafer structure 61 (SiC semiconductor wafer 41), the SiC semiconductor wafer structure 61 (SiC semiconductor wafer 41) can be cleaved appropriately without forming a plurality of the modified lines 70 (modified lines 22A to 22D) at intervals in the normal direction z.

In this case, the second main surface 4 of the SiC semiconductor layer 2 is constituted of the ground surface. The SiC semiconductor device 1 (see FIG. 13T and FIG. 13U) preferably includes the SiC semiconductor layer 2 having the thickness TL that is not less than 40 μm and not more than 200 μm. The SiC semiconductor layer 2 having such thickness TL can be cut out appropriately from the SiC semiconductor wafer structure 61 (SiC semiconductor wafer 41).

In the SiC semiconductor layer 2, the thickness TS of the SiC semiconductor substrate 6 may be not less than 40 μm and not more than 150 μm. The thickness TE of the SiC epitaxial layer 7 in the SiC semiconductor layer 2 may be not less than 1 μm and not more than 50 μm. The thinning of the SiC semiconductor layer 2 is also effective in terms of reducing resistance value.

Also, with the SiC semiconductor device 1 (see FIG. 13T and FIG. 13U), the modified lines 22A to 22D are formed at intervals toward the second main surface 4 side from the first main surface 3. Stress concentrates readily at corner portions connecting the first main surface 3 and the side surfaces 5A to 5D. Therefore, by forming the modified lines 22A to 22D at intervals from the corner portions connecting the first main surface 3 and the side surfaces 5A to 5D, generation of cracks at the corner portions of the SiC semiconductor layer 2 can be suppressed appropriately.

In particular, with the SiC semiconductor device 1 (see FIG. 13T and FIG. 13U), the modified lines 22A to 22D are formed in the SiC semiconductor substrate 6 while avoiding the SiC epitaxial layer 7. That is, the modified lines 22A to 22D expose the SiC epitaxial layer 7 in which a main portion of the functional device (the Schottky barrier diode D in this embodiment) is formed. Thereby, influences on the functional device due to the modified lines 22A to 22D can also be reduced appropriately.

Also, with the SiC semiconductor device 1 (see FIG. 13T and FIG. 13U), the modified lines 22A to 22D are formed at intervals toward the first main surface 3 side from the second main surface 4. Stress concentrates readily at corner portions connecting the second main surface 4 and the side surfaces 5A to 5D. Therefore, by forming the modified lines 22A to 22D at intervals from the corner portions connecting the second main surface 4 and the side surfaces 5A to 5D, generation of cracks at the corner portions of the siC semiconductor layer 2 can be suppressed appropriately.

Also, with the SiC semiconductor device 1 (see FIG. 13T and FIG. 13U), the main surface insulating layer 10 and the first main surface electrode layer 12 formed on the first main surface 3 are included. The main surface insulating layer has the insulating side surfaces 11A to 11D that are continuous to the side surfaces 5A to 5D of the SiC semiconductor layer 2. The main surface insulating layer 10 improves an insulating property between the side surfaces 5A to 5D and the first main surface electrode layer 12 in the structure in which the modified lines 22A to 22D are formed. Stability of the electrical characteristics of the siC semiconductor layer 2 can thereby be improved in the structure in which the modified lines 22A to 22D are formed in the side surfaces 5A to 5D.

Figure 13V:
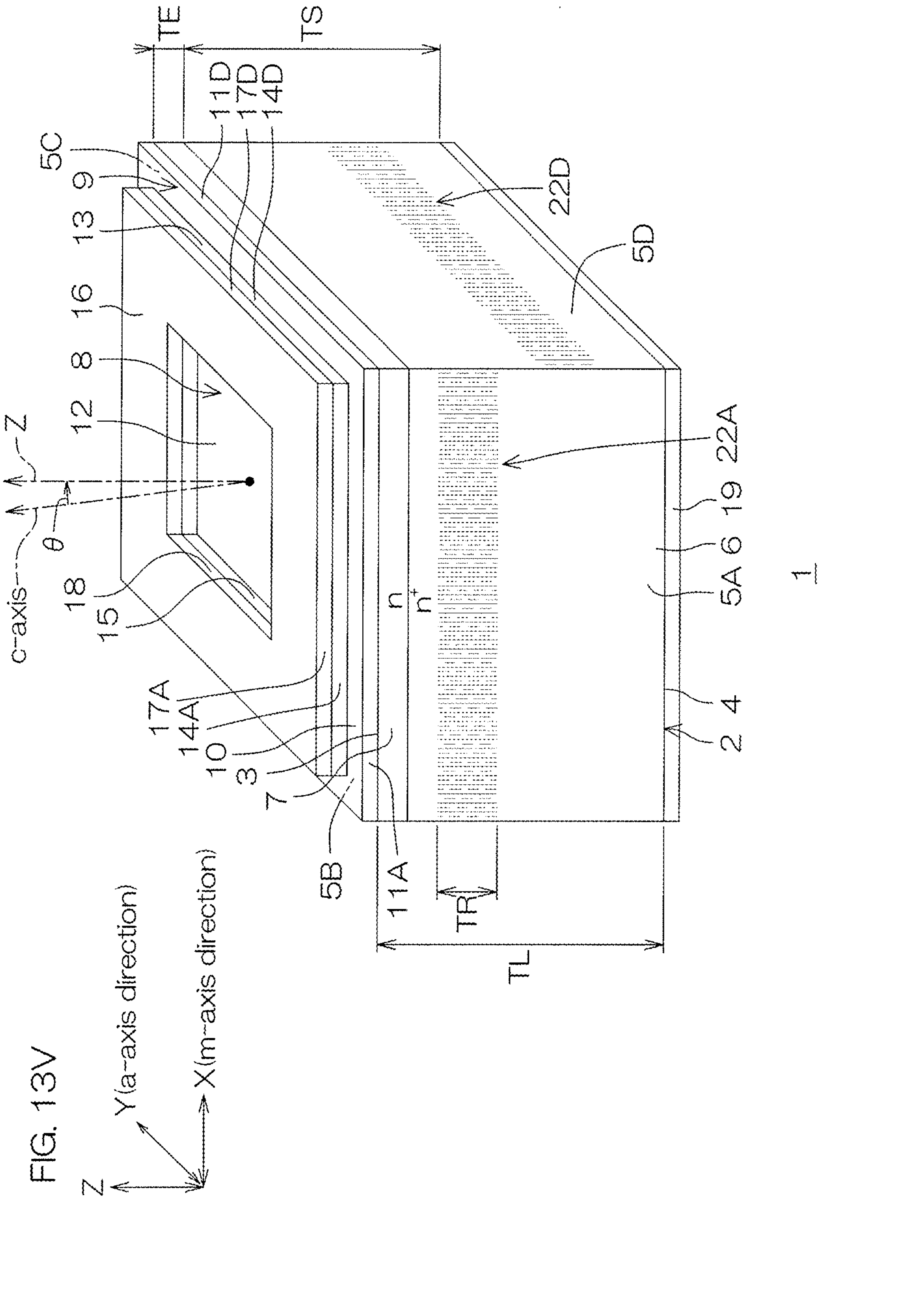

FIG. 13V is a perspective view of the SiC semiconductor device 1 shown in FIG. 3 and is a perspective view of a seventeenth configuration example of the modified lines 22A to 22D. In the following, structures corresponding to the structures described with the SiC semiconductor device 1 shall be provided with the same reference signs and description thereof shall be omitted.

The modified lines 22A to 22D according to the sixteenth configuration example are continuous to each other at the corner portions connecting the side surfaces 5A to 5D. On the other hand, the modified lines 22A to 22D according to the seventeenth configuration example are formed at intervals from each other at the corner portions connecting the side surfaces 5A to 5D.

More specifically, the modified line 22A and the modified line 22B are formed at an interval from each other in the normal direction Z at the corner portion connecting the side surface 5A and the side surface 5B. The modified line 22B and the modified line 22C are formed at an interval from each other in the normal direction Z at the corner portion connecting the side surface 5B and the side surface 5C.

The modified line 22C and the modified line 22D are formed at an interval from each other in the normal direction Z at the corner portion connecting the side surface 5C and the side surface 5D. The modified line 22D and the modified line 22A are formed at an interval from each other in the normal direction Z at the corner portion connecting the side surface 5D and the side surface 5A.

At least one of the modified lines 22A to 22D may be formed at an interval from the others of the modified lines 22A to 22D at a corner portion connecting any of the side surfaces 5A to 5D. Two or three of the modified lines 22A to 22D may be continuous to each other at a corner portion or corner portions connecting any of the side surfaces 5A to 5D.

The modified lines 22A to 22D according to the seventeenth configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the seventeenth configuration example are formed, the same effects as in the case of forming the modified lines 22A to 22D according to the sixteenth configuration example can be exhibited.

Figure 13W:
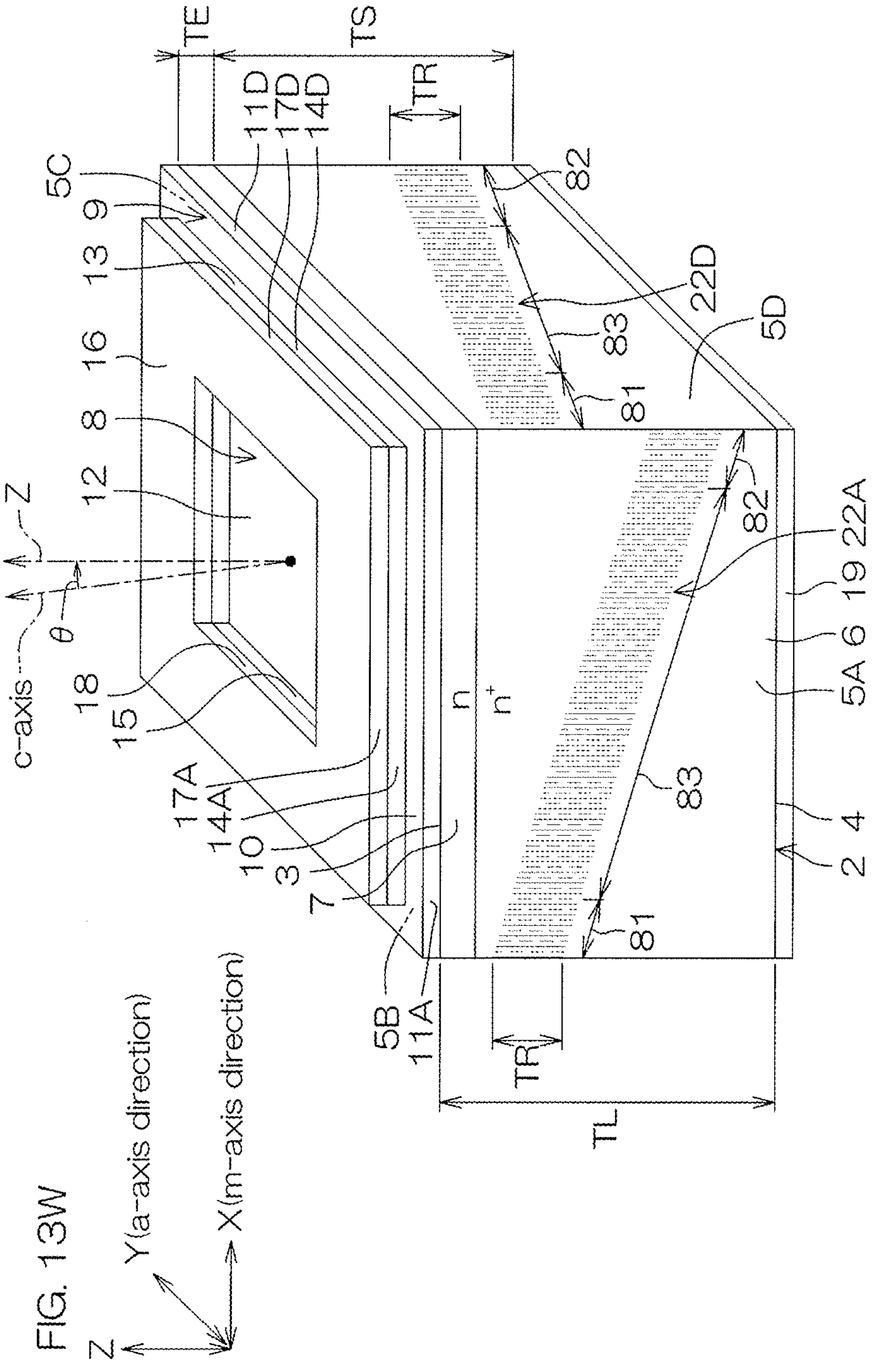

FIG. 13W is a perspective view of the siC semiconductor device 1 shown in FIG. 3 and is a perspective view of an eighteenth configuration example of the modified lines 22A to 22D. In the following, structures corresponding to the structures described with the SiC semiconductor device 1 shall be provided with the same reference signs and description thereof shall be omitted.

The modified lines 22A to 22D according to the sixteenth configuration example are formed in band shapes extending rectilinearly along the tangential directions to the first main surface 3. On the other hand, the modified lines 22A to 22D according to the eighteenth configuration example are formed in band shapes extending in slope shapes inclined downwardly from the first main surface 3 toward the second main surface 4. More specifically, the modified lines 22A to 22D according to the eighteenth configuration example each include a first end portion region 81, a second end portion region 82, and a slope region 83.

The first end portion regions 81 are positioned at the first main surface 3 side in vicinities of the corner portions of the SiC semiconductor layer 2. The second end portion regions 82 are positioned at the second main surface 4 sides with respect to the first end portion regions 81 in the vicinities of the corner portions of the SiC semiconductor layer 2. The slope regions 83 are inclined downwardly from the first main surface 3 toward the second main surface 4 in regions between the first end portion regions 81 and the second end portion regions 82.

The first end portion region 81 of the modified line 22A and the first end portion region 81 of the modified line 22B may be positioned at the corner portion connecting the side surface 5A and the side surface 5B. The second end portion region 82 of the modified line 22A and the second end portion region 82 of the modified line 22B may be positioned at the corner portion connecting the side surface 5A and the side surface 5B.

The first end portion region 81 of the modified line 22A and the second end portion region 82 of the modified line 22B may be positioned at the corner portion connecting the side surface 5A and the side surface 5B. The second end portion region 82 of the modified line 22A and the first end portion region 81 of the modified line 22B may be positioned at the corner portion connecting the side surface 5A and the side surface 5B. The modified line 22A and the modified line 22B may be continuous to each other or may be formed at an interval from each other at the corner portion connecting the side surface 5A and the side surface 5B.

The first end portion region 81 of the modified line 22B and the first end portion region 81 of the modified line 22C may be positioned at the corner portion connecting the side surface 5B and the side surface 5C. The second end portion region 82 of the modified line 22B and the second end portion region 82 of the modified line 22C may be positioned at the corner portion connecting the side surface 5B and the side surface 5C.

The first end portion region 81 of the modified line 22B and the second end portion region 82 of the modified line 22C may be positioned at the corner portion connecting the side surface 5B and the side surface 5C. The second end portion region 82 of the modified line 22B and the first end portion region 81 of the modified line 22C may be positioned at the corner portion connecting the side surface 5B and the side surface 5C. The modified line 22B and the modified line 22C may be continuous to each other or may be formed at an interval from each other at the corner portion connecting the side surface 5B and the side surface 5C.

The first end portion region 81 of the modified line 22C and the first end portion region 81 of the modified line 22D may be positioned at the corner portion connecting the side surface 5C and the side surface 5D. The second end portion region 82 of the modified line 22C and the second end portion region 82 of the modified line 22D may be positioned at the corner portion connecting the side surface 5C and the side surface 5D.

The first end portion region 81 of the modified line 22C and the second end portion region 82 of the modified line 22D may be positioned at the corner portion connecting the side surface 5C and the side surface 5D. The second end portion region 82 of the modified line 22C and the first end portion region 81 of the modified line 22D may be positioned at the corner portion connecting the side surface 5C and the side surface 5D. The modified line 22C and the modified line 22D may be continuous to each other or may be formed at an interval from each other at the corner portion connecting the side surface 5C and the side surface 5D.

The first end portion region 81 of the modified line 22D and the first end portion region 81 of the modified line 22A may be positioned at the corner portion connecting the side surface 5D and the side surface 5A. The second end portion region 82 of the modified line 22D and the second end portion region 82 of the modified line 22A may be positioned at the corner portion connecting the side surface 5D and the side surface 5A.

The first end portion region 81 of the modified line 22D and the second end portion region 82 of the modified line 22A may be positioned at the corner portion connecting the side surface 5D and the side surface 5A. The second end portion region 82 of the modified line 22D and the first end portion region 81 of the modified line 22A may be positioned at the corner portion connecting the side surface 5D and the side surface 5A. The modified line 22D and the modified line 22A may be continuous to each other or may be formed at an interval from each other at the corner portion connecting the side surface 5D and the side surface 5A.

The modified lines 22A to 22D according to the eighteenth configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the eighteenth configuration example are formed, the same effects as in the case of forming the modified lines 22A to 22D according to the sixteenth configuration example can be exhibited. In particular, with the modified lines 22A to 22D according to the eighteenth configuration example, the cleaving starting points can be formed in different regions in the thickness direction of the SiC semiconductor wafer structure 61 (SiC semiconductor wafer 41). The SiC semiconductor wafer structure 61 can thereby be cleaved appropriately even when the modified lines 22A to 22D constituted of a single layer are formed.

Figure 13X:
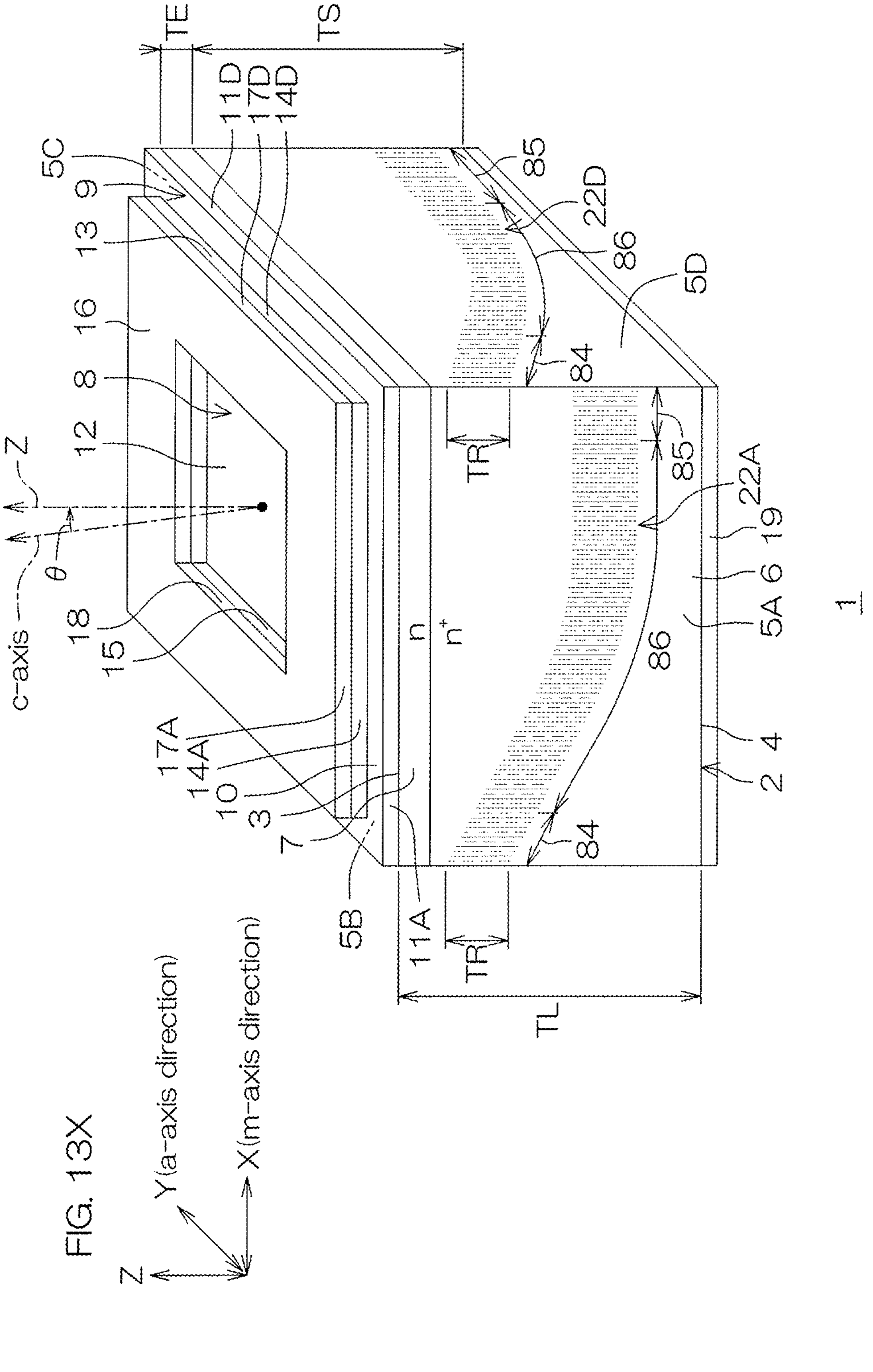

FIG. 13X is a perspective view of the SiC semiconductor device 1 shown in FIG. 3 and is a perspective view of a nineteenth configuration example of the modified lines 22A to 22D. In the following, structures corresponding to the structures described with the SiC semiconductor device 1 shall be provided with the same reference signs and description thereof shall be omitted.

The modified lines 22A to 22D according to the sixteenth configuration example are formed in band shapes extending rectilinearly along the tangential directions to the first main surface 3. On the other hand, the modified lines 22A to 22D according to the nineteenth configuration example are formed in band shapes extending such as to be inclined downwardly in curves (curved shapes) from the first main surface 3 toward the second main surface 4. More specifically, the modified lines 22A to 22D according to the nineteenth configuration example each include a first end portion region 84, a second end portion region 85, and a curved region 86.

The first end portion regions 84 are positioned at the first main surface 3 side in vicinities of the corner portions of the SiC semiconductor layer 2. The second end portion regions 85 are positioned at the second main surface 4 side with respect to the first end portion regions 84 in the vicinities of the corner portions of the SiC semiconductor layer 2. The curved regions 86 are inclined downwardly in a concavely curved shape from the first main surface 3 toward the second main surface 4 and connect the first end portion regions 84 and the second end portion regions 85. The curved regions 86 may instead be inclined downwardly in a convexly curved shape from the second main surface 4 toward the first main surface 3.

The first end portion region 84 of the modified line 22A and the first end portion region 84 of the modified line 22B may be positioned at the corner portion connecting the side surface 5A and the side surface 5B. The second end portion region 85 of the modified line 22A and the second end portion region 85 of the modified line 22B may be positioned at the corner portion connecting the side surface 5A and the side surface 5B.

The first end portion region 84 of the modified line 22A and the second end portion region 85 of the modified line 22B may be positioned at the corner portion connecting the side surface 5A and the side surface 5B. The second end portion region 85 of the modified line 22A and the first end portion region 84 of the modified line 22B may be positioned at the corner portion connecting the side surface 5A and the side surface 5B. The modified line 22A and the modified line 22B may be continuous to each other or may be formed at an interval from each other at the corner portion connecting the side surface 5A and the side surface 5B.

The first end portion region 84 of the modified line 22B and the first end portion region 84 of the modified line 22C may be positioned at the corner portion connecting the side surface 5B and the side surface 5C. The second end portion region 85 of the modified line 22B and the second end portion region 85 of the modified line 22C may be positioned at the corner portion connecting the side surface 5B and the side surface 5C.

The first end portion region 84 of the modified line 22B and the second end portion region 85 of the modified line 22C may be positioned at the corner portion connecting the side surface 5B and the side surface 5C. The second end portion region 85 of the modified line 22B and the first end portion region 84 of the modified line 22C may be positioned at the corner portion connecting the side surface 5B and the side surface 5C. The modified line 22B and the modified line 22C may be continuous to each other or may be formed at an interval from each other at the corner portion connecting the side surface 5B and the side surface 5C.

The first end portion region 84 of the modified line 22C and the first end portion region 84 of the modified line 22D may be positioned at the corner portion connecting the side surface 5C and the side surface 5D. The second end portion region 85 of the modified line 22C and the second end portion region 85 of the modified line 22D may be positioned at the corner portion connecting the side surface 5C and the side surface 5D.

The first end portion region 84 of the modified line 22C and the second end portion region 85 of the modified line 22D may be positioned at the corner portion connecting the side surface 5C and the side surface 5D. The second end portion region 85 of the modified line 22C and the first end portion region 84 of the modified line 22D may be positioned at the corner portion connecting the side surface 5C and the side surface 5D. The modified line 22C and the modified line 22D may be continuous to each other or may be formed at an interval from each other at the corner portion connecting the side surface 5C and the side surface 5D.

The first end portion region 84 of the modified line 22D and the first end portion region 84 of the modified line 22A may be positioned at the corner portion connecting the side surface 5D and the side surface 5A. The second end portion region 85 of the modified line 22D and the second end portion region 85 of the modified line 22A may be positioned at the corner portion connecting the side surface 5D and the side surface 5A.

The first end portion region 84 of the modified line 22D and the second end portion region 85 of the modified line 22A may be positioned at the corner portion connecting the side surface 5D and the side surface 5A. The second end portion region 85 of the modified line 22D and the first end portion region 84 of the modified line 22A may be positioned at the corner portion connecting the side surface 5D and the side surface 5A. The modified line 22D and the modified line 22A may be continuous to each other or may be formed at an interval from each other at the corner portion connecting the side surface 5D and the side surface 5A.

The modified lines 22A to 22D according to the nineteenth configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the nineteenth configuration example are formed, the same effects as in the case of forming the modified lines 22A to 22D according to the sixteenth configuration example can be exhibited. In particular, with the modified lines 22A to 22D according to the nineteenth configuration example, the cleaving starting points can be formed in different regions in the thickness direction of the SiC semiconductor wafer structure 61 (SiC semiconductor wafer 41). The SiC semiconductor wafer structure 61 can thereby be cleaved appropriately even when the modified lines 22A to 22D constituted of a single layer are formed.

Figure 13Y:
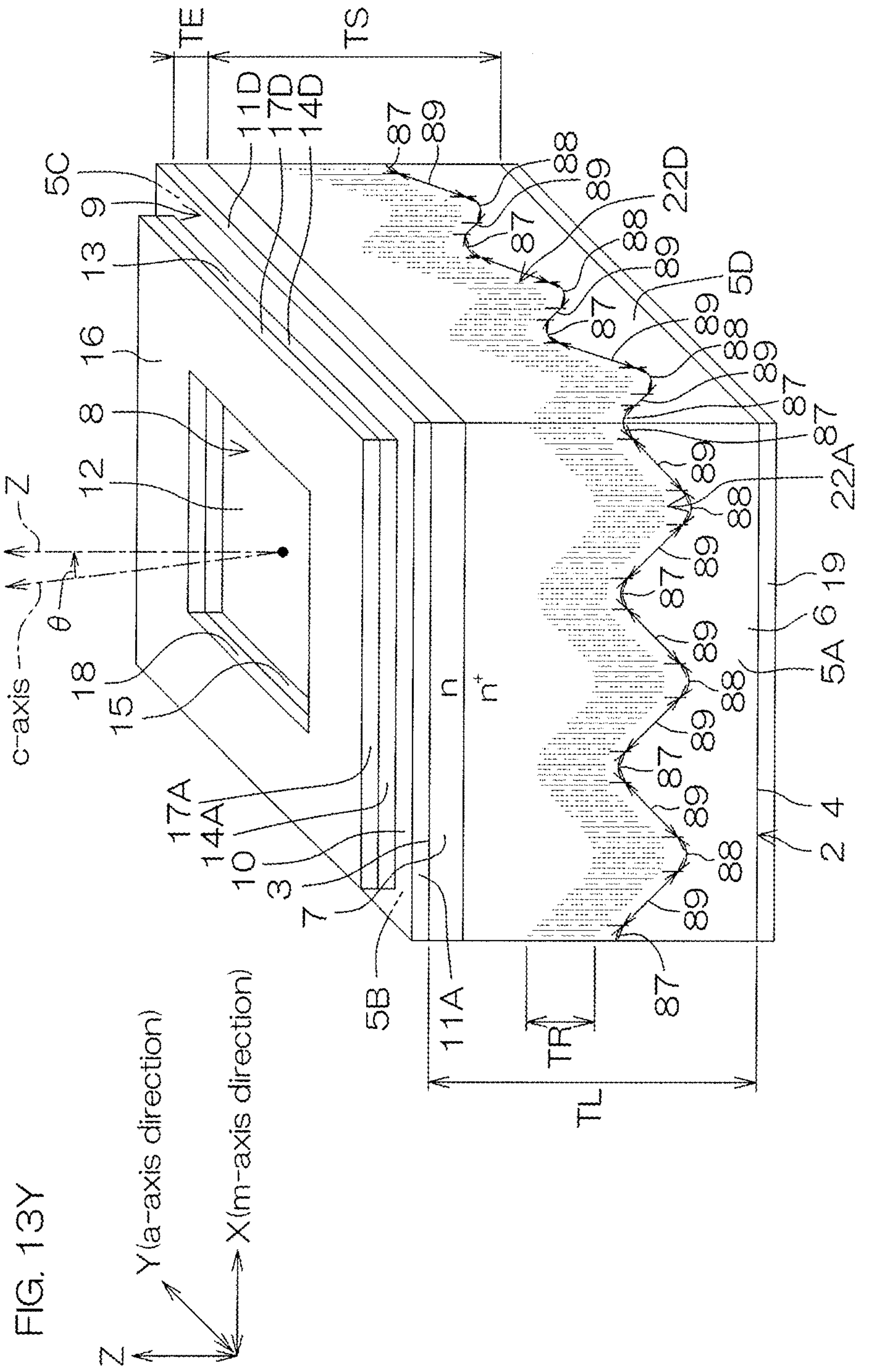

FIG. 13Y is a perspective view of the siC semiconductor device 1 shown in FIG. 3 and is a perspective view of a twentieth configuration example of the modified lines 22A to 22D. In the following, structures corresponding to the structures described with the SiC semiconductor device 1 shall be provided with the same reference signs and description thereof shall be omitted.

The modified lines 22A to 22D according to the sixteenth configuration example are formed in band shapes extending rectilinearly along the tangential directions to the first main surface 3. On the other hand, the modified lines 22A to 22D according to the twentieth configuration example are formed in band shapes extending in curves (curved shapes) meandering from the first main surface 3 toward the second main surface 4. More specifically, the modified lines 22A to 22D according to the twentieth configuration example each include a plurality of first regions 87, a plurality of second regions 88, and a plurality of connecting regions 89.

The plurality of first regions 87 are positioned at regions at the first main surface 3 side. The plurality of second regions 88 are positioned at regions at the second main surface 4 side with respect to the plurality of first regions 87. Each of the plurality of curved regions 86 connects the corresponding first region 87 and second region 88.

The modified line 22A and the modified line 22B may be continuous to each other or may be formed at an interval from each other at the corner portion connecting the side surface 5A and the side surface 5B. The modified line 22B and the modified line 22C may be continuous to each other or may be formed at an interval from each other at the corner portion connecting the side surface 5B and the side surface 5C.

The modified line 22C and the modified line 22D may be continuous to each other or may be formed at an interval from each other at the corner portion connecting the side surface 5C and the side surface 5D. The modified line 22D and the modified line 22A may be continuous to each other or may be formed at an interval from each other at the corner portion connecting the side surface 5D and the side surface 5A.

Meandering cycles of the modified lines 22A to 22D are arbitrary. The modified lines 22A to 22D may each be formed in a single band shape extending in a concavely curved shape from the first main surface 3 toward the second main surface 4. In this case, each of the modified lines 22A to 22D may include two first regions 87, one second region 88, and two connecting regions 89.

Also, the modified lines 22A to 22D may each be formed in a single band shape extending in a convexly curved shape from the second main surface 4 toward the first main surface 3. In this case, each of the modified lines 22A to 22D may include one first region 87, two second regions 88, and two connecting regions 89.

The modified lines 22A to 22D according to the twentieth configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the twentieth configuration example are formed, the same effects as in the case of forming the modified lines 22A to 22D according to the sixteenth configuration example can be exhibited. In particular, with the modified lines 22A to 22D according to the twentieth configuration example, the cleaving starting points can be formed in different regions in the thickness direction of the SiC semiconductor wafer structure 61 (SiC semiconductor wafer 41). The SiC semiconductor wafer structure 61 can thereby be cleaved appropriately even when the modified lines 22A to 22D constituted of a single layer are formed.

Figure 13Z:
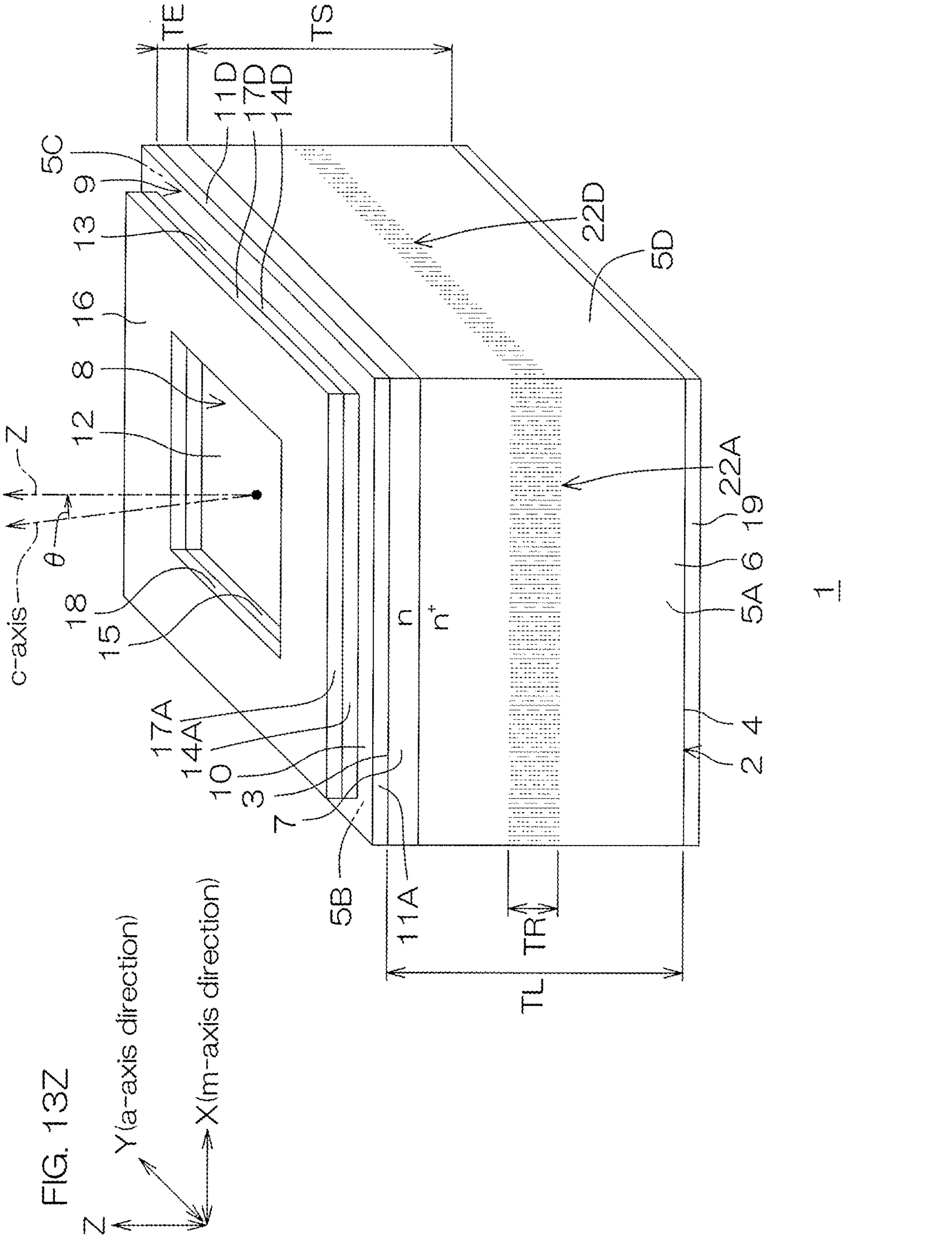

FIG. 13Z is a perspective view of the SiC semiconductor device 1 shown in FIG. 3 and is a perspective view of a twenty first configuration example of the modified lines 22A to 22D. In the following, structures corresponding to the structures described with the SiC semiconductor device 1 shall be provided with the same reference signs and description thereof shall be omitted.

The modified lines 22A to 22D according to the sixteen configuration example are formed in equal shapes at the side surfaces 5A to 5D. On the other hand, the modified lines 22A to 22D according to the twenty first configuration example are formed at different occupying ratios RA, RB, RC, and RD at the side surfaces 5A to 5D. The occupying ratios RA to RD are ratios of the modified lines 22A to 22D occupying in the side surfaces 5A to 5D.

More specifically, the occupying ratios RA to RD differ in accordance with the crystal planes of the SiC monocrystal. The occupying ratios RB and RD of the modified lines 22B and 22D formed at the m-planes of the SiC monocrystal are not more than the occupying ratios RA and RC of the modified lines 22A and 22C formed at the a-planes of the SiC monocrystal (RB, RDSRA, RC). More specifically, the occupying ratios RB and RD are less than occupying ratios RA and RC (RB, RD<RA, RC).

The occupying ratios RA and RC of the modified lines 22A and 22C may be mutually equal or may be mutually different. Also, the occupying ratios RB and RD of the modified lines 22B and 22D may be mutually equal or may be mutually different. In this configuration, surface areas of the modified lines 22B and 22D with respect to the side surfaces 5B and 5D are less than surface areas of the modified lines 22A and 22C with respect to the side surfaces 5A and 5C. In this configuration, the thicknesses TR of the modified lines 22B and 22D are less than the thicknesses TR of the modified lines 22A and 22C.

The modified lines 22A to 22D according to the twenty first configuration example are formed by adjusting the light converging portion (focal point), etc., of the laser light in the step of forming the modified lines 70 (see also FIG. 10K).

Even in a case where the modified lines 22A to 22D according to the twenty first configuration example are formed, the same effects as in the case of forming the modified lines 22A to 22D according to the sixteen configuration example can be exhibited. In particular, the modified lines 22A to 22D according to the twenty first configuration example are respectively formed at the different occupying ratios RA to RD at the side surfaces 5A to 5D. More specifically, the modified lines 22A to 22D have occupying ratios RA to RD that differ in accordance with the crystal planes of the SiC monocrystal.

The occupying ratios RB and RD of the modified lines 22B and 22D formed at the m-planes of the SiC monocrystal are not more than the occupying ratios RA and RC of the modified lines 22A and 22C formed at the a-planes of the SiC monocrystal (RB, RD≤RA, RC).

In a plan view of viewing the c-plane (silicon plane) from the c-axis, the SiC monocrystal has a physical property of cracking easily along the nearest atom directions (see also FIG. 1 and FIG. 2) and not cracking easily along directions intersecting the nearest atom directions. The nearest atom directions are the a-axis direction and directions equivalent thereto. The crystal planes oriented along the nearest atom directions are the m-planes and planes equivalent thereto. The directions intersecting the nearest atom directions are the m-axis direction and directions equivalent thereto. The crystal planes oriented along the directions intersecting the nearest atom directions are the a-planes and planes equivalent thereto.

Therefore, even if, in the step of forming the modified lines 70, the modified lines 70 having comparatively large occupying ratios are not formed at the crystal planes oriented along the nearest atom directions of the SiC monocrystal, the SiC monocrystal can be cut (cleaved) appropriately because these crystal planes have the property of cracking comparatively easily (see also FIG. 10L).

That is, in the step of forming the modified lines 70, the occupying ratios of the modified lines 70 oriented along the second cutting schedule lines 55 extending in the a-axis direction can be made smaller than the occupying ratios of the modified lines 70 oriented along the first cutting schedule lines 54 extending in the m-axis direction.

On the other hand, the modified lines 70 having the comparatively large occupying ratios are formed at the crystal planes oriented along the directions intersecting the nearest atom directions of the SiC monocrystal. Inappropriate cutting (cleaving) of the SiC semiconductor wafer structure 61 can thereby be suppressed and generation of cracks due to the physical property of the SiC monocrystal can thus be suppressed appropriately.

Thus, with the modified lines 22A to 22D according to the twenty first configuration example, the physical property of the SiC monocrystal can be used to adjust and reduce the occupying ratios RA to RD with respect to the side surfaces 5A to 5D. The influences on the SiC semiconductor layer 2 due to the modified lines 22A to 22D can thereby be reduced further. Time reduction of the step of forming the modified lines 70 can also be achieved.

The occupying ratios RA to RD may be adjusted by the surface areas of the modified lines 22A to 22D with respect to the side surfaces 5A to 5D. The occupying ratios RA to RD may be adjusted by the thicknesses TR of the modified lines 22A to 22D. The occupying ratios RA to RD may be adjusted by the numbers of the modified lines 22A to 22D.

The SiC semiconductor device 1 that includes at least two types of the modified lines 22A to 22D according to the sixteenth configuration example, seventeenth configuration example, eighteenth configuration example, nineteenth configuration example, twentieth configuration example, and twenty first configuration example (hereinafter referred to simply as the "sixteenth to twenty first configuration examples") at the same time may be formed.

Also, features of the modified lines 22A to 22D according to the sixteenth to twenty first configuration examples may be combined among each other in any mode or any configuration. That is, the modified lines 22A to 22D having configurations combining at least two features among the features of the modified lines 22A to 22D according to the sixteenth to twenty first configuration examples may be adopted.

For example, the features of the modified lines 22A to 22D according to the eighteenth configuration example may be combined with the features of the modified lines 22A to 22D according to the twentieth configuration example. In this case, band-shaped modified lines 22A to 22D inclined downwardly from the first main surface 3 toward the second main surface 4 and extending in curves (curved shapes) meandering from the first main surface 3 toward the second main surface 4 are formed.

Figure 14:
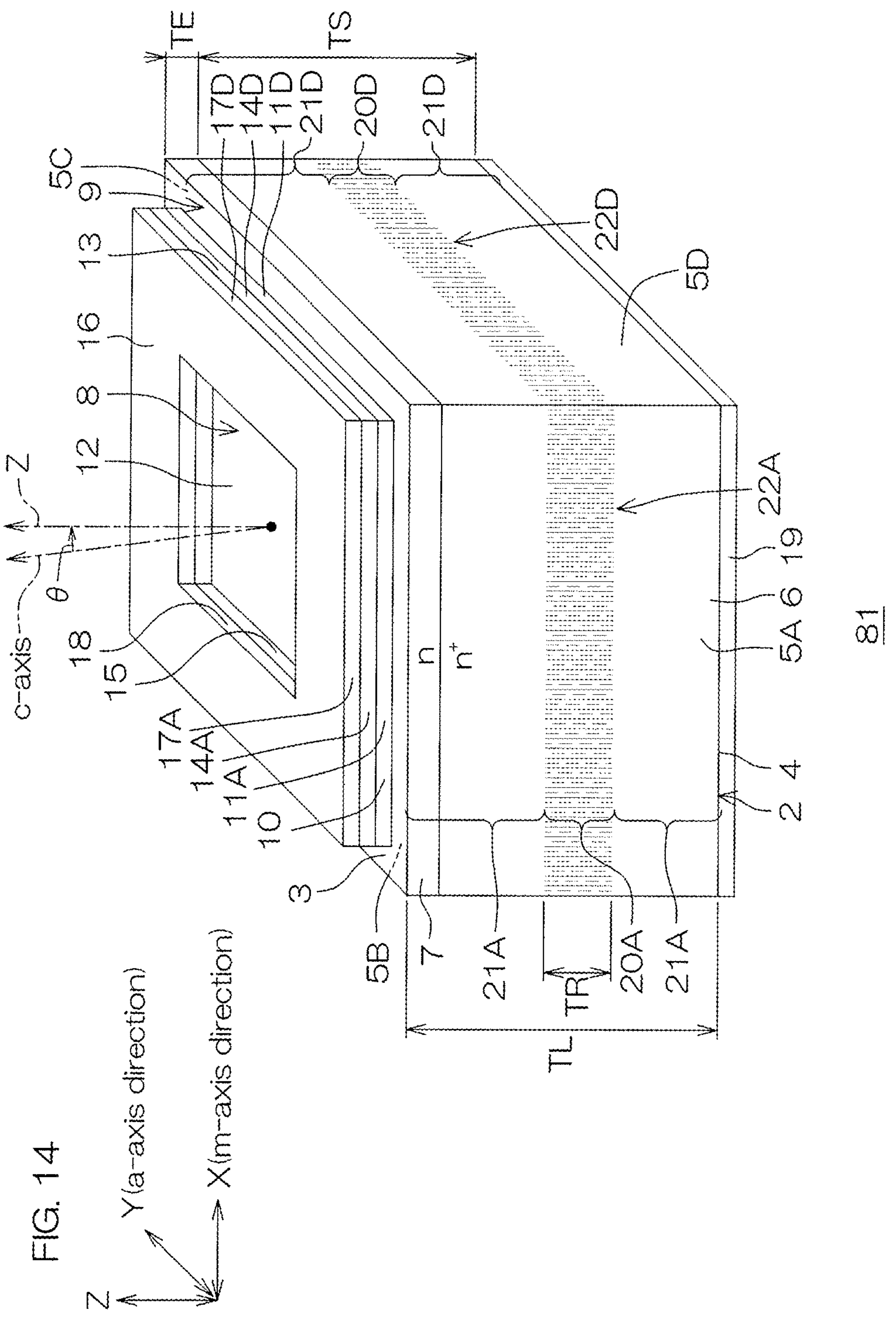
FIG. 14 is a perspective view showing an SiC semiconductor device according to a second preferred embodiment of the present invention and is a perspective view showing a structure applied with the modified lines according to the first configuration example.

FIG. 14 is a perspective view of an SiC semiconductor device 91 according to a second preferred embodiment of the present invention and is a perspective view of a structure applied with the modified lines 22A to 22D (the rough surface regions 20A to 20D and the smooth surface regions 21A to 21D) according to the first configuration example. In the following, structures corresponding to the structures described with the SiC semiconductor device 1 shall be provided with the same reference signs and description thereof shall be omitted.

In this embodiment, the rough surface regions 20A to 20D and the smooth surface regions 21A to 21D according to the first configuration example are applied. However, the modified lines 22A to 22D according to the second to eighth configuration examples may be adopted in place of or in addition to the modified lines 22A to 22D according to the first configuration example. Also, the modified lines 22A to 22D having configurations combining at least two features among the features of the modified lines 22A to 22D according to the first to eighth configuration examples may be adopted.

Also, the modified lines 22A to 22D according to the ninth configuration example may be adopted in place of the modified lines 22A to 22D according to the first configuration example. Also, any one of the modified lines 22A to 22D according to the tenth to fifteenth configuration examples may be adopted in place of or in addition to the modified lines 22A to 22D according to the ninth configuration example. Also, the modified lines 22A to 22D having configurations combining at least two features among the features of the modified lines 22A to 22D according to the ninth to fifteenth configuration examples may be adopted.

Also, the modified lines 22A to 22D according to the sixteenth configuration example may be adopted in place of the modified lines 22A to 22D according to the first configuration example. Also, any one of the modified lines 22A to 22D according to the seventeenth to twenty first configuration examples may be adopted in place of or in addition to the modified lines 22A to 22D according to the sixteenth configuration example. Also, the modified lines 22A to 22D having configurations combining at least two features among the features of the modified lines 22A to 22D according to the sixteenth to twenty first configuration examples may be adopted.

Referring to FIG. 14, in this embodiment, the insulating side surfaces 11A to 11D of the main surface insulating layer 10 are formed at intervals toward the inner region from the side surfaces 5A to 5D of the SiC semiconductor layer 2. In plan view, the main surface insulating layer 10 exposes a peripheral edge portion of the first main surface 3.

The main surface insulating layer 10, together with the resin layer 16 and the passivation layer 13, exposes the peripheral edge portion of the first main surface 3. In this embodiment, the insulating side surfaces 11A to 11D of the main surface insulating layer 10 are formed flush with the resin side surfaces 17A to 17D of the resin layer 16 and the side surfaces 14A to 14D of the passivation layer 13. In this embodiment, the resin side surfaces 11A to 11D demarcate a dicing street.

The main surface insulating layer 10 is formed by performing a step of removing the main surface insulating layer 10 by an etching method after the step of removing the passivation layer 13 in the step of FIG. 10I described above. In this case, in the step of FIG. 10K described above, the laser light may be irradiated directly onto an interior of the SiC semiconductor wafer structure 61 from the first main surface 62 side of the SiC semiconductor wafer structure 61 and not via the main surface insulating layer 10.

As described above, even with the SiC semiconductor device 91, the same effects as the effects described for the SiC semiconductor device 1 can be exhibited. However, in terms of improving the insulating property between the side surfaces 5A to 5D of the SiC semiconductor layer 2 and the first main surface electrode layer 12, the structure of the SiC semiconductor device 1 according to the first preferred embodiment is preferable.

Figure 15:
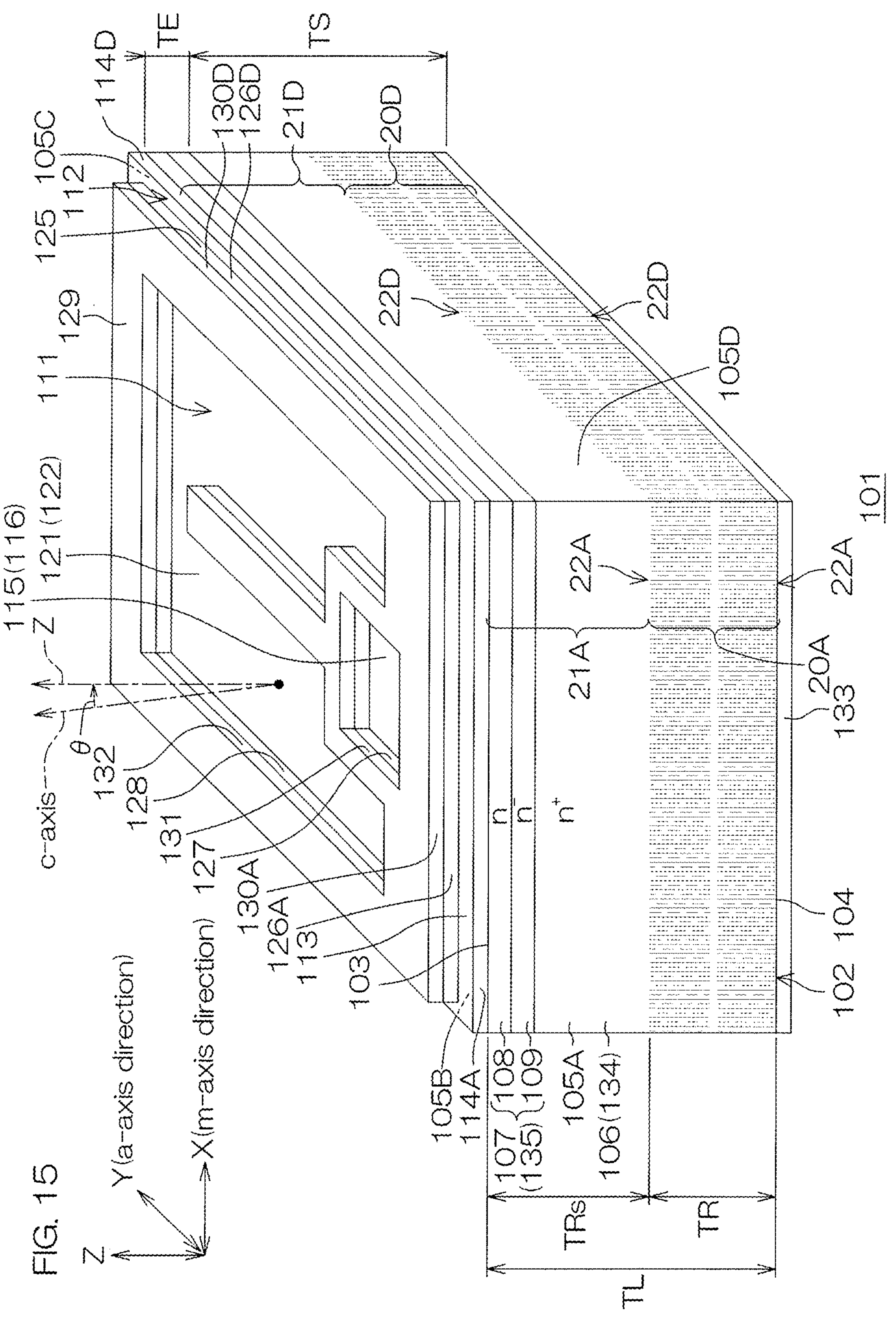
FIG. 15 is a perspective view as viewed from one angle of an SiC semiconductor device according to a third preferred embodiment of the present invention and is a perspective view showing a structure applied with the modified lines according to the first configuration example.
Figure 16:
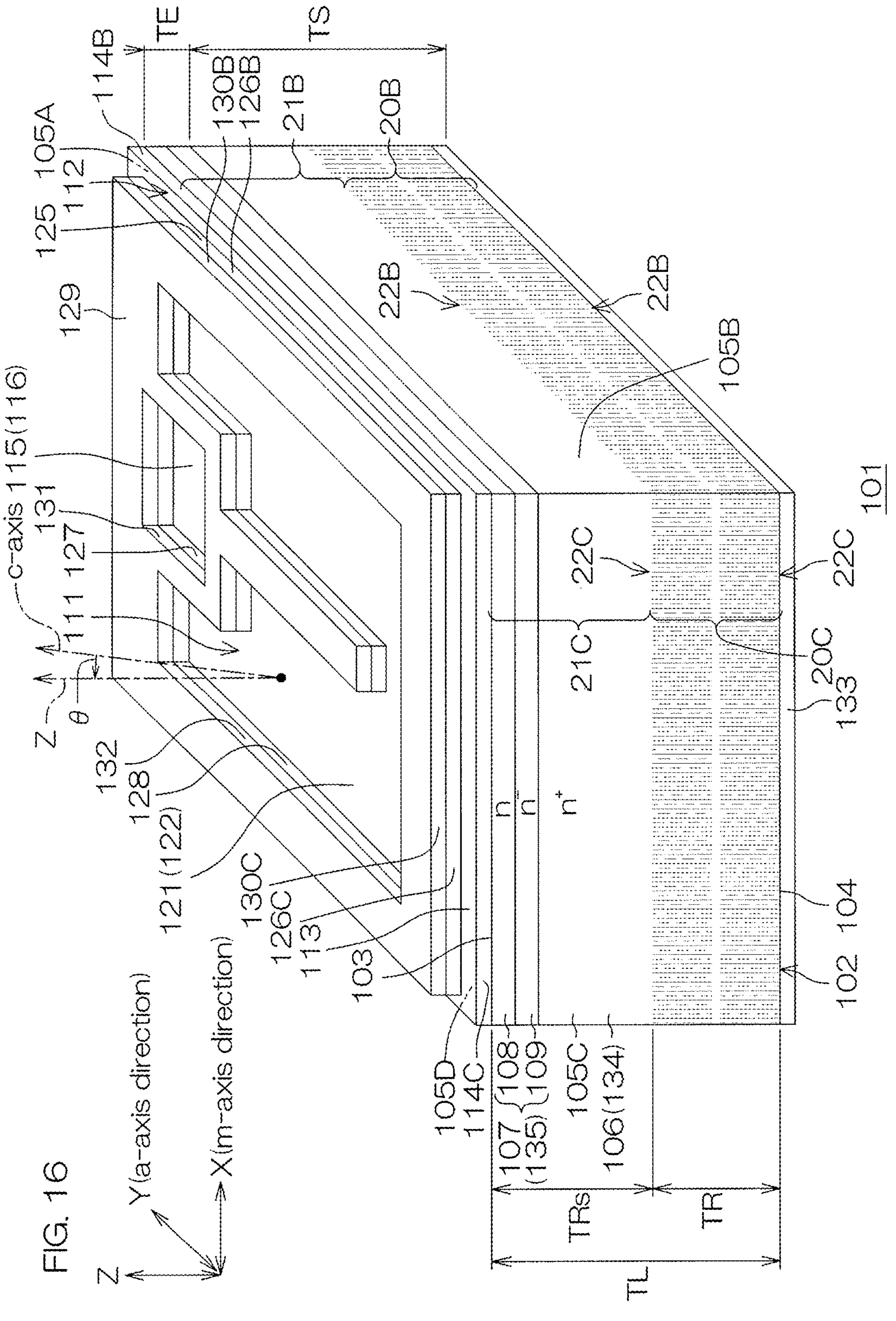
FIG. 16 is a perspective view as viewed from another angle of the SiC semiconductor device shown in FIG. 15.
Figure 17:
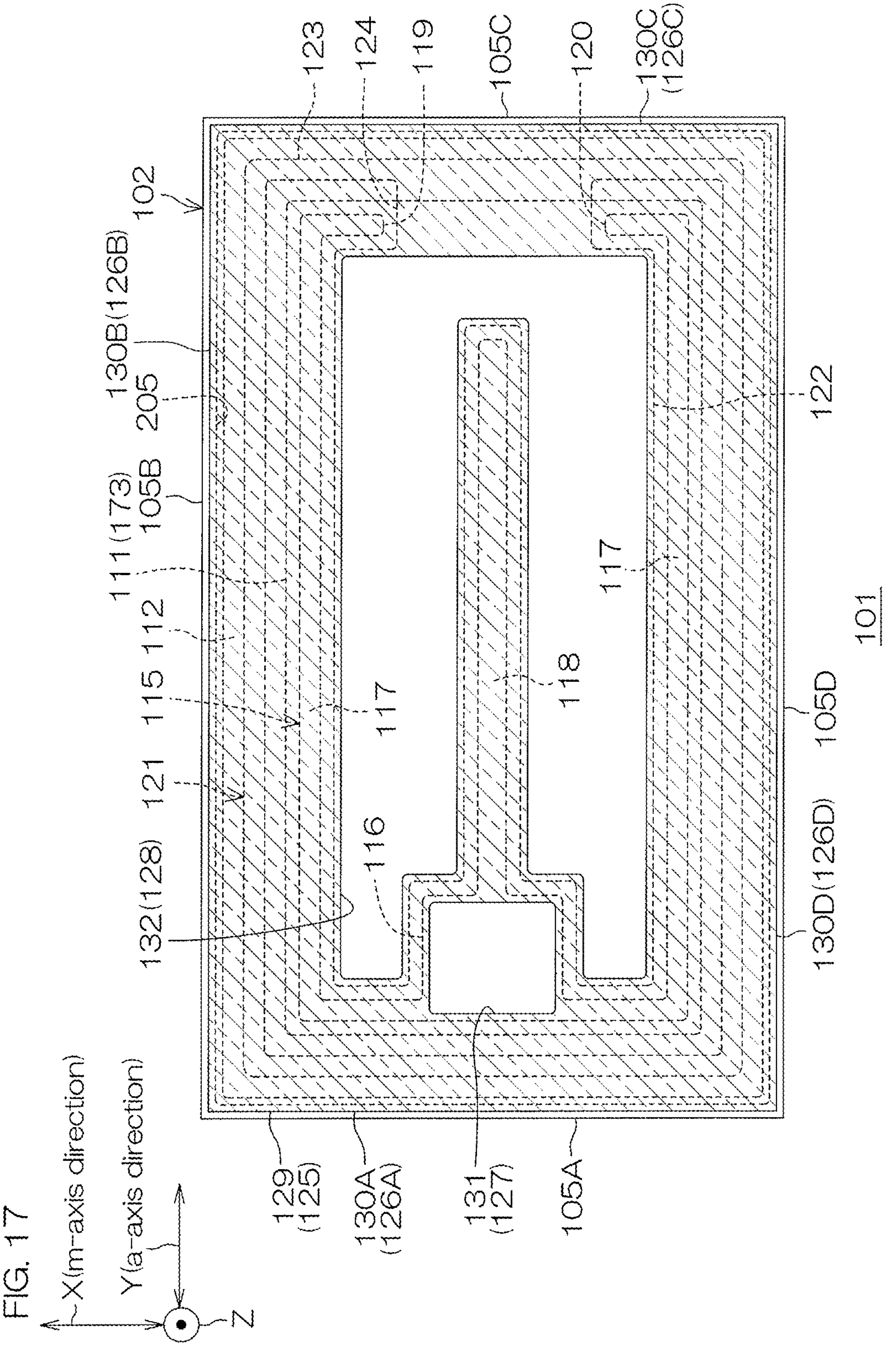
FIG. 17 is a plan view of the SiC semiconductor device shown in FIG. 15.
Figure 18:
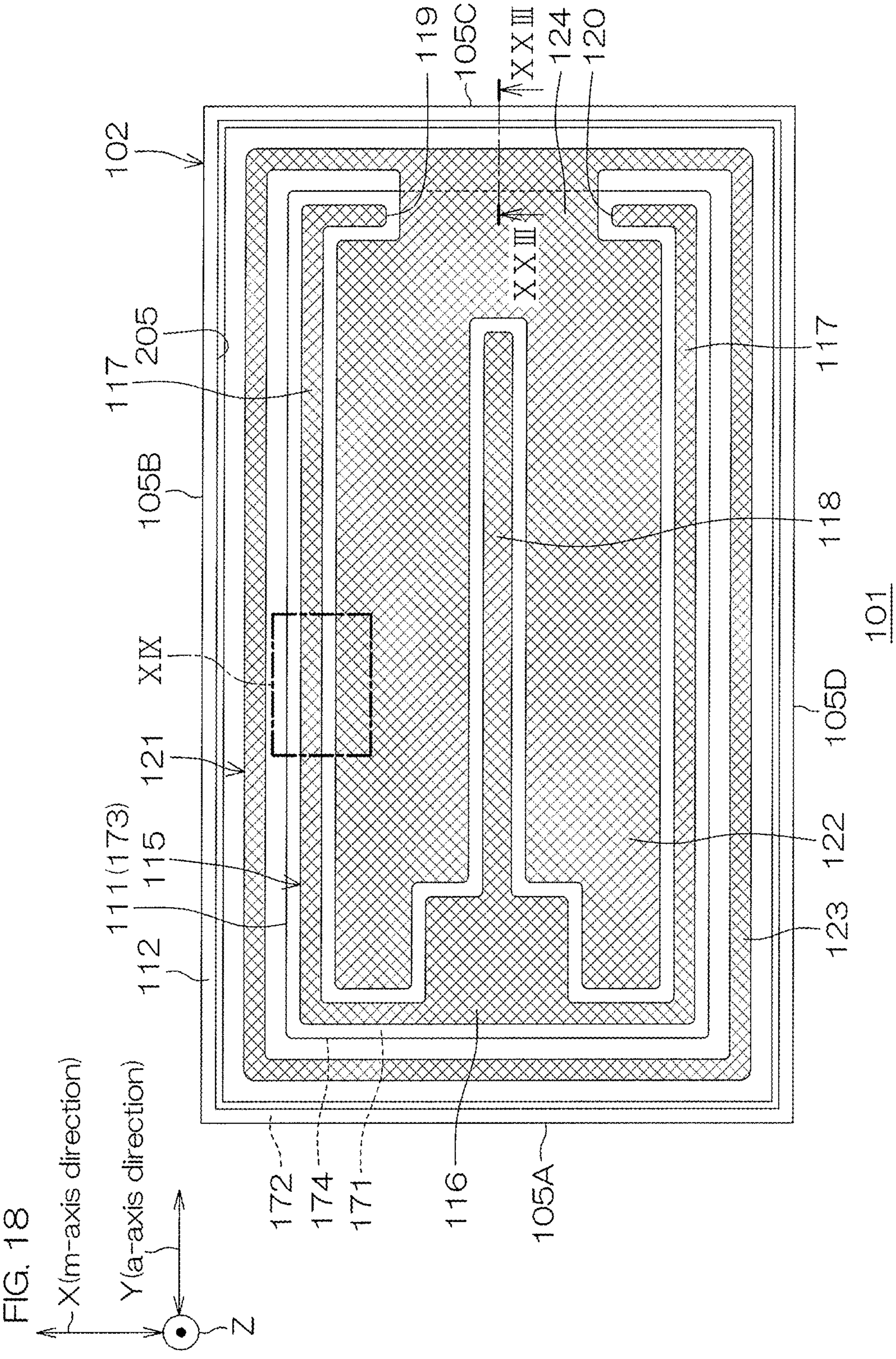
FIG. 18 is a plan view with a resin layer removed from FIG. 17.

FIG. 15 is a perspective view as viewed from one angle of an SiC semiconductor device 101 according to a third preferred embodiment of the present invention and is a perspective view showing a structure applied with the modified lines 22A to 22D according to the first configuration example. FIG. 16 is a perspective view as viewed from another angle of the SiC semiconductor device 101 shown in FIG. 15. FIG. 17 is a plan view of the SiC semiconductor device 101 shown in FIG. 15. FIG. 18 is a plan view with a resin layer 129 removed from FIG. 17.

In this embodiment, the modified lines 22A to 22D according to the first configuration example are applied. That is, in a manufacturing process of the SiC semiconductor device 101, the same steps as the steps of FIG. 10A to FIG. 10M described above are applied.

In the SiC semiconductor device 101, any one of the modified lines 22A to 22D according to the second to eighth configuration examples may be adopted in place of or in addition to the modified lines 22A to 22D according to the first configuration example. Also, the modified lines 22A to 22D having configurations combining at least two features among the features of the modified lines 22A to 22D according to the first to eighth configuration examples may be adopted.

Also, in the SiC semiconductor device 101, the modified lines 22A to 22D according to the ninth configuration example may be adopted in place of the modified lines 22A to 22D according to the first configuration example. Also, any one of the modified lines 22A to 22D according to the tenth to fifteenth configuration examples may be adopted in place of or in addition to the modified lines 22A to 22D according to the ninth configuration example. Also, the modified lines 22A to 22D having configurations combining at least two features among the features of the modified lines 22A to 22D according to the ninth to fifteenth configuration examples may be adopted.

Also, in the SiC semiconductor device 101, the modified lines 22A to 22D according to the sixteenth configuration example may be adopted in place of the modified lines 22A to 22D according to the first configuration example. Also, any one of the modified lines 22A to 22D according to the seventeenth to twenty first configuration examples may be adopted in place of or in addition to the modified lines 22A to 22D according to the sixteenth configuration example. Also, the modified lines 22A to 22D having configurations combining at least two features among the features of the modified lines 22A to 22D according to the sixteenth to twenty first configuration examples may be adopted.

Referring to FIG. 15 to FIG. 18, the SiC semiconductor device 101 includes an SiC semiconductor layer 102. The SiC semiconductor layer 102 includes a 4H-SiC monocrystal as an example of an SiC monocrystal constituted of a hexagonal crystal. The SiC semiconductor layer 102 is formed in a chip shape of rectangular parallelepiped shape.

The SiC semiconductor layer 102 has a first main surface 103 at one side, a second main surface 104 at another side, and side surfaces 105A, 105B, 105C, and 105D connecting the first main surface 103 and the second main surface 104. The first main surface 103 and the second main surface 104 are formed in quadrilateral shapes (rectangular shapes here) in a plan view as viewed in a normal direction Z thereof (hereinafter referred to simply as "plan view").

The first main surface 103 is a device surface in which a functional device is formed. The second main surface 104 is constituted of a ground surface having grinding marks. The side surfaces 105A to 105D are each constituted of a smooth cleavage surface facing a crystal plane of the SiC monocrystal. The side surfaces 105A to 105D are free from a grinding mark.

A thickness TL of the SiC semiconductor layer 102 may be not less than 40 μm and not more than 200 μm. The thickness TL may be not less than 40 μm and not more than 60 μm, not less than 60 μm and not more than 80 μm, not less than 80 μm and not more than 100 μm, not less than 100 μm and not more than 120 μm, not less than 120 μm and not more than 140 μm, not less than 140 μm and not more than 160 μm, not less than 160 μm and not more than 180 μm, or not less than 180 μm and not more than 200 μm. The thickness TL is preferably not less than 60 μm and not more than 150 μm.

In this embodiment, the first main surface 103 and the second main surface 104 face the c-planes of the SiC monocrystal. The first main surface 103 faces the (0001) plane (silicon plane). The second main surface 104 faces the (000-1) plane (carbon plane) of the SiC monocrystal.

The first main surface 103 and the second main surface 104 have an off angle θ inclined at an angle of not more than 10° in the [11-20] direction with respect to the c-planes of the SiC monocrystal. The normal direction Z is inclined by just the off angle θ with respect to the c-axis (direction) of the SiC monocrystal.

The off angle θ may be not less than 0° and not more than 5.0°. The off angle θ may be set in an angular range of not less than 0° and not more than 1.0°, not less than 1.0° and not more than 1.5°, not less than 1.5° and not more than 2.0°, not less than 2.0° and not more than 2.5°, not less than 2.5° and not more than 3.0°, not less than 3.0° and not more than 3.5°, not less than 3.5° and not more than 4.0°, not less than 4.0° and not more than 4.5°, or not less than 4.5° and not more than 5.0°. The off angle θ preferably exceeds 0°. The off angle θ may be less than 4.0°.

The off angle θ may be set in an angular range of not less than 3.0° and not more than 4.5°. In this case, the off angle θ is preferably set in an angular range of not less than 3.0° and not more than 3.5°, or not less than 3.5° and not more than 4.0°. The off angle θ may be set in an angular range of not less than 1.5° and not more than 3.0°. In this case, the off angle θ is preferably set in an angular range of not less than 1.5° and not more than 2.0°, or not less than 2.0° and not more than 2.5°.

Lengths of the side surfaces 105A to 105D may each be not less than 1 mm and not more than 10 mm (for example, not less than 2 mm and not more than 5 mm). In this embodiment, surface areas of the side surfaces 105B and 105D exceed surface areas of the side surfaces 105A and 105C. The first main surface 103 and the second main surface 104 may be formed in square shapes in plan view. In this case, the surface areas of the side surfaces 105A and 105C are equal to the surface areas of the side surfaces 105B and 105D.

In this embodiment, the side surface 105A and the side surface 105C extend in a first direction X and oppose each other in a second direction Y intersecting the first direction X. In this embodiment, the side surface 105B and the side surface 105D extend in the second direction Y and oppose each other in the first direction X. More specifically, the second direction Y is orthogonal to the first direction X.

In this embodiment, the first direction X is set to the m-axis direction ([1-100] direction) of the siC monocrystal. The second direction Y is set to the a-axis direction ([11-20] direction) of the SiC monocrystal.

The side surface 105A and the side surface 105C form short sides of the SiC semiconductor layer 102 in plan view. The side surface 105A and the side surface 105C are formed by the a-planes of the SiC monocrystal and oppose each other in the a-axis direction. The side surface 105A is formed by the (−1-120) plane of the SiC monocrystal. The side surface 105C is formed by the (11-20) plane of the SiC monocrystal.

The side surface 105A and the side surface 105C may form inclined surfaces that, when a normal to the first main surface 103 is taken as a basis, are inclined toward the c-axis direction ([0001] direction) of the SiC monocrystal with respect to the normal. In this case, the side surface 105A and the side surface 105C may be inclined at an angle in accordance with the off angle θ with respect to the normal to the first main surface 103 when the normal to the first main surface 103 is 0°. The angle in accordance with the off angle θ may be equal to the off angle θ or may be an angle that exceeds 0° and is less than the off angle θ.

The side surface 105B and the side surface 105D form long sides of the SiC semiconductor layer 102 in plan view. The side surface 105B and the side surface 105D are formed by the m-planes of the SiC monocrystal and oppose each other in the m-axis direction. The side surface 105B is formed by the (−1100) plane of the SiC monocrystal. The side surface 105D is formed by the (1-100) plane of the SiC monocrystal. The side surface 105B and the side surface 105D extend in plane shapes along the normal to the first main surface 103. More specifically, the side surface 105B and the side surface 105D are formed substantially perpendicular to the first main surface 103 and the second main surface 104.

In this embodiment, the SiC semiconductor layer 102 has a laminated structure that includes an n+ type SiC semiconductor substrate 106 and an n type SiC epitaxial layer 107. The SiC semiconductor substrate 106 and the SiC epitaxial layer 107 respectively correspond to the SiC semiconductor substrate 6 and the SiC epitaxial layer 7 according to the first preferred embodiment. The second main surface 104 of the SiC semiconductor layer 102 is formed by the SiC semiconductor substrate 106.

The first main surface 103 is formed by the SiC epitaxial layer 107. The side surfaces 105A to 105D of the SiC semiconductor layer 102 are formed by the SiC semiconductor substrate 106 and the SiC epitaxial layer 107.

A thickness TS of the SiC semiconductor substrate 106 may be not less than 40 μm and not more than 150 μm. The thickness TS may be not less than 40 μm and not more than 50 μm, not less than 50 μm and not more than 60 μm, not less than 60 μm and not more than 70 μm, not less than 70 μm and not more than 80 μm, not less than 80 μm and not more than 90 μm, not less than 90 μm and not more than 100 μm, not less than 100 μm and not more than 110 μm, not less than 110 μm and not more than 120 μm, not less than 120 μm and not more than 130 μm, not less than 130 μm and not more than 140 μm, or not less than 140 μm and not more than 150 μm. The thickness TS is preferably not less than 40 μm and not more than 130 μm. By thinning the SiC semiconductor substrate 106, a current path is shortened and reduction of resistance value can thus be achieved.

A thickness TE of the SiC epitaxial layer 107 may be not less than 1 μm and not more than 50 μm. The thickness TE may be not less than 1 μm and not more than 5 μm, not less than 5 μm and not more than 10 μm, not less than 10 μm and not more than 15 μm, not less than 15 μm and not more than 20 μm, not less than 20 μm and not more than 25 μm, not less than 25 μm and not more than 30 μm, not less than 30 μm and not more than 35 μm, not less than 35 μm and not more than 40 μm, not less than 40 μm and not more than 45 μm, or not less than 45 μm and not more than 50 μm. The thickness TE is preferably not less than 5 μm and not more than 15 μm.

An n type impurity concentration of the sic epitaxial layer 107 is not more than an n type impurity concentration of the SiC semiconductor substrate 106. More specifically, the n type impurity concentration of the SiC epitaxial layer 107 is less than the n type impurity concentration of the SiC semiconductor substrate 106. The n type impurity concentration of the SiC semiconductor substrate 106 may be not less than $1.0\times10^{18}$ $cm^{-3}$ and not more than $1.0\times10^{21}$ $cm^{-3}$. The n type impurity concentration of the SiC epitaxial layer 107 may be not less than $1.0\times10^{15}$ $cm^{-3}$ and not more than $1.0\times10^{18}$ $cm^{-3}$.

In this embodiment, the SiC epitaxial layer 107 has a plurality of regions having different n type impurity concentrations along the normal direction Z. More specifically, the SiC epitaxial layer 107 includes a high concentration region 108 having a comparatively high n type impurity concentration and a low concentration region 109 having an n type impurity concentration lower than the high concentration region 108. The high concentration region 108 is formed in a region at the first main surface 103 side. The low concentration region 109 is formed in a region at the second main surface 104 side with respect to the high concentration region 108.

The n type impurity concentration of the high concentration region 108 may be not less than $1\times10^{16}$ $cm^{-3}$ and not more than $1\times10^{18}$ $cm^{-3}$. The n type impurity concentration of the low concentration region 109 may be not less than $1\times10^{15}$ $cm^{-3}$ and not more than $1\times10^{16}$ $cm^{-3}$.

A thickness of the high concentration region 108 is not more than a thickness of the low concentration region 109. More specifically, the thickness of the high concentration region 108 is less than the thickness of the low concentration region 109. The thickness of the high concentration region 108 is less than one-half the total thickness of the SiC epitaxial layer 107.

The SiC semiconductor layer 102 includes an active region 111 and an outer region 112. The active region 111 is a region in which a vertical MISFET (metal insulator field effect transistor) is formed as an example of a functional device. In plan view, the active region 111 is formed in a central portion of the SiC semiconductor layer 102 at intervals toward an inner region from the side surfaces 105A to 105D. In plan view, the active region 111 is formed in a quadrilateral shape (a rectangular shape in this embodiment) having four sides parallel to the four side surfaces 105A to 105D.

The outer region 112 is a region at an outer side of the active region 111. The outer region 112 is formed in a region between the side surfaces 105A to 105D and peripheral edges of the active region 111. The outer region 112 is formed in an endless shape (a quadrilateral annular shape in this embodiment) surrounding the active region 111 in plan view.

The SiC semiconductor device 101 includes a main surface insulating layer 113 formed on the first main surface 103. The main surface insulating layer 113 corresponds to the main surface insulating layer 10 according to the first preferred embodiment. The main surface insulating layer 113 selectively covers the active region 111 and the outer region 112. The main surface insulating layer 113 may include silicon oxide ($SiO_2$).

The main surface insulating layer 113 has four insulating side surfaces 114A, 114B, 114C, and 114D exposed from the side surfaces 105A to 105D. The insulating side surfaces 114A to 114D are continuous to the side surfaces 105A to 105D. The insulating side surfaces 114A to 114D are formed flush with the side surfaces 105A to 105D. The insulating side surfaces 114A to 114D are constituted of cleavage surfaces.

A thickness of the main surface insulating layer 113 may be not less than 1 μm and not more than 50 μm. The thickness of the main surface insulating layer 113 may be not less than 1 μm and not more than 10 μm, not less than 10 μm and not more than 20 μm, not less than 20 μm and not more than μm, not less than 30 μm and not more than 40 μm, or not less than 40 μm and not more than 50 μm.

The SiC semiconductor device 101 includes a main surface gate electrode layer 115 formed on the main surface insulating layer 113 as one of first main surface electrode layers. A gate voltage is applied to the main surface gate electrode layer 115. The gate voltage may be not less than 10 V and not more than 50 V (for example, approximately 30 V). The main surface gate electrode layer 115 penetrates through the main surface insulating layer 113 and is electrically connected to an arbitrary region of the SiC semiconductor layer 102.

The main surface gate electrode layer 115 includes a gate pad 116 and gate fingers 117 and 118. The gate pad 116 and the gate fingers 117 and 118 are arranged in the active region 111.

The gate pad 116 is formed along the side surface 105A in plan view. The gate pad 116 is formed along a central region of the side surface 105A in plan view. The gate pad 116 may be formed along a corner portion connecting any two of the side surfaces 105A to 105D in plan view. The gate pad 116 may be formed in a quadrilateral shape in plan view.

The gate fingers 117 and 118 include an outer gate finger 117 and an inner gate finger 118. The outer gate finger 117 is led out from the gate pad 116 and extends in a band shape along a peripheral edge of the active region 111. In this embodiment, the outer gate finger 117 is formed along the three side surfaces 105A, 105B, and 105D such as to demarcate an inner region of the active region 111 from three directions.

The outer gate finger 117 has a pair of open end portions 119 and 120. The pair of open end portions 119 and 120 are formed in a region opposing the gate pad 116 across the inner region of the active region 111. In this embodiment, the pair of open end portions 119 and 120 are formed along the side surface 105C.

The inner gate finger 118 is led out from the gate pad 116 to the inner region of the active region 111. The inner gate finger 118 extends in a band shape in the inner region of the active region 111. The inner gate finger 118 extends from the gate pad 116 toward the side surface 105C.

The SiC semiconductor device 101 includes a main surface source electrode layer 121 formed on the main surface insulating layer 113 as one of the first main surface electrode layers. A source voltage is applied to the main surface source electrode layer 121. The source voltage may be a reference voltage (for example, a GND voltage). The main surface source electrode layer 121 penetrates through the main surface insulating layer 113 and is electrically connected to an arbitrary region of the SiC semiconductor layer 102. In this embodiment, the main surface source electrode layer 121 includes a source pad 122, a source routing wiring 123, and a source connection portion 124.

The source pad 122 is formed in the active region 111 at intervals from the gate pad 116 and the gate fingers 117 and 118. The source pad 122 is formed in a C shape (an inverted C shape in FIG. 17 and FIG. 18) in plan view such as to cover a region of C shape (inverted C shape in FIG. 17 and FIG. 18) demarcated by the gate pad 116 and the gate fingers 117 and 118.

The source routing wiring 123 is formed in the outer region 112. The source routing wiring 123 extends in a band shape along the active region 111. In this embodiment, the source routing wiring 123 is formed in an endless shape (a quadrilateral annular shape in this embodiment) surrounding the active region 111 in plan view. The source routing wiring 123 is electrically connected to the SiC semiconductor layer 102 in the outer region 112.

The source connection portion 124 connects the source pad 122 and the source routing wiring 123. The source connection portion 124 is formed in a region between the pair of open end portions 119 and 120 of the outer gate finger 117. The source connection portion 124 crosses a boundary region between the active region 111 and the outer region 112 from the source pad 122 and is connected to the source routing wiring 123.

The MISFET formed in the active region 111 includes an npn type parasitic bipolar transistor due to its structure. When an avalanche current generated in the outer region 112 flows into the active region 111, the parasitic bipolar transistor is switched to an on state. In this case, control of the MISFET may become unstable, for example, due to latchup.

Therefore, with the SiC semiconductor device 101, the structure of the main surface source electrode layer 121 is used to form an avalanche current absorbing structure that absorbs the avalanche current generated in the outer region 112. More specifically, the avalanche current generated in the outer region 112 is absorbed by the source routing wiring 123 and reaches the source pad 122 via the source connection portion 124. If a conductive wire (for example, a bonding wire) for external connection is connected to the source pad 122, the avalanche current is taken out by this conductive wire.

Switching of the parasitic bipolar transistor to the on state by an undesirable current generated in the outer region 112 can thereby be suppressed. Latchup can thus be suppressed and therefore stability of control of the MISFET can be improved.

The SiC semiconductor device 101 includes a passivation layer 125 (insulating layer) formed on the main surface insulating layer 113. The passivation layer 125 may have a single layer structure constituted of a silicon oxide layer or a silicon nitride layer. The passivation layer 125 may have a laminated structure that includes a silicon oxide layer and a silicon nitride layer. The silicon oxide layer may be formed on the silicon nitride layer. The silicon nitride layer may be formed on the silicon oxide layer. In this embodiment, the passivation layer 125 has a single layer structure constituted of a silicon nitride layer.

The passivation layer 125 includes four side surfaces 126A, 126B, 126C, and 126D. In plan view, the side surfaces 126A to 126D of the passivation layer 125 are formed at intervals toward the inner region from the side surfaces 105A to 105D of the SiC semiconductor layer 102. In plan view, the passivation layer 125 exposes a peripheral edge portion of the SiC semiconductor layer 102. The passivation layer 125 exposes the main surface insulating layer 113.

The passivation layer 125 selectively covers the main surface gate electrode layer 115 and the main surface source electrode layer 121. The passivation layer 125 includes a gate sub pad opening 127 and a source sub pad opening 128. The gate sub pad opening 127 exposes the gate pad 116. The source sub pad opening 128 exposes the source pad 122.

A thickness of the passivation layer 125 may be not less than 1 μm and not more than 50 μm. The thickness of the passivation layer 125 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm.

The SiC semiconductor device 101 includes a resin layer 129 (insulating layer) formed on the passivation layer 125. The passivation layer 125 and the resin layer 129 form a single insulating laminated structure (insulating layer). In FIG. 17, the resin layer 129 is shown with hatching.

The resin layer 129 may include a negative type or positive type photosensitive resin. In this embodiment, the resin layer 129 includes a polybenzoxazole as an example of a positive type photosensitive resin. The resin layer 129 may include a polyimide as an example of a negative type photosensitive resin.

The resin layer 129 selectively covers the main surface gate electrode layer 115 and the main surface source electrode layer 121. The resin layer 129 includes four resin side surfaces 130A, 130B, 130C, and 130D. The resin side surfaces 130A to 130D are formed at intervals toward the inner region from the side surfaces 105A to 105D of the SiC semiconductor layer 102. The resin layer 129, together with the passivation layer 125, exposes the main surface insulating layer 113. In this embodiment, the resin side surfaces 130A to 130D are formed flush with the side surfaces 126A to 126D of the passivation layer 125.

The resin side surfaces 130A to 130D of the resin layer 129, with the side surfaces 105A to 105D of the SiC semiconductor layer 102, demarcate a dicing street. In this embodiment, the side surfaces 126A to 126D of the passivation layer 125 also demarcate the dicing street. According to the dicing street, it is made unnecessary to physically cut the resin layer 129 and the passivation layer 125 when cutting out the SiC semiconductor device 101 from a single siC semiconductor wafer. The SiC semiconductor device 101 can thereby be cut out smoothly from the single SiC semiconductor wafer. Also, insulation distances from the side surfaces 105A to 105D can be increased.

A width of the dicing street may be not less than 1 μm and not more than 25 μm. The width of the dicing street may be not less than 1 μm and not more than 5 μm, not less than 5 μm and not more than 10 μm, not less than 10 μm and not more than 15 μm, not less than 15 μm and not more than 20 μm, or not less than 20 μm and not more than 25 μm.

The resin layer 129 includes a gate pad opening 131 and a source pad opening 132. The gate pad opening 131 exposes the gate pad 116. The source pad opening 132 exposes the source pad 122.

The gate pad opening 131 is in communication with the gate sub pad opening 127 of the passivation layer 125. Inner walls of the gate pad opening 131 may be positioned at outer sides of inner walls of the gate sub pad opening 127. The inner walls of the gate pad opening 131 may be positioned at inner sides of the inner walls of the gate sub pad opening 127. The resin layer 129 may cover the inner walls of the gate sub pad opening 127.

The source pad opening 132 is in communication with the source sub pad opening 128 of the passivation layer 125. The inner walls of the gate pad opening 131 may be positioned at outer sides of inner walls of the source sub pad opening 128. Inner walls of the source pad opening 132 may be positioned at inner sides of the inner walls of the source sub pad opening 128. The resin layer 129 may cover the inner walls of the source sub pad opening 128.

A thickness of the resin layer 129 may be not less than 1 μm and not more than 50 μm. The thickness of the resin layer 129 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm.

The SiC semiconductor device 101 includes a drain electrode layer 133 formed on the second main surface 104 as a second main surface electrode layer. The drain electrode layer 133 forms an ohmic contact with the second main surface 104 (SiC semiconductor substrate 106). That is, the SiC semiconductor substrate 106 is formed as a drain region 134 of the MISFET. Also, the SiC epitaxial layer 107 is formed as a drift region 135 of the MISFET. A maximum voltage applicable between the main surface source electrode layer 121 and the drain electrode layer 133 in an off state may be not less than 1000 V and not more than 10000 V.

The drain electrode layer 133 may include at least one layer among a Ti layer, an Ni layer, an Au layer, an Ag layer, and an Al layer. The drain electrode layer 133 may have a single layer structure that includes a Ti layer, an Ni layer, an Au layer, an Ag layer, or an Al layer. The drain electrode layer 133 may have a laminated structure in which at least two layers among a Ti layer, an Ni layer, an Au layer, an Ag layer, and an Al layer are laminated in any mode. The drain electrode layer 133 may have a four-layer structure that includes a Ti layer, an Ni layer, an Au layer, and an Ag layer that are laminated in that order from the second main surface 104.

The SiC semiconductor device 101 includes the plurality of modified lines 22A to 22D (the rough surface regions 20A to 20D and the smooth surface regions 21A to 21D) according to the first configuration example that are formed at the side surfaces 105A to 105D of the SiC semiconductor layer 102. The structure of the modified lines 22A to 22D of the SiC semiconductor device 101 is the same as the structure of the modified lines 22A to 22D of the SiC semiconductor device 1 with the exception of the point of being formed in the SiC semiconductor layer 102 instead of the siC semiconductor layer 2.

The descriptions of the modified lines 22A to 22D of the SiC semiconductor device 1 apply respectively to the modified lines 22A to 22D of the SiC semiconductor device 101. Specific descriptions of the modified lines 22A to 22D of the SiC semiconductor device 101 shall be omitted.

Figure 19:
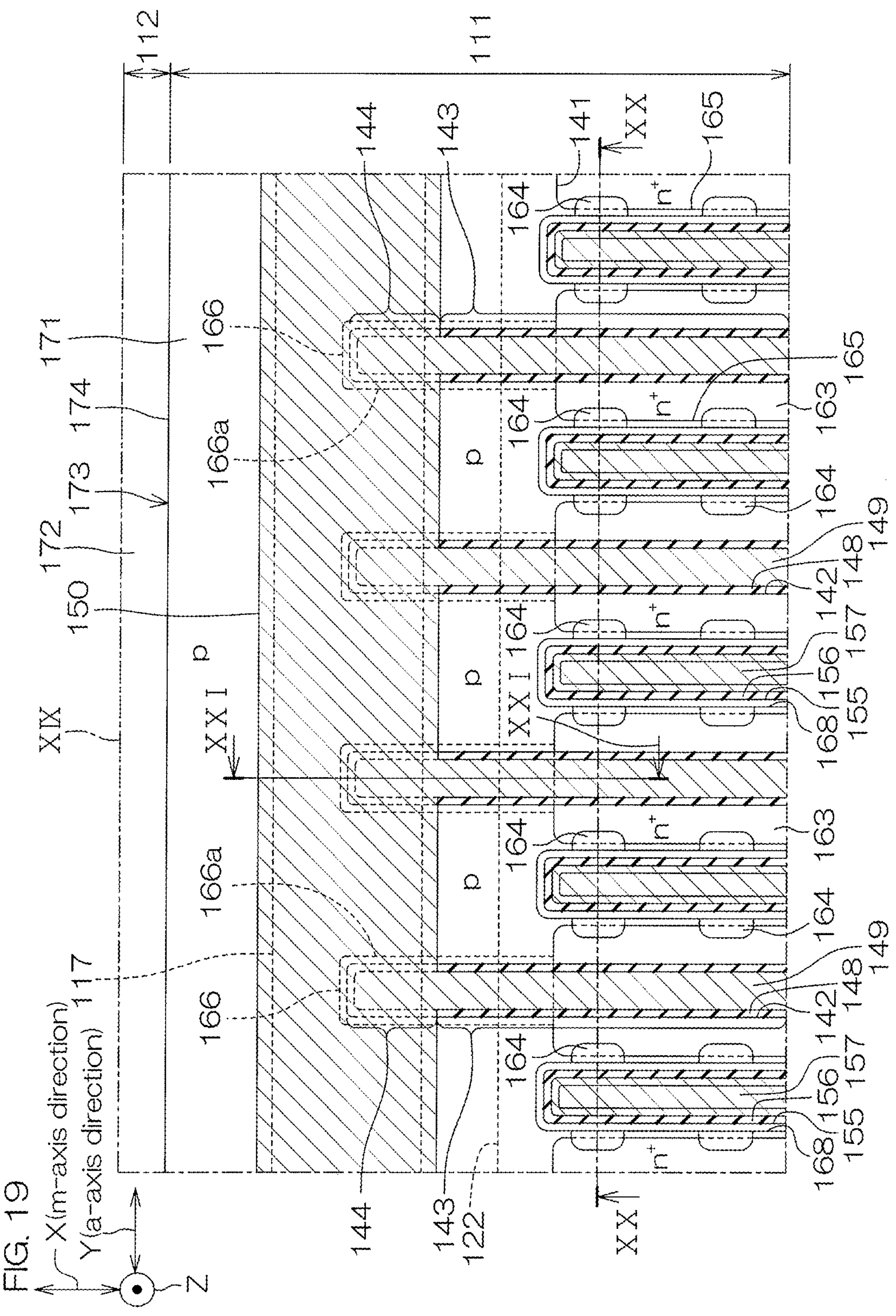
FIG. 19 is an enlarged view of a region XIX shown in FIG. 18 and is a diagram for describing the structure of a first main surface of an SiC semiconductor layer.
Figure 20:
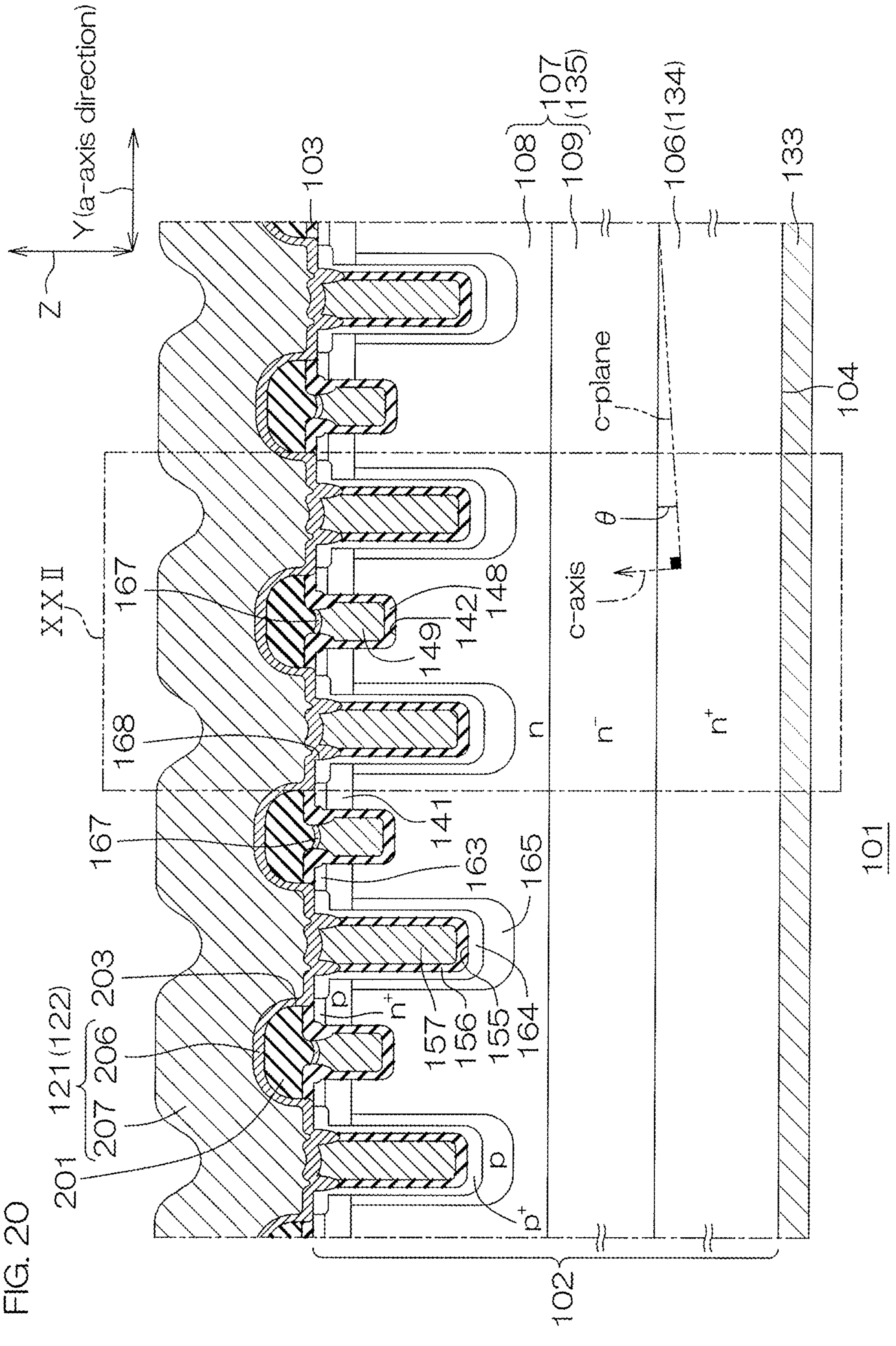
FIG. 20 is a sectional view taken along line XX-XX shown in FIG. 19.
Figure 21:
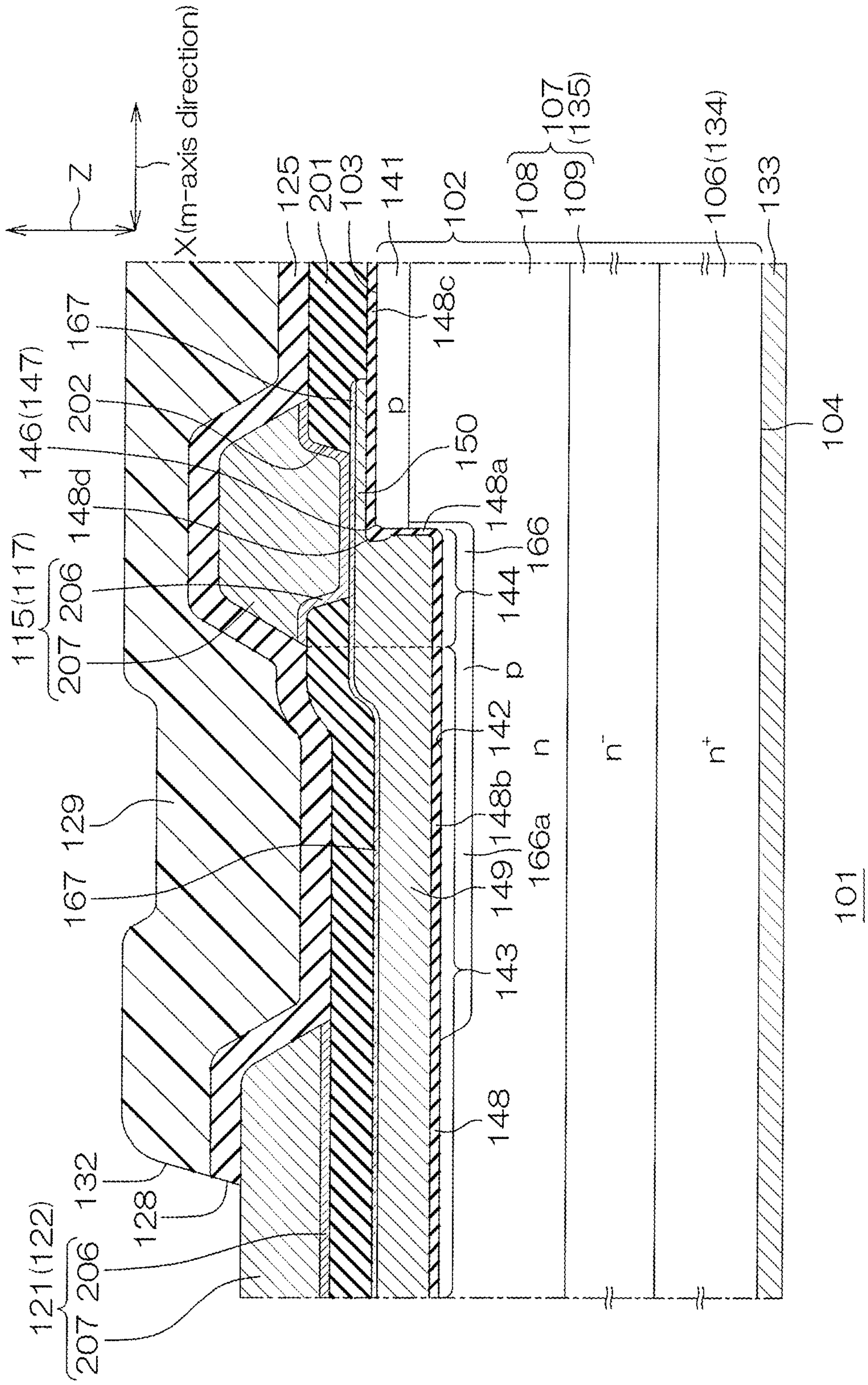
FIG. 21 is a sectional view taken along line XXI-XXI shown in FIG. 19.
Figure 22:
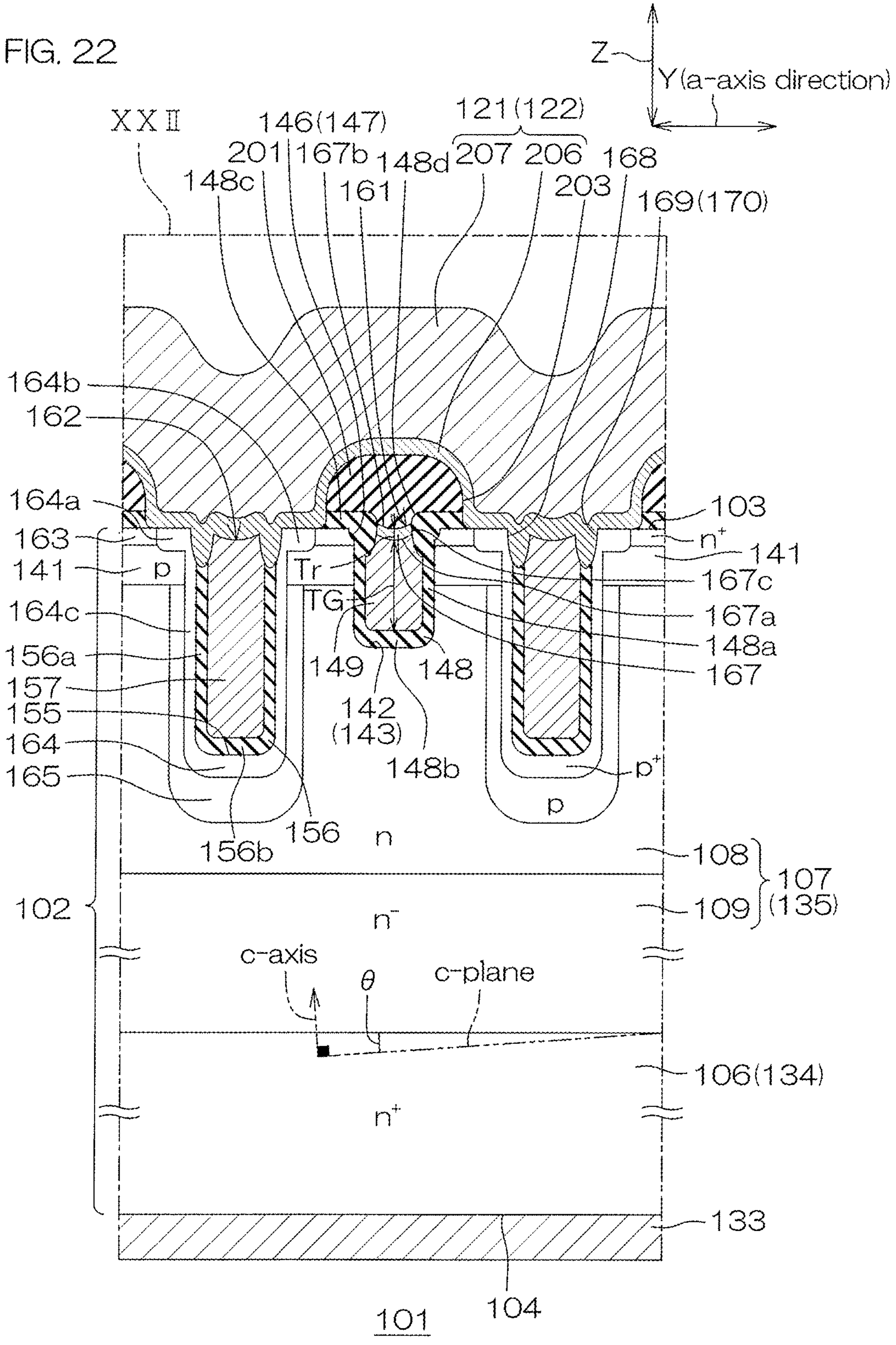
FIG. 22 is an enlarged view of a region XXII shown in FIG. 22.
Figure 23:
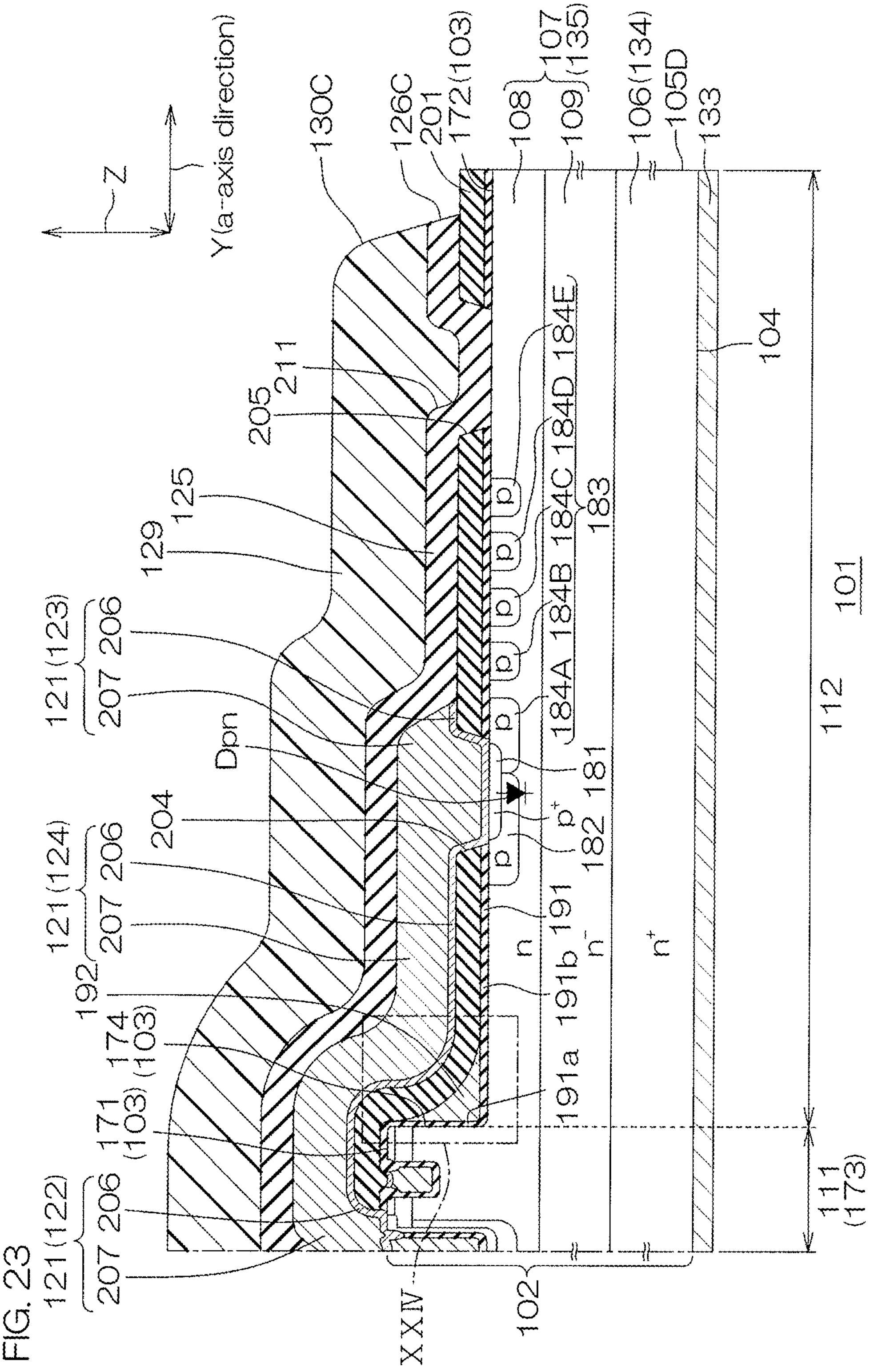
FIG. 23 is a sectional view taken along line XXIII-XXIII shown in FIG. 18.
Figure 24:
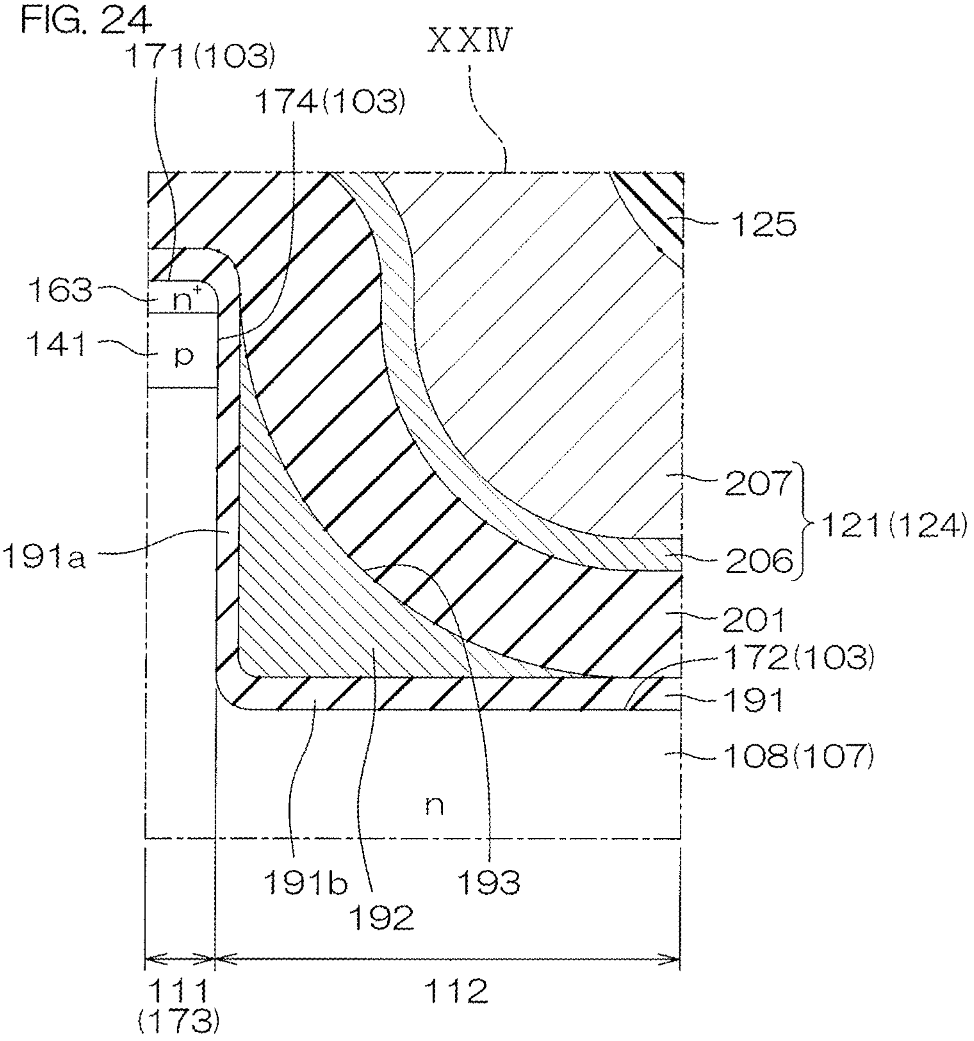
FIG. 24 is an enlarged view of a region XXIV shown in FIG. 23.

FIG. 19 is an enlarged view of a region XIX shown in FIG. 18 and is a diagram for describing the structure of the first main surface 103. FIG. 20 is a sectional view taken along line XX-XX shown in FIG. 19. FIG. 21 is a sectional view taken along line XXI-XXI shown in FIG. 19. FIG. 22 is an enlarged view of a region XXII shown in FIG. 20. FIG. 23 is a sectional view taken along line XXIII-XXIII shown in FIG. 18. FIG. 24 is an enlarged view of a region XXIV shown in FIG. 23.

Referring to FIG. 19 to FIG. 23, the SiC semiconductor device 101 includes a p type body region 141 formed in a surface layer portion of the first main surface 103 in the active region 111. In this embodiment, the body region 141 is formed over an entire area of a region of the first main surface 103 forming the active region 111. The body region 141 thereby defines the active region 111. A p type impurity concentration of the body region 141 may be not less than $1.0\times10^{17}$ $cm^{-3}$ and not more than $1.0\times10^{19}$ $cm^{-3}$.

The SiC semiconductor device 101 includes a plurality of gate trenches 142 formed in the surface layer portion of the first main surface 103 in the active region 111. In plan view, the plurality of gate trenches 142 are respectively formed in band shapes extending along the first direction X (the m-axis direction of the SiC monocrystal) and are formed at intervals along the second direction Y (the a-axis direction of the SiC monocrystal).

In this embodiment, each gate trench 142 extends from a peripheral edge portion at one side (the side surface 105B side) toward a peripheral edge portion at another side (the side surface 105D side) of the active region 111. The plurality of gate trenches 142 are formed in a stripe shape as a whole in plan view.

Each gate trench 142 crosses an intermediate portion between the peripheral edge portion at the one side and the peripheral edge portion at the other side of the active region 111. One end portion of each gate trench 142 is positioned at the peripheral edge portion at the one side of the active region 111. Another end portion of each gate trench 142 is positioned at the peripheral edge portion at the other side of the active region 111.

A length of each gate trench 142 may be not less than 0.5 mm. The length of each gate trench 142 is, in the section shown in FIG. 21, a length from the end portion at the side of a connection portion of each gate trench 142 and the outer gate finger 117 to the end portion at the opposite side. In this embodiment, the length of each gate trench 142 is not less than 1 mm and not more than 10 mm (for example, not less than 2 mm and not more than 5 mm). A total extension of one or a plurality of the gate trenches 142 per unit area may be not less than 0.5 μm/μm$^2$ and not more than 0.75 μm/μm$^2$.

Each gate trench 142 integrally includes an active trench portion 143 and a contact trench portion 144. The active trench portion 143 is a portion in the active region 111 oriented along a channel of the MISFET.

The contact trench portion 144 is a portion of the gate trench 142 that mainly serves as a contact with the outer gate finger 117. The contact trench portion 144 is led out from the active trench portion 143 to the peripheral edge portion of the active region 111. The contact trench portion 144 is formed in a region directly below the outer gate finger 117. A lead-out amount of the contact trench portion 144 is arbitrary.

Each gate trench 142 penetrates through the body region 141 and reaches the SiC epitaxial layer 107. Each gate trench 142 includes side walls and a bottom wall. The side walls that form long sides of each gate trench 142 are formed by the a-planes of the SiC monocrystal. The side walls that form short sides of each gate trench 142 are formed by the m-planes of the SiC monocrystal.

The side walls of each gate trench 142 may extend along the normal direction Z. The side walls of each gate trench 142 may be formed substantially perpendicular to the first main surface 103. Angles that the side walls of each gate trench 142 form with respect to the first main surface 103 inside the SiC semiconductor layer 102 may be not less than 90° and not more than 95° (for example, not less than 91° and not more than 93°). Each gate trench 142 may be formed in a tapered shape with an opening area at the bottom wall side being smaller than an opening area at an opening side in sectional view.

The bottom wall of each gate trench 142 is positioned at the SiC epitaxial layer 107. More specifically, the bottom wall of each gate trench 142 is positioned at the high concentration region 108 of the SiC epitaxial layer 107. The bottom wall of each gate trench 142 faces the c-plane of the SiC monocrystal. The bottom wall of each gate trench 142 has the off angle θ inclined in the [11-20] direction with respect to the c-plane of the SiC monocrystal.

The bottom wall of each gate trench 142 may be formed parallel to the first main surface 103. Obviously, the bottom wall of each gate trench 142 may be formed in a curved shape toward the second main surface 104.

A depth in the normal direction Z of each gate trench 142 may be not less than 0.5 μm and not more than 3.0 μm. The depth of each gate trench 142 may be not less than 0.5 μm and not more than 1.0 μm, not less than 1.0 μm and not more than 1.5 μm, not less than 1.5 μm and not more than 2.0 μm, not less than 2.0 μm and not more than 2.5 μm, or not less than 2.5 μm and not more than 3.0 μm.

A width of each gate trench 142 along the second direction Y may be not less than 0.1 μm and not more than 2 μm. The width of each gate trench 142 may be not less than 0.1 μm and not more than 0.5 μm, not less than 0.5 μm and not more than 1.0 μm, not less than 1.0 μm and not more than 1.5 μm, or not less than 1.5 μm and not more than 2 μm.

Referring to FIG. 22, an opening edge portion 146 of each gate trench 142 includes an inclined portion 147 that is inclined downwardly from the first main surface 103 toward an inner side of each gate trench 142. The opening edge portion 146 of each gate trench 142 is a corner portion connecting the first main surface 103 and the side walls of each gate trench 142.

In this embodiment, the inclined portion 147 is formed in a curved shape recessed toward the SiC semiconductor layer 102 side. The inclined portion 147 may be formed in a curved shape protruding toward the corresponding gate trench 142 side. The inclined portion 147 relaxes concentration of electric field with respect to the opening edge portion 146 of the corresponding gate trench 142.

The SiC semiconductor device 101 includes a gate insulating layer 148 and a gate electrode layer 149 that are formed inside the respective gate trenches 142. In FIG. 19, the gate insulating layers 148 and the gate electrode layers 149 are shown with hatching.

The gate insulating layer 148 includes at least one type of material among silicon oxide ($SiO_2$), silicon nitride (SiN), aluminum oxide ($Al_2O_3$), zirconium oxide ($ZrO_2$), and tantalum oxide ($Ta_2O_3$). The gate insulating layer 148 may have a laminated structure that includes an SiN layer and an $SiO_2$ layer that are laminated in that order from the SiC semiconductor layer 102 side.

The gate insulating layer 148 may have a laminated structure that includes a $SiO_2$ layer and an SiN layer that are laminated in that order from the SiC semiconductor layer 102 side. The gate insulating layer 148 may have a single layer structure constituted of an $SiO_2$ layer or an SiN layer. In this embodiment, the gate insulating layer 148 has a single layer structure constituted of an $SiO_2$ layer.

The gate insulating layer 148 is formed in a film along inner wall surfaces of each gate trench 142 and demarcates a recess space inside the gate trench 142. The gate insulating layer 148 includes first regions **148*a*, second regions 148*b*, and third regions 148*c***.

Each first region **148*a* is formed along the side walls of the corresponding gate trench 142. Each second region 148*b* is formed along the bottom wall of the corresponding gate trench 142. Each third region 148*c* is formed along the first main surface 103. The third region 148*c* of the gate insulating layer 148 forms a portion of the main surface insulating layer 113**.

A thickness Ta of the first region **148*a* is less than a thickness Tb of the second region 148*b* and a thickness Tc of the third region 148*c*. A ratio Tb/Ta of the thickness Tb of the second region 148*b* with respect to the thickness Ta of the first region 148*a* may be not less than 2 and not more than 5. A ratio T3/Ta of the thickness Tc of the third region 148*c* with respect to the thickness Ta of the first region 148*a*** may be not less than 2 and not more than 5.

The thickness Ta of the first region **148*a* may be not less than 0.01 μm and not more than 0.2 μm. The thickness Tb of the second region 148*b* may be not less than 0.05 μm and not more than 0.5 μm. The thickness Tc of the third region 148*c*** may be not less than 0.05 μm and not more than 0.5 μm.

By making the first region **148*a* thin, increase in carriers induced in regions of the body region 141 in vicinities of the side walls of the corresponding gate trench 142 can be suppressed. Increase in channel resistance can thereby be suppressed. By making the second region 148*b* thick, concentration of electric field with respect to the bottom wall of the corresponding gate trench 142** can be relaxed.

By making the third region **148*c* thick, a withstand voltage of the gate insulating layer 148 in a vicinity of the opening edge portion 146 of each gate trench 142 can be improved. Also, by making the third region 148*c* thick, loss of the third region 148*c*** due to an etching method can be suppressed.

The first region **148*a* can thereby be suppressed from being removed by the etching method due to the loss of the third region 148*c***. Consequently, each gate electrode layer

149 can be made to oppose the SiC semiconductor layer 102 (body region 141) appropriately across the corresponding gate insulating layer 148.

The gate insulating layer 148 further includes a bulging portion **148*d* bulging toward an interior of the corresponding gate trench 142 at the opening edge portion 146 of the corresponding gate trench 142. The bulging portion 148*d* is formed at a corner portion connecting the corresponding first region 148*a* and third region 148*c* of the gate insulating layer 148**.

The bulging portion **148*d* bulges curvingly toward the interior of the corresponding gate trench 142. The bulging portion 148*d* narrows an opening of the corresponding gate trench 142 at the opening edge portion 146 of the corresponding gate trench 142**.

The bulging portion **148*d* improves a dielectric withstand voltage of the gate insulating layer 148 at the opening edge portions 146. Obviously, the gate insulating layer 148 not having the bulging portions 148*d* may be formed. Also, the gate insulating layer 148** having a uniform thickness may be formed.

Each gate electrode layer 149 is embedded in the corresponding gate trench 142 across the gate insulating layer 148. More specifically, the gate electrode layer 149 is embedded in the recess space demarcated by the gate insulating layer 148 in the corresponding gate trench 142. The gate electrode layer 149 is controlled by the gate voltage.

The gate electrode layer 149 has an upper end portion positioned at the opening side of the corresponding gate trench 142. The upper end portion of the gate electrode layer 149 is formed in a curved shape recessed toward the bottom wall of the corresponding gate trench 142. The upper end portion of the gate electrode layer 149 has a constricted portion that is constricted along the bulging portion **148*d* of the gate insulating layer 148**.

A cross-sectional area of the gate electrode layer 149 may be not less than 0.05 $\mu m^2$ and not more than 0.5 $\mu m^2$. The cross-sectional area of the gate electrode layer 149 is an area of a section that appears when the gate electrode layer 149 is cut in a direction orthogonal to the direction in which the gate trench 142 extends. The cross-sectional area of the gate electrode layer 149 is defined as a product of a depth of the gate electrode layer 149 and a width of the gate electrode layer 149.

The depth of the gate electrode layer 149 is a distance from the upper end portion to a lower end portion of the gate electrode layer 149. The width of the gate electrode layer 149 is a width of the gate trench 142 at an intermediate position between the upper end portion and the lower end portion of the gate electrode layer 149. If the upper end portion is a curved surface, the position of the upper end portion of the gate electrode layer 149 is deemed to be an intermediate position of the upper end portion of the gate electrode layer 149.

The gate electrode layer 149 includes a p type polysilicon doped with a p type impurity. The p type impurity of the gate electrode layer 149 may include at least one type of material among boron (B), aluminum (Al), indium (In), and gallium (Ga).

A p type impurity concentration of the gate electrode layer 149 is not less than the p type impurity concentration of the body region 141. More specifically, the p type impurity concentration of the gate electrode layer 149 exceeds the p type impurity concentration of the body region 141. The p type impurity concentration of the gate electrode layer 149 may be not less than $1\times10^{18}$ $cm^{-3}$ and not more than $1\times10^{22}$ $cm^{-3}$. A sheet resistance of the gate electrode layer 149 may be not less than 10Ω/□ and not more than 500Ω/□ (approximately 200Ω/□ in this embodiment).

Referring to FIG. 19 and FIG. 21, the SiC semiconductor device 101 includes a gate wiring layer 150 formed in the active region 111. The gate wiring layer 150 is electrically connected to the gate pad 116 and the gate fingers 117 and 118. In FIG. 21, the gate wiring layer 150 is shown with hatching.

The gate wiring layer 150 is formed on the first main surface 103. More specifically, the gate wiring layer 150 is formed on the third regions **148*c* of the gate insulating layer 148. In this embodiment, the gate wiring layer 150 is formed along the outer gate finger 117. More specifically, the gate wiring layer 150 is formed along the three side surfaces 105A, 105B, and 105D of the SiC semiconductor layer 102 such as to demarcate the inner region of the active region 111** from three directions.

The gate wiring layer 150 is connected to the gate electrode layer 149 exposed from the contact trench portion 144 of each gate trench 142. In this embodiment, the gate wiring layer 150 is formed by lead-out portions of the gate electrode layers 149 that are led out from the respective gate trenches 142 onto the first main surface 103. An upper end portion of the gate wiring layer 150 is connected to the upper end portions of the gate electrode layers 149.

Referring to FIG. 19, FIG. 20 and FIG. 22, the SiC semiconductor device 101 includes a plurality of source trenches 155 formed in the first main surface 103 in the active region 111. Each source trench 155 is formed in a region between two mutually adjacent gate trenches 142.

The plurality of source trenches 155 are each formed in a band shape extending along the first direction X (the m-axis direction of the SiC monocrystal). The plurality of source trenches 155 are formed in a stripe shape as a whole in plan view. A pitch in the second direction Y between central portions of source trenches 155 that are mutually adjacent may be not less than 1.5 μm and not more than 3 μm.

Each source trench 155 penetrates through the body region 141 and reaches the SiC epitaxial layer 107. Each source trench 155 includes side walls and a bottom wall. The side walls that form long sides of each source trench 155 are formed by the a-planes of the SiC monocrystal. The side walls that form short sides of each source trench 155 are formed by the m-planes of the SiC monocrystal.

The side walls of each source trench 155 may extend along the normal direction Z. The side walls of each source trench 155 may be formed substantially perpendicular to the first main surface 103. Angles that the side walls of each source trench 155 form with respect to the first main surface 103 inside the SiC semiconductor layer 102 may be not less than 90° and not more than 95° (for example, not less than 91° and not more than 93°). Each source trench 155 may be formed in a tapered shape with an opening area at the bottom wall side being smaller than an opening area at an opening side in sectional view.

The bottom wall of each source trench 155 is positioned inside the SiC epitaxial layer 107. More specifically, the bottom wall of each source trench 155 is positioned at the high concentration region 108 of the SiC epitaxial layer 107. The bottom wall of each source trench 155 is positioned at the second main surface 104 side with respect to the bottom wall of each gate trench 142. The bottom wall of each source trench 155 is positioned at a region between the bottom wall of each gate trench 142 and the low concentration region 109.

The bottom wall of each source trench 155 faces the c-plane of the SiC monocrystal. The bottom wall of each source trench 155 has the off angle θ inclined in the [11-20] direction with respect to the c-plane of the SiC monocrystal. The bottom wall of each source trench 155 may be formed parallel to the first main surface 103. The bottom wall of each source trench 155 may be formed in a curved shape toward the second main surface 104.

In this embodiment, a depth of each source trench 155 is not less than the depth of each gate trench 142. More specifically, the depth of each source trench 155 is greater than the depth of each gate trench 142. The depth of each source trench 155 may be equal to the depth of each gate trench 142.

The depth in the normal direction Z of each source trench 155 may be not less than 0.5 μm and not more than 10 μm (for example, approximately 2 μm). A ratio of the depth of each source trench 155 with respect to the depth of each gate trench 142 may be not less than 1.5. The ratio of the depth of each source trench 155 with respect to the depth of each gate trench 142 is preferably not less than 2.

A first direction width of each source trench 155 may be substantially equal to the first direction width of each gate trench 142. The first direction width of each source trench 155 may be not less than the first direction width of each gate trench 142. The first direction width of each source trench 155 may be not less than 0.1 μm and not more than 2 μm (for example, approximately 0.5 μm).

The SiC semiconductor device 101 includes a source insulating layer 156 and a source electrode layer 157 that are formed inside each source trench 155. In FIG. 19, the source insulating layers 156 and the source electrode layers 157 are shown with hatching.

Each source insulating layer 156 includes at least one type of material among silicon oxide ($SiO_2$), silicon nitride (SiN), aluminum oxide ($Al_2O_3$), zirconium oxide ($Zro_2$), and tantalum oxide ($Ta_2O_3$). The source insulating layer 156 may have a laminated structure that includes an SiN layer and an $SiO_2$ layer that are laminated in that order from the first main surface 103 side.

The source insulating layer 156 may have a laminated structure that includes an $SiO_2$ layer and an SiN layer that are laminated in that order from the first main surface 103 side. The source insulating layer 156 may have a single layer structure constituted of an $SiO_2$ layer or an SiN layer. In this embodiment, the source insulating layer 156 has a single layer structure constituted of an $SiO_2$ layer.

The source insulating layer 156 is formed in a film along inner wall surfaces of the corresponding source trench 155 and demarcates a recess space inside the corresponding source trench 155. The source insulating layer 156 includes a first region **156*a* and a second region 156*b***.

The first region **156*a* is formed along the side walls of the corresponding source trench 155. The second region 156*b* is formed along the bottom wall of the corresponding source trench 155. A thickness Tsa of the first region 156*a* is less than a thickness Tsb of the second region 156*b***.

A ratio Tsb/Tsa of the thickness Tsb of the second region **156*b* with respect to the thickness Tsa of the first region 156*a* may be not less than 2 and not more than 5. The thickness Tsa of the first region 156*a* may be not less than 0.01 μm and not more than 0.2 μm. The thickness Tsb of the second region 156*b*** may be not less than 0.05 μm and not more than 0.5 μm.

The thickness Tsa of the first region **156*a* may be substantially equal to the thickness Ta of the first region 156*a* of the gate insulating layer 148. The thickness Tsb of the second region 156*b* may be substantially equal to the thickness Tb of the second region 156*b* of the gate insulating layer 148. Obviously, a source insulating layer 156** having a uniform thickness may be formed.

Each source electrode layer 157 is embedded in the corresponding source trench 155 across the source insulating layer 156. More specifically, the source electrode layer 157 is embedded in the recess space demarcated by the source insulating layer 156 in the corresponding source trench 155. The source electrode layer 157 is controlled by the source voltage.

The source electrode layer 157 has an upper end portion positioned at an opening side of the corresponding source trench 155. The upper end portion of the source electrode layer 157 is formed at the bottom wall side of the source trench 155 with respect to the first main surface 103. The upper end portion of the source electrode layer 157 may be positioned higher than the first main surface 103.

The upper end portion of the source electrode layer 157 is formed in a concavely curved shape recessed toward the bottom wall of the corresponding source trench 155. The upper end portion of the source electrode layer 157 may be formed parallel to the first main surface 103.

The upper end portion of the source electrode layer 157 may protrude higher than an upper end portion of the source insulating layer 156. The upper end portion of the source electrode layer 157 may be positioned at the bottom wall side of the source trench 155 with respect to the upper end portion of the source insulating layer 156. A thickness of the source electrode layer 157 may be not less than 0.5 μm and not more than 10 μm (for example, approximately 1 μm).

The source electrode layer 157 preferably includes a polysilicon having properties close to SiC in terms of material properties. Stress generated in the SiC semiconductor layer 102 can thereby be reduced. In this embodiment, the source electrode layer 157 includes a p type polysilicon doped with a p type impurity. In this case, the source electrode layer 157 can be formed at the same time as the gate electrode layer 149. The p type impurity of the source electrode layer 157 may include at least one type of material among boron (B), aluminum (Al), indium (In), and gallium (Ga).

A p type impurity concentration of the source electrode layer 157 is not less than the p type impurity concentration of the body region 141. More specifically, the p type impurity concentration of the source electrode layer 157 exceeds the p type impurity concentration of the body region 141. The p type impurity concentration of the source electrode layer 157 may be not less than $1\times10^{18}$ $cm^{-3}$ and not more than $1\times10^{22}$ $cm^{-3}$.

A sheet resistance of the source electrode layer 157 may be not less than 10Ω/□ and not more than 500Ω/□ (approximately 200Ω/□ in this embodiment). The p type impurity concentration of the source electrode layer 157 may be substantially equal to the p type impurity concentration of the gate electrode layer 149. The sheet resistance of the source electrode layer 157 may be substantially equal to the sheet resistance of the gate electrode layer 149.

The source electrode layer 157 may include an n type polysilicon in place of or in addition to the p type polysilicon. The source electrode layer 157 may include at least one type of material among tungsten, aluminum, copper, an aluminum alloy, and a copper alloy in place of or in addition to the p type polysilicon.

The SiC semiconductor device 101 thus has a plurality of trench gate structures 161 and a plurality of trench source structures 162. Each trench gate structure 161 includes the gate trench 142, the gate insulating layer 148, and the gate electrode layer 149. Each trench source structure 162 includes the source trench 155, the source insulating layer 156, and the source electrode layer 157.

The SiC semiconductor device 101 includes n+ type source regions 163 formed in regions of a surface layer portion of the body region 141 along the side walls of each gate trench 142. An n type impurity concentration of the source regions 163 may be not less than $1.0\times10^{18}$ $cm^{-3}$ and not more than $1.0\times10^{21}$ $cm^{-3}$. An n type impurity of the source regions 163 may be phosphorus (P).

A plurality of the source regions 163 are formed along the side wall at one side and the side wall at another side of each gate trench 142. The plurality of source regions 163 are respectively formed in band shapes extending along the first direction X. The plurality of source regions 163 are formed in a stripe shape as a whole in plan view. The respective source regions 163 are exposed from the side walls of the respective gate trenches 142 and the side walls of the respective source trenches 155.

The source regions 163, the body region 141, and the drift region 135 are thus formed in that order from the first main surface 103 toward the second main surface 104 in regions of the surface layer portion of the first main surface 103 along the side walls of the gate trenches 142. The channels of the MISFET are formed in regions of the body region 141 along the side walls of the gate trenches 142. The channels are formed in the regions along the side walls of the gate trenches 142 facing the a-planes of the SiC monocrystal. ON/OFF of the channels is controlled by the gate electrode layers 149.

The SiC semiconductor device 101 includes a plurality of $p^+$ type contact regions 164 formed in the surface layer portion of the first main surface 103 in the active region 111. Each contact region 164 is formed in a region between two mutually adjacent gate trenches 142 in plan view. Each contact region 164 is formed in a region opposite the corresponding gate trench 142 with respect to the corresponding source region 163.

Each contact region 164 is formed along an inner wall of the corresponding source trench 155. In this embodiment, a plurality of contact regions 164 are formed at intervals along the inner walls of each source trench 155. Each contact region 164 is formed at intervals from the corresponding gate trenches 142.

A p type impurity concentration of each contact region 164 is greater than the p type impurity concentration of the body region 141. The p type impurity concentration of each contact region 164 may be not less than $1.0\times10^{18}$ $cm^{-3}$ and not more than $1.0\times10^{21}$ $cm^{-3}$. A p type impurity of each contact region 164 may be aluminum (Al).

Each contact region 164 covers the side walls and the bottom wall of the corresponding source trench 155. A bottom portion of each contact region 164 may be formed parallel to the bottom wall of the corresponding source trench 155. More specifically, each contact region 164 integrally includes a first surface layer region 164*a*, a second surface layer region 164*b*, and an inner wall region 164*c*.

The first surface layer region 164*a* covers the side wall at one side of the source trench 155 in the surface layer portion of the body region 141. The first surface layer region 164*a* is electrically connected to the body region 141 and the source region 163.

The first surface layer region 164*a* is positioned at a region at the first main surface 103 side with respect to a bottom portion of the source region 163. In this embodiment, the first surface layer region 164*a* has a bottom portion extending in parallel to the first main surface 103. In this embodiment, the bottom portion of the first surface layer region 164*a* is positioned at a region between a bottom portion of the body region 141 and the bottom portion of the source region 163. The bottom portion of the first surface layer region 164*a* may be positioned at a region between the first main surface 103 and the bottom portion of the body region 141.

In this embodiment, the first surface layer region 164*a* is led out from the source trench 155 toward the gate trench 142 adjacent thereto. The first surface layer region 164*a* may extend to an intermediate region between the gate trench 142 and the source trench 155. The first surface layer region 164*a* is formed at an interval toward the source trench 155 side from the gate trench 142.

The second surface layer region 164*b* covers the side wall at the other side of the source trench 155 in the surface layer portion of the body region 141. The second surface layer region 164*b* is electrically connected to the body region 141 and the source region 163. The second surface layer region 164*b* is positioned at a region at the first main surface 103 side with respect to the bottom portion of the source region 163. In this embodiment, the second surface layer region 164*b* has a bottom portion extending in parallel to the first main surface 103.

In this embodiment, the bottom portion of the second surface layer region 164*b* is positioned at a region between the bottom portion of the body region 141 and the bottom portion of the source region 163. The bottom portion of the second surface layer region 164*b* may be positioned at a region between the first main surface 103 and the bottom portion of the body region 141.

In this embodiment, the second surface layer region 164*b* is led out from the side wall at the other side of the source trench 155 toward the gate trench 142 adjacent thereto. The second surface layer region 164*b* may extend to an intermediate region between the source trench 155 and the gate trench 142. The second surface layer region 164*b* is formed at an interval toward the source trench 155 side from the gate trench 142.

The inner wall region 164*c* is positioned at a region at the second main surface 104 side with respect to the first surface layer region 164*a* and the second surface layer region 164*b* (the bottom portion of the source region 163). The inner wall region 164*c* is formed in a region of the SiC semiconductor layer 102 along the inner walls of the source trench 155. The inner wall region 164*c* covers the side walls of the source trench 155.

The inner wall region 164*c* covers a corner portion connecting the side walls and the bottom wall of the source trench 155. The inner wall region 164*c* covers the bottom wall of the source trench 155 from the side walls and via the corner portion of the source trench 155. The bottom portion of the contact region 164 is formed by the inner wall region 164*c*.

The SiC semiconductor device 101 includes a plurality of deep well regions 165 formed in the surface layer portion of the first main surface 103 in the active region 111. Each deep well region 165 is also referred to as a withstand voltage adjustment region (withstand voltage holding region) that adjusts the withstand voltage of the SiC semiconductor layer 102.

Each deep well region 165 is formed in the SiC epitaxial layer 107. More specifically, each deep well region 165 is formed in the high concentration region 108 of the SiC epitaxial layer 107.

Each deep well region 165 is formed along the inner walls of the corresponding source trench 155 such as to cover the corresponding contact regions 164. Each deep well region 165 is electrically connected to the corresponding contact regions 164. Each deep well region 165 is formed in a band shape extending along the corresponding source trench 155 in plan view. Each deep well region 165 covers the side walls of the corresponding source trench 155.

Each deep well region 165 covers the corner portion connecting the side walls and the bottom wall of the corresponding source trench 155. Each deep well region 165 covers the bottom wall of the corresponding source trench 155 from the side walls and via the corner portion of the corresponding source trench 155. Each deep well region 165 is continuous to the body region 141 at the side walls of the corresponding source trench 155.

Each deep well region 165 has a bottom portion positioned at the second main surface 104 side with respect to the bottom wall of the corresponding gate trench 142. The bottom portion of each deep well region 165 may be formed parallel to the bottom wall of the corresponding source trench 155.

A p type impurity concentration of each deep well region 165 may be substantially equal to the p type impurity concentration of the body region 141. The p type impurity concentration of each deep well region 165 may exceed the p type impurity concentration of the body region 141. The p type impurity concentration of each deep well region 165 may be less than the p type impurity concentration of the body region 141.

The p type impurity concentration of each deep well region 165 may be not more than the p type impurity concentration of the contact regions 164. The p type impurity concentration of each deep well region 165 may be less than the p type impurity concentration of the contact regions 164. The p type impurity concentration of each deep well region 165 may be not less than $1.0\times10^{17}$ $cm^{-3}$ and not more than $1.0\times10^{19}$ $cm^{-3}$.

Each deep well region 165 forms a pn junction portion with the SiC semiconductor layer 102 (the high concentration region 108 of the SiC epitaxial layer 107). From the pn junction portion, a depletion layer spreads toward a region between the plurality of gate trenches 142 that are mutually adjacent. The depletion layer spreads toward a region at the second main surface 104 side with respect to the bottom wall of each gate trench 142.

The depletion layer spreading from each deep well region 165 may overlap with the bottom walls of the corresponding gate trenches 142. The depletion layer spreading from the bottom portion of each deep well region 165 may overlap with the bottom walls of the corresponding gate trenches 142.

Referring to FIG. 19 and FIG. 21, the SiC semiconductor device 101 includes a p type peripheral edge deep well region 166 formed in a peripheral edge portion of the active region 111. The peripheral edge deep well region 166 is formed in the SiC epitaxial layer 107. More specifically, the peripheral edge deep well region 166 is formed in the high concentration region 108 of the SiC epitaxial layer 107.

The peripheral edge deep well region 166 is electrically connected to the respective deep well regions 165. The peripheral edge deep well region 166 forms an equal potential with the respective deep well regions 165. In this embodiment, the peripheral edge deep well region 166 is formed integral to the respective deep well regions 165.

More specifically, in the peripheral edge portion of the active region 111, the peripheral edge deep well region 166 is formed in regions along the inner wall of the contact trench portions 144 of the respective gate trenches 142. The peripheral edge deep well region 166 covers the side walls of the contact trench portions 144 of the respective gate trenches 142. The peripheral edge deep well region 166 covers corner portions connecting the side walls and the bottom walls of the respective contact trench portions 144.

The peripheral edge deep well region 166 covers the bottom walls of the respective contact trench portions 144 from the side walls and via the corner portions of the respective contact trench portions 144. The respective deep well regions 165 are continuous to the body region 141 at the side walls of the corresponding contact trench portions 144. A bottom portion of the peripheral edge deep well region 166 is positioned at the second main surface 104 side with respect to the bottom walls of the respective contact trench portions 144.

The peripheral edge deep well region 166 overlaps with the gate wiring layer 150 in plan view. The peripheral edge deep well region 166 opposes the gate wiring layer 150 across the gate insulating layer 148 (the third regions 148*c*).

The peripheral edge deep well region 166 includes lead-out portions 166*a* led out to the respective active trench portions 143 from the corresponding contact trench portions 144. The lead-out portions 166*a* are formed in the high concentration region 108 of the SiC epitaxial layer 107. Each lead-out portion 166*a* extends along the side walls of the corresponding active trench portion 143 and covers the bottom wall of the active trench portion 143 through a corner portion.

The lead-out portion 166*a* covers the side walls of the corresponding active trench portion 143. The lead-out portion 166*a* covers the corner portion connecting the side walls and the bottom wall of the corresponding active trench portion 143. The lead-out portion 166*a* covers the bottom wall of the corresponding active trench portion 143 from the side walls and via the corner portion of the corresponding active trench portion 143. The lead-out portion 166*a* is continuous to the body region 141 at the side walls of the corresponding active trench portion 143. A bottom portion of the lead-out portion 166*a* is positioned at the second main surface 104 side with respect to the bottom wall of the corresponding active trench portion 143.

A p type impurity concentration of the peripheral edge deep well region 166 may be substantially equal to the p type impurity concentration of the body region 141. The p type impurity concentration of the peripheral edge deep well region 166 may exceed the p type impurity concentration of the body region 141. The p type impurity concentration of the peripheral edge deep well region 166 may be less than the p type impurity concentration of the body region 141.

The p type impurity concentration of the peripheral edge deep well region 166 may be substantially equal to the p type impurity concentration of each deep well region 165. The p type impurity concentration of the peripheral edge deep well region 166 may exceed the p type impurity concentration of each deep well region 165. The p type impurity concentration of the peripheral edge deep well region 166 may be less than the p type impurity concentration of each deep well region 165.

The p type impurity concentration of the peripheral edge deep well region 166 may be not more than the p type impurity concentration of the contact regions 164. The p type impurity concentration of the peripheral edge deep well region 166 may be less than the p type impurity concentration of the contact regions 164. The p type impurity concentration of the peripheral edge deep well region 166 may be not less than $1.0\times10^{17}$ $cm^{-3}$ and not more than $1.0\times10^{19}$ $cm^{-3}$.

With an SiC semiconductor device that includes just a pn junction diode, due to the structure being free from trenches, a problem of concentration of electric field inside the SiC semiconductor layer 102 rarely occurs. The respective deep well regions 165 (the peripheral edge deep well region 166) make the trench gate type MISFET approach the structure of a pn junction diode. The electric field inside the SiC semiconductor layer 102 can thereby be relaxed in the trench gate type MISFET. Narrowing a pitch between the plurality of mutually adjacent deep well regions 165 is thus effective in terms of relaxing the concentration of electric field.

Also, with the respective deep well regions 165 having the bottom portions at the second main surface 104 side with respect to the bottom walls of the corresponding gate trenches 142, concentration of electric field with respect to the corresponding gate trenches 142 can be relaxed appropriately by the depletion layers. Preferably, distances between the bottom portions of the plurality of deep well regions 165 and the second main surface 104 are substantially equal.

Occurrence of variation in the distances between the bottom portions of the plurality of deep well regions 165 and the second main surface 104 can thereby be suppressed. The withstand voltage (for example, an electrostatic breakdown strength) of the SiC semiconductor layer 102 can thus be suppressed from being restricted by a configuration of the respective deep well regions 165 and therefore improvement of the withstand voltage can be achieved appropriately.

By forming the source trenches 155, the p type impurity can be introduced into the inner walls of the source trenches 155. The respective deep well regions 165 can thereby be formed conformally to the source trenches 155 and occurrence of variation in the depths of the respective deep well regions 165 can thus be suppressed appropriately. Also, by using the respective source trenches 155, the corresponding deep well regions 165 can be formed appropriately in comparatively deep regions of the SiC semiconductor layer 102.

In this embodiment, the high concentration region 108 of the SiC epitaxial layer 107 is interposed in regions between the plurality of mutually adjacent deep well regions 165. JFET (junction field effect transistor) resistance can thereby be reduced in the regions between the plurality of mutually adjacent deep well regions 165.

Further, in this embodiment, the bottom portions of the respective deep well regions 165 are positioned inside the high concentration region 108 of the SiC epitaxial layer 107. Current paths can thereby be expanded in lateral direction parallel to the first main surface 103 from the bottom portions of the respective deep well regions 165. Current spread resistance can thereby be reduced. The low concentration region 109 of the SiC epitaxial layer 107 increases the withstand voltage of the SiC semiconductor layer 102 in such a structure.

Referring to FIG. 22, the SiC semiconductor device 101 includes a low resistance electrode layer 167 formed on the gate electrode layers 149. Inside the respective gate trenches 142, the low resistance electrode layer 167 covers the upper end portions of the gate electrode layers 149. The low resistance electrode layer 167 includes a conductive material having a sheet resistance less than the sheet resistance of the gate electrode layers 149. The sheet resistance of the low resistance electrode layer 167 may be not less than 0.01Ω/□ and not more than 10Ω/□.

The low resistance electrode layer 167 is formed in a film. The low resistance electrode layer 167 has connection portions **167*a* in contact with the upper end portions of the gate electrode layers 149 and non-connection portions 167*b* opposite thereof. The connection portions 167*a* and the non-connection portions 167*b* of the low resistance electrode layer 167 may be formed in curved shapes conforming to the upper end portions of the gate electrode layers 149. The connection portions 167*a* and the non-connection portions 167*b* of the low resistance electrode layer 167** may take on any of various configurations.

An entirety of each connection portion **167*a* may be positioned higher than the first main surface 103. The entirety of the connection portion 167*a* may be positioned lower than the first main surface 103. The connection portion 167*a* may include a portion positioned higher than the first main surface 103. The connection portion 167*a* may include a portion positioned lower than the first main surface 103. For example, a central portion of the connection portion 167*a* may be positioned lower than the first main surface 103 and a peripheral edge portion of the connection portion 167*a* may be positioned higher than the first main surface 103**.

An entirety of each non-connection portion **167*b* may be positioned higher than the first main surface 103. The entirety of the non-connection portion 167*b* may be positioned lower than the first main surface 103. The non-connection portion 167*b* may include a portion positioned higher than the first main surface 103. The non-connection portion 167*b* may include a portion positioned lower than the first main surface 103. For example, a central portion of the non-connection portion 167*b* may be positioned lower than the first main surface 103 and a peripheral edge portion of the non-connection portion 167*b* may be positioned higher than the first main surface 103**.

The low resistance electrode layer 167 has edge portions **167*c* contacting the gate insulating layer 148. Each edge portion 167*c* contacts a corner portion of the gate insulating layer 148 connecting the corresponding first region 148*a* and the corresponding second region 148*b*. The edge portion 167*c* contacts the corresponding third region 148*c* of the gate insulating layer 148. More specifically, the edge portion 167*c* contacts the corresponding bulging portion 148*d* of the gate insulating layer 148**.

The edge portion **167*c* is formed in a region at the first main surface 103 side with respect to the bottom portions of the source regions 163. The edge portion 167*c* is formed in a region further to the first main surface 103 side than boundary regions between the body region 141 and the source regions 163. The edge portion 167*c* thus opposes the source regions 163 across the gate insulating layer 148. The edge portion 167*c* does not oppose the body region 141 across the gate insulating layer 148**.

Forming of a current path in a region of the gate insulating layer 148 between the low resistance electrode layer 167 and the body region 141 can thereby be suppressed. The current path may be formed by undesired diffusion of an electrode material of the low resistance electrode layer 167 into the gate insulating layer 148. In particular, a design where the edge portion **167*c* is connected to the comparatively thick third region 148*c* of the gate insulating layer 148 (the corner portion of the gate insulating layer 148**) is effective for reducing the risk of forming the current path.

In the normal direction Z, a thickness Tr of the low resistance electrode layer 167 is not more than a thickness TG of the gate electrode layer 149 (Tr≤TG). The thickness Tr of the low resistance electrode layer 167 is preferably less than the thickness TG of the gate electrode layer 149

(Tr<TG). More specifically, the thickness Tr of the low resistance electrode layer 167 is not more than one-half the thickness TG of the gate electrode layer 149 (Tr≤TG/2).

A ratio Tr/TG of the thickness Tr of the low resistance electrode layer 167 with respect to the thickness TG of the gate electrode layer 149 is not less than 0.01 and not more than 1. The thickness TG of the gate electrode layer 149 may be not less than 0.5 μm and not more than 3 μm. The thickness Tr of the low resistance electrode layer 167 may be not less than 0.01 μm and not more than 3 μm.

A current supplied into the respective gate trenches 142 flows through the low resistance electrode layer 167 having the comparatively low sheet resistance and is transmitted to entireties of the gate electrode layers 149. The entireties of the gate electrode layers 149 (an entire area of the active region 111) can thereby be made to transition rapidly from an off state to an on state and therefore delay of switching response can be suppressed.

In particular, although time is required for transmission of current in a case of the gate trenches 142 having a length of the millimeter order (a length not less than 1 mm), the delay of the switching response can be suppressed appropriately by the low resistance electrode layer 167. That is, the low resistance electrode layer 167 is formed in a current diffusing electrode layer that diffuses the current into the corresponding gate trench 142.

Also, as refinement of cell structure progresses, the width, depth, cross-sectional area, etc., of the gate electrode layer 149 decreases and there is thus concern for the delay of the switching response due to increase of electrical resistance inside each gate trench 142. In this respect, according to the low resistance electrode layer 167, the entireties of the gate electrode layers 149 can be made to transition rapidly from the off state to the on state and therefore the delay of the switching response due to refinement can be suppressed appropriately.

Referring to FIG. 21, in this embodiment, the low resistance electrode layer 167 also covers the upper end portion of the gate wiring layer 150. A portion of the low resistance electrode layer 167 that covers the upper end portion of the gate wiring layer 150 is formed integral to portions of the low resistance electrode layer 167 covering the upper end portions of the gate electrode layers 149. The low resistance electrode layer 167 thereby covers entire areas of the gate electrode layers 149 and an entire area of the gate wiring layer 150.

A current supplied from the gate pad 116 and the gate fingers 117 and 118 to the gate wiring layer 150 is thus transmitted via the low resistance electrode layer 167 having the comparatively low sheet resistance to the entireties of the gate electrode layers 149 and the gate wiring layer 150.

The entireties of the gate electrode layers 149 (the entire area of the active region 111) can thereby be made to transition rapidly from the off state to the on state via the gate wiring layer 150 and therefore the delay of the switching response can be suppressed. In particular, in the case of the gate trenches 142 having the length of the millimeter order, the delay of the switching response can be suppressed appropriately by the low resistance electrode layer 167 covering the upper end portion of the gate wiring layer 150.

The low resistance electrode layer 167 includes a polycide layer. The polycide layer is formed by portions forming surface layer portions of the gate electrode layers 149 being silicided by a metal material. More specifically, the polycide layer is constituted of a p type polycide layer that includes the p type impurity doped in the gate electrode layers 149 (p type polysilicon). The polycide layer preferably has a specific resistance of not less than 10 μΩ·cm and not more than 110 μΩ·cm.

A sheet resistance inside the gate trench 142 embedded with the gate electrode layers 149 and the low resistance electrode layer 167 is not more than a sheet resistance of the gate electrode layers 149 alone. The sheet resistance inside the gate trench 142 is preferably not more than a sheet resistance of an n type polysilicon doped with an n type impurity.

The sheet resistance inside the gate trench 142 is approximated by the sheet resistance of the low resistance electrode layer 167. That is, the sheet resistance inside the gate trench 142 may be not less than 0.01Ω/□ and not more than 10Ω/□. The sheet resistance inside the gate trench 142 is preferably less than 10Ω/□.

The low resistance electrode layer 167 may include at least one type of material among TiSi, $TiSi_2$, NiSi, CoSi, $CoSi_2$, $MoSi_2$, and $WSi_2$. Among these types of materials, NiSi, $CoSi_2$, and $TiSi_2$ are especially suitable as the polycide layer forming the low resistance electrode layer 167 due to being comparatively low in specific resistance value and temperature dependence.

The SiC semiconductor device 101 includes source sub-trenches 168 formed in regions of the first main surface 103 along the upper end portions of the source electrode layers 157 such as to be in communication with the corresponding source trenches 155. Each source sub-trench 168 forms a portion of the side walls of the corresponding source trench 155.

In this embodiment, the source sub-trench 168 is formed in an endless shape (a quadrilateral annular shape in this embodiment) surrounding the upper end portion of the source electrode layer 157 in plan view. The source sub-trench 168 borders the upper end portion of the source electrode layer 157.

The source sub-trench 168 is formed by digging into a portion of the source insulating layer 156. More specifically, the source sub-trench 168 is formed by digging into the upper end portion of the source insulating layer 156 and the upper end portion of the source electrode layer 157 from the first main surface 103.

The upper end portion of the source electrode layer 157 has a shape that is inwardly constricted with respect to a lower end portion of the source electrode layer 157. The lower end portion of the source electrode layer 157 is a portion of the source electrode layer 157 that is positioned at the bottom wall side of the corresponding source trench 155. A first direction width of the upper end portion of the source electrode layer 157 may be less than a first direction width of the lower end portion of the source electrode layer 157.

The source sub-trench 168 is formed, in sectional view, to a convergent shape with a bottom area being less than an opening area. A bottom wall of the source sub-trench 168 may be formed in a curved shape toward the second main surface 104.

An Inner wall of the source sub-trench 168 exposes the source region 163, the contact region 164, the source insulating layer 156, and the source electrode layer 157. The inner wall of the source sub-trench 168 exposes the first surface layer region **164*a* and the second surface layer region 164*b* of the contact region 164. The bottom wall of the source sub-trench 168 exposes at least the first region 156*a* of the source insulating layer 156. An upper end portion of the first region 156*a* of the source insulating layer 156 is positioned lower than the first main surface 103**.

An opening edge portion 169 of each source trench 155 includes an inclined portion 170 that inclines downwardly from the first main surface 103 toward an inner side of the source trench 155. The opening edge portion 169 of each source trench 155 is a corner portion connecting the first main surface 103 and the side walls of the source trench 155. The inclined portion 170 of each source trench 155 is formed by the source sub-trench 168.

In this embodiment, the inclined portion 170 is formed in a curved shape recessed toward the SiC semiconductor layer 102 side. The inclined portion 170 may be formed in a curved shape protruding toward the source sub-trench 168 side. The inclined portion 170 relaxes concentration of electric field with respect to the opening edge portion 169 of the corresponding source trench 155.

Referring to FIG. 23 and FIG. 24, the active region 111 has an active main surface 171 forming a portion of the first main surface 103. The outer region 112 has an outer main surface 172 forming a portion of the first main surface 103. In this embodiment, the outer main surface 172 is connected to the side surfaces 105A to 105D of the SiC semiconductor layer 102.

The active main surface 171 and the outer main surface 172 respectively face the c-plane of the SiC monocrystal. Also, active main surface 171 and the outer main surface 172 respectively each have the off angle θ inclined in the [11-20] direction with respect to the c-planes of the SiC monocrystal.

The outer main surface 172 is positioned at the second main surface 104 side with respect to the active main surface 171. In this embodiment, the outer region 112 is formed by digging into the first main surface 103 toward the second main surface 104 side. The outer main surface 172 is thus formed in a region that is recessed toward the second main surface 104 side with respect to the active main surface 171.

The outer main surface 172 may be positioned at the second main surface 104 side with respect to the bottom walls of the respective gate trenches 142. The outer main surface 172 may be formed at a depth position substantially equal to the bottom walls of the respective source trenches 155. The outer main surface 172 may be positioned on substantially the same plane as the bottom walls of the respective source trenches 155.

A distance between the outer main surface 172 and the second main surface 104 may be substantially equal to distances between the bottom walls of the respective source trenches 155 and the second main surface 104. The outer main surface 172 may be positioned at the second main surface 104 side with respect to the bottom walls of the respective source trenches 155. The outer main surface 172 may be positioned at a range of not less than 0 μm and not more than 1 μm to the second main surface 104 side with respect to the bottom walls of the respective source trenches 155.

The outer main surface 172 exposes the SiC epitaxial layer 107. More specifically, the outer main surface 172 exposes the high concentration region 108 of the SiC epitaxial layer 107. The outer main surface 172 thereby opposes the low concentration region 109 across the high concentration region 108.

In this embodiment, the active region 111 is demarcated as a mesa by the outer region 112. That is, the active region 111 is formed as an active mesa 173 of mesa shape protruding further upward than the outer region 112.

The active mesa 173 includes active side walls 174 connecting the active main surface 171 and the outer main surface 172. The active side walls 174 demarcate a boundary region between the active region 111 and the outer region 112. The first main surface 103 is formed by the active main surface 171, the outer main surface 172, and the active side walls 174.

In this embodiment, the active side walls 174 extend along the normal direction Z to the active main surface 171 (outer main surface 172). The active side walls 174 are formed by the m-planes and the a-planes of the SiC monocrystal.

The active side walls 174 may have inclined surfaces inclined downwardly from the active main surface 171 toward the outer main surface 172. An inclination angle of each active side wall 174 is an angle that the active side wall 174 forms with the active main surface 171 inside the SiC semiconductor layer 102.

In this case, the inclination angle of the active side wall 174 may exceed 90° and be not more than 135°. The inclination angle of the active side wall 174 may exceed 90° and be not more than 95°, be not less than 95° and not more than 100°, be not less than 100° and not more than 110°, be not less than 110° and not more than 120°, or be not less than 120° and be not more than 135°. The inclination angle of the active side wall 174 preferably exceeds 90° and is not more than 95°.

The active side walls 174 expose the SiC epitaxial layer 107. More specifically, the active side walls 174 expose the high concentration region 108. In a region at the active main surface 171 side, the active side walls 174 expose at least the body region 141. In FIG. 23 and FIG. 24, a configuration example where the active side walls 174 expose the body region 141 and the source regions 163 is shown.

The SiC semiconductor device 101 includes a $p^+$ type diode region 181 (impurity region) formed in a surface layer portion of the outer main surface 172. Also, the SiC semiconductor device 101 includes a p type outer deep well region 182 formed in the surface layer portion of the outer main surface 172. Also, the SiC semiconductor device 101 includes a p type field limit structure 183 formed in the surface layer portion of the outer main surface 172.

The diode region 181 is formed in a region of the outer region 112 between the active side walls 174 and the side surfaces 105A to 105D. The diode region 181 is formed at intervals from the active side walls 174 and the side surfaces 105A to 105D.

The diode region 181 extends in a band shape along the active region 111 in plan view. In this embodiment, the diode region 181 is formed in an endless shape (a quadrilateral annular shape in this embodiment) surrounding the active region 111 in plan view. The diode region 181 overlaps with the source routing wiring 123 in plan view. The diode region 181 is electrically connected to the source routing wiring 123. The diode region 181 forms a portion of the avalanche current absorbing structure.

The diode region 181 forms a pn junction portion with the SiC semiconductor layer 102. More specifically, the diode region 181 is positioned inside the SiC epitaxial layer 107. The diode region 181 thus forms the pn junction portion with the SiC epitaxial layer 107.

Even more specifically, the diode region 181 is positioned inside the high concentration region 108. The diode region 181 thus forms the pn junction portion with the high concentration region 108. A pn junction diode Dpn, having the diode region 181 as an anode and the SiC semiconductor layer 102 as a cathode, is thereby formed.

An entirety of the diode region 181 is positioned at the second main surface 104 side with respect to the bottom walls of the respective gate trenches 142. A bottom portion of the diode region 181 is positioned at the second main surface 104 side with respect to the bottom walls of the respective source trenches 155. The bottom portion of the diode region 181 may be formed at a depth position substantially equal to the bottom portions of the contact regions 164. The bottom portion of the diode region 181 may be positioned on substantially the same plane as the bottom portions of the contact regions 164.

A p type impurity concentration of the diode region 181 is substantially equal to the p type impurity concentration of the contact regions 164. The p type impurity concentration of the diode region 181 is greater than the p type impurity concentration of the body region 141. The p type impurity concentration of the diode region 181 may be not less than $1.0\times10^{18}$ $cm^{-3}$ and not more than $1.0\times10^{21}$ $cm^{-3}$.

The outer deep well region 182 is formed in a region between the active side walls 174 and the diode region 181 in plan view. In this embodiment, the outer deep well region 182 is formed at intervals toward the diode region 181 side from the active side walls 174. The outer deep well region 182 is also referred to as a withstand voltage adjustment region (withstand voltage holding region) that adjusts the withstand voltage of the SiC semiconductor layer 102.

The outer deep well region 182 extends in a band shape along the active region 111 in plan view. In this embodiment, the outer deep well region 182 is formed in an endless shape (a quadrilateral annular shape in this embodiment) surrounding the active region 111 in plan view. The outer deep well region 182 is electrically connected to the source routing wiring 123 via the diode region 181. The outer deep well region 182 may form a portion of the pn junction diode Dpn. The outer deep well region 182 may form a portion of the avalanche current absorbing structure.

An entirety of the outer deep well region 182 is positioned at the second main surface 104 side with respect to the bottom walls of the respective gate trenches 142. A bottom portion of the outer deep well region 182 is positioned at the second main surface 104 side with respect to the bottom walls of the respective source trenches 155. The bottom portion of the outer deep well region 182 is positioned at the second main surface 104 side with respect to the bottom portion of the diode region 181.

The bottom portion of the outer deep well region 182 may be formed at a depth position substantially equal to the bottom portions of the respective deep well regions 165. The bottom portion of the outer deep well region 182 may be positioned on substantially the same plane as the bottom portions of the respective deep well regions 165. A distance between the bottom portion of the outer deep well region 182 and the outer main surface 172 may be substantially equal to distances between the bottom portions of the respective deep well regions 165 and the bottom walls of the respective source trenches 155.

A distance between the bottom portion of the outer deep well region 182 and the second main surface 104 may be substantially equal to the distances between the bottom portions of the respective deep well regions 165 and the second main surface 104. Variation can thereby be suppressed from occurring between the distance between the bottom portion of the outer deep well region 182 and the second main surface 104 and the distances between the bottom portions of the respective deep well regions 165 and the second main surface 104.

The withstand voltage (for example, the electrostatic breakdown strength) of the SiC semiconductor layer 102 can thus be suppressed from being restricted by the configuration of the outer deep well region 182 and the configuration of the respective deep well regions 165 and therefore improvement of the withstand voltage can be achieved appropriately.

The bottom portion of the outer deep well region 182 may be positioned at the second main surface 104 side with respect to the bottom portions of the respective deep well regions 165. The bottom portion of the outer deep well region 182 may be positioned at a range of not less than 0 μm and not more than 1 μm to the second main surface 104 side with respect to the bottom portions of the respective deep well regions 165.

An inner peripheral edge of the outer deep well region 182 may extend to the vicinity of the boundary region between the active region 111 and the outer region 112. The outer deep well region 182 may cross the boundary region between the active region 111 and the outer region 112. The inner peripheral edge of the outer deep well region 182 may cover corner portions connecting the active side walls 174 and the outer main surface 172. The inner peripheral edge of the outer deep well region 182 may extend further along the active side walls 174 and be connected to the body region 141.

In this embodiment, an outer peripheral edge of the outer deep well region 182 covers the diode region 181 from the second main surface 104 side. The outer deep well region 182 may overlap with the source routing wiring 123 in plan view. The outer peripheral edge of the outer deep well region 182 may be formed at intervals toward the active side wall 174 sides from the diode region 181.

A p type impurity concentration of the outer deep well region 182 may be not more than the p type impurity concentration of the diode region 181. The p type impurity concentration of the outer deep well region 182 may be less than the p type impurity concentration of the diode region 181.

The p type impurity concentration of the outer deep well region 182 may be substantially equal to the p type impurity concentration of each deep well region 165. The p type impurity concentration of the outer deep well region 182 may be substantially equal to the p type impurity concentration of the body region 141.

The p type impurity concentration of the outer deep well region 182 may exceed the p type impurity concentration of the body region 141. The p type impurity concentration of the outer deep well region 182 may be less than the p type impurity concentration of the body region 141.

The p type impurity concentration of the outer deep well region 182 may be not more than the p type impurity concentration of each contact region 164. The p type impurity concentration of the outer deep well region 182 may be less than the p type impurity concentration of each contact region 164. The p type impurity concentration of the outer deep well region 182 may be not less than $1.0\times10^{17}$ $cm^{-3}$ and not more than $1.0\times10^{19}$ $cm^{-3}$.

The field limit structure 183 is formed in a region between the diode region 181 and the side surfaces 105A to 105D in plan view. In this embodiment, the field limit structure 183 is formed at intervals toward the diode region 181 side from the side surfaces 105A to 105D.

The field limit structure 183 includes one or a plurality of (for example, not less than two and not more than twenty) field limit regions 184. In this embodiment, the field limit structure 183 includes a field limit region group having a plurality of (five) field limit regions 184A, 184B, 184C, 184D, and 184E. The field limit regions 184A to 184E are formed in that order at intervals along a direction away from the diode region 181.

The field limit regions 184A to 184E respectively extend in band shapes along the peripheral edge of the active region 111 in plan view. More specifically, the field limit regions 184A to 184E are respectively formed in endless shapes (quadrilateral annular shapes in this embodiment) surrounding the active region 111 in plan view. Each of the field limit regions 184A to 184E is also referred to as an FLR (field limiting ring) region.

In this embodiment, bottom portions of the field limit regions 184A to 184E are positioned at the second main surface 104 side with respect to the bottom portion of the diode region 181. In this embodiment, the field limit region 184A at an innermost side among the field limit regions 184A to 184E covers the diode region 181 from the second main surface 104 side. The field limit region 184A may be overlapped in plan view with the source routing wiring 123 described above.

The field limit region 184A is electrically connected to the source routing wiring 123 via the diode region 181. The field limit region 184A may form a portion of the pn junction diode Dpn. The field limit region 184A may form a portion of the avalanche current absorbing structure.

Entireties of the field limit regions 184A to 184E are positioned at the second main surface 104 side with respect to the bottom walls of the respective gate trenches 142. The bottom portions of the field limit regions 184A to 184E are positioned at the second main surface 104 side with respect to the bottom walls of the respective source trenches 155.

The field limit regions 184A to 184E may be formed at a depth position substantially equal to the respective deep well regions 165 (the outer deep well region 182). The bottom portions of the field limit regions 184A to 184E may be positioned on substantially the same plane as the bottom portions of the respective deep well regions 165 (the outer deep well region 182).

The bottom portions of the field limit regions 184A to 184E may be positioned at the outer main surface 172 side with respect to the bottom portions of the respective deep well regions 165 (the outer deep well region 182). The bottom portions of the field limit regions 184A to 184E may be positioned at the second main surface 104 side with respect to the bottom portions of the respective deep well regions 165 (the outer deep well region 182).

Widths between mutually adjacent field limit regions 184A to 184E may differ from each other. The widths between mutually adjacent field limit regions 184A to 184E may increase in a direction away from the active region 111. The widths between mutually adjacent field limit regions 184A to 184E may decrease in the direction away from the active region 111.

Depths of the field limit regions 184A to 184E may differ from each other. The depths of the field limit regions 184A to 184E may decrease in the direction away from the active region 111. The depths of the field limit regions 184A to 184E may increase in the direction away from the active region 111.

A p type impurity concentration of the field limit regions 184A to 184E may be not more than the p type impurity concentration of the diode region 181. The p type impurity concentration of the field limit regions 184A to 184E may be less than the p type impurity concentration of the diode region 181.

The p type impurity concentration of the field limit regions 184A to 184E may be not more than the p type impurity concentration of the outer deep well region 182. The p type impurity concentration of the field limit regions 184A to 184E may be less than the p type impurity concentration of the outer deep well region 182.

The p type impurity concentration of the field limit regions 184A to 184E may be not less than the p type impurity concentration of the outer deep well region 182. The p type impurity concentration of the field limit regions 184A to 184E may be greater than the p type impurity concentration of the outer deep well region 182.

The p type impurity concentration of the field limit regions 184A to 184E may be not less than $1.0\times10^{15}$ $cm^{-3}$ and not more than $1.0\times10^{18}$ $cm^{-3}$. Preferably, the p type impurity concentration of the diode region 181>the p type impurity concentration of the outer deep well region 182>the p type impurity concentration of the field limit regions 184A to 184E.

The field limit structure 183 relaxes concentration of electric field in the outer region 112. The number, widths, depths, p type impurity concentration, etc., of the field limit regions 184 may take on any of various values in accordance with the electric field to be relaxed.

With this embodiment, an example where the field limit structure 183 includes one or a plurality of field limit regions 184 formed in the region between the diode region 181 and the side surfaces 105A to 105D in plan view was described. However, the field limit structure 183 may include one or a plurality of field limit regions 184 formed in the region between the active side walls 174 and the diode region 181 in plan view in place of the region between the diode region 181 and the side surfaces 105A to 105D.

Also, the field limit structure 183 may include one or a plurality of field limit regions 184 formed in the region between the diode region 181 and the side surfaces 105A to 105D in plan view and one or a plurality of field limit regions 184 formed in the region between the active side walls 174 and the diode region 181 in plan view.

The SiC semiconductor device 101 includes an outer insulating layer 191 formed on the first main surface 103 in the outer region 112. The outer insulating layer 191 forms a portion of the main surface insulating layer 113. The outer insulating layer 191 forms portions of the insulating side surfaces 114A to 114D of the main surface insulating layer 113.

The outer insulating layer 191 selectively covers the diode region 181, the outer deep well region 182, and the field limit structure 183 in the outer region 112. The outer insulating layer 191 is formed in a film along the active side walls 174 and the outer main surface 172. On the active main surface 171, the outer insulating layer 191 is continuous to the gate insulating layer 148. More specifically, the outer insulating layer 191 is continuous to the third regions 148*c* of the gate insulating layer 148.

The outer insulating layer 191 may include silicon oxide. The outer insulating layer 191 may include another insulating film of silicon nitride, etc. In this embodiment, the outer insulating layer 191 is formed of the same insulating material type as the gate insulating layer 148.

The outer insulating layer 191 includes a first region 191*a* and a second region 191*b*. The first region 191*a* of the outer insulating layer 191 covers the active side walls 174. The second region 191*b* of the outer insulating layer 191 covers the outer main surface 172.

A thickness of the second region 191*b* of the outer insulating layer 191 may be not more than a thickness of the first region 191*a* of the outer insulating layer 191. The thickness of the second region 191*b* of the outer insulating layer 191 may be less than the thickness of the first region 191*a* of the outer insulating layer 191.

The thickness of the first region 191*a* of the outer insulating layer 191 may be substantially equal to the thickness of the first regions 191*a* of the gate insulating layer 148. The thickness of the second region 191*b* of the outer insulating layer 191 may be substantially equal to the thickness of the third regions 148*c* of the gate insulating layer 148. Obviously, the outer insulating layer 191 having a uniform thickness may be formed.

Referring to FIG. 23 and FIG. 24, the SiC semiconductor device 101 further includes a side wall structure 192 covering the active side walls 174. The side wall structure 192 protects and reinforces the active mesa 173 from the outer region 112 side.

Also, the side wall structure 192 forms a level difference moderating structure that moderates a level difference formed between the active main surface 171 and the outer main surface 172. If an upper layer structure (covering layer) covering the boundary region between the active region 111 and the outer region 112 is formed, the upper layer structure covers the side wall structure 192. The side wall structure 192 improves flatness of the upper layer structure.

The side wall structure 192 may have an inclined portion 193 that inclines downwardly from the active main surface 171 toward the outer main surface 172. The level difference can be moderated appropriately by the inclined portion 193. The inclined portion 193 may be formed in a curved shape recessed toward the SiC semiconductor layer 102 side. The inclined portion 193 may be formed in a curved shape protruding in a direction away from the SiC semiconductor layer 102.

The inclined portion 193 may extend in a plane from the active main surface 171 side toward the outer main surface 172 side. The inclined portion 193 may extend rectilinearly from the active main surface 171 side toward the outer main surface 172 side.

The inclined portion 193 may be formed in a set of stairs descending from the active main surface 171 toward the outer main surface 172. That is, the inclined portion 193 may have one or a plurality of step portions recessed toward the SiC semiconductor layer 102 side. A plurality of step portions increase a surface area of the inclined portion 193 and improve adhesion force with respect to the upper layer structure.

The inclined portion 193 may include a plurality of raised portions raised in the direction away from the SiC semiconductor layer 102. The plurality of raised portions increase the surface area of the inclined portion 193 and improve the adhesion force with respect to the upper layer structure. The inclined portion 193 may include a plurality of recesses recessed toward the SiC semiconductor layer 102 side. The plurality of recesses increase the surface area of the inclined portion 193 and improve the adhesion force with respect to the upper layer structure.

The side wall structure 192 is formed self-aligningly with respect to the active main surface 171. More specifically, the side wall structure 192 is formed along the active side walls 174. In this embodiment, the side wall structure 192 is formed in an endless shape (a quadrilateral annular shape in this embodiment) surrounding the active region 111 in plan view.

The side wall structure 192 preferably includes a p type polysilicon doped with a p type impurity. In this case, the side wall structure 192 can be formed at the same time as the gate electrode layers 149 and the source electrode layers 157.

A p type impurity concentration of the side wall structure 192 is not less than the p type impurity concentration of the body region 141. More specifically, the p type impurity concentration of the side wall structure 192 is greater than the p type impurity concentration of the body region 141. The p type impurity of the side wall structure 192 may include at least one type of material among boron (B), aluminum (Al), indium (In), and gallium (Ga).

The p type impurity concentration of the side wall structure 192 may be not less than $1\times10^{18}$ cm$^{-3}$ and not more than $1\times10^{22}$ cm$^{-3}$. A sheet resistance of the side wall structure 192 may be not less than 10Ω/□ and not more than 500Ω/□ (approximately 200Ω/□ in this embodiment). The p type impurity concentration of the side wall structure 192 may be substantially equal to the p type impurity concentration of the gate electrode layers 149. The sheet resistance of the side wall structure 192 may be substantially equal to the sheet resistance of the gate electrode layers 149.

The side wall structure 192 may include an n type polysilicon in place of or in addition to the p type polysilicon. The side wall structure 192 may include at least one type of material among tungsten, aluminum, copper, an aluminum alloy, and a copper alloy in place of or in addition to the p type polysilicon. The side wall structure 192 may include an insulating material. In this case, an insulating property of the active region 111 with respect to the outer region 112 can be improved by the side wall structure 192.

Referring to FIG. 20 to FIG. 24, the SiC semiconductor device 101 includes an interlayer insulating layer 201 formed on the first main surface 103. The interlayer insulating layer 201 forms a portion of the main surface insulating layer 113. The interlayer insulating layer 201 forms portions of the insulating side surfaces 114A to 114D of the main surface insulating layer 113. That is, the main surface insulating layer 113 has a laminated structure that includes the gate insulating layer 148 (outer insulating layer 191) and the interlayer insulating layer 201.

The interlayer insulating layer 201 selectively covers the active region 111 and the outer region 112. More specifically, the interlayer insulating layer 201 selectively covers the third regions 148*c* of the gate insulating layer 148 and the outer insulating layer 191.

The interlayer insulating layer 201 is formed in a film along the active main surface 171 and the outer main surface 172. In the active region 111, the interlayer insulating layer 201 selectively covers the trench gate structures 161, the gate wiring layer 150, and the trench source structures 162. In the outer region 112, the interlayer insulating layer 201 selectively covers the diode region 181, the outer deep well region 182, and the field limit structure 183.

In the boundary region between the active region 111 and the outer region 112, the interlayer insulating layer 201 is formed along an outer surface (inclined portion 193) of the side wall structure 192. The interlayer insulating layer 201 forms a portion of the upper layer structure that covers the side wall structure 192.

The interlayer insulating layer 201 may include silicon oxide or silicon nitride. The interlayer insulating layer 201 may include PSG (phosphor silicate glass) and/or BPSG (boron phosphor silicate glass) as an example of silicon oxide. The interlayer insulating layer 201 may have a laminated structure including a PSG layer and a BPSG layer laminated in that order from the first main surface 103 side. The interlayer insulating layer 201 may have a laminated structure including a BPSG layer and a PSG layer laminated in that order from the first main surface 103 side.

The interlayer insulating layer 201 includes a gate contact hole 202, source contact holes 203, and a diode contact hole 204. The interlayer insulating layer 201 also includes an anchor hole 205.

The gate contact hole 202 exposes the gate wiring layer 150 in the active region 111. The gate contact hole 202 may be formed in a band shape oriented along the gate wiring layer 150. An opening edge portion of the gate contact hole 202 is formed in a curved shape toward the gate contact hole 202 side.

The source contact holes 203 expose the source regions 163, the contact regions 164, and the trench source structures 162 in the active region 111. The source contact holes 203 may be formed in band shapes oriented along the trench source structures 162, etc. An opening edge portion of each source contact hole 203 is formed in a curved shape toward the source contact hole 203 side.

The diode contact hole 204 exposes the diode region 181 in the outer region 112. The diode contact hole 204 may be formed in a band shape (more specifically, an endless shape) extending along the diode region 181.

The diode contact hole 204 may expose the outer deep well region 182 and/or the field limit structure 183. An opening edge portion of the diode contact hole 204 is formed in a curved shape toward the diode contact hole 204 side.

The anchor hole 205 is formed by digging into the interlayer insulating layer 201 in the outer region 112. The anchor hole 205 is formed in the region between the diode region 181 and the side surfaces 105A to 105D in plan view. More specifically, the anchor hole 205 is formed in a region between the field limit structure 183 and the side surfaces 105A to 105D in plan view. The anchor hole 205 exposes the first main surface 103 (outer main surface 172). An opening edge portion of the anchor hole 205 is formed in a curved shape toward the anchor hole 205 side.

Referring to FIG. 18, the anchor hole 205 extends in a band shape along the active region 111 in plan view. In this embodiment, the anchor hole 205 is formed in an endless shape (a quadrilateral annular shape in this embodiment) surrounding the active region 111 in plan view.

In this embodiment, a single anchor hole 205 is formed in a portion of the interlayer insulating layer 201 covering the outer region 112. However, a plurality of anchor holes 205 may be formed in portions of the interlayer insulating layer 201 covering the outer region 112.

The main surface gate electrode layer 115 and the main surface source electrode layer 121 described above are respectively formed on the interlayer insulating layer 201. Each of the main surface gate electrode layer 115 and the main surface source electrode layer 121 has a laminated structure that includes a barrier electrode layer 206 and a main electrode layer 207 laminated in that order from the SiC semiconductor layer 102 side.

The barrier electrode layer 206 may have a single layer structure constituted of a titanium layer or a titanium nitride layer. The barrier electrode layer 206 may have a laminated structure including a titanium layer and a titanium nitride layer that are laminated in that order from the SiC semiconductor layer 102 side.

A thickness of the main electrode layer 207 exceeds a thickness of the barrier electrode layer 206. The main electrode layer 207 includes a conductive material having a resistance value less than a resistance value of the barrier electrode layer 206. The main electrode layer 207 may include at least one type of material among aluminum, copper, an aluminum alloy, and a copper alloy. The main electrode layer 207 may include at least one type of material among an AlSi alloy, an AlSiCu alloy, and an AlCu alloy. In this embodiment, the main electrode layer 207 includes an AlSiCu alloy.

The outer gate finger 117 included in the main surface gate electrode layer 115 enters into the gate contact hole 202 from on the interlayer insulating layer 201. The outer gate finger 117 is electrically connected to the gate wiring layer 150 inside the gate contact hole 202. An electrical signal from the gate pad 116 is thereby transmitted to the gate electrode layers 149 via the outer gate finger 117.

The source pad 122 included in the main surface source electrode layer 121 enters into the source contact holes 203 and the source sub-trenches 168 from on the interlayer insulating layer 201. The source pad 122 is electrically connected to the source regions 163, the contact regions 164, and the source electrode layers 157 inside the source contact holes 203 and the source sub-trenches 168.

The source electrode layers 157 may be formed using partial regions of the source pad 122. The source electrode layers 157 may be formed by portions of the source pad 122 entering into the respective source trenches 155.

The source routing wiring 123 included in the main surface source electrode layer 121 enters into the diode contact hole 204 from on the interlayer insulating layer 201. The source routing wiring 123 is electrically connected to the diode region 181 inside the diode contact hole 204.

The source connection portion 124 included in the main surface source electrode layer 121 crosses the side wall structure 192 from the active region 111 and is led out to the outer region 112. The source connection portion 124 forms a portion of the upper layer structure covering the side wall structure 192.

The passivation layer 125 described above is formed on the interlayer insulating layer 201. The passivation layer 125 is formed in a film along the interlayer insulating layer 201. The passivation layer 125 selectively covers the active region 111 and the outer region 112 via the interlayer insulating layer 201.

The passivation layer 125 crosses the side wall structure 192 from the active region 111 and is led out to the outer region 112. The passivation layer 125 forms a portion of the upper layer structure covering the side wall structure 192.

Referring to FIG. 23, in the outer region 112, the passivation layer 125 enters into the anchor hole 205 from on the interlayer insulating layer 201. Inside the anchor hole 205, the passivation layer 125 is connected to the outer main surface 172 (first main surface 103). A recess 211 recessed in conformance to the anchor hole 205 is formed in a region of an outer surface of the passivation layer 125 positioned on the anchor hole 205.

The resin layer 129 described above is formed on the passivation layer 125. The resin layer 129 is formed in a film along the passivation layer 125. The resin layer 129 selectively covers the active region 111 and the outer region 112 across the passivation layer 125 and the interlayer insulating layer 201. The resin layer 129 crosses the side wall structure 192 from the active region 111 and is led out to the outer region 112. The resin layer 129 forms a portion of the upper layer structure covering the side wall structure 192.

Referring to FIG. 23, the resin layer 129 has, in the outer region 112, an anchor portion entering into the recess 211 of the passivation layer 125. An anchor structure arranged to improve a connection strength of the resin layer 129 is thus formed in the outer region 112.

The anchor structure includes an uneven structure formed in the first main surface 103 in the outer region 112. More specifically, the uneven structure (anchor structure) includes unevenness formed using the interlayer insulating layer 201 covering the outer main surface 172. Even more specifically, the uneven structure (anchor structure) includes the anchor hole 205 formed in the interlayer insulating layer 201.

The resin layer 129 is engaged with the anchor hole 205. In this embodiment, the resin layer 129 is engaged with the anchor hole 205 via the passivation layer 125. The connection strength of the resin layer 129 with respect to the first main surface 103 can thereby be improved and therefore, peeling of the resin layer 129 can be suppressed.

As described above, even with the SiC semiconductor device 101, the same effects as the effects described for the SiC semiconductor device 1 can be exhibited. Also, with the SiC semiconductor device 101, depletion layers can be spread from boundary regions (pn junction portions) between the SiC semiconductor layer 102 and the deep well regions 165 toward regions at the second main surface 104 side with respect to the gate trenches 142.

Current paths of a short-circuit current flowing between the main surface source electrode layer 121 and the drain electrode layers 133 can thereby be narrowed. Also, a feedback capacitance Crss can be reduced inverse-proportionately by the depletion layers spreading from the boundary regions between the SiC semiconductor layer 102 and the deep well regions 165. The SiC semiconductor device 101 can thus be provided in which the short-circuit capacity can be improved and the feedback capacitance Crss can be reduced. The feedback capacitance Crss is a static capacitance across the gate electrode layers 149 and the drain electrode layer 133.

The depletion layers spreading from the boundary regions between the SiC semiconductor layer 102 and the deep well regions 165 may overlap with the bottom walls of the gate trenches 142. In this case, the depletion layers spreading from the bottom portions of the deep well regions 165 may overlap with the bottom walls of the gate trenches 142.

Also, with the SiC semiconductor device 101, the distances between the bottom portions of the respective deep well regions 165 and the second main surface 104 are substantially equal. Occurrence of variation in the distances between the bottom portions of the respective deep well regions 165 and the second main surface 104 can thereby be suppressed. The withstand voltage (for example, the electrostatic breakdown strength) of the SiC semiconductor layer 102 can thus be suppressed from being restricted by the deep well regions 165 and therefore improvement of the withstand voltage can be achieved appropriately.

Also, with the SiC semiconductor device 101, the diode region 181 is formed in the outer region 112. The diode region 181 is electrically connected to the main surface source electrode layer 121. The avalanche current generated in the outer region 112 can thereby be made to flow into the main surface source electrode layer 121 via the diode region 181. That is, the avalanche current generated in the outer region 112 can be absorbed by the diode region 181 and the main surface source electrode layer 121. Consequently, stability of operation of the MISFET can be improved.

Also, with the SiC semiconductor device 101, the outer deep well region 182 is formed in the outer region 112. The withstand voltage of the SiC semiconductor layer 102 can thereby be adjusted in the outer region 112. In particular, with the SiC semiconductor device 101, the outer deep well region 182 is formed at substantially the same depth position as the deep well regions 165. More specifically, the bottom portion of the outer deep well region 182 is positioned on substantially the same plane as the bottom portions of the deep well regions 165.

The distance between the bottom portion of the outer deep well region 182 and the second main surface 104 is substantially equal to the distances between the bottom portions of the deep well regions 165 and the second main surface 104. Variation can thereby be suppressed from occurring between the distance between the bottom portion of the outer deep well region 182 and the second main surface 104 and the distances between the bottom portions of the deep well regions 165 and the second main surface 104.

The withstand voltage (for example, the electrostatic breakdown strength) of the SiC semiconductor layer 102 can thus be suppressed from being restricted by the configuration of outer deep well region 182 and the configuration of the deep well regions 165. Consequently, improvement of the withstand voltage can be achieved appropriately. In particular, with the SiC semiconductor device 101, the outer region 112 is formed in a region at the second main surface 104 side with respect to the active region 111. The position of the bottom portion of the outer deep well region 182 can thereby be made to approach the positions of the bottom portions of the deep well regions 165 appropriately.

That is, a need to introduce the p type impurity to a comparatively deep position of the surface layer portion of the first main surface 103 during the forming of the outer deep well region 182 is eliminated. The position of the bottom portion of the outer deep well region 182 can thus be suppressed appropriately from deviating greatly with respect to the positions of the bottom portions of the deep well regions 165.

Moreover, with the SiC semiconductor device 101, the outer main surface 172 is positioned on substantially the same plane as the bottom walls of the source trenches 155. Thereby, if the p type impurity is introduced into the bottom walls of the source trenches 155 and the outer main surface 172 at an equal energy, the deep well regions 165 and the outer deep well region 182 can be formed at substantially equal depth positions. Consequently, the position of the bottom portion of the outer deep well region 182 can be suppressed even more appropriately from deviating greatly with respect to the positions of the bottom portions of the deep well regions 165.

Also, with the SiC semiconductor device 101, the field limit structure 183 is formed in the outer region 112. An electric field relaxation effect by the field limit structure 183 can thereby be obtained in the outer region 112. The electrostatic breakdown strength of the SiC semiconductor layer 102 can thus be improved appropriately.

Also, with the SiC semiconductor device 101, the active region 111 is formed as the active mesa 173 of mesa shape. The active mesa 173 includes the active side walls 174 connecting the active main surface 171 of the active region 111 and the outer main surface 172. The level difference moderating structure that moderates the level difference between the active main surface 171 and the outer main surface 172 is formed in the region between the active main surface 171 and the outer main surface 172. The level difference moderating structure includes the side wall structure 192.

The level difference between the active main surface 171 and the outer main surface 172 can thereby be moderated appropriately. The flatness of the upper layer structure formed on the side wall structure 192 can thus be improved appropriately. With the SiC semiconductor device 101, the interlayer insulating layer 201, the main surface source electrode layer 121, the passivation layer 125, and the resin layer 129 are formed as an example of the upper layer structure.

Also, with the SiC semiconductor device 101, the anchor structure arranged to improve the connection strength of the resin layer 129 is formed in the outer region 112. The anchor structure includes the uneven structure formed in the first main surface 103 in the outer region 112. More specifically, the uneven structure (anchor structure) includes the unevenness formed using the interlayer insulating layer 201 formed on the first main surface 103 in the outer region 112. Even more specifically, the uneven structure (anchor structure) includes the anchor hole 205 formed in the interlayer insulating layer 201.

The resin layer 129 is engaged with the anchor hole 205. In this embodiment, the resin layer 129 is engaged with the anchor hole 205 via the passivation layer 125. The connection strength of the resin layer 129 with respect to the first main surface 103 can thereby be improved and therefore, peeling of the resin layer 129 can be suppressed appropriately.

Also, with the SiC semiconductor device 101, the trench gate structures 161 with each of which the gate electrode layer 149 is embedded across the gate insulating layer 148 in the gate trench 142 are formed. With the trench gate structure 161, the gate electrode layer 149 is covered by the low resistance electrode layer 167 in the limited space of the gate trench 142. An effect described using FIG. 25 can be exhibited by such a structure.

Figure 25:
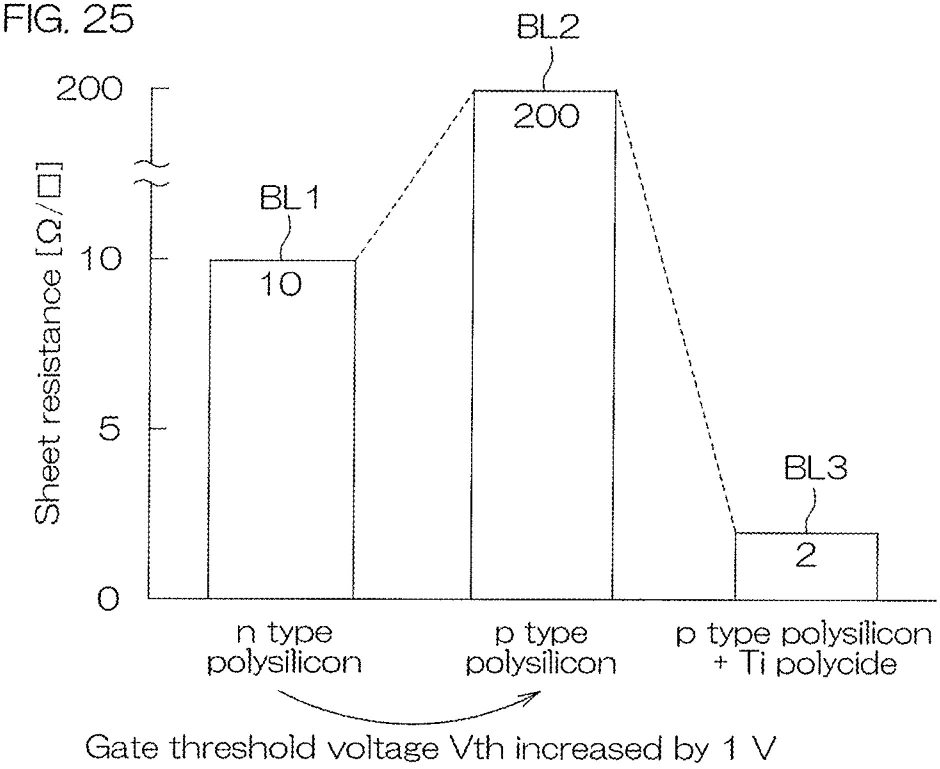
FIG. 25 is a graph for describing sheet resistance.

FIG. 25 is a graph for describing the sheet resistance inside the gate trench 142. In FIG. 25, the ordinate represents sheet resistance (Ω/□) and the abscissa represents items. In FIG. 25, a first bar graph BL1, a second bar graph BL2, and a third bar graph BL3 are shown.

The first bar graph BL1 represents the sheet resistance inside the gate trench 142 embedded with the n type polysilicon. The second bar graph BL2 represents the sheet resistance inside the gate trench 142 embedded with the p type polysilicon.

The third bar graph BL3 represents the sheet resistance inside the gate trench 142 embedded with the gate electrode layers 149 (p type polysilicon) and the low resistance electrode layer 167. Here, a case where the low resistance electrode layer 167 constituted of $TiSi_2$ (p type titanium silicide) as an example of polycide (silicide) is formed shall be described.

Referring to the first bar graph BL1, the sheet resistance inside the gate trench 142 embedded with the n type polysilicon was 10Ω/□. Referring to the second bar graph BL2, the sheet resistance inside the gate trench 142 embedded with the p type polysilicon was 200Ω/□. Referring to the third bar graph BL3, the sheet resistance inside the gate trench 142 embedded with the gate electrode layers 149 (p type polysilicon) and the low resistance electrode layer 167 was 2Ω/□.

The p type polysilicon has a work function differing from the n type polysilicon. With a structure in which the p type polysilicon is embedded in the gate trenches 142, a gate threshold voltage Vth can be increased by approximately 1 V.

However, the p type polysilicon has a sheet resistance of several tens of times (here, approximately 20 times) higher than a sheet resistance of the n type polysilicon. Therefore, if the p type polysilicon is adopted as a material of the gate electrode layers 149, energy loss increases significantly in accompaniment with increase of parasitic resistance inside the gate trenches 142 (referred to hereinafter simply as “gate resistance”).

On the other hand, with the structure having the low resistance electrode layer 167 on the gate electrode layers 149 (p type polysilicon), the sheet resistance can be decreased to not more than 1/100th in comparison to a case of not forming the low resistance electrode layer 167. That is, with the structure having the low resistance electrode layer 167, the sheet resistance can be decreased to not more than 1/5th in comparison to the gate electrode layers 149 including the n type polysilicon.

Thus, with the structure having the low resistance electrode layer 167, the sheet resistance inside the gate trench 142 can be reduced while increasing the gate threshold voltage Vth (for example, increasing it by approximately 1 V). Reduction of the gate resistance can thereby be achieved and therefore a current can be diffused efficiently along the trench gate structures 161. Consequently, reduction of switching delay can be achieved.

Also, with the structure having the low resistance electrode layer 167, the p type impurity concentration of the body region 141 and the p type impurity concentration of the contact regions 164 do not have to be increased. The gate threshold voltage Vth can thus be increased appropriately while suppressing the increase in channel resistance.

The low resistance electrode layer 167 may include at least one type of material among TiSi, $TiSi_2$, NiSi, CoSi, $CoSi_2$, $MoSi_2$, and $WSi_2$. Among these types of materials, NiSi, $CoSi_2$, and $TiSi_2$ are especially suitable as the polycide layer forming the low resistance electrode layer 167 due to being comparatively low in the value of specific resistance and temperature dependence.

As a result of further tests by the present inventors, increase of gate-to-source leak current was observed during low electric field application when $TiSi_2$ was adopted as the material of the low resistance electrode layer 167. On the other hand, increase of gate-to-source leak current was not observed during low electric field application when $CoSi_2$ was adopted. In consideration of this point, it is considered that $CoSi_2$ is most preferable as the polycide layer forming the low resistance electrode layer 167.

Further, with the SiC semiconductor device 101, the gate wiring layer 150 is covered by the low resistance electrode layer 167. Reduction of gate resistance of the gate wiring layer 150 can also be achieved thereby. In particular, with the structure where the gate electrode layers 149 and the gate wiring layer 150 are covered by the low resistance electrode layer 167, the current can be diffused efficiently along the trench gate structures 161. The reduction of switching delay can thus be achieved appropriately.

Figure 26:
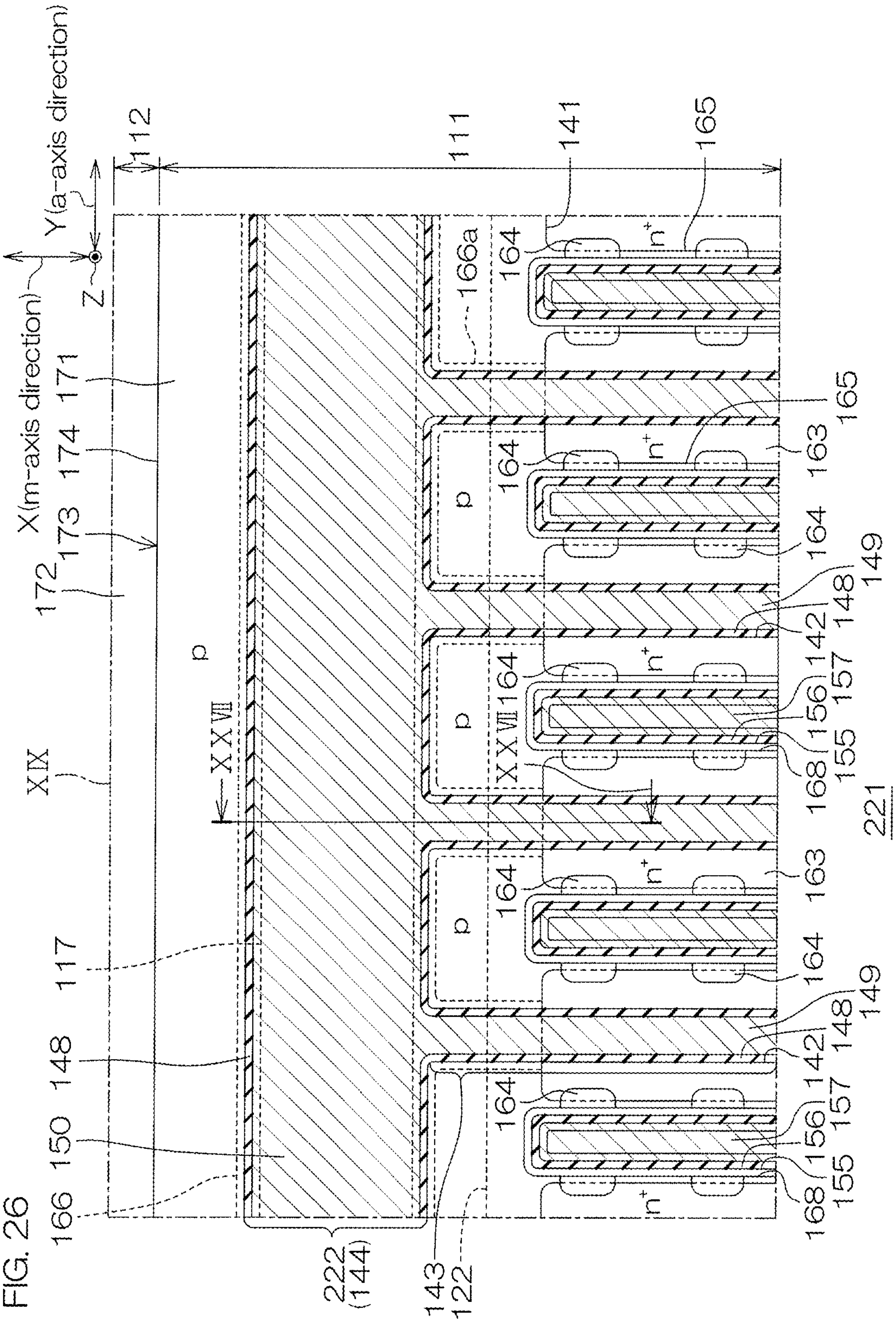
FIG. 26 is an enlarged view of a region corresponding to FIG. 19 and is an enlarged view of an SiC semiconductor device according to a fourth preferred embodiment of the present invention.
Figure 27:
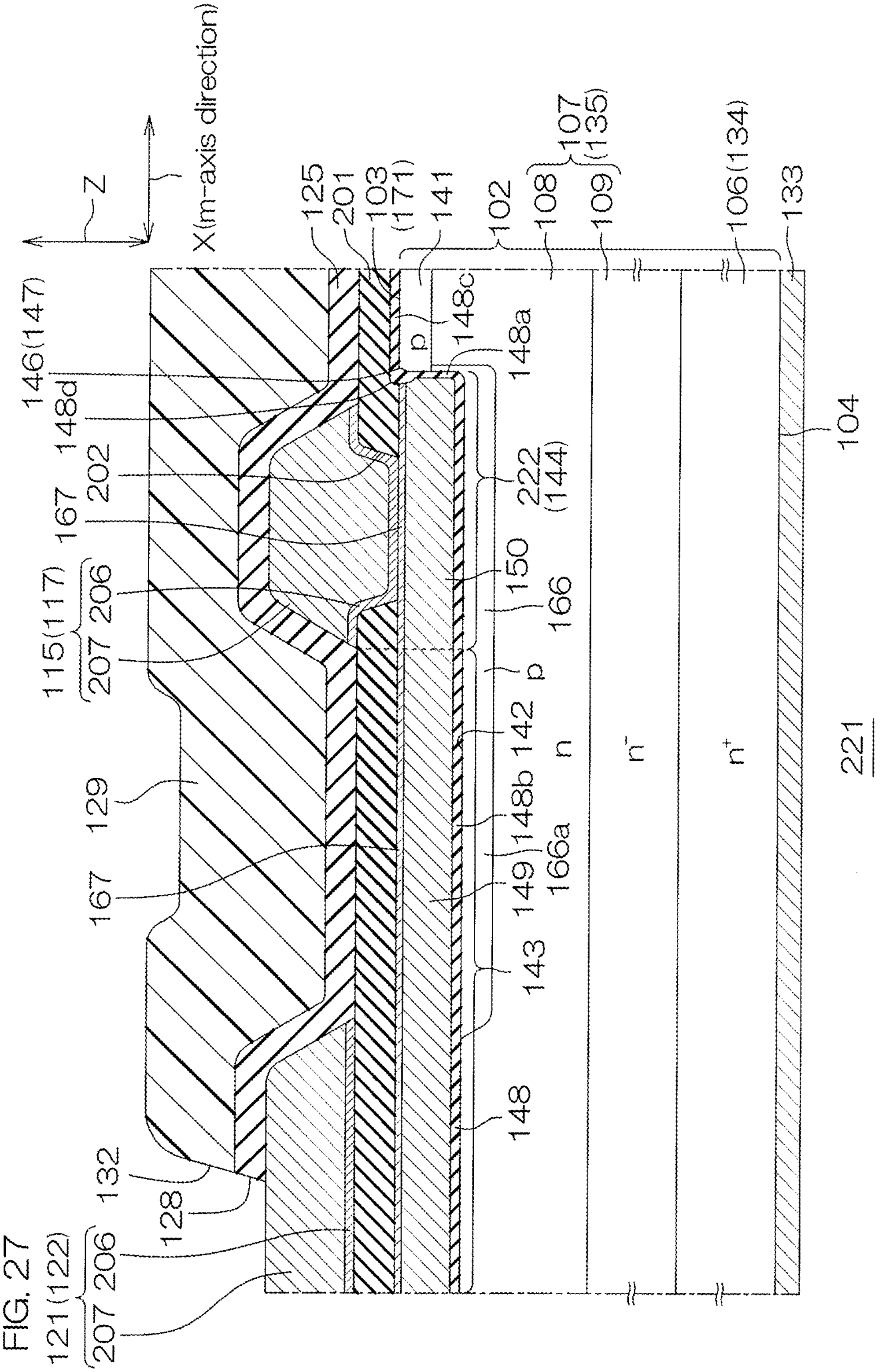
FIG. 27 is a sectional view taken along line XXVII-XXVII shown in FIG. 26.

FIG. 26 is an enlarged view of a region corresponding to FIG. 19 and is an enlarged view of an SiC semiconductor device 221 according to a fourth preferred embodiment of the present invention. FIG. 27 is a sectional view taken along line XXVII-XXVII shown in FIG. 26. In the following, structures corresponding to structures described with the SiC semiconductor device 101 shall be provided with the same reference signs and description thereof shall be omitted.

Referring to FIG. 26 and FIG. 27, the SiC semiconductor device 221 includes an outer gate trench 222 formed in the first main surface 103 in the active region 111. The outer gate trench 222 extends in a band shape along the peripheral edge portions of the active region 111. The outer gate trench 222 is formed in a region of the first main surface 103 directly below the outer gate finger 117.

The outer gate trench 222 extends along the outer gate finger 117. More specifically, the outer gate trench 222 is formed along the three side surfaces 105A, 105B, and 105D of the SiC semiconductor layer 102 such as to demarcate the inner region of the active region 111 from three directions. The outer gate trench 222 may be formed in an endless shape (for example, a quadrilateral annular shape) surrounding the inner region of the active region 111.

The outer gate trench 222 is in communication with the contact trench portions 144 of the respective gate trenches 142. The outer gate trench 222 and the gate trenches 142 are thereby formed by a single trench.

The gate wiring layer 150 described above is embedded in the outer gate trench 222. The gate wiring layer 150 is connected to the gate electrode layers 149 at communication portions of the gate trenches 142 and the outer gate trench 222. Also, the low resistance electrode layer 167 described above covers the gate wiring layer 150 inside the outer gate trench 222. In this case, the low resistance electrode layer 167 covering the gate electrode layers 149 and the low resistance electrode layer 167 covering the gate wiring layer 150 are formed inside a single trench.

As described above, even with the SiC semiconductor device 221, the same effects as the effects described for the SiC semiconductor device 101 can be exhibited. Also, with the semiconductor device 221, the gate wiring layer 150 is not required to be led out onto the first main surface 103. The gate wiring layer 150 can thereby be suppressed from opposing the SiC semiconductor layer 102 across the gate insulating layer 148 at the opening edge portions 146 of the gate trenches 142 (the outer gate trench 222). Consequently, the concentration of electric field at the opening edge portions 146 of the gate trenches 142 (the outer gate trench 222) can be suppressed.

Figure 28:
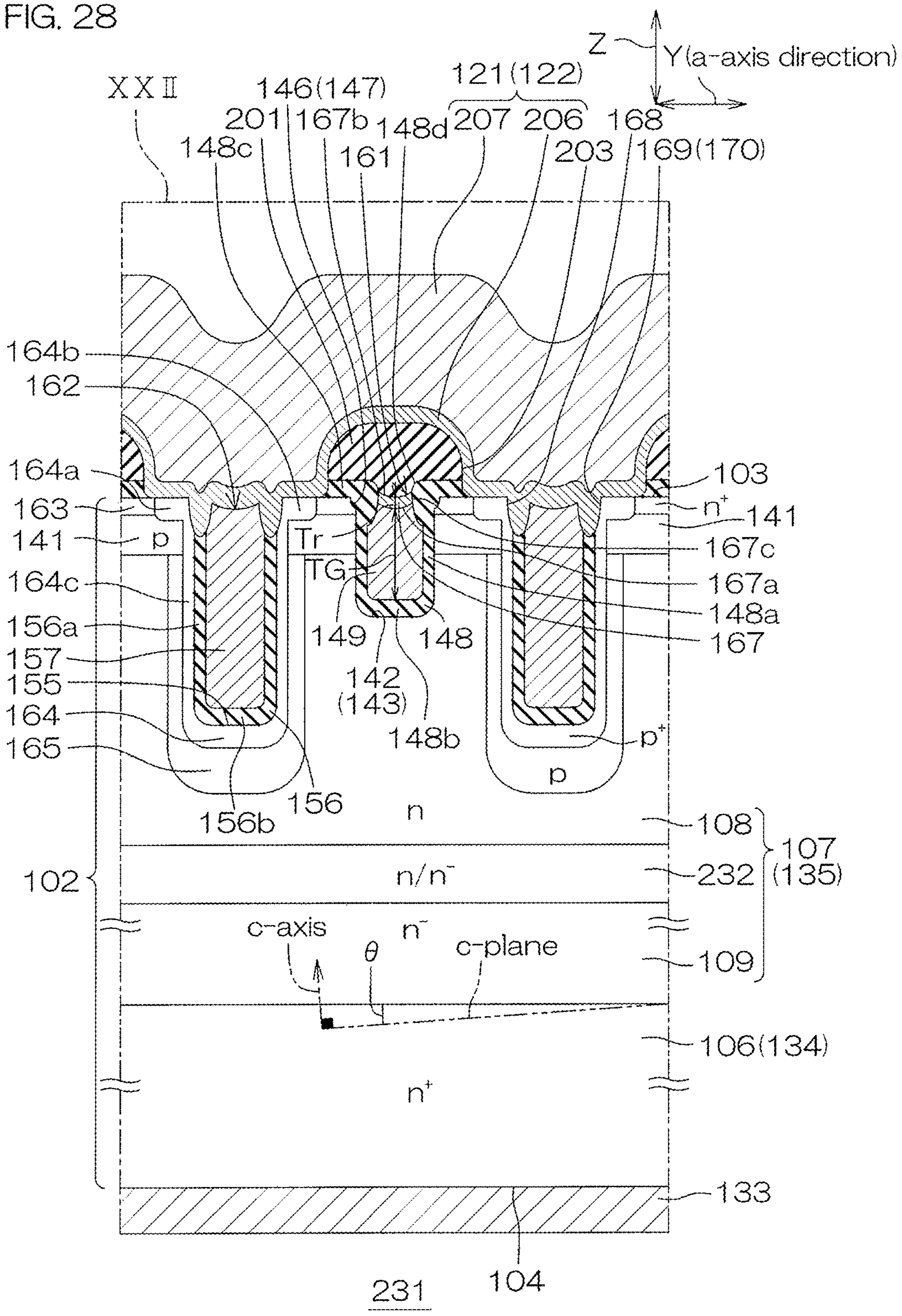
FIG. 28 is an enlarged view of a region corresponding to FIG. 22 and is an enlarged view of an SiC semiconductor device according to a fifth preferred embodiment of the present invention.

FIG. 28 is an enlarged view of a region corresponding to FIG. 22 and is an enlarged view of an SiC semiconductor device 231 according to a fifth preferred embodiment of the present invention. In the following, structures corresponding to the structures described with the SiC semiconductor device 101 shall be provided with the same reference signs and description thereof shall be omitted.

Referring to FIG. 28, in this embodiment, the SiC epitaxial layer 107 includes the high concentration region 108, the low concentration region 109, and a concentration gradient region 232, interposed between the high concentration region 108 and the low concentration region 109. In the SiC epitaxial layer 107, the concentration gradient region 232 is formed in the outer region 112 as well as in the active region 111. The concentration gradient region 232 is formed in an entire area of the SiC epitaxial layer 107.

The concentration gradient region 232 has a concentration gradient in which the n type impurity concentration decreases gradually from the high concentration region 108 toward the low concentration region 109. In other words, the concentration gradient region 232 has a concentration gradient in which the n type impurity concentration increases gradually from the low concentration region 109 toward the high concentration region 108. The concentration gradient region 232 suppresses sudden change of the n type impurity concentration in a region between the high concentration region 108 and the low concentration region 109.

When the SiC epitaxial layer 107 includes the concentration gradient region 232, the n type impurity concentration of the high concentration region 108 is preferably not less than 1.5 times and not more than 5 times the n type impurity concentration of the low concentration region 109. The n type impurity concentration of the high concentration region 108 may be not less than 3 times and not more than 5 times the n type impurity concentration of the low concentration region 109.

A thickness of the concentration gradient region 232 may be not less than 0.5 μm and not more than 2.0 μm. The thickness of the concentration gradient region 232 may be not less than 0.5 μm and not more than 1.0 μm, not less than 1.0 μm and not more than 1.5 μm, or not less than 1.5 μm and not more than 2.0 μm.

Although a specific description shall be omitted, the gate trenches 142, the source trenches 155, the deep well regions 165, the outer deep well region 182, etc., described above are formed in the high concentration region 108. That is, the gate trenches 142, the source trenches 155, the deep well regions 165, the outer deep well region 182, etc., described above are formed in a region of the SiC semiconductor layer 102 at the first main surface 103 side of a boundary region between the high concentration region 108 and the concentration gradient region 232.

As described above, even with the semiconductor device 231, the same effects as the effects described for the SiC semiconductor device 101 can be exhibited.

Figure 29:
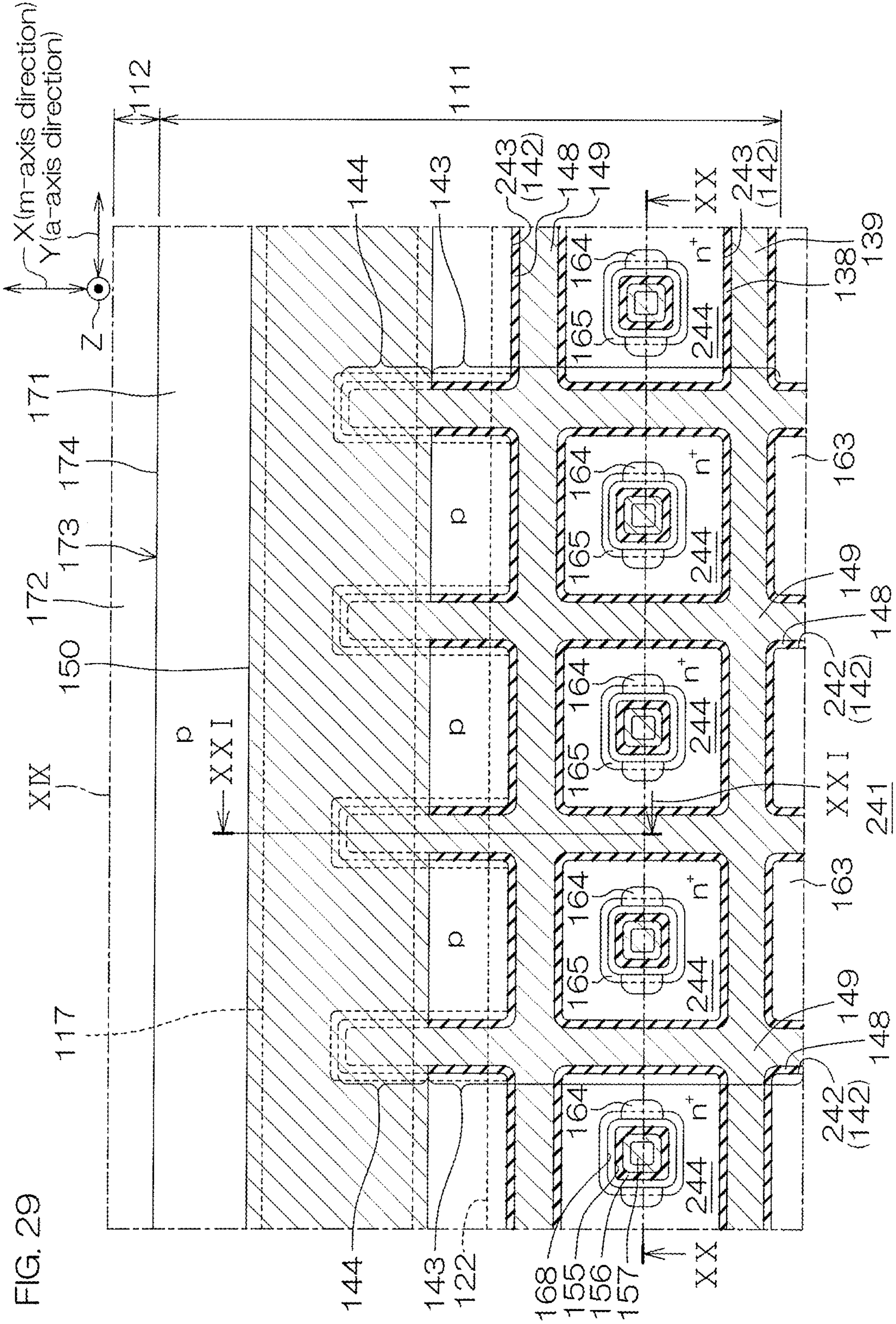
FIG. 29 is an enlarged view of a region corresponding to FIG. 19 and is an enlarged view of an SiC semiconductor device according to a sixth preferred embodiment of the present invention.

FIG. 29 is an enlarged view of a region corresponding to FIG. 19 and is an enlarged view of an SiC semiconductor device 241 according to a sixth preferred embodiment of the present invention. In the following, structures corresponding to the structures described with the SiC semiconductor device 101 shall be provided with the same reference signs and description thereof shall be omitted.

Referring to FIG. 29, in this embodiment, a gate trench 142 is formed in a lattice shape in plan view. More specifically, the gate trench 142 includes a plurality of first gate trenches 242 and a plurality of second gate trenches 243. The plurality of first gate trenches 242 and the plurality of second gate trenches 243 form active trench portions 143.

The plurality of first gate trenches 242 are formed at intervals in the second direction Y and are each formed in a band shape extending along the first direction X. The plurality of first gate trenches 242 are formed in a stripe shape as a whole in plan view. Side walls of each first gate trench 242 that form long sides are formed by the a-planes of the SiC monocrystal. The side walls of each first gate trench 242 that form short sides are formed by the m-planes of the SiC monocrystal.

The plurality of second gate trenches 243 are formed at intervals in the first direction X and are each formed in a band shape extending along the second direction Y. The plurality of second gate trenches 243 are formed in a stripe shape as a whole in plan view. Side walls of each second gate trench 243 that form long sides are formed by the m-planes of the SiC monocrystal. The side walls of each second gate trench 243 that form short sides are formed by the a-planes of the SiC monocrystal.

The plurality of first gate trenches 242 and the plurality of second gate trenches 243 intersect each other. A single gate trench 142 of lattice shape in plan view is thereby formed. A plurality of cell regions 244 are demarcated in regions surrounded by the gate trench 142.

The plurality of cell regions 244 are arranged in a matrix at intervals in the first direction X and the second direction Y in plan view. The plurality of cell regions 244 are formed in quadrilateral shapes in plan view. In each cell region 244, the body region 141 is exposed from the side walls of the gate trench 142. The body region 141 is exposed from the side walls of the gate trench 142 that are formed by the m-planes and the a-planes of the SiC monocrystal.

Obviously, the gate trench 142 may be formed in a honeycomb shape in plan view as one mode of the lattice shape. In this case, the plurality of cell regions 244 may be arranged in a staggered arrangement at intervals in the first direction X and the second direction Y. Also, in this case, the plurality of cell regions 244 may be formed in hexagonal shapes in plan view.

Each source trench 155 is formed in a central portion of the corresponding cell region 244 in plan view. Each source trench 155 is formed in a pattern appearing singly at a cut surface appearing when the corresponding cell region 244 is cut along the first direction X. Also, each source trench 155 is formed in a pattern appearing singly at a cut surface appearing when the corresponding cell region 244 is cut along the second direction Y.

More specifically, each source trench 155 is formed in a quadrilateral shape in plan view. Four side walls of each source trench 155 are formed by the m-planes and the a-planes of the SiC monocrystal. A planar shape of each source trench 155 is arbitrary. Each source trench 155 may be formed in a polygonal shape, such as a triangular shape, pentagonal shape, hexagonal shape, etc., or a circular shape or elliptical shape in plan view.

A sectional view taken along line XX-XX of FIG. 29 corresponds to the sectional view of FIG. 20. A sectional view taken along line XXI-XXI of FIG. 29 corresponds to the sectional view of FIG. 21.

As described above, even with the sic semiconductor device 241, the same effects as the effects described for the SiC semiconductor device 101 can be exhibited.

Preferred embodiments of the present invention may be implemented in yet other embodiments.

With each of the preferred embodiments described above, an embodiment where the side surface 5A or 105A and the side surface 5C or 105C of the SiC semiconductor layer 2 or 102 face the a-planes of the SiC monocrystal and the side surface 5B or 105B and the side surface 5D or 105D face the m-planes of the SiC monocrystal was described. However, an embodiment where the side surface 5A or 105A and the side surface 5C or 105C face the m-planes of the SiC monocrystal and the side surface 5B or 105B and the side surface 5D or 105D face the a-planes of the SiC monocrystal may be adopted.

With each of the preferred embodiments described above, an example where the modified lines 22A to 22D of band shapes that extend continuously are formed was described. However, in each of the preferred embodiments described above, the modified lines 22A to 22D of broken-line band shapes (broken line shapes) may be formed. That is, the modified lines 22A to 22D may be formed in band shapes extending intermittently. In this case, one, two or three of the modified lines 22A to 22D may be formed in a broken-line band shape and the remainder may be formed in a band shape.

With each of the third to sixth preferred embodiments described above, an example where the plurality of gate trenches 142 (first gate trenches 242) extending along the m-axis direction (the [1-100] direction) of the SiC monocrystal are formed was described. However, the plurality of gate trenches 142 (first gate trenches 242) extending along the a-axis direction (the [11-20] direction) of the SiC monocrystal may be formed. In this case, the plurality of source trenches 155 extending along the a-axis direction (the [11-20] direction) of the SiC monocrystal are formed.

With each of the third to sixth preferred embodiments described above, an example where the source electrode layers 157 are embedded in the source trenches 155 across the source insulating layers 156 was described. However, the source electrode layers 157 may be embedded directly in the source trenches 155 without interposition of the source insulating layers 156.

With each of the third to sixth preferred embodiments described above, an example where each source insulating layer 156 is formed along the side walls and the bottom wall of the corresponding source trench 155 was described. However, each source insulating layer 156 may be formed along the side walls of the corresponding source trench 155 such as to expose the bottom wall of the source trench 155. Each source insulating layer 156 may be formed along the side walls and the bottom wall of the corresponding source trench 155 such as to expose a portion of the bottom wall of the source trench 155.

Also, each source insulating layer 156 may be formed along the bottom wall of the corresponding source trench 155 such as to expose the side walls of the source trench 155. Each source insulating layer 156 may be formed along the side walls and the bottom wall of the corresponding source trench 155 such as to expose a portion of the side walls of the source trench 155.

With each of the third to sixth preferred embodiments described above, an example where the gate electrode layers 149 and the gate wiring layer 150 that include the p type polysilicon doped with the p type impurity are formed was described. However, if increase of the gate threshold voltage Vth is not emphasized, the gate electrode layers 149 and the gate wiring layer 150 may include the n type polysilicon doped with the n type impurity in place of or in addition to the p type polysilicon.

In this case, the low resistance electrode layer 167 may be formed by siliciding, by a metal material, the portions of the gate electrode layers 149 (n type polysilicon) forming the surface layer portions. That is, the low resistance electrode layer 167 may include an n type polycide. With such a structure, reduction of gate resistance can be achieved.

In each of the third to sixth preferred embodiments described above, a $p^+$ type SiC semiconductor substrate (106) may be adopted in place of the $n^+$ type SiC semiconductor substrate 106. With this structure, an IGBT (insulated gate bipolar transistor) can be provided in place of a MISFET. In this case, in each of the third to sixth preferred embodiments described above, the "source" of the MISFET is replaced by an "emitter" of the IGBT and the "drain" of the MISFET is replaced by a "collector" of the IGBT.

In each of the preferred embodiments described above, a structure in which the conductivity types of the respective semiconductor portions are inverted may be adopted. That is, a p type portion may be made to be of an n type and an n type portion may be made to be of a p type.

The respective preferred embodiments described above can also be applied to a semiconductor device using a semiconductor material differing from SiC. The semiconductor material differing from SiC may be a compound semiconductor material. The compound semiconductor material may be either or both of gallium nitride (GaN) and gallium oxide ($Ga_2O_3$).

For example, each of the third to sixth preferred embodiments described above may be a compound semiconductor device that includes a vertical type compound semiconductor MISFET adopting a compound semiconductor material in place of SiC. In the compound semiconductor, magnesium may be adopted as a p type impurity (acceptor). Also, germanium (Ge), oxygen (O), or silicon (Si) may be adopted as an n type impurity (donor).

The present description does not restrict any combined embodiment of features illustrated with the first to sixth preferred embodiments. The first to sixth preferred embodiments may be combined among each other in any mode or any embodiment. That is, an SiC semiconductor device combining features illustrated with the first to sixth preferred embodiments in any mode or any configuration may be adopted.

Examples of features extracted from the present description and drawings (in particular, FIG. 1 to FIG. 13G) are indicated below.

Japanese Patent Application Publication No. 2012-146878 discloses a method for manufacturing an SiC semiconductor device that uses a stealth dicing method. With the manufacturing method of Japanese Patent Application Publication No. 2012-146878, a plurality of columns of rough surface regions constituted of laser irradiation marks are formed by laser irradiation over entire areas of respective side surfaces of an SiC semiconductor layer cut out from an SiC semiconductor wafer.

[A1] to [A26], [B1] to [B18], [C1], [D1] to [D3], [E1] to [E3], and [F1] in the following provide an SiC semiconductor device that enables wet-spreading of a conductive bonding material to be suppressed.

[A1] An SiC semiconductor device including an SiC semiconductor layer including an SiC monocrystal and having a mounting surface, a non-mounting surface at a side opposite to the mounting surface, and a side surface connecting the mounting surface and the non-mounting surface, a rough surface region formed at the side surface of the SiC semiconductor layer, and a smooth surface region formed in a region of the side surface of the SiC semiconductor layer differing from the rough surface region.

According to this SiC semiconductor device, a capillary phenomenon occurring at the rough surface region can be suppressed by the smooth surface region. Wet-spreading of a conductive bonding material at the side surface of the SiC semiconductor layer can thus be suppressed.

[A2] The SiC semiconductor device according to A1, wherein the rough surface region is formed in a region of the side surface at the mounting surface side.

[A3] The SiC semiconductor device according to A1 or A2, wherein the rough surface region is formed at an interval from the mounting surface at the side surface.

[A4] The SiC semiconductor device according to any one of A1 to A3, wherein the rough surface region is formed at an interval from the non-mounting surface at the side surface.

[A5] The SiC semiconductor device according to any one of A1 to A4, wherein the smooth surface region is formed in a region of the side surface at the non-mounting surface side with respect to the rough surface region.

[A6] The SiC semiconductor device according to any one of A1 to A5, wherein the smooth surface region is formed in a surface layer portion of the non-mounting surface at the side surface.

[A7] The SiC semiconductor device according to any one of A1 to A6, wherein the smooth surface region is formed in a surface layer portion of the mounting surface at the side surface.

[A8] The SiC semiconductor device according to any one of A1 to A7, wherein the rough surface region extends in a band shape along a tangential direction to the mounting surface at the side surface.

[A9] The SiC semiconductor device according to any one of A1 to A8, wherein the rough surface region extends in an annular shape surrounding the SiC semiconductor layer at the side surface.

[A10] The SiC semiconductor device according to any one of A1 to A9, wherein the smooth surface region extends in a band shape along a tangential direction to the mounting surface at the side surface.

[A11] The SiC semiconductor device according to any one of A1 to A10, wherein the smooth surface region extends in an annular shape surrounding the SiC semiconductor layer at the side surface.

[A12] The SiC semiconductor device according to any one of A1 to A11, wherein the non-mounting surface is a device surface.

[A13] The SiC semiconductor device according to any one of A1 to A11, wherein the mounting surface is a device surface.

[A14] The SiC semiconductor device according to any one of A1 to A13, wherein the rough surface region includes a modified layer modified to be of a property differing from the SiC monocrystal and the smooth surface region is constituted of a crystal plane of the SiC monocrystal.

[A15] The SiC semiconductor device according to any one of A1 to A14, wherein the SiC semiconductor layer has a thickness not less than 40 μm and not more than 200 μm.

[A16] The SiC semiconductor device according to any one of A1 to A15, wherein the SiC semiconductor layer has a laminated structure that includes an SiC semiconductor substrate and an SiC epitaxial layer, the rough surface region is formed in the SiC semiconductor substrate, and the smooth surface region is formed in the SiC epitaxial layer.

[A17] The SiC semiconductor device according to A16, wherein the smooth surface region crosses a boundary of the SiC semiconductor substrate and the SiC epitaxial layer and is formed in the SiC semiconductor substrate and the SiC epitaxial layer.

[A18] The SiC semiconductor device according to A16 or A17, wherein the rough surface region is formed in a region of the SiC semiconductor layer at the non-mounting surface side with respect to a boundary of the SiC semiconductor substrate and the SiC epitaxial layer.

[A19] The SiC semiconductor device according to any one of A16 to A18, wherein the SiC epitaxial layer has a thickness not more than a thickness of the SiC semiconductor substrate.

[A20] The SiC semiconductor device according to any one of A16 to A19, wherein the SiC semiconductor substrate has a thickness not less than 40 μm and not more than 150 μm and the SiC epitaxial layer has a thickness not less than 1 μm and not more than 50 μm.

[A21] The SiC semiconductor device according to any one of A1 to A20, wherein the SiC monocrystal is constituted of a hexagonal crystal.

[A22] The SiC semiconductor device according to A21, wherein the SiC monocrystal is constituted of a 2H (hexagonal)-SiC monocrystal, a 4H-SiC monocrystal, or a 6H-SiC monocrystal.

[A23] The SiC semiconductor device according to A21 or A22, wherein the mounting surface of the SiC semiconductor layer faces a c-plane of the SiC monocrystal.

[A24] The SiC semiconductor device according to any one of A21 to A23, wherein the mounting surface of the SiC semiconductor layer has an off angle inclined at an angle not less than 0° and not more than 10° with respect to a c-plane of the SiC monocrystal.

[A25] The SiC semiconductor device according to A24, wherein the off angle is an angle not more than 5°.

[A26] The SiC semiconductor device according to A24 or A25, wherein the off angle is an angle exceeding 0° and being less than 4°.

[B1] An SiC semiconductor device including an SiC semiconductor layer including an SiC monocrystal and having a first main surface as a device surface, a second main surface at a side opposite to the first main surface, and a side surface connecting the first main surface and the second main surface, a rough surface region formed at the side surface of the SiC semiconductor layer, and a smooth surface region formed in a region of the side surface of the SiC semiconductor layer differing from the rough surface region.

According to this SiC semiconductor device, a capillary phenomenon occurring at the rough surface region can be suppressed by the smooth surface region. Wet-spreading of a conductive bonding material at the side surface of the SiC semiconductor layer can thus be suppressed.

[B2] The SiC semiconductor device according to B1, wherein the rough surface region is formed in a region of the SiC semiconductor layer at the second main surface side and the smooth surface region is formed in a region of the SiC semiconductor layer at the first main surface side with respect to the rough surface region.

[B3] The SiC semiconductor device according to B1 or B2, wherein the rough surface region extends in a band shape along a tangential direction to the first main surface at the side surface and the smooth surface region extends in a band shape along the tangential direction to the first main surface at the side surface.

[B4] The SiC semiconductor device according to any one of B1 to B3, wherein the rough surface region extends in an annular shape surrounding the SiC semiconductor layer at the side surface and the smooth surface region extends in an annular shape surrounding the SiC semiconductor layer at the side surface.

[B5] The SiC semiconductor device according to any one of B1 to B4, wherein the rough surface region includes a modified layer modified to be of a property differing from the SiC monocrystal and the smooth surface region is constituted of a cleavage surface of the SiC monocrystal.

[B6] The SiC semiconductor device according to B5, wherein the modified layer includes a plurality of modified portions each extending in a normal direction to the first main surface of the SiC semiconductor layer and opposing each other in a tangential direction to the first main surface of the SiC semiconductor layer.

[B7] The SiC semiconductor device according to any one of B1 to B6, wherein the SiC semiconductor layer has a thickness not less than 40 μm and not more than 200 μm.

[B8] The SiC semiconductor device according to any one of B1 to B7, wherein the SiC semiconductor layer has a laminated structure that includes an SiC semiconductor substrate and an SiC epitaxial layer and in which the first main surface is formed by the SiC epitaxial layer, the rough surface region is formed in the SiC semiconductor substrate, and the smooth surface region is formed in the SiC epitaxial layer.

[B9] The SiC semiconductor device according to B8, wherein the smooth surface region crosses a boundary of the SiC semiconductor substrate and the SiC epitaxial layer and is formed in the SiC semiconductor substrate and the SiC epitaxial layer.

[B10] The SiC semiconductor device according to B8 or B9, wherein the rough surface region is formed in a region at the second main surface side of the SiC semiconductor layer with respect to a boundary of the SiC semiconductor substrate and the SiC epitaxial layer.

[B11] The SiC semiconductor device according to any one of B8 to B10, wherein the SiC epitaxial layer has a thickness not more than a thickness of the SiC semiconductor substrate.

[B12] The SiC semiconductor device according to any one of B8 to B11, wherein the SiC semiconductor substrate has a thickness not less than 40 μm and not more than 150 μm and the SiC epitaxial layer has a thickness not less than 1 μm and not more than 50 μm.

[B13] The SiC semiconductor device according to any one of B1 to B12, wherein the SiC monocrystal is constituted of a hexagonal crystal.

[B14] The SiC semiconductor device according to B13, wherein the SiC monocrystal is constituted of a 2H (hexagonal)-SiC monocrystal, a 4H-SiC monocrystal, or a 6H-SiC monocrystal.

[B15] The SiC semiconductor device according to B13 or B14, wherein the first main surface of the SiC semiconductor layer faces a c-plane of the SiC monocrystal.

[B16] The SiC semiconductor device according to any one of B13 to B15, wherein the first main surface of the SiC semiconductor layer has an off angle inclined at an angle not less than 0° and not more than 10° with respect to a c-plane of the SiC monocrystal.

[B17] The SiC semiconductor device according to B16, wherein the off angle is an angle not more than 5°.

[B18] The SiC semiconductor device according to B16 or B17, wherein the off angle is an angle exceeding 0° and being less than 4°.

[C1] An SiC semiconductor device including an SiC semiconductor layer including an SiC monocrystal and having a mounting surface, a non-mounting surface at a side opposite to the mounting surface, and a side surface connecting the mounting surface and the non-mounting surface, a rough surface region formed in a region of the side surface of the SiC semiconductor layer at the mounting surface side, and a smooth surface region formed in a region of the side surface of the SiC semiconductor layer at the non-mounting surface side with respect to the rough surface region.

According to this SiC semiconductor device, a capillary phenomenon occurring at the rough surface region can be suppressed by the smooth surface region. Wet-spreading of a conductive bonding material at the side surface of the SiC semiconductor layer can thus be suppressed. In particular, with the smooth surface region formed in the non-mounting surface region of the SiC semiconductor layer, flowing around of the conductive bonding material to the non-mounting surface can be suppressed appropriately. A short circuit due to the wet-spreading of the conductive bonding material can thus be suppressed appropriately.

[D1] An SiC semiconductor device including an SiC semiconductor layer including an SiC monocrystal and having a first main surface as a device surface, a second main surface at a side opposite to the first main surface, and a side surface connecting the first main surface and the second main surface, an insulating layer containing an insulating material, covering the first main surface of the SiC semiconductor layer, and having an insulating side surface continuous to the side surface of the SiC semiconductor layer, a rough surface region that includes a modified layer modified to be of a property differing from the SiC monocrystal and is formed at the side surface of the SiC semiconductor layer, a smooth surface region formed in a region of the side surface of the SiC semiconductor layer differing from the rough surface region, and an electrode formed on the insulating layer.

According to this SiC semiconductor device, a capillary phenomenon occurring at the rough surface region can be suppressed by the smooth surface region. Wet-spreading of a conductive bonding material at the side surface of the siC semiconductor layer can thus be suppressed. Moreover, the insulating layer having the insulating side surface formed flush with the side surface of the SiC semiconductor layer is formed on the first main surface of the SiC semiconductor layer. Thereby, an insulating property between the side surface of the SiC semiconductor layer and the electrode can be improved by the insulating layer while suppressing wet-spreading of the conductive bonding material. A short circuit due to the wet-spreading of the conductive bonding material can thereby be suppressed appropriately.

[D2] An SiC semiconductor device including an SiC semiconductor layer including an SiC monocrystal and having a first main surface as a device surface, a second main surface at a side opposite to the first main surface, and a side surface connecting the first main surface and the second main surface, an insulating layer containing an insulating material, covering the first main surface of the SiC semiconductor layer, and having an insulating side surface continuous to the side surface of the SiC semiconductor layer, a rough surface region that includes a modified layer modified to be of a property differing from the SiC monocrystal and is formed in a region of the side surface of the SiC semiconductor layer at the second main surface side, and a smooth surface region formed in a region of the side surface of the SiC semiconductor layer at the first main surface side with respect to the rough surface region.

According to this SiC semiconductor device, a capillary phenomenon occurring at the rough surface region can be suppressed by the smooth surface region and therefore wet-spreading of a conductive bonding material at the side surface of the SiC semiconductor layer can be suppressed. In particular, with the smooth surface region formed in the region of the SiC semiconductor layer at the first main surface side, flowing around of the conductive bonding material to the first main surface of the SiC semiconductor layer can be suppressed appropriately.

Moreover, the insulating layer having the insulating side surface formed flush with the side surface of the SiC semiconductor layer is formed on the first main surface of the SiC semiconductor layer. Thereby, an insulating property between the side surface of the SiC semiconductor layer and an electrode can be improved by the insulating layer while suppressing the flowing around of the conductive bonding material to the first main surface of the SiC semiconductor layer. A short circuit due to the wet-spreading of the conductive bonding material can thereby be suppressed appropriately.

[D3] The SiC semiconductor device according to D1 or D2, wherein the insulating layer is continuous to the smooth surface region.

[E1] An SiC semiconductor device including an SiC semiconductor layer including an SiC monocrystal and having a mounting surface, a non-mounting surface at a side opposite to the mounting surface, and a side surface connecting the mounting surface and the non-mounting surface, a rough surface region formed at the side surface of the SiC semiconductor layer, a smooth surface region formed in a region of the side surface of the SiC semiconductor layer differing from the rough surface region, and an insulating layer covering the non-mounting surface of the SiC semiconductor layer and having an insulating side surface continuous to the side surface of the SiC semiconductor layer.

According to this SiC semiconductor device, a capillary phenomenon occurring at the rough surface region can be suppressed by the smooth surface region. Wet-spreading of a conductive bonding material at the side surface of the SiC semiconductor layer can thus be suppressed. Moreover, the insulating layer having the insulating side surface formed flush with the side surface of the SiC semiconductor layer is formed on the non-mounting surface of the SiC semiconductor layer. Thereby, an insulating property between the side surface of the SiC semiconductor layer and an electrode can be improved by the insulating layer while suppressing the wet-spreading of the conductive bonding material. A short circuit due to the wet-spreading of the conductive bonding material can thereby be suppressed appropriately.

[E2] An SiC semiconductor device including an SiC semiconductor layer including an SiC monocrystal and having a mounting surface, a non-mounting surface at a side opposite to the mounting surface, and a side surface connecting the mounting surface and the non-mounting surface, a rough surface region formed in a region of the side surface of the SiC semiconductor layer at the mounting surface side, a smooth surface region formed in a region of the side surface of the SiC semiconductor layer at the non-mounting surface side with respect to the rough surface region, and an insulating layer covering the non-mounting surface of the SiC semiconductor layer and having an insulating side surface continuous to the side surface of the SiC semiconductor layer.

According to this SiC semiconductor device, a capillary phenomenon occurring at the rough surface region can be suppressed by the smooth surface region. Wet-spreading of a conductive bonding material at the side surface of the SiC semiconductor layer can thus be suppressed. In particular, with the smooth surface region formed in the region of the SiC semiconductor layer at the first main surface side, flowing around of the conductive bonding material to the first main surface of the SiC semiconductor layer can be suppressed appropriately.

Moreover, the insulating layer having the insulating side surface formed flush with the side surface is formed on the first main surface of the SiC semiconductor layer. Thereby, an insulating property between the side surface of the SiC semiconductor layer and an electrode can be improved by the insulating layer while suppressing the flowing around of the conductive bonding material to the first main surface of the SiC semiconductor layer. A short circuit due to the wet-spreading of the conductive bonding material can thereby be suppressed appropriately.

[E3] The SiC semiconductor device according to E1 or E2, wherein the insulating layer is continuous to the smooth surface region.

[F1] An SiC semiconductor device including an SiC semiconductor layer including an SiC monocrystal constituted of a hexagonal crystal and having a mounting surface, a non-mounting surface at a side opposite to the mounting surface, a first side surface faces an m-plane of the SiC monocrystal, and a second side surface faces an a-plane of the SiC monocrystal, a first rough surface region including a first modified layer modified to be of a property differing from the SiC monocrystal and formed at a first occupying ratio at the first side surface of the SiC semiconductor layer, and a second rough surface region including a second modified layer modified to be of a property differing from the SiC monocrystal and formed at a second occupying ratio less than the first occupying ratio at the second side surface of the SiC semiconductor layer.

In a plan view of viewing a c-plane (silicon plane) from a c-axis, the SiC monocrystal has a physical property of cracking easily along nearest atom directions of Si atoms and not cracking easily along directions intersecting the nearest atom directions. The nearest atom directions are an a-axis direction and directions equivalent thereto. Crystal planes oriented along the nearest atom directions are m-planes and planes equivalent thereto. The directions intersecting the nearest atom directions are an m-axis direction and directions equivalent thereto. The crystal planes oriented along the directions intersecting the nearest atom directions are a-planes and planes equivalent thereto.

Therefore, even if modified layers having comparatively large occupying ratios are not formed at the crystal planes oriented along the nearest atom directions of the SiC monocrystal, the SiC monocrystal can be cut appropriately because these crystal planes have the property of cracking comparatively easily.

The SiC semiconductor device having the first rough surface region formed at the first occupying ratio at the side surface facing the m-plane of the SiC monocrystal and the second rough surface region formed at the second occupying ratio less than the first occupying ratio at the side surface facing the a-plane of the SiC monocrystal can thereby be provided. Regions of the first side surface and the second side surface in which a capillary phenomenon occurs can thus be reduced and therefore wet-spreading of a conductive bonding material can be suppressed appropriately.

Examples of other features extracted from the present description and drawings (in particular, FIG. 13H to FIG. 13S) are indicated below.

Japanese Patent Application Publication No. 2012-146878 discloses a method for manufacturing an SiC semiconductor device that uses a stealth dicing method. With the manufacturing method of Japanese Patent Application Publication No. 2012-146878, a plurality of columns of modified regions (modified lines) are formed over entire areas of respective side surfaces of an SiC semiconductor layer cut out from an SiC semiconductor wafer. The plurality of columns of modified regions extend along tangential directions to a main surface of the SiC semiconductor layer and are formed at intervals in a normal direction to the main surface of the SiC semiconductor layer.

The modified lines are formed by modifying an SiC monocrystal of the SiC semiconductor layer to be of another property. Thus, in consideration of influences on the SiC semiconductor layer due to the modified lines, it cannot be said to be desirable to form the plurality of modified lines over the entire areas of the side surfaces of the SiC semiconductor layer. As examples of the influences on the SiC semiconductor layer due to the modified lines, fluctuation of electrical characteristics of the SiC semiconductor layer due to the modified lines, generation of cracks in the SiC semiconductor layer with the modified lines as starting points, etc., can be cited.

[G1] to [G21] in the following provide an SiC semiconductor device that enables influences on an SiC semiconductor layer due to modified lines to be reduced.

[G1] An SiC semiconductor device including an SiC semiconductor layer including an SiC monocrystal and having a first main surface as a device surface, a second main surface at a side opposite to the first main surface, and a plurality of side surfaces connecting the first main surface and the second main surface, and a plurality of modified lines formed one layer each as a band shape at the respective side surfaces of the SiC semiconductor layer and each including a portion extending inclinedly with respect to the first main surface and modified to be of a property differing from the SiC monocrystal.

According to this SiC semiconductor device, cutting starting points of the SiC semiconductor layer can thereby be formed in a region at the first main surface side of the SiC semiconductor layer and a region at the second main surface side of the SiC semiconductor layer by the modified line of one layer. Therefore, when manufacturing the SiC semiconductor device, a SiC semiconductor wafer can be cut appropriately without forming a plurality of the modified lines along a thickness direction of the SiC semiconductor wafer. Thereby, forming regions of the modified lines can be reduced appropriately at the respective side surfaces of the SiC semiconductor layer. The influences on the SiC semiconductor layer due to the modified lines can thus be reduced.

[G2] The SiC semiconductor device according to G1, wherein each of the modified lines is formed at an interval toward the second main surface side from the first main surface of the SiC semiconductor layer.

[G3] The SiC semiconductor device according to G1 or G2, wherein each of the modified lines is formed at an interval toward the first main surface side from the second main surface of the SiC semiconductor layer.

[G4] The SiC semiconductor device according to any one of G1 to G3, wherein each of the modified lines bipartitions the corresponding side surface of the SiC semiconductor layer into a region at the first main surface side and a region at the second main surface side in a side view as viewed from a normal direction to the side surface of the SiC semiconductor layer.

[G5] The SiC semiconductor device according to any one of G1 to G4, wherein each of the modified lines includes a rectilinearly extending portion.

[G6] The SiC semiconductor device according to any one of G1 to G5, wherein each of the modified lines includes a portion extending in a concavely curved shape from the first main surface toward the second main surface of the SiC semiconductor layer.

[G7] The SiC semiconductor device according to any one of G1 to G6, wherein each of the modified lines includes a portion extending in a convexly curved shape from the second main surface toward the first main surface of the SiC semiconductor layer.

[G8] The SiC semiconductor device according to any one of G1 to G7, wherein each of the modified lines includes a portion extending in a convexly curved shape from the second main surface toward the first main surface of the SiC semiconductor layer and a portion extending in a concavely curved shape from the first main surface toward the second main surface of the SiC semiconductor layer.

[G9] The SiC semiconductor device according to any one of G1 to G8, wherein each of the modified lines includes a first region formed at the first main surface side of the SiC semiconductor layer, a second region formed shifted toward the second main surface side of the SiC semiconductor layer with respect to the first region, and a connecting region connecting the first region and the second region.

[G10] The SiC semiconductor device according to G9, wherein the first region of each of the modified lines is positioned at the first main surface side of the SiC semiconductor layer with respect to a thickness direction middle portion of the SiC semiconductor layer, the second region of each of the modified lines is positioned at the second main surface side of the SiC semiconductor layer with respect to the thickness direction middle portion of the SiC semiconductor layer, and the connecting region of each of the modified lines crosses the thickness direction middle portion of the SiC semiconductor layer.

[G11] The SiC semiconductor device according to any one of G1 to G10, wherein the side surfaces of the SiC semiconductor layer are constituted of cleavage surfaces.

[G12] The SiC semiconductor device according to any one of G1 to G11, wherein the SiC semiconductor layer has a thickness not less than 40 μm and not more than 200 μm.

[G13] The SiC semiconductor device according to any one of G1 to G12, wherein the second main surface of the SiC semiconductor layer is constituted of a ground surface.

[G14] The SiC semiconductor device according to any one of G1 to G13, wherein the SiC monocrystal is constituted of a hexagonal crystal.

[G15] The SiC semiconductor device according to G14, wherein the SiC monocrystal is constituted of a 2H (hexagonal)-SiC monocrystal, a 4H-SiC monocrystal, or a 6H-SiC monocrystal.

[G16] The SiC semiconductor device according to G14 or G15, wherein the first main surface of the SiC semiconductor layer faces a c-plane of the SiC monocrystal.

[G17] The SiC semiconductor device according to any one of G14 to G16, wherein the first main surface of the SiC semiconductor layer has an off angle inclined at an angle not less than 0° and not more than 10° with respect to a c-plane of the SiC monocrystal.

[G18] The SiC semiconductor device according to G17, wherein the off angle is an angle not more than 5°.

[G19] The SiC semiconductor device according to G17 or G18, wherein the off angle is an angle exceeding 0° and being less than 4°.

[G20] The SiC semiconductor device according to any one of G1 to G19, wherein the SiC semiconductor layer has a laminated structure that includes an SiC semiconductor substrate and an SiC epitaxial layer and in which the first main surface is formed by the SiC epitaxial layer and the modified lines are formed in the SiC semiconductor substrate.

[G21] The SiC semiconductor device according to G20, wherein the modified lines are formed in the SiC semiconductor substrate while avoiding the SiC epitaxial layer.

Examples of yet other features extracted from the present description and drawings (in particular, FIG. 13T to FIG. 13Z) are indicated below.

Japanese Patent Application Publication No. 2012-146878 discloses a method for manufacturing an SiC semiconductor device that uses a stealth dicing method. With the manufacturing method of Japanese Patent Application Publication No. 2012-146878, a plurality of columns of modified layers (modified lines) are formed over entire areas of respective side surfaces of an SiC semiconductor layer cut out from an SiC semiconductor wafer. The plurality of columns of modified regions extend along tangential directions to a main surface of the SiC semiconductor layer and are formed at intervals in a normal direction to the main surface of the SiC semiconductor layer.

The modified lines are formed by modifying an SiC monocrystal of the SiC semiconductor layer to be of another property. Thus, in consideration of influences on the SiC semiconductor layer due to the modified lines, it cannot be said to be desirable to form the plurality of modified lines over the entire areas of the side surfaces of the SiC semiconductor layer. As examples of the influences on the SiC semiconductor layer due to the modified lines, fluctuation of electrical characteristics of the SiC semiconductor layer due to the modified lines, generation of cracks in the SiC semiconductor layer with the modified lines as starting points, etc., can be cited.

[H1] to [H20] in the following provide an SiC semiconductor device that enables influences on an siC semiconductor layer due to modified lines to be reduced.

[H1] An SiC semiconductor device including an SiC semiconductor layer including an SiC monocrystal and having a first main surface as a device surface, a second main surface at a side opposite to the first main surface, and a plurality of side surfaces connecting the first main surface and the second main surface, and a plurality of modified lines formed one layer each at the respective side surfaces of the SiC semiconductor layer and each extending in a band shape along a tangential direction to the first main surface of the SiC semiconductor layer and modified to be of a property differing from the SiC monocrystal.

According to this SiC semiconductor device, just one modified line is formed at each side surface of the SiC semiconductor layer. Influences on the SiC semiconductor layer due to the modified lines can thus be reduced.

[H2] The SiC semiconductor device according to H1, wherein the SiC semiconductor layer has a thickness not less than 40 μm and not more than 200 μm.

[H3] The SiC semiconductor device according to H1 or H2, wherein the second main surface of the SiC semiconductor layer is constituted of a ground surface.

[H4] The SiC semiconductor device according to any one of H1 to H3, wherein each of the modified lines is formed at an interval toward the second main surface side from the first main surface of the SiC semiconductor layer.

[H5] The SiC semiconductor device according to any one of H1 to H4, wherein each of the modified lines is formed at an interval toward the first main surface side from the second main surface of the SiC semiconductor layer.

[H6] The SiC semiconductor device according to any one of H1 to H5, wherein the SiC semiconductor layer includes a corner portion connecting two of the side surfaces and the plurality of modified lines include two of the modified lines that are continuous to each other at the corner portion of the SiC semiconductor layer.

[H7] The SiC semiconductor device according to any one of H1 to H6, wherein the plurality of modified lines are formed integrally such as to surround the SiC semiconductor layer.

[H8] The SiC semiconductor device according to any one of H1 to H7, wherein each of the modified lines extends rectilinearly or in a curve.

[H9] The SiC semiconductor device according to any one of H1 to H8, wherein each of the modified lines includes a plurality of modified portions each extending in a normal direction to the first main surface of the SiC semiconductor layer and opposing each other in the tangential direction to the first main surface of the SiC semiconductor layer.

[H10] The SiC semiconductor device according to any one of H1 to H9, wherein each of the side surfaces of the SiC semiconductor layer is constituted of a cleavage surface.

[H11] The SiC semiconductor device according to any one of H1 to H10, wherein the SiC monocrystal is constituted of a hexagonal crystal.

[H12] The SiC semiconductor device according to H11, wherein the SiC monocrystal is constituted of a 2H (hexagonal)-SiC monocrystal, a 4H-SiC monocrystal, or a 6H-SiC monocrystal.

[H13] The SiC semiconductor device according to H11 or H12, wherein the first main surface of the SiC semiconductor layer faces a c-plane of the SiC monocrystal.

[H14] The SiC semiconductor device according to any one of H11 to H13, wherein the first main surface of the SiC semiconductor layer has an off angle inclined at an angle not less than 0° and not more than 10° with respect to a c-plane of the SiC monocrystal.

[H15] The SiC semiconductor device according to H14, wherein the off angle is an angle not more than 5°.

[H16] The SiC semiconductor device according to H14 or H15, wherein the off angle is an angle exceeding 0° and being less than 4°.

[H17] The SiC semiconductor device according to any one of H1 to H16, wherein the SiC semiconductor layer has a laminated structure that includes an SiC semiconductor substrate and an SiC epitaxial layer and in which the first main surface is formed by the SiC epitaxial layer and the modified lines are formed in a region of the SiC semiconductor substrate.

[H18] The SiC semiconductor device according to H17, wherein the modified lines are formed in the SiC semiconductor substrate while avoiding the SiC epitaxial layer.

[H19] The SiC semiconductor device according to H17 or H18, wherein the SiC epitaxial layer has a thickness not more than a thickness of the SiC semiconductor substrate.

[H20] The SiC semiconductor device according to any one of H17 to H19, wherein the SiC semiconductor substrate has a thickness not less than 40 μm and not more than 150 μm and the SiC epitaxial layer has a thickness not less than 1 μm and not more than 50 μm.

[I1] to [I7] in the following provide a method for manufacturing an SiC semiconductor device that enables influences on an SiC semiconductor layer due to modified lines to be reduced.

[I1] A method for manufacturing an SiC semiconductor device including a step of preparing an SiC semiconductor wafer including an SiC monocrystal and having a first main surface at which a device forming region that has a plurality of sides is set and a second main surface at a side opposite to the first main surface, a step wherein, by irradiating laser light into an interior of the SiC semiconductor wafer along the plurality of sides of the device forming region, a plurality of modified lines modified to be of a property differing from the SiC monocrystal are formed one layer each in a relationship of one-to-one correspondence with respect to the plurality of sides of the device forming region, and a step of cutting the SiC semiconductor wafer along the plurality of modified lines.

According to this manufacturing method, the SiC semiconductor device including the SiC semiconductor layer including the SiC monocrystal and having the first main surface as a device surface, the second main surface at the side opposite to the first main surface, and a plurality of side surfaces connecting the first main surface and the second main surface, and the plurality of modified lines formed one layer each at the respective side surfaces of the SiC semiconductor layer and each extending in a band shape along a tangential direction to the first main surface of the SiC semiconductor layer and modified to be of the property differing from the SiC monocrystal can be manufactured and provided. Thus, the SiC semiconductor device that enables influences on the SiC semiconductor layer due to the modified lines to be reduced can be manufactured and provided.

[I2] The method for manufacturing the SiC semiconductor device according to H1, further including a step of grinding the second main surface of the SiC semiconductor wafer before the step of cutting the SiC semiconductor wafer.

[I3] The method for manufacturing the SiC semiconductor device according to I2, wherein the step of forming the modified lines is performed before the grinding step.

[I4] The method for manufacturing the SiC semiconductor device according to I2, wherein the step of forming the modified lines is performed after the grinding step.

[I5] The method for manufacturing the SiC semiconductor device according to any one of I2 to I4, wherein the step of preparing the SiC semiconductor wafer includes a step of preparing the SiC semiconductor wafer having a thickness exceeding 150 μm and the grinding step includes a step of grinding the SiC semiconductor wafer until the SiC semiconductor wafer becomes not less than 40 μm and not more than 150 μm.

[I6] The method for manufacturing the SiC semiconductor device according to any one of I1 to I5, wherein the step of forming the modified lines includes a step of irradiating the laser light into the interior of the SiC semiconductor wafer from the first main surface side of the SiC semiconductor wafer.

[I17] The method for manufacturing the SiC semiconductor device according to any one of I1 to 15, wherein the step of forming the modified lines includes a step of irradiating the laser light into the interior of the SiC semiconductor wafer from the second main surface side of the SiC semiconductor wafer.

Examples of other features extracted from the present description and drawings are indicated below.

[J1] to [J6] in the following provide an SiC semiconductor device that enables stability of electrical characteristics of an SiC semiconductor layer to be improved.

[J1] An SiC semiconductor device including an SiC semiconductor layer including an SiC monocrystal and having a first main surface as a device surface, a second main surface at a side opposite to the first main surface, and a side surface connecting the first main surface and the second main surface, an insulating layer containing an insulating material, covering the first main surface of the SiC semiconductor layer, and having an insulating side surface continuous to the side surface of the SiC semiconductor layer, an electrode formed on the insulating layer, and a modified layer formed at the side surface of the SiC semiconductor layer and modified to be of a property differing from the SiC monocrystal.

According to this SiC semiconductor device, an insulating property between the side surface of the SiC semiconductor layer and the electrode can be improved by the insulating layer in a structure in which the modified layer is formed at the side surface of the SiC semiconductor layer. Stability of electrical characteristics of the siC semiconductor layer can thereby be improved.

[J2] The SiC semiconductor device according to J1, wherein the modified layer is formed at a thickness direction intermediate portion of the SiC semiconductor layer at an interval from the insulating layer.

[J3] The SiC semiconductor device according to J1 or J2, wherein the SiC semiconductor layer has a laminated structure that includes an SiC semiconductor substrate and an SiC epitaxial layer and in which the first main surface is formed by the SiC epitaxial layer, the insulating layer covers the epitaxial layer, and the modified layer is formed in a region of the SiC semiconductor substrate.

[J4] The SiC semiconductor device according to J3, wherein the modified layer is formed in the SiC semiconductor substrate while avoiding the SiC epitaxial layer.

[J5] The SiC semiconductor device according to J3 or J4, wherein the SiC epitaxial layer has a thickness not more than a thickness of the SiC semiconductor substrate.

[J6] The SiC semiconductor device according to any one of J3 to J5, wherein the SiC semiconductor substrate has a thickness not less than 40 μm and not more than 150 μm and the SiC epitaxial layer has a thickness not less than 1 μm and not more than 50 μm.

[K1] to [K5] in the following provide a method for manufacturing an SiC semiconductor device that enables stability of electrical characteristics of an SiC semiconductor layer to be improved.

[K1] A method for manufacturing an siC semiconductor device including a step of preparing an SiC semiconductor wafer including an SiC monocrystal and having a first main surface at which a device forming region that has a plurality of sides is set and a second main surface at a side opposite to the first main surface, a step of forming an insulating layer on the first main surface of the SiC semiconductor wafer, a step of forming an electrode on the insulating layer, a step where, by irradiating laser light into an interior of the SiC semiconductor wafer along the plurality of sides of the device forming region, a plurality of modified layers modified to be of a property differing from the SiC monocrystal are formed, and a step of cutting the SiC semiconductor wafer, together with the insulating layer, along the plurality of modified layers.

According to this manufacturing method, the SiC semiconductor device including the SiC semiconductor layer including the SiC monocrystal and having the first main surface as a device surface, the second main surface at the side opposite to the first main surface, and a side surface connecting the first main surface and the second main surface, the insulating layer containing an insulating material, covering the first main surface of the SiC semiconductor layer, and having an insulating side surface continuous to the side surface of the SiC semiconductor layer, the electrode formed on the insulating layer, and the modified layers formed at the side surface of the SiC semiconductor layer and modified to be of the property differing from the SiC monocrystal can be manufactured and provided. Thus, the SiC semiconductor device that enables stability of electrical characteristics of the SiC semiconductor layer to be improved can be manufactured and provided.

[K2] The method for manufacturing the SiC semiconductor device according to K1, further including a step of grinding the second main surface of the SiC semiconductor wafer.

[K3] The method for manufacturing the SiC semiconductor device according to K2, wherein the step of forming the modified lines is performed before the grinding step.

[K4] The method for manufacturing the SiC semiconductor device according to K2, wherein the step of forming the modified lines is performed after the grinding step.

[K5] The method for manufacturing the SiC semiconductor device according to any one of K1 to K4, wherein the step of preparing the SiC semiconductor wafer includes a step of preparing the SiC semiconductor wafer having a thickness exceeding 150 μm and the grinding step includes a step of grinding the SiC semiconductor wafer until the Sic semiconductor wafer becomes not less than 40 μm and not more than 150 μm.

[L1] to [L5] in the following provide a method for manufacturing an SiC semiconductor device that enables a modified layer to be formed appropriately inside an SiC semiconductor wafer and the SiC semiconductor wafer to be cut appropriately.

[L1] A method for manufacturing an SiC semiconductor device including a step of preparing an SiC semiconductor wafer including an SiC monocrystal and having a first main surface at which a device forming region that has a plurality of sides is set and a second main surface at a side opposite to the first main surface, a step of forming an insulating layer on the first main surface of the SiC semiconductor wafer, a step of partially removing the insulating layer to form, in the insulating layer, an opening exposing the plurality of sides of the device forming region, a step wherein, by irradiating laser light into an interior of the SiC semiconductor wafer along the plurality of sides of the device forming region, a plurality of modified layers modified to be of a property differing from the SiC monocrystal are formed, and a step of cutting the SiC semiconductor wafer along the plurality of modified layers.

According to this method for manufacturing the SiC semiconductor device, the modified layers can be formed appropriately inside the SiC semiconductor wafer and the SiC semiconductor wafer can be cut appropriately.

[L2] The method for manufacturing the SiC semiconductor device according to L1, further including a step of grinding the second main surface of the SiC semiconductor wafer.

[L3] The method for manufacturing the SiC semiconductor device according to L2, wherein the step of forming the modified lines is performed before the grinding step.

[L4] The method for manufacturing the SiC semiconductor device according to L2, wherein the step of forming the modified lines is performed after the grinding step.

[L5] The method for manufacturing the SiC semiconductor device according to any one of L1 to L4, wherein the step of preparing the SiC semiconductor wafer includes a step of preparing the SiC semiconductor wafer having a thickness exceeding 150 μm and the grinding step includes a step of grinding the SiC semiconductor wafer until the SiC semiconductor wafer becomes not less than 40 μm and not more than 150 μm.

[M1] and [M2] in the following provide an SiC semiconductor device that enables cracking of an siC semiconductor layer to be suppressed.

[M1] An SiC semiconductor device including an SiC semiconductor layer including an SiC monocrystal and having a first main surface as a device surface, a second main surface at a side opposite to the first main surface, and a side surface connecting the first main surface and the second main surface, and a plurality of modified layers formed at the side surface at intervals toward the second main surface side from the first main surface such as to expose a surface layer portion of the first main surface of the SiC semiconductor layer and modified to be of a property differing from the SiC monocrystal.

Due to a property of being formed by modifying the SiC monocrystal of the SiC semiconductor layer to be of another property, the modified layers readily become starting points of cracks. In particular, stress readily concentrates at a corner portion connecting the first main surface and the side surface of the SiC semiconductor layer and therefore, in a structure wherein the modified layers are formed at the corner portion of the SiC semiconductor layer, there is increased risk of cracking occurring at the corner portion of the SiC semiconductor layer.

According to this SiC semiconductor device, the modified layers are formed at intervals toward the second main surface side from the first main surface of the SiC semiconductor layer such as to expose the surface layer portion of the first main surface of the SiC semiconductor layer from the side surface of the SiC semiconductor layer. The risk of occurrence of cracking at the corner portion at the first main surface side of the SiC semiconductor layer can thus be reduced.

[M2] An SiC semiconductor device including an SiC semiconductor layer including an SiC monocrystal and having a first main surface as a device surface, a second main surface at a side opposite to the first main surface, and a side surface connecting the first main surface and the second main surface, and a plurality of modified layers formed at the side surface at intervals toward the first main surface side from the second main surface such as to expose a surface layer portion of the second main surface of the SiC semiconductor layer and modified to be of a property differing from the SiC monocrystal.

Due to a property of being formed by modifying the SiC monocrystal of the SiC semiconductor layer to be of another property, the modified layers readily become starting points of cracks. In particular, stress readily concentrates at a corner portion connecting the second main surface and the side surface of the SiC semiconductor layer and therefore, in a structure wherein the modified layers are formed at the corner portion of the SiC semiconductor layer, there is increased risk of cracking occurring at the corner portion of the SiC semiconductor layer.

According to this SiC semiconductor device, the modified layers are formed at intervals toward the first main surface side from the second main surface of the SiC semiconductor layer such as to expose the surface layer portion of the second main surface of the SiC semiconductor layer from the side surface of the SiC semiconductor layer. The risk of occurrence of cracking at the corner portion at the second main surface side of the SiC semiconductor layer can thus be reduced.

The present application corresponds to Japanese Patent Application No. 2018-151450 filed on Aug. 10, 2018 in the Japan Patent Office, Japanese Patent Application No. 2018-151451 filed on Aug. 10, 2018 in the Japan Patent Office, and Japanese Patent Application No. 2018-151452 filed on Aug. 10, 2018 in the Japan Patent Office, and the entire disclosures of these applications are incorporated herein by reference.

While preferred embodiments of the present invention have been described in detail, these are merely specific examples used to clarify the technical contents of the present invention and the present invention should not be interpreted as being limited to these specific examples and the scope of the present invention is to be limited only by the appended claims.

REFERENCE SIGNS LIST

1 SiC semiconductor device
2 SiC semiconductor layer
3 first main surface of SiC semiconductor layer
4 second main surface of SiC semiconductor layer
5A side surface of SiC semiconductor layer
5B side surface of SiC semiconductor layer
5C side surface of SiC semiconductor layer
5D side surface of SiC semiconductor layer
6 SiC semiconductor substrate
7 SiC epitaxial layer
20A rough surface region
20B rough surface region
20C rough surface region
20D rough surface region
21A smooth surface region
21B smooth surface region
21C smooth surface region
21D smooth surface region
22A modified line
22B modified line
22C modified line
22D modified line
28 a-plane modified portion (modified portion)
29 m-plane modified portion (modified portion)
81 SiC semiconductor device
101 SiC semiconductor device
102 SiC semiconductor layer
103 first main surface of SiC semiconductor layer
104 second main surface of SiC semiconductor layer
105A side surface of SiC semiconductor layer
105B side surface of SiC semiconductor layer
105C side surface of SiC semiconductor layer
105D side surface of SiC semiconductor layer
106 SiC semiconductor substrate
107 SiC epitaxial layer
θ off angle

The invention claimed is:

1. An SiC semiconductor device comprising:

an SiC semiconductor layer including an SiC monocrystal and having a first main surface as a device surface, a second main surface at a side opposite to the first main surface, and a plurality of side surfaces connecting the first main surface and the second main surface; and a plurality of modified lines formed one layer each as a band shape at the respective side surfaces of the SiC semiconductor layer and each including a portion extending inclinedly with respect to the first main surface and modified to be of a property differing from the SiC monocrystal.

2. The SiC semiconductor device according to claim 1, wherein each of the modified lines is formed at an interval toward the second main surface side from the first main surface of the SiC semiconductor layer.

3. The SiC semiconductor device according to claim 1, wherein each of the modified lines is formed at an interval toward the first main surface side from the second main surface of the SiC semiconductor layer.

4. The SiC semiconductor device according to claim 1, wherein each of the modified lines bipartitions the corresponding side surface of the SiC semiconductor layer into a region at the first main surface side and a region at the second main surface side in a side view as viewed from a normal direction to the side surface of the SiC semiconductor layer.

5. The SiC semiconductor device according to claim 1, wherein each of the modified lines includes a rectilinearly extending portion.

6. The SiC semiconductor device according to claim 1, wherein each of the modified lines includes a portion extending in a concavely curved shape from the first main surface toward the second main surface of the sic semiconductor layer.

7. The SiC semiconductor device according to claim 1, wherein each of the modified lines includes a portion extending in a convexly curved shape from the second main surface toward the first main surface of the SiC semiconductor layer.

8. The SiC semiconductor device according to claim 1, wherein each of the modified lines includes a portion extending in a convexly curved shape from the second main surface toward the first main surface of the SiC semiconductor layer and a portion extending in a concavely curved shape from the first main surface toward the second main surface of the SiC semiconductor layer.

9. The SiC semiconductor device according to claim 1, wherein each of the modified lines includes a first region formed at the first main surface side of the SiC semiconductor layer, a second region formed shifted toward the second main surface side of the SiC semiconductor layer with respect to the first region, and a connecting region connecting the first region and the second region.

10. The SiC semiconductor device according to claim 9, wherein the first region of each of the modified lines is positioned at the first main surface side of the SiC semiconductor layer with respect to a thickness direction middle portion of the SiC semiconductor layer, the second region of each of the modified lines is positioned at the second main surface side of the SiC semiconductor layer with respect to the thickness direction middle portion of the SiC semiconductor layer, and the connecting region of each of the modified lines crosses the thickness direction middle portion of the SiC semiconductor layer.

11. The SiC semiconductor device according to claim 1, wherein the side surfaces of the SiC semiconductor layer are constituted of cleavage surfaces.

12. The SiC semiconductor device according to claim 1, wherein the SiC semiconductor layer has a thickness not less than 40 μm and not more than 200 μm.

13. The SiC semiconductor device according to claim 1, wherein the second main surface of the SiC semiconductor layer is constituted of a ground surface.

14. The SiC semiconductor device according to claim 1, wherein the SiC monocrystal is constituted of a hexagonal crystal.

15. The SiC semiconductor device according to claim 14, wherein the SiC monocrystal is constituted of a 2H (hexagonal)-SiC monocrystal, a 4H-SiC monocrystal, or a 6H-SiC monocrystal.

16. The SiC semiconductor device according to claim 14, wherein the first main surface of the SiC semiconductor layer faces a c-plane of the SiC monocrystal.

17. The SiC semiconductor device according to claim 14, wherein the first main surface of the SiC semiconductor layer has an off angle inclined at an angle not less than 0° and not more than 10° with respect to a c-plane of the SiC monocrystal.

18. The SiC semiconductor device according to claim 17, wherein the off angle is an angle not more than 5°.

19. The SiC semiconductor device according to claim 17, wherein the off angle is an angle exceeding 0° and being less than 4°.

20. The SiC semiconductor device according to claim 1, wherein the SiC semiconductor layer has a laminated structure that includes an SiC semiconductor substrate and an SiC epitaxial layer and in which the first main surface is formed by the SiC epitaxial layer and the modified lines are formed in the SiC semiconductor substrate.

21. The SiC semiconductor device according to claim 20, wherein the modified lines are formed in the SiC semiconductor substrate while avoiding the SiC epitaxial layer.

* * * * *